(12) United States Patent
Nakamura et al.

(10) Patent No.: US 10,147,780 B2
(45) Date of Patent: Dec. 4, 2018

(54) DISPLAY DEVICE

(71) Applicant: Semiconductor Energy Laboratory Co., Ltd., Atsugi-shi, Kanagawa-ken (JP)

(72) Inventors: Daiki Nakamura, Kanagawa (JP); Kohei Yokoyama, Kanagawa (JP); Yasuhiro Jinbo, Kanagawa (JP); Toshiki Sasaki, Kanagawa (JP); Masataka Nakada, Tochigi (JP); Naoto Goto, Tochigi (JP); Takahiro Iguchi, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 93 days.

(21) Appl. No.: 15/290,085

(22) Filed: Oct. 11, 2016

(65) Prior Publication Data

US 2017/0104049 A1    Apr. 13, 2017

(30) Foreign Application Priority Data

Oct. 12, 2015    (JP) .................................. 2015-201659

(51) Int. Cl.
  *H01L 27/32*    (2006.01)
  *H01L 29/786*   (2006.01)
  (Continued)

(52) U.S. Cl.
  CPC ........ *H01L 27/3267* (2013.01); *G02F 1/1368* (2013.01); *G02F 1/133345* (2013.01);
  (Continued)

(58) Field of Classification Search
  CPC ............... H01L 27/3267; H01L 27/124; H01L 29/7869; G02F 1/133345; G02F 1/1368; G02F 1/134309
  See application file for complete search history.

(56) References Cited

U.S. PATENT DOCUMENTS 6,160,600 A    12/2000    Yamazaki et al.
6,407,785 B1    6/2002    Yamazaki
(Continued)

FOREIGN PATENT DOCUMENTS

CN    001403856 A    3/2003
CN    001714380 A    12/2005
(Continued)

OTHER PUBLICATIONS

Shieh.H, "Transflective display by Hybrid OLED and LCD", LEOS 2005 (IEEE Lasers and Electro-Optics Society Annual Meeting), Oct. 22, 2005, pp. 650-651, IEEE.
(Continued)

*Primary Examiner* — Joseph L Williams
(74) *Attorney, Agent, or Firm* — Fish & Richardson P.C.

(57) ABSTRACT

A novel display device that is highly convenient with low power consumption is provided. The display device includes a display element including a liquid crystal layer, a display element including a light-emitting layer, and a pixel circuit. Electrodes of the display element including the liquid crystal layer and the display element including the light-emitting layer are electrically connected to the pixel circuit. The electrode of the display element including the liquid crystal layer includes a reflective film including an opening. The pixel circuit includes a transistor including a semiconductor film. The number of insulating films in a region overlapping with the opening is smaller than that of insulating films overlapping with the semiconductor film. In addition, the display element including the light-emitting layer includes (Continued)

two light-emitting elements. The number of optical elements overlapping with one light-emitting element is smaller than that of optical elements overlapping with the other light-emitting element.

19 Claims, 65 Drawing Sheets

(51) Int. Cl.
*G02F 1/1343* (2006.01)
*G02F 1/1333* (2006.01)
*G02F 1/1335* (2006.01)
*G02F 1/1368* (2006.01)
*H01L 27/12* (2006.01)

(52) U.S. Cl.
CPC .. *G02F 1/133553* (2013.01); *G02F 1/134309* (2013.01); *H01L 27/124* (2013.01); *H01L 27/3232* (2013.01); *H01L 29/7869* (2013.01)

(56) References Cited

U.S. PATENT DOCUMENTS

| | | |
|---|---|---|
| 6,714,268 B2 | 3/2004 | Wang et al. |
| 6,784,952 B2 | 8/2004 | Yamazaki |
| 6,999,137 B2 | 2/2006 | Yamazaki |
| 7,038,641 B2 | 5/2006 | Hirota et al. |
| 7,053,969 B2 | 5/2006 | Yamazaki et al. |
| 7,084,936 B2 | 8/2006 | Kato |
| 7,102,704 B2 | 9/2006 | Mitsui et al. |
| 7,176,991 B2 | 2/2007 | Mitsui et al. |
| 7,212,265 B2 | 5/2007 | Eguchi et al. |
| 7,239,361 B2 | 7/2007 | Kato |
| 7,248,235 B2 | 7/2007 | Fujii et al. |
| 7,253,854 B2 | 8/2007 | Yamazaki |
| 7,385,654 B2 | 6/2008 | Mitsui et al. |
| 7,612,849 B2 | 11/2009 | Eguchi et al. |
| 7,626,663 B2 | 12/2009 | Kimura |
| 7,821,613 B2 | 10/2010 | Kimura |
| 7,889,300 B2 | 2/2011 | Kimura |
| 8,035,781 B2 | 10/2011 | Eguchi et al. |
| 8,130,350 B2 | 3/2012 | Kimura |
| 8,212,953 B2 | 7/2012 | Hosoya |
| 8,242,683 B2 | 8/2012 | Abe et al. |
| 8,305,535 B2 | 11/2012 | Kimura |
| 8,576,363 B2 | 11/2013 | Kimura |
| 8,634,044 B2 | 1/2014 | Kimura |
| 8,866,725 B2 | 10/2014 | Yamazaki et al. |
| 8,976,308 B2 | 3/2015 | Hosoya |
| 9,000,438 B2 | 4/2015 | Jintyou et al. |
| 9,046,245 B2 | 6/2015 | Hirakata |
| 9,057,920 B2 | 6/2015 | Eguchi et al. |
| 9,235,090 B2 | 1/2016 | Kimura et al. |
| 9,298,035 B2 | 3/2016 | Yamazaki et al. |
| 9,349,325 B2 | 5/2016 | Yamazaki et al. |
| 9,437,623 B2 | 9/2016 | Hosoya |
| 9,448,432 B2 | 9/2016 | Yamazaki et al. |
| 9,448,433 B2 | 9/2016 | Yamazaki et al. |
| 2001/0017371 A1 | 8/2001 | Tanaka et al. |
| 2002/0038998 A1 | 4/2002 | Fujita et al. |
| 2003/0052869 A1 | 3/2003 | Fujii et al. |
| 2003/0201960 A1 | 10/2003 | Fujieda |
| 2004/0066136 A1 | 4/2004 | Yoneda et al. |
| 2005/0007322 A1 | 1/2005 | Adachi et al. |
| 2006/0072047 A1 | 4/2006 | Sekiguchi |
| 2007/0236141 A1 | 10/2007 | Lee et al. |
| 2008/0006833 A1 | 1/2008 | Hirakata |
| 2008/0158138 A1 | 7/2008 | Yamazaki et al. |
| 2008/0180618 A1 | 7/2008 | Fujieda |
| 2008/0230775 A1 | 9/2008 | Rhee et al. |
| 2009/0115688 A1 | 5/2009 | Adachi et al. |
| 2010/0171905 A1 | 7/2010 | Huang et al. |
| 2010/0187522 A1 | 7/2010 | Lee et al. |
| 2011/0157254 A1 | 6/2011 | Yamazaki et al. |
| 2011/0175874 A1 | 7/2011 | Wakimoto et al. |
| 2011/0260605 A1 | 10/2011 | Adachi et al. |
| 2012/0033156 A1 | 2/2012 | Yamazaki et al. |
| 2012/0097952 A1 | 4/2012 | Kang et al. |
| 2012/0248476 A1 | 10/2012 | Adachi et al. |
| 2014/0132872 A1 | 5/2014 | Kimura |
| 2014/0293192 A1 | 10/2014 | Hatano |
| 2015/0301388 A1 | 10/2015 | Eguchi et al. |
| 2015/0316818 A1 | 11/2015 | Jintyou et al. |
| 2016/0012783 A1 | 1/2016 | Kimura et al. |
| 2016/0033820 A1 | 2/2016 | Kimura |
| 2016/0042696 A1 | 2/2016 | Hirakata et al. |
| 2016/0042702 A1 | 2/2016 | Hirakata et al. |
| 2016/0210910 A1 | 7/2016 | Yamazaki et al. |
| 2016/0275911 A1 | 9/2016 | Kubota et al. |
| 2016/0283028 A1 | 9/2016 | Yamazaki et al. |
| 2016/0299387 A1 | 10/2016 | Yamazaki et al. |
| 2016/0313769 A1 | 10/2016 | Yoshitani et al. |

FOREIGN PATENT DOCUMENTS

| | | |
|---|---|---|
| JP | 2001-066593 A | 3/2001 |
| JP | 2002-140022 A | 5/2002 |
| JP | 2002-196702 A | 7/2002 |
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 B2 | 10/2008 |
| JP | 2011-248351 A | 12/2011 |
| JP | 2013-221965 A | 10/2013 |
| KR | 2003-0022049 A | 3/2003 |
| TW | 588185 | 5/2004 |
| WO | WO-2004/053819 | 6/2004 |
| WO | WO-2004-053819 A | 6/2004 |

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.
Invitation to Pay Additional Fees (Application No. PCT/IB2016/055972), International Searching Authority, dated Nov. 29, 2016.

FIG. 1A
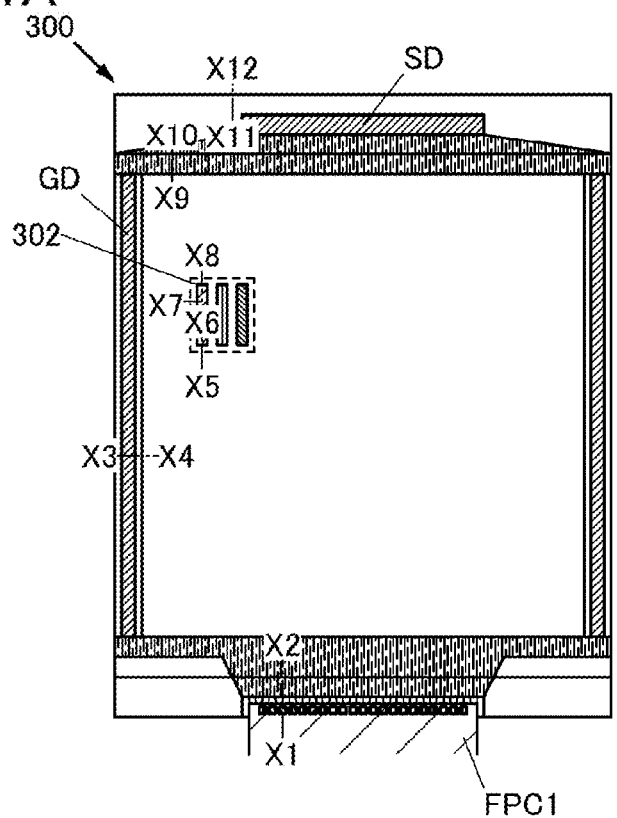
FIG. 1B1
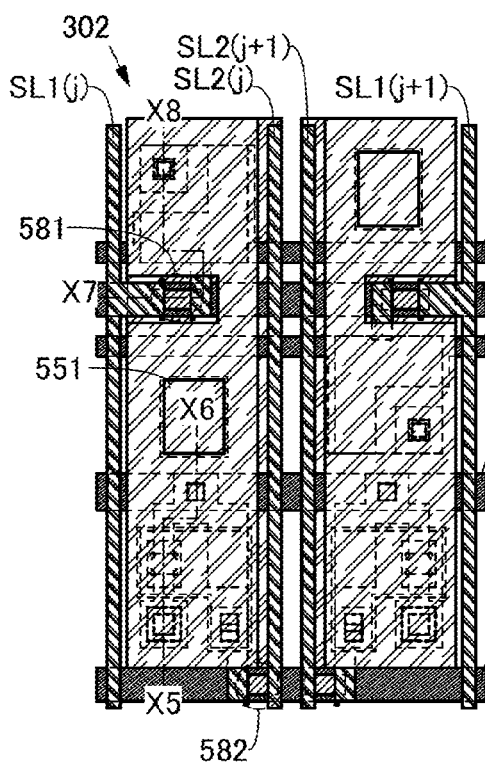
FIG. 1B2
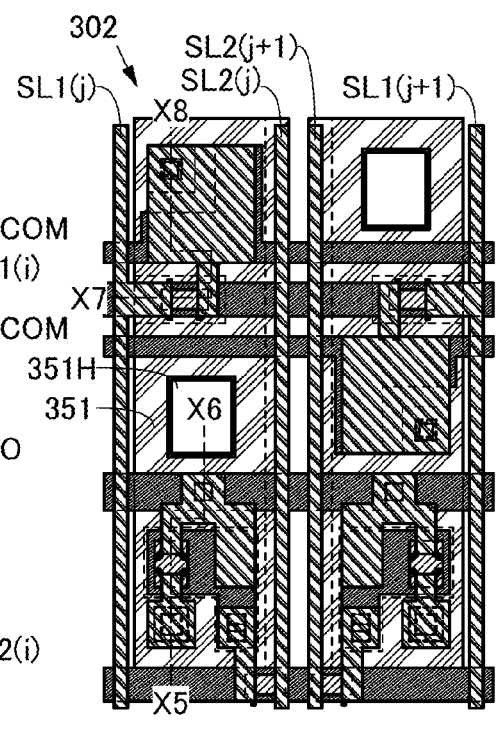

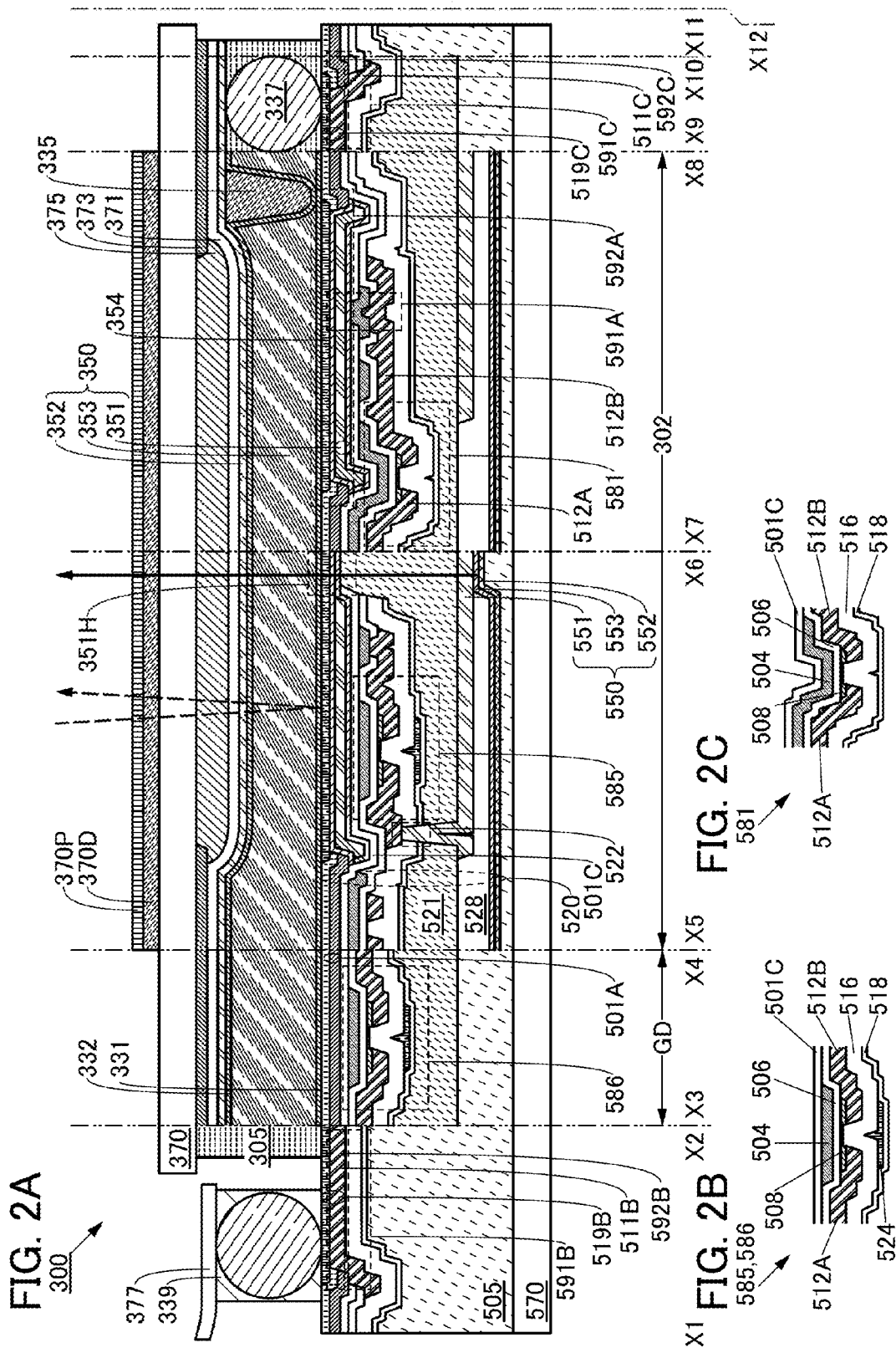

FIG. 4A
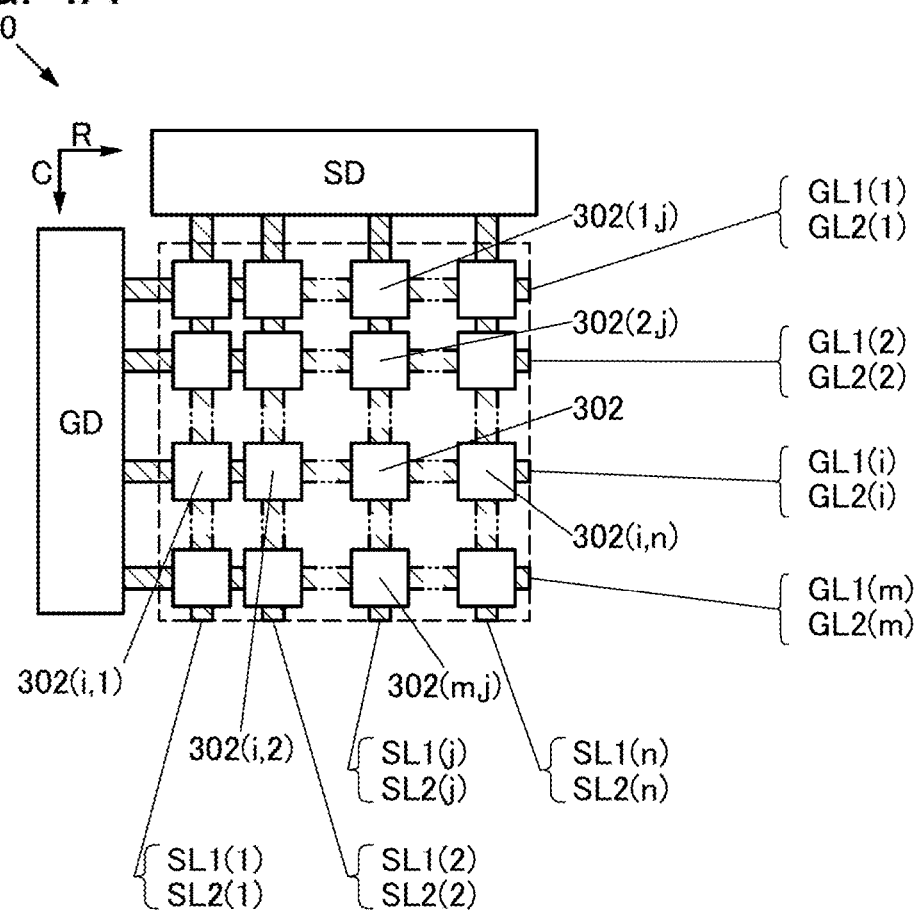
FIG. 4B1
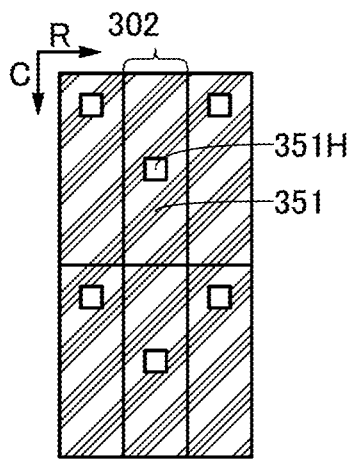
FIG. 4B2
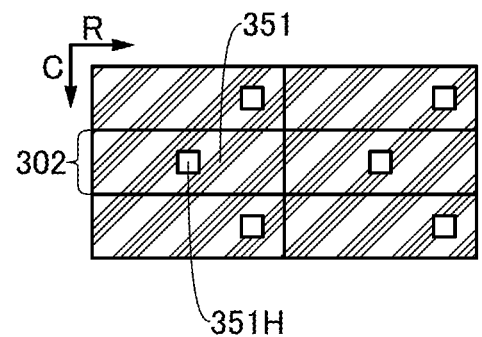

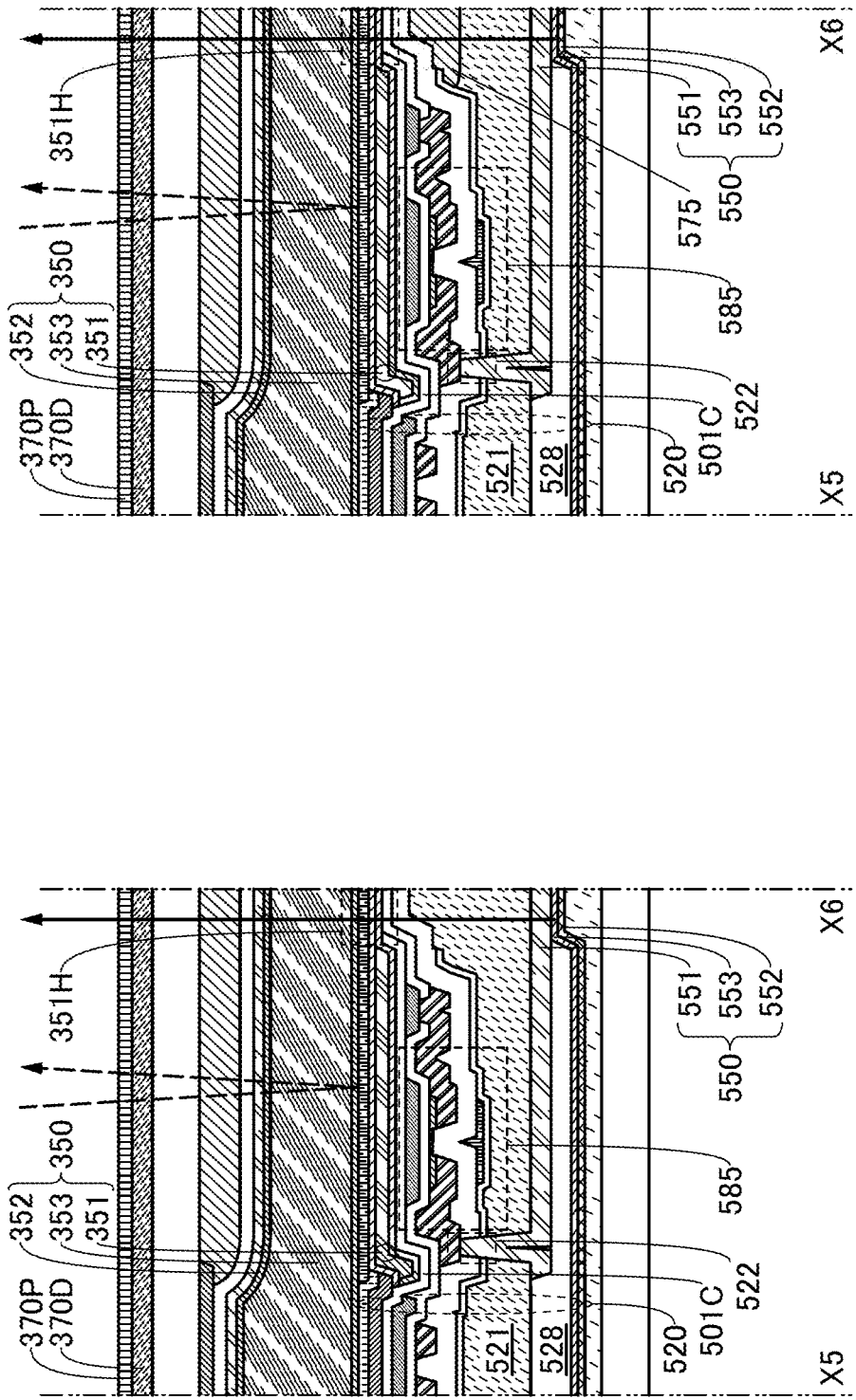

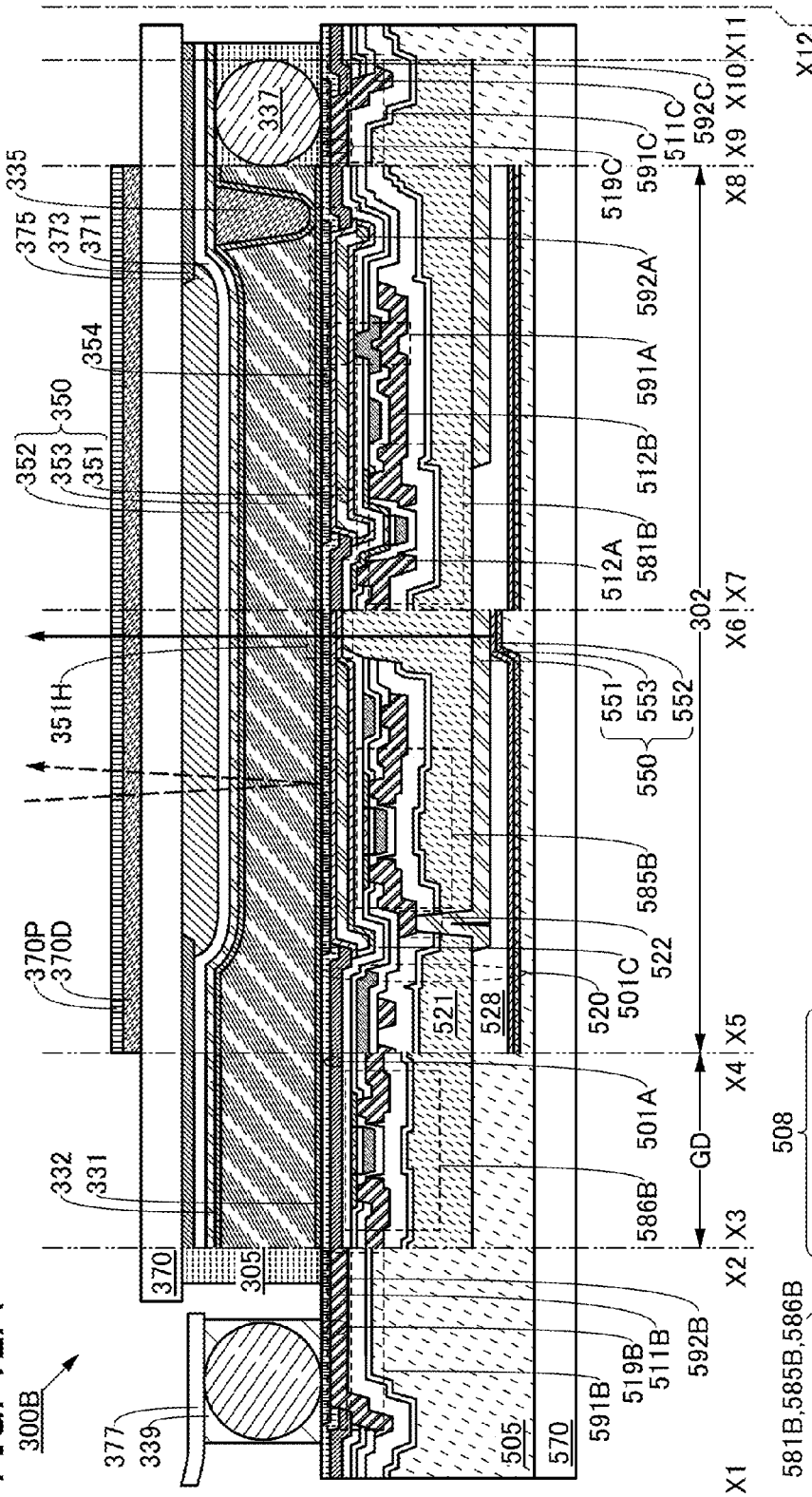

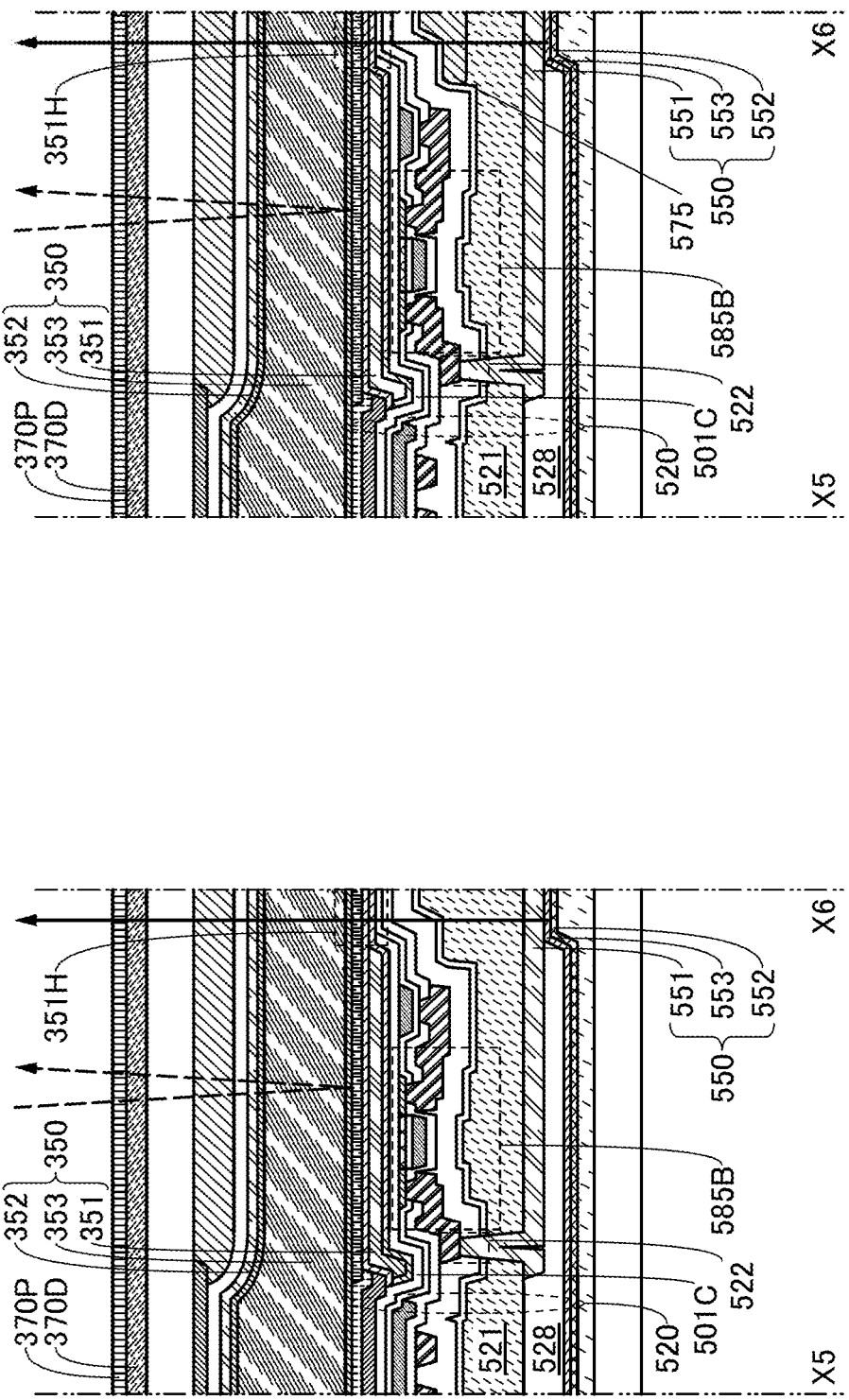

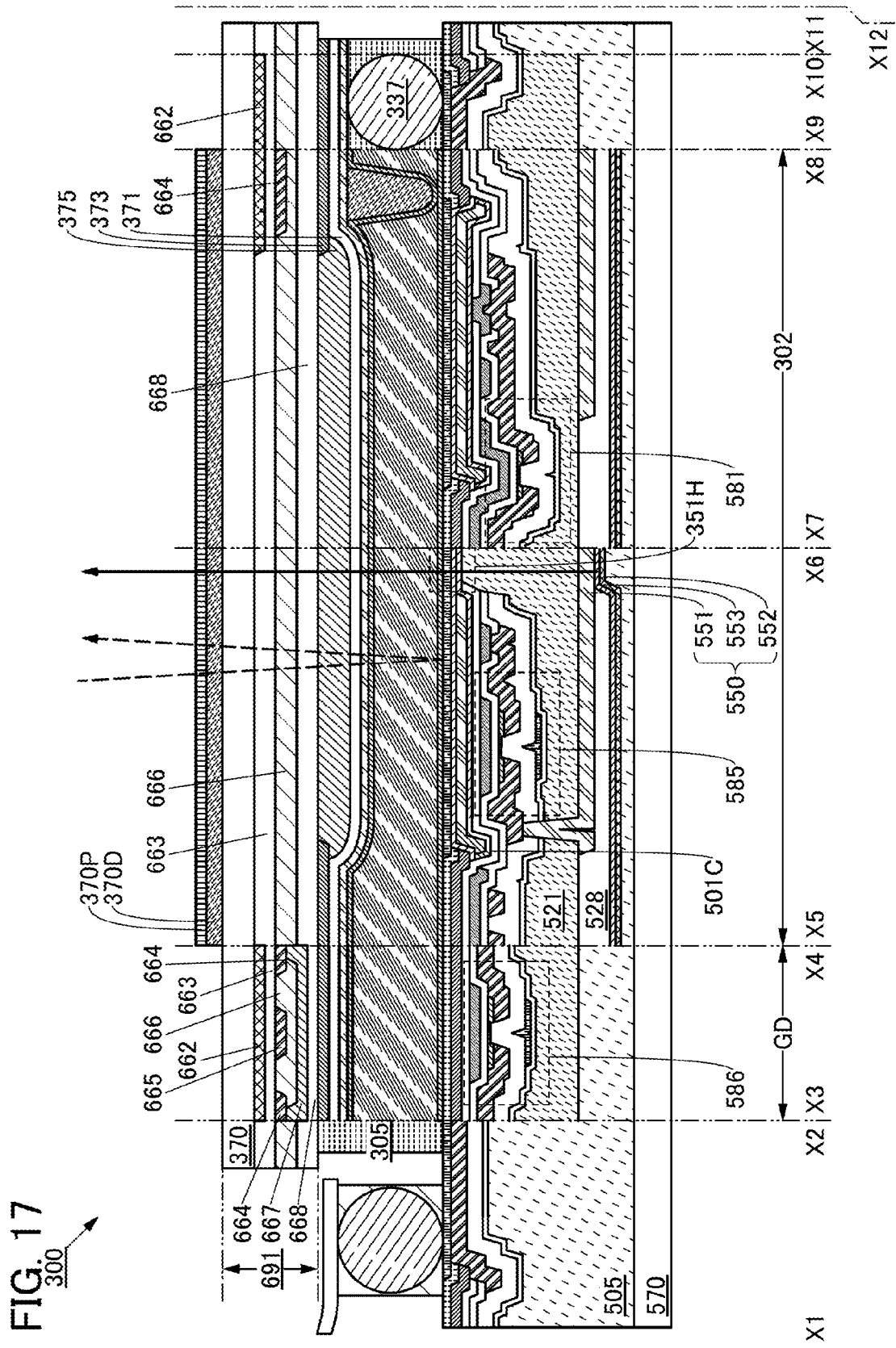

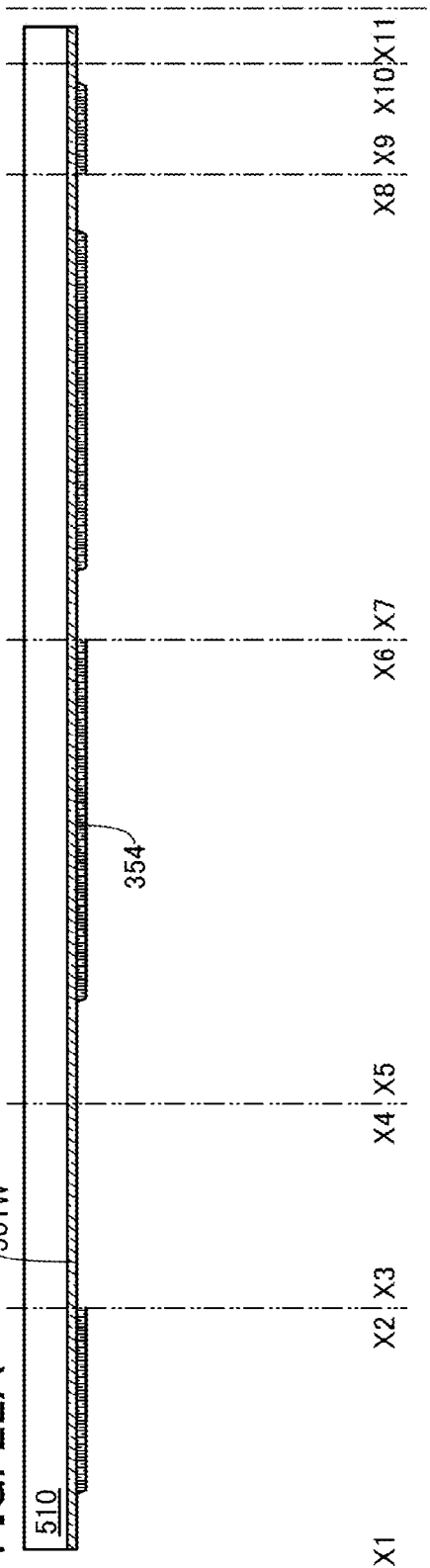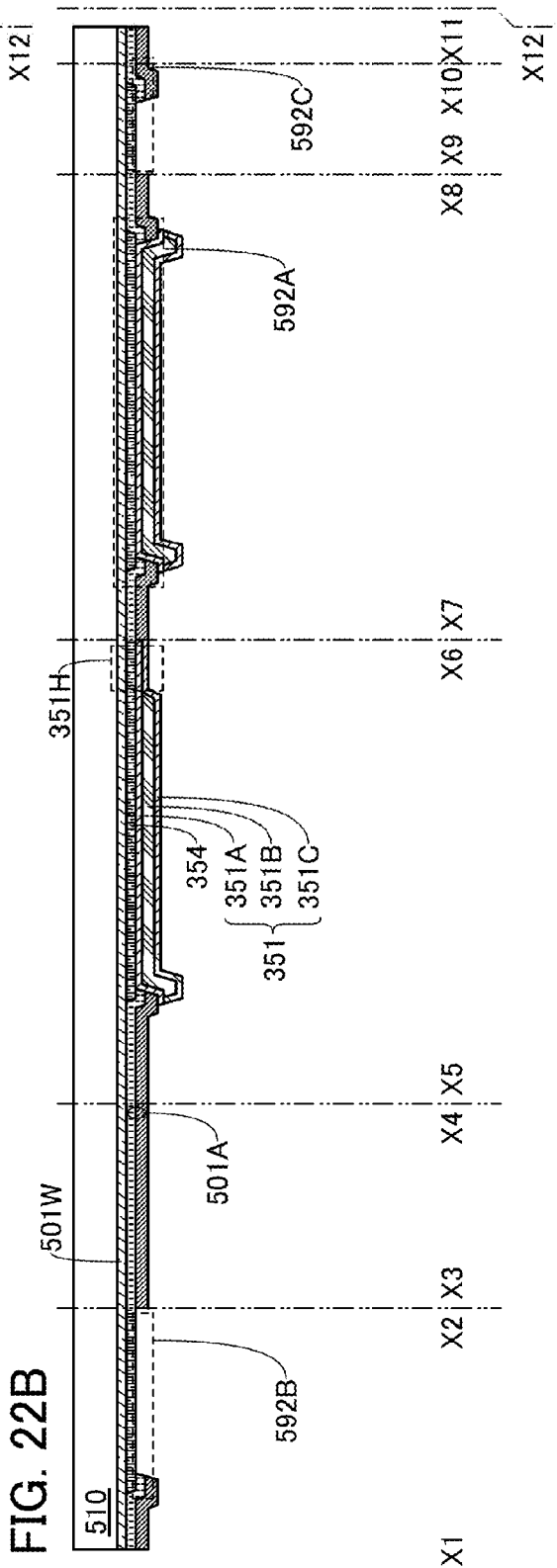

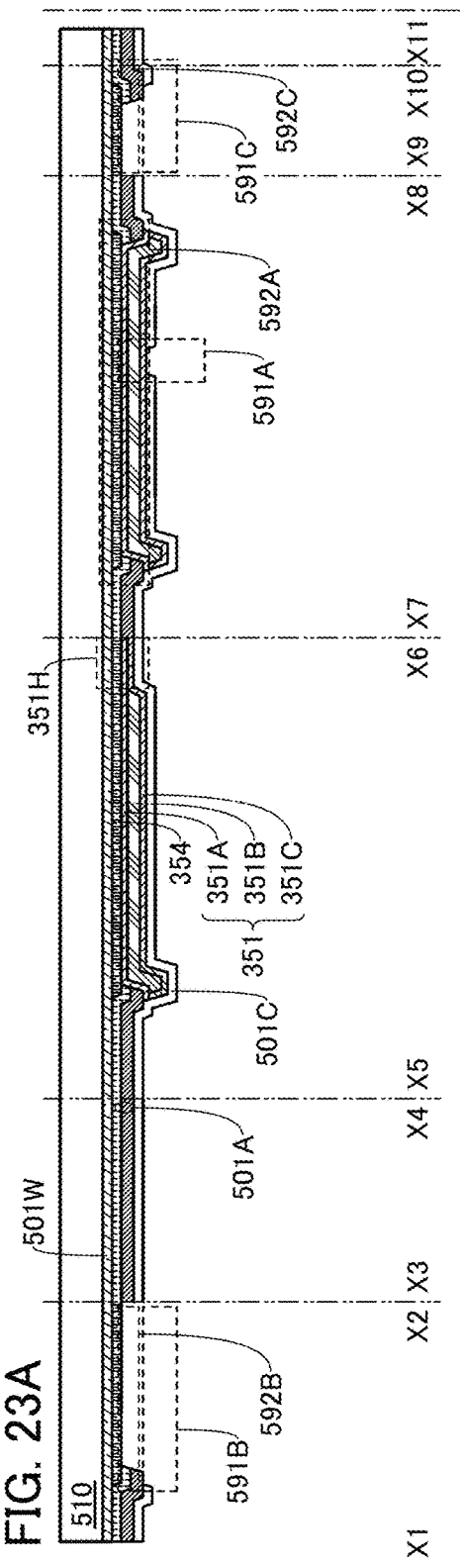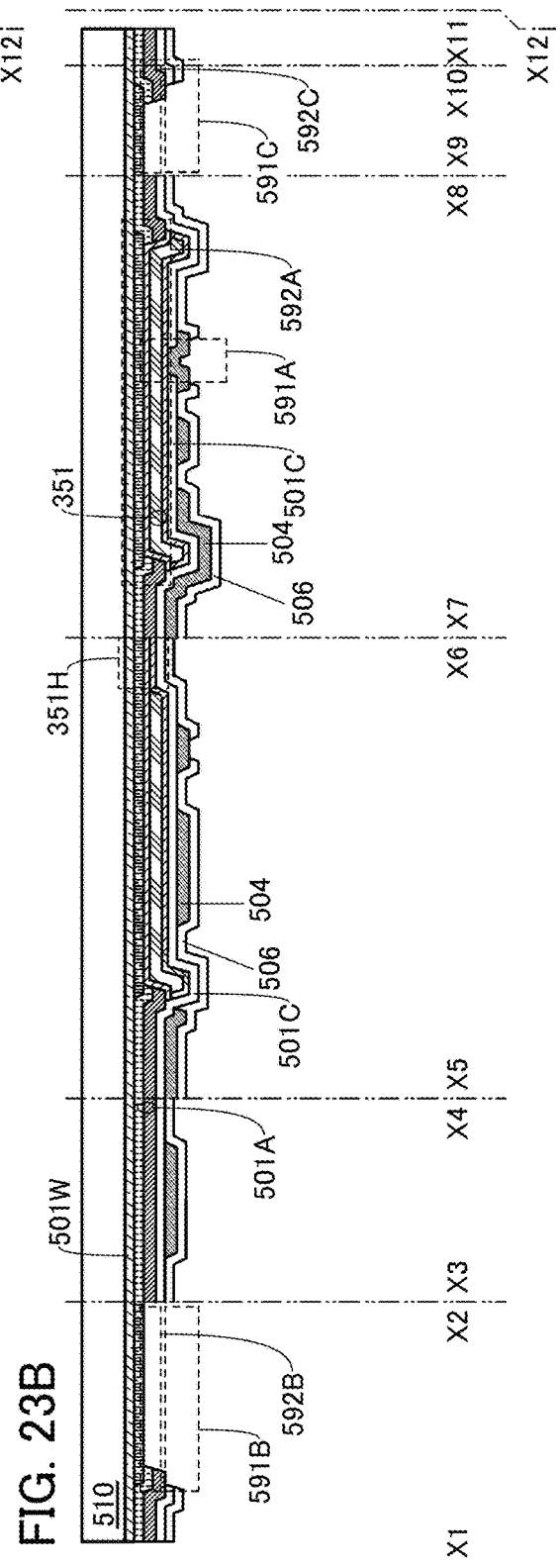

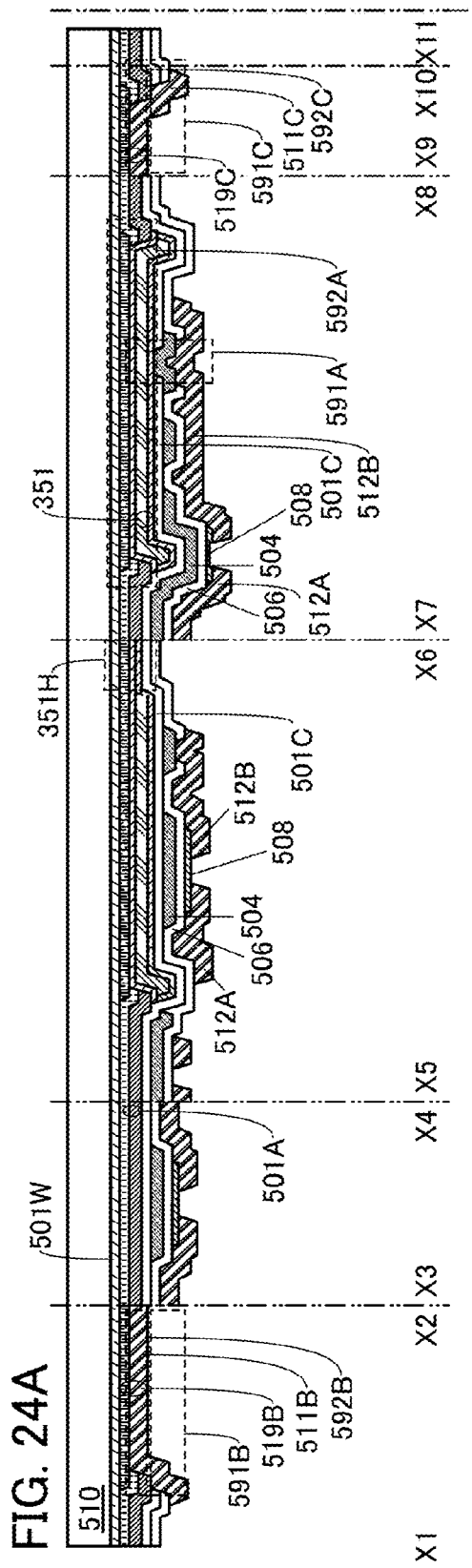
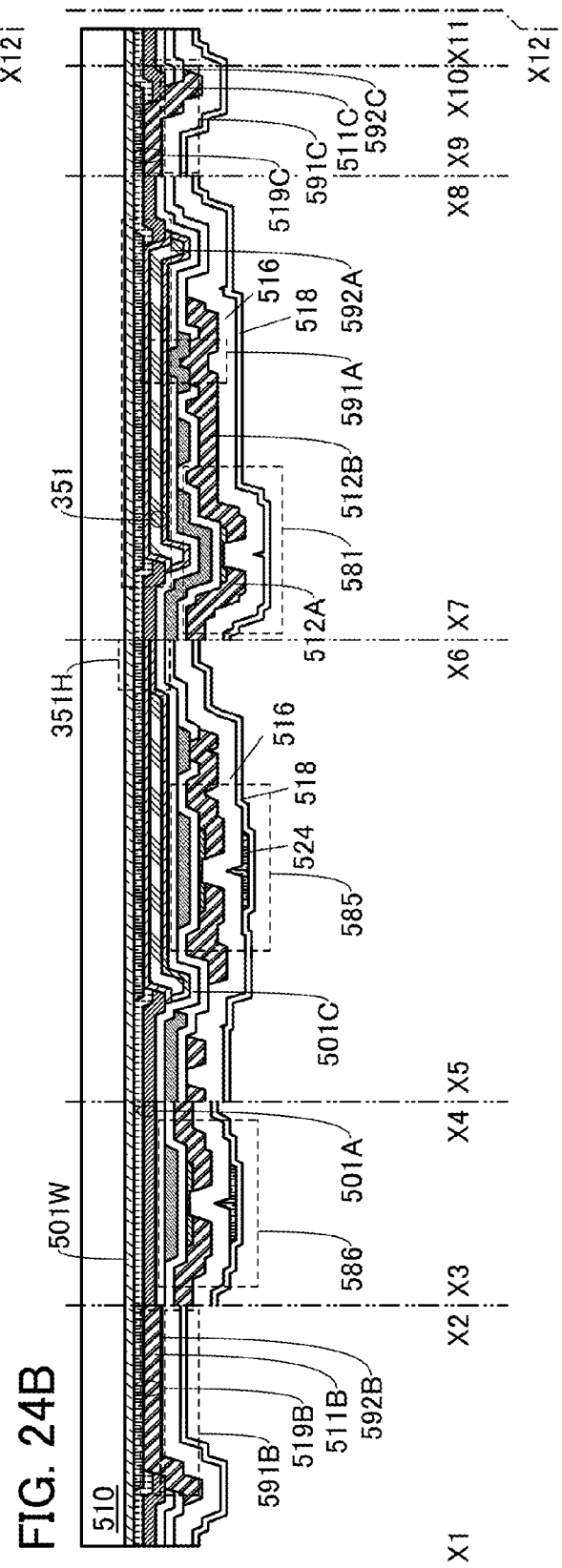
FIG. 24A
FIG. 24B

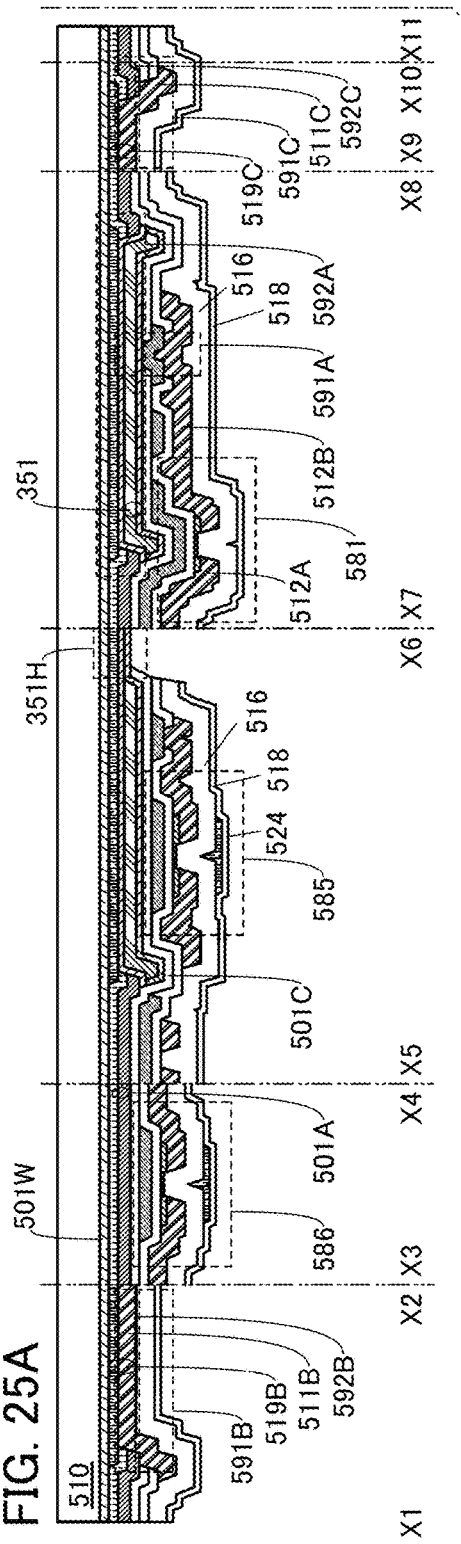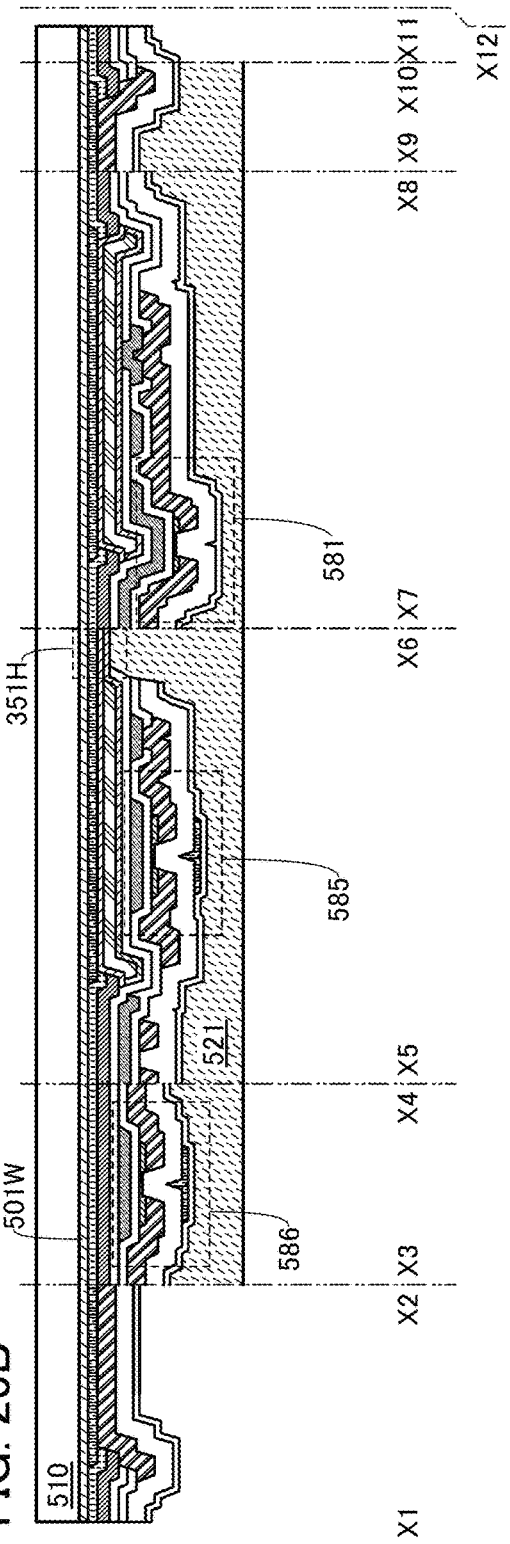
FIG. 25A / FIG. 25B

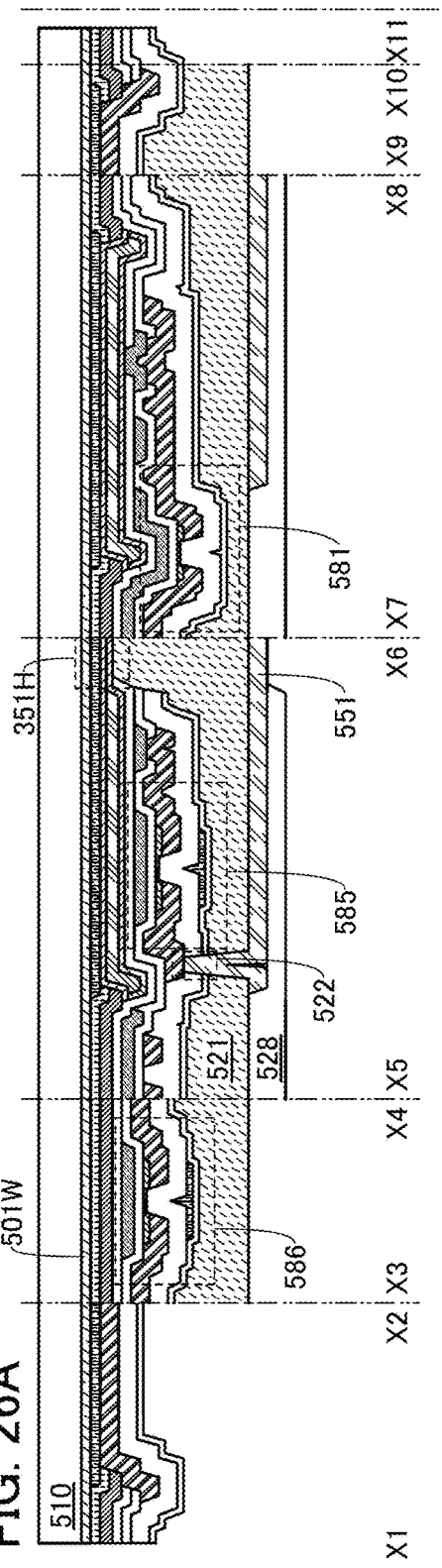
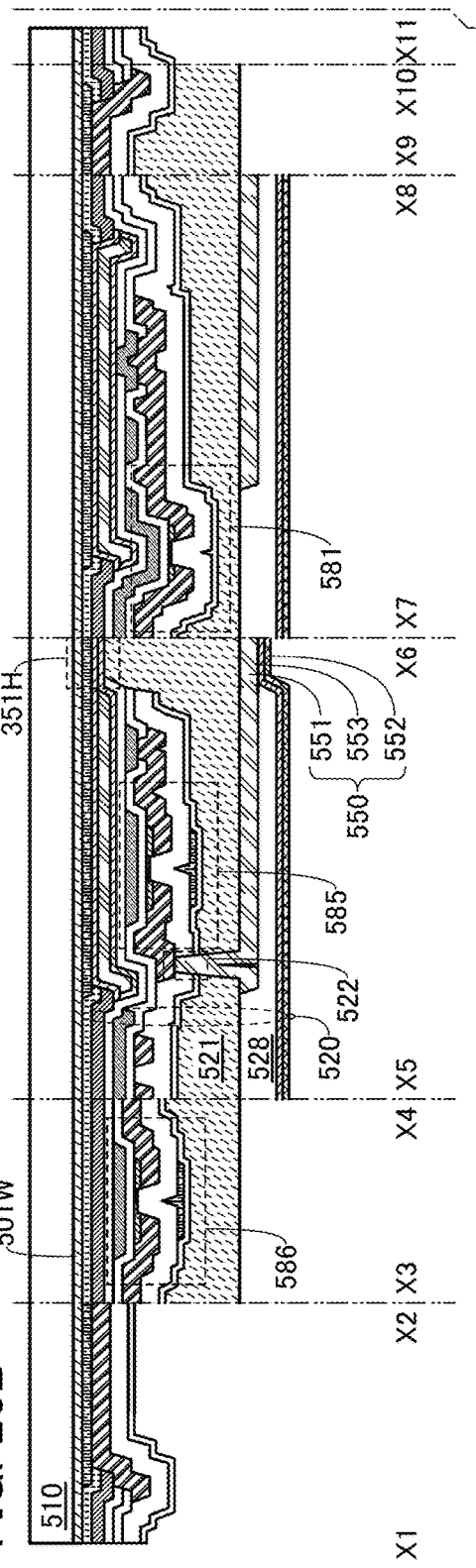

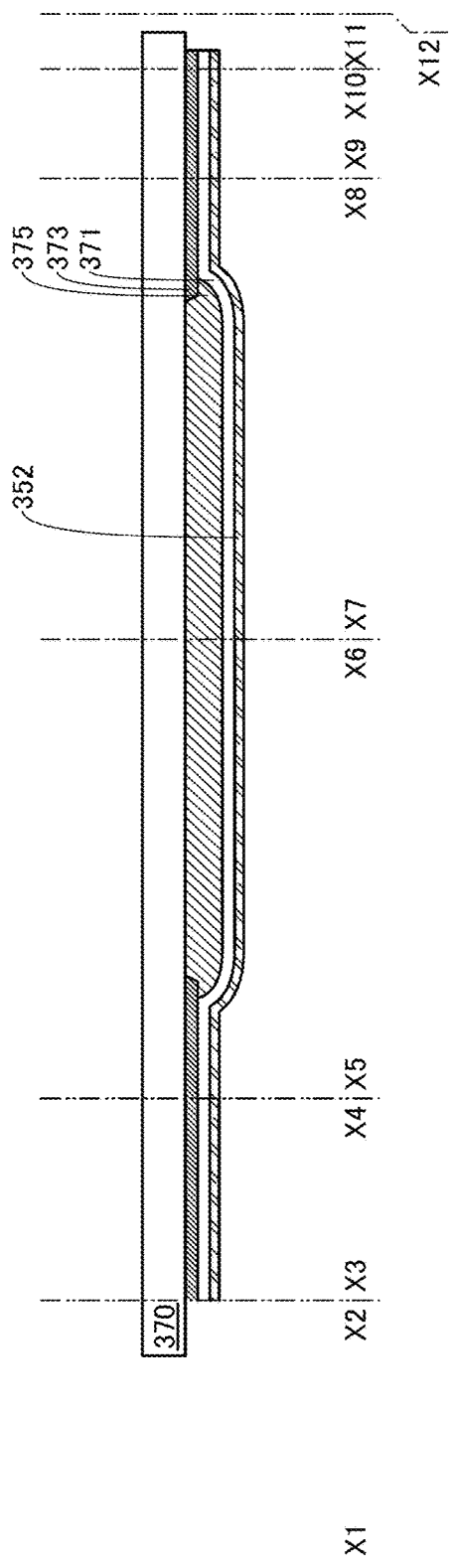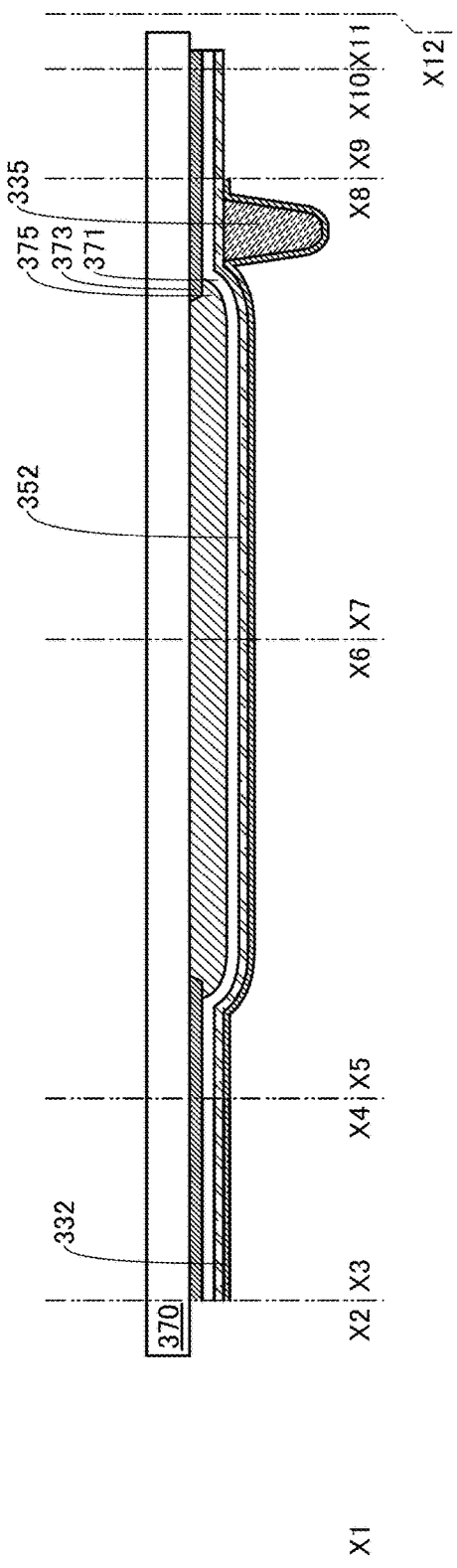

200

208

200

208

250B 208b 208c
208

250B 208b 208c
208

DISPLAY DEVICE

TECHNICAL FIELD

One embodiment of the present invention relates to a display device and a manufacturing method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

BACKGROUND ART

There is a liquid crystal display device in which a surface-emitting light source is provided as a backlight and combined with a transmissive liquid crystal display element in order to reduce power consumption and suppress a reduction in display quality (e.g., Patent Document 1).

A display device including a self-luminous light-emitting element has been developed. The self-luminous display device has advantages of high visibility, no need of backlight which is necessary for a transmissive liquid crystal display device, and the like.

REFERENCE

Patent Document

[Patent Document 1] Japanese Published Patent Application No. 2011-248351

DISCLOSURE OF INVENTION

A display device including a light-emitting element or a transmissive liquid crystal display element has a problem that the visibility is reduced when images are displayed in a bright environment, such as under strong outside light. In addition, when the display device outputs high luminance for high visibility in the bright environment, it consumes more power. In contrast, a display device including a reflective liquid crystal display element has problems of dark display, low color reproducibility, and low visibility when images are displayed in a dark environment. Accordingly, a convenient display device with high visibility and low power consumption both in bright and dark environments is required.

In view of the above, an object of one embodiment of the present invention is to provide a display device with high visibility that is highly convenient. Another object of one embodiment of the present invention is to provide a display device with low power consumption. Another object of one embodiment of the present invention is to provide a display device with high color reproducibility. Another object of one embodiment of the present invention is to provide a display device with high reliability. Another object of one embodiment of the present invention is to provide a novel display device. Another object of one embodiment of the present invention is to provide a method for manufacturing a novel display device.

Note that the description of the objects does not disturb the existence of other objects. In one embodiment of the present invention, there is no need to achieve all the objects. Other objects are apparent from and can be derived from the description of the specification and the like.

One embodiment of the present invention is a display device in which a first display element including a liquid crystal layer and a second display element including a light-emitting layer can be driven using a pixel circuit which can be formed in one process. In addition, in the display device, the number of insulating films in a region where light is emitted from the second display element is smaller than the number of insulating films including a region overlapping with a semiconductor film of a transistor included in the pixel circuit.

Thus, one embodiment of the present invention is a display device including a first display element, a second display element, a pixel circuit, and a first insulating film. The first display element includes a first electrode and a liquid crystal layer. The second display element includes a second electrode and a light-emitting layer. The first electrode is electrically connected to the pixel circuit. The second electrode is electrically connected to the pixel circuit. The first electrode includes a reflective film. The reflective film has an opening. The pixel circuit includes a transistor. The transistor includes a semiconductor film and a second insulating film. The opening includes a region overlapping with the first insulating film. The semiconductor film includes a region overlapping with the first insulating film and the second insulating film.

Another embodiment of the present invention is a display device including a first display element, a second display element, a pixel circuit, and a first insulating film. The first display element includes a first electrode and a liquid crystal layer. The second display element includes a second electrode and a light-emitting layer. The first electrode is electrically connected to the pixel circuit. The second electrode is electrically connected to the pixel circuit. The first electrode includes a reflective film. The reflective film has an opening. The pixel circuit includes a transistor. The transistor includes a semiconductor film, a second insulating film, and a third insulating film. The opening includes a region overlapping with the first insulating film and the second insulating film. The semiconductor film includes a region overlapping with the first insulating film, the second insulating film, and the third insulating film.

In the above structure, a refractive index of the second insulating film is preferably different from a refractive index of the third insulating film. In addition, the refractive index of the second insulating film is preferably higher than the refractive index of the third insulating film. Alternatively, the refractive index of the third insulating film is preferably higher than the refractive index of the second insulating film.

In addition, in each of the above structures, the number of insulating films overlapping with the opening is preferably smaller than the number of insulating films overlapping with the semiconductor film.

In addition, in each of the above structures, the semiconductor film preferably includes an oxide semiconductor.

Another embodiment of the present invention is a display device including a first display element, a second display element, and a pixel circuit. The first display element includes a first electrode and a liquid crystal layer. The second display element includes a second electrode and a light-emitting layer. The first electrode is electrically connected to the pixel circuit. The second electrode is electrically connected to the pixel circuit. The second display element includes a first light-emitting element and a second light-emitting element. The first light-emitting element has a function of emitting light of a color different from a color of light emitted from the second light-emitting element. The first light-emitting element includes a region overlapping with a first optical element. The second light-emitting element includes a region overlapping with a second optical element and a third optical element.

In each of the above structures, the light emitted from the first light-emitting element preferably has an emission spectrum peak on the shorter wavelength side than the light emitted from the second light-emitting element.

In addition, in each of the above structures, the second display element preferably has a function of emitting light toward the opening and preferably has a function of performing display in a direction in which the first display element performs display.

Another embodiment of the present invention is an electronic device including the display device and at least one of a housing and a touch sensor. The category of one embodiment of the present invention includes not only a display device but also an electronic device including a display device. Therefore, a display device in this specification refers to an image display device. One embodiment of the present invention includes the following modules in its category: a module in which a connector such as a flexible printed circuit (FPC) or a tape carrier package (TCP) is attached to a display device; a module having a TCP provided with a printed wiring board at the end thereof; and a module in which an integrated circuit (IC) is directly mounted on a display device by a chip on glass (COG) method.

One embodiment of the present invention provides a display device with high visibility that is highly convenient, a display device with low power consumption, a display device with high color reproducibility, a display device with high reliability, a novel display device, or a method for manufacturing a novel display device.

Note that the description of the effect does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 1A, 1B1, and 1B2 illustrate a structure of a display device of one embodiment of the present invention;

FIGS. 2A to 2C are cross-sectional views illustrating a structure of a display device of one embodiment of the present invention;

FIGS. 4A, 4B1, and 4B2 illustrate structures of a display device of one embodiment of the present invention;

FIGS. 9A and 9B are cross-sectional views each illustrating a structure of a display device of one embodiment of the present invention;

FIGS. 12A and 12B are cross-sectional views illustrating a structure of a display device of one embodiment of the present invention;

FIGS. 15A and 15B are cross-sectional views each illustrating a structure of a display device of one embodiment of the present invention;

FIG. 17 is a cross-sectional view illustrating a structure of a display device of one embodiment of the present invention;

FIGS. 22A and 22B are cross-sectional views illustrating a method for manufacturing a display device of one embodiment of the present invention;

FIGS. 23A and 23B are cross-sectional views illustrating a method for manufacturing a display device of one embodiment of the present invention;

FIGS. 24A and 24B are cross-sectional views illustrating a method for manufacturing a display device of one embodiment of the present invention;

FIGS. 25A and 25B are cross-sectional views illustrating a method for manufacturing a display device of one embodiment of the present invention;

FIGS. 26A and 26B are cross-sectional views illustrating a method for manufacturing a display device of one embodiment of the present invention;

FIGS. 29A and 29B are cross-sectional views illustrating a method for manufacturing a display device of one embodiment of the present invention;

BEST MODE FOR CARRYING OUT THE INVENTION

Figure 3:
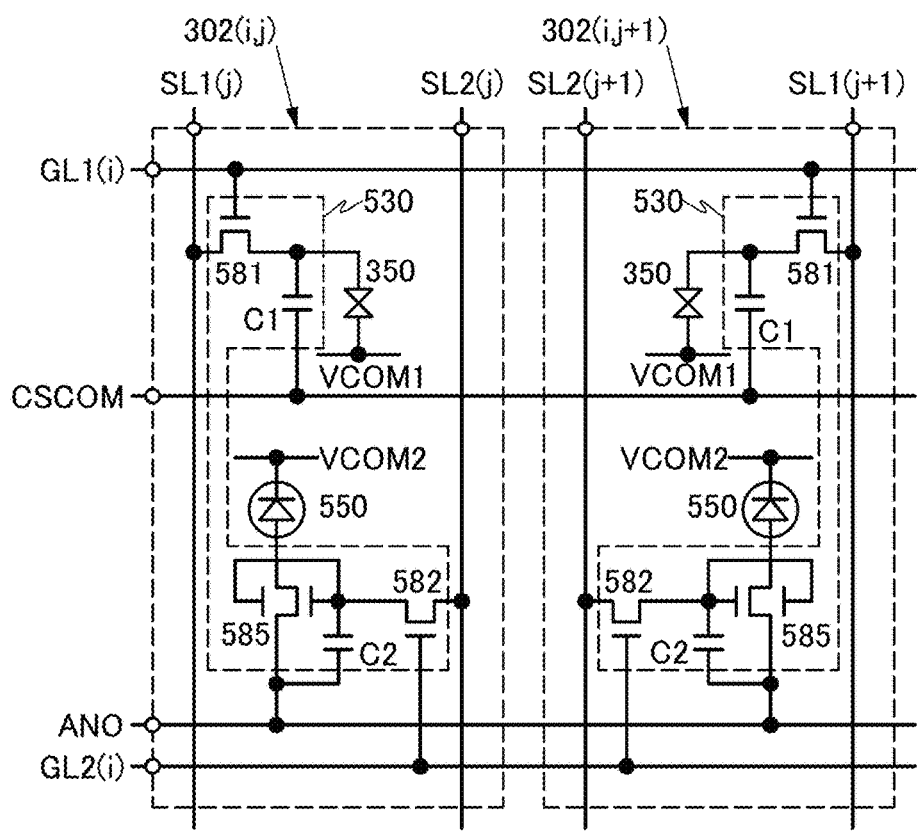
FIG. 3 illustrates a circuit of pixels of a display device of one embodiment of the present invention.

Embodiments of the present invention will be described below with reference to the drawings. Note that the present invention is not limited to the following description, and the mode and details can be variously changed unless departing from the scope and spirit of the present invention. Accordingly, the present invention should not be interpreted as being limited to the content of the embodiments below.

Note that the position, the size, the range, or the like of each structure illustrated in the drawings and the like are not accurately represented in some cases for easy understanding. Therefore, the disclosed invention is not necessarily limited to the position, size, range, or the like as disclosed in the drawings and the like.

In each of the diagrams, independent blocks show elements, which are classified according to their functions. However, it may be practically difficult to completely separate the elements according to their functions; in some cases, one element can involve a plurality of functions.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In the description of modes of the present invention in this specification and the like with reference to the drawings, the same components in different diagrams are commonly denoted by the same reference numeral in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

Furthermore, in this specification and the like, one of a first electrode and a second electrode of a transistor refers to a source electrode and the other refers to a drain electrode.

The terms "source terminal" and "drain terminal" included in a transistor can interchange with each other depending on the polarity of the transistor or the levels of potentials applied to the respective terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

In this specification, a state in which transistors are connected in series means, for example, a state in which only one of a source and a drain of a first transistor is connected to one of a source and a drain of a second transistor. In addition, a state in which transistors are connected to each other in parallel means a state in which one of a source and a drain of a first transistor is connected to one of a source and a drain of a second transistor and the other of the source and the drain of the first transistor is connected to the other of the source and the drain of the second transistor.

In this specification, even when a circuit diagram illustrates independent components that are connected to each other, there is a case where one conductive film has functions of a plurality of components, such as the case where part of a wiring functions as an electrode. The term "connection" in this specification and the like also means such a case where one conductive film has functions of a plurality of components.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

In this specification and the like, a wavelength range of blue refers to a wavelength range of greater than or equal to 400 nm and less than 490 nm, and blue light emission refers to light emission with at least one emission spectrum peak in the wavelength range. A wavelength range of green refers to a wavelength range of greater than or equal to 490 nm and less than 550 nm, and green light emission refers to light emission with at least one emission spectrum peak in the wavelength range. A wavelength range of yellow refers to a wavelength range of greater than or equal to 550 nm and less than 590 nm, and yellow light has at least one peak in that range in an emission spectrum. A wavelength range of red refers to a wavelength range of greater than or equal to 590 nm and less than or equal to 740 nm, and red light has at least one peak in that range in an emission spectrum.

Note that in this specification and the like, "room temperature" refers to a temperature in the range of higher than or equal to 0° C. and lower than or equal to 40° C.

EMBODIMENT 1

In this embodiment, a display device of one embodiment of the present invention will be described with reference to FIGS. 1 to 30.

FIG. 1A is a bottom view illustrating the structure of a display device 300 of one embodiment of the present invention. FIG. 1B1 is a bottom view illustrating part of FIG. 1A. FIG. 1B2 is a bottom view in which some components in FIG. 1B1 are not illustrated.

FIGS. 2A, 2B, and 2C are cross-sectional views illustrating the structure of the display device 300 of one embodiment of the present invention. FIG. 2A is a cross-sectional view taken along dashed-dotted lines X1-X2, X3-X4, X5-X6, X7-X8, X9-X10, and X11-X12 in FIG. 1A. FIG. 2B is a cross-sectional view illustrating part of the display device 300. FIG. 2C is a cross-sectional view illustrating other part of the display device 300.

FIG. 3 illustrates a circuit of a pixel 302 included in the display device 300 of one embodiment of the present invention.

<Structure Example 1 of Display Device>

As illustrated in FIG. 1A, the display device 300 of one embodiment of the present invention includes the pixel 302.

The pixel 302 includes a first display element 350, a second display element 550, and a pixel circuit 530 (see FIG. 3).

The first display element 350 and the second display element 550 perform display in the same direction. For example, a dashed line arrow in FIG. 2A denotes the direction in which the first display element 350 performs display by adjusting the intensity of external light reflection. A solid line arrow in FIG. 2A denotes the direction in which the second display element 550 performs display.

The first display element 350 has a function of reflecting incident light and a function of adjusting the intensity of the reflected light. The first display element 350 thus includes a reflective film which has a function of reflecting incident light and a layer containing a material which has a function of adjusting the intensity of the reflected light.

A reflective liquid crystal element is preferably used as the first display element 350. Specifically, the first display element 350 preferably includes a liquid crystal layer 353, an electrode 351, and an electrode 352. The electrode 351 preferably includes a reflective film which has a function of reflecting light. In addition, the liquid crystal layer 353 contains a liquid crystal material. Note that the electrode 352 is positioned so that an electric field for controlling the alignment of the liquid crystal material is generated between the electrode 352 and the electrode 351. In addition, the liquid crystal layer 353 preferably has a function of adjusting the intensity of light which enters the first display element 350 and is reflected by the reflective film.

In addition, the display device 300 includes an alignment film 331 and an alignment film 332. The liquid crystal layer 353 is sandwiched between the alignment films 331 and 332.

The pixel 302 includes a first optical element, and the first optical element includes a coloring layer 375. The pixel 302 also includes a light-blocking film 373, an insulating film 371, a functional film 370D, and a functional film 370P.

The coloring layer 375 has a region overlapping with the first display element 350. The light-blocking film 373 has an opening in a region overlapping with the first display element 350. When the coloring layer 375 is provided, light which enters the first display element 350 and is reflected by the reflective film can be extracted to the outside with a predetermined color.

The insulating film 371 is provided between the coloring layer 375 and the liquid crystal layer 353 or between the light-blocking film 373 and the liquid crystal layer 353. Owing to this, unevenness due to the thickness of the coloring layer 375 may be eliminated. Such a structure can suppress impurity diffusion from the light-blocking film 373, the coloring layer 375, or the like to the liquid crystal layer 353.

The functional films 370D and 370P each include a region overlapping with the first display element 350. A substrate 370 is interposed between the functional film 370D and the first display element 350. As the functional films 370D and 370P, a film having a function of displaying clearer images of the first display element 350 and the second display element 550, a film having a function of protecting the surface of the display device 300, or the like can be used. Note that either the functional film 370D or 370P may be used.

The display device 300 includes the substrate 570, a substrate 370, and a functional layer 520.

The substrate 370 has a region overlapping with the substrate 570. The functional layer 520 is provided between the substrates 570 and 370.

The functional layer 520 includes the pixel circuit 530, the second display element 550, an insulating film 521, and an insulating film 528.

The insulating film 521 is provided between the pixel circuit 530 and the second display element 550. The insulating film 521 is preferably formed so that steps due to components overlapping with the insulating film 521 can be covered to form a flat surface.

A light-emitting element is preferably used as the second display element 550. Specifically, an organic electroluminescence element (organic EL element), an inorganic electroluminescence element (inorganic EL element), a light-emitting diode (LED), or the like can be used.

The second display element 550 includes an electrode 551, an electrode 552, and a light-emitting layer 553. The electrode 552 has a region overlapping with the electrode 551. The light-emitting layer 553 is provided between the electrodes 551 and 552. The electrode 551 is electrically connected to the pixel circuit 530 in a connection portion 522.

In addition, the insulating film 528 has a region sandwiched between the electrodes 551 and 552. The insulating film 528 has an insulating property and thus can avoid a short circuit between the electrodes 551 and 552. In order to avoid a short circuit, a side end portion of the electrode 551 preferably has a region in contact with the insulating film 528. In addition, the insulating film 528 has an opening in a region overlapping with the second display element 550. In the opening, the second display element 550 emits light.

The light-emitting layer 553 preferably contains an organic material or an inorganic material as a light-emitting material. Specifically, a fluorescent organic light-emitting material or a phosphorescent organic light-emitting material can be used. In addition, an inorganic light-emitting material such as quantum dots can be used.

The reflective film of the first display element 350 has an opening 351H. The second display element 550 has a function of emitting light toward the opening 351H. In other words, the first display element 350 has a function of performing display in a region overlapping with the electrode 351, and the second display element 550 has a function of performing display in a region overlapping with the opening 351H. In addition, the second display element 550 has a function of performing display in a region surrounded by the display region of the first display element 350 (see FIGS. 1B1 and 1B2).

It is thus preferable that the opening which is provided in the insulating film 528 have a region overlapping with the opening 351H and have an area almost equal to the area of the opening 351H. This can achieve efficient extraction of light from the second display element 550 emitting in the opening which is provided in the insulating film 528 through the opening 351H. Specifically, the area of the opening 351H when the area of the opening which is provided in the insulating film 528 is 1 is preferably greater than or equal to 0.5 and less than or equal to 2, further preferably greater than or equal to 0.7 and less than or equal to 1.4.

Note that it is preferable in order to efficiently reflect light entering the first display element 350 that the area of the opening 351H be smaller than the area of the opening provided in the insulating film 528. Alternatively, it is preferable in order to extract light emitted from the second display element 550 to the outside as much as possible that the area of the opening 351H be larger than that of the opening provided in the insulating film 528.

With the above-described structure in which a reflective liquid crystal element and a light-emitting element are used as the first display element 350 and the second display element 550, respectively, the display device can perform display using the reflective liquid crystal element (the first display element 350) in a bright environment, whereas using light from the light-emitting element (the second display element 550) in a dark environment. Thus, a convenient display device with high visibility and low power consumption both in bright and dark environments can be manufactured. In addition, the display device can perform display in a dim environment using both the reflective liquid crystal element (utilizing external light) and light from the light-emitting element. Thus, a convenient display device with high visibility and low power consumption can be manufactured.

Figure 6:
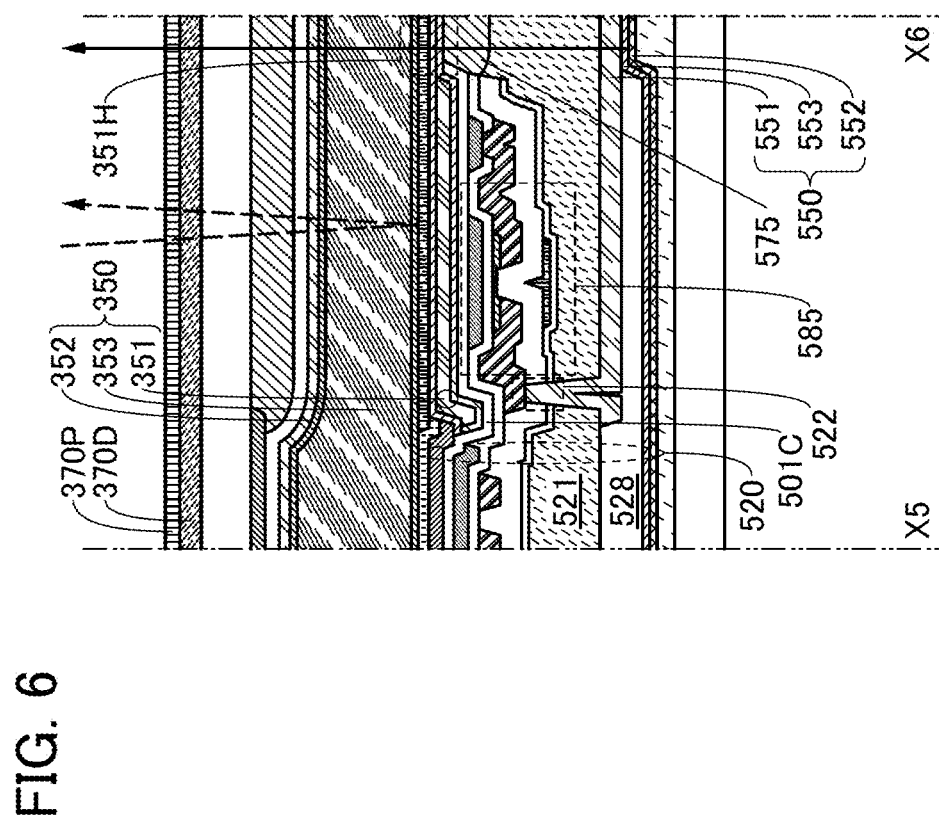
FIG. 6 is a cross-sectional view illustrating a structure of a display device of one embodiment of the present invention.

Note that as illustrated in FIG. 6, the pixel 302 may have a structure where a second optical element is provided in a region sandwiched between the first display element 350 and the second display element 550 and overlapping with the opening 351H and where the second optical element includes a coloring layer 575. The coloring layer 575 has a region overlapping with the second display element 550, and light emitted from the second display element 550 is emitted to the outside through the coloring layer 575 and the coloring layer 375. Therefore, with the coloring layer 575, the color purity of light emitted from the second display element 550 can be improved.

In addition, the functional layer 520 includes insulating films such as an insulating film 501C, an insulating film 506, an insulating film 516, and an insulating film 518 in addition to the insulating films 521 and 528. Therefore, light emission of the second display element 550 from the opening 351H is made through these insulating films. It is preferable that the number of insulating films in a region overlapping with the opening 351H be small to increase the intensity of light emitted from the second display element 550. Alternatively, when there is a plurality of insulating films in the region overlapping with the opening 351H, a difference in refractive index of two insulating films which are in contact with each other is preferably small and the refractive indices are further preferably the same.

The pixel 302 includes the insulating film 501C and an intermediate film 354. The pixel circuit 530 includes the switch 581, and the switch 581 includes a transistor. The pixel circuit 530 includes the transistor 585. These transistors preferably include a semiconductor film 508. The semiconductor film 508 preferably includes an oxide semiconductor.

The transistor that can be used as the switch 581, the transistor 585, and a transistor 586 each include a conductive film 504 and the insulating film 506 each having a region overlapping with the semiconductor film 508 in addition to the semiconductor film 508. The transistors each include conductive films 512A and 512B and the insulating films 516 and 518 (see FIGS. 2B and 2C).

The conductive film 504 and the insulating film 506 function as a gate electrode and a gate insulating film of each of the transistors, respectively. The conductive film 512A functions as one of a source electrode and a drain electrode, and the conductive film 512B functions as the other.

The transistors 585 and 586 preferably each include a conductive film 524. The semiconductor film 508 is provided between the conductive film 504 and the conductive film 524 (see FIG. 2B). The conductive film 524 functions as a gate electrode of each of the transistors.

The insulating films 516 and 518 each have a region functioning as a protective insulating film of the transistor that can be used as the switch 581. The insulating film 516 has a region functioning as a gate insulating film of each of the transistors 585 and 586, and the insulating film 518 has a region functioning as a protective insulating film of each of the transistors 585 and 586.

That is, the semiconductor film 508 has a region overlapping with the insulating film 506 and a region overlapping with the insulating films 516 and 518. Moreover, the semiconductor film 508 has regions overlapping with the insulating films 501C and 521.

As described above, the semiconductor film 508 preferably has regions overlapping with the conductive film functioning as a gate electrode and the insulating film functioning as a protective insulating film, and the number of insulating films having a region overlapping with the opening 351H is preferably small. Therefore, one embodiment of the present invention is a display device in which the number of insulating films having a region overlapping with the opening 351H is smaller than the number of insulating films having a region overlapping with the semiconductor film 508.

For example, as illustrated in FIG. 2A, as a structure of the display device of one embodiment of the present invention, a structure in which the insulating films 501C, 506, 516, and 518 each have an opening in a region overlapping with the opening 351H is preferably employed.

Figure 7A:
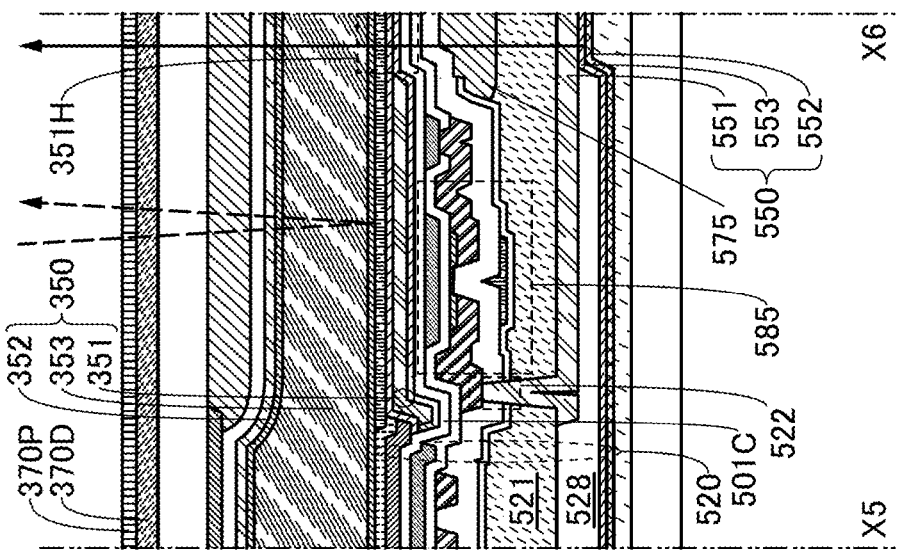
FIGS. 7A and 7B are cross-sectional views each illustrating a structure of a display device of one embodiment of the present invention.
Figure 8B:
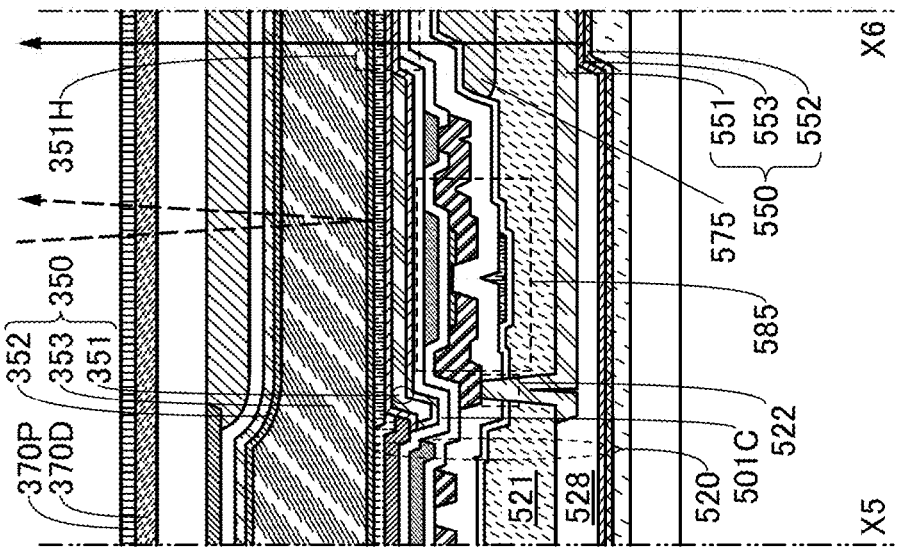
FIGS. 8A and 8B are cross-sectional views each illustrating a structure of a display device of one embodiment of the present invention.
Figure 8A:
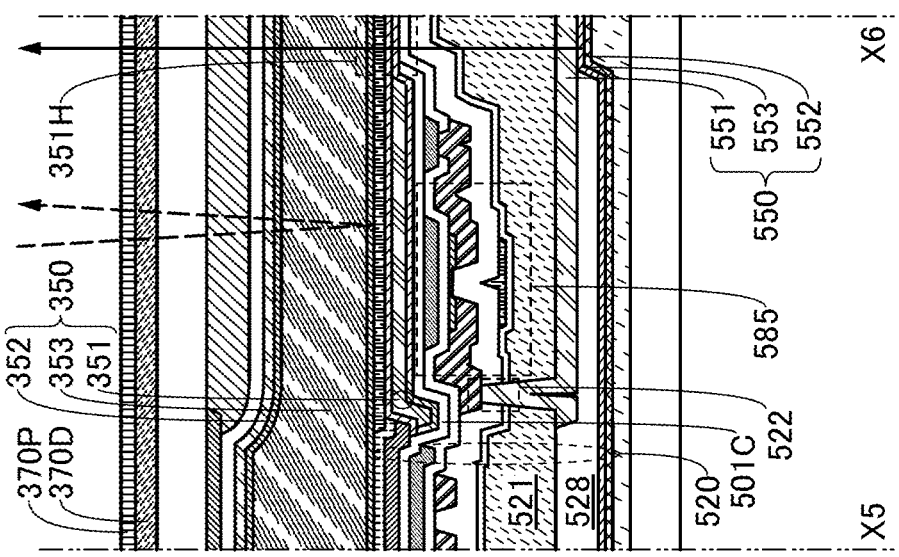
Figure 10A:
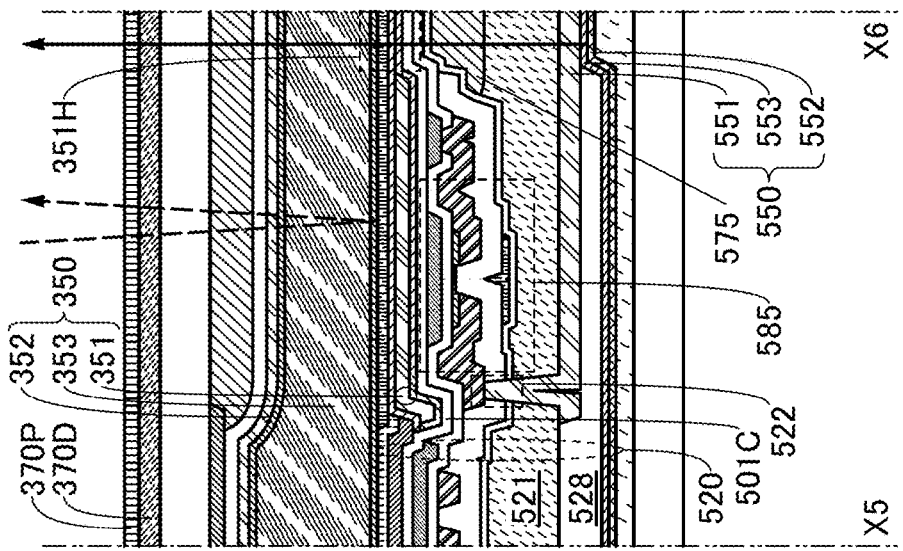
FIGS. 10A and 10B are cross-sectional views each illustrating a structure of a display device of one embodiment of the present invention.

Note that the structure of the display device of one embodiment of the present invention is not limited to the structure illustrated as an example in FIG. 2A. For example, as illustrated in FIG. 7A, a structure in which the insulating film 518 has an opening in a region overlapping with the opening 351H is preferably used. Alternatively, for example, as illustrated in FIG. 8A, a structure in which the insulating film 501C has an opening in a region overlapping with the opening 351H is preferably used. Alternatively, for example, as illustrated in FIG. 9A, a structure in which the insulating films 501C and 518 each have an opening in a region overlapping with the opening 351H is preferably used. Alternatively, for example, as illustrated in FIG. 10A, a structure in which the insulating film 516 has an opening in a region overlapping with the opening 351H is preferably used.

In each of the structures illustrated in FIG. 7B, FIG. 8B, FIG. 9B, and FIG. 10B as examples, the second optical element may be provided in a region sandwiched between the first display element 350 and the second display element 550 and overlapping with the opening 351H, and the second optical element may include the coloring layer 575. With such a structure, light emitted from the second display element 550 is extracted to the outside through the coloring layers 575 and 375; therefore, the color purity of the light emitted from the second display element 550 can be improved and the intensity of light emitted from the second display element 550 can be increased.

<Transmittance of Opening>

Here, variations in transmittance depending on structures of insulating films in a region overlapping with the opening 351H are obtained by optical calculation. Examples of the variations are shown below.

For the optical calculation, software, Essential Macleod (manufactured by Thin Film Center Inc.), was used. By the optical calculation, the transmittances of the layers between the insulating film 521 and the liquid crystal layer 353 when light was emitted from the insulating film 521 to the liquid crystal layer 353 were estimated. The conditions of the layers between the insulating film 521 and the liquid crystal layer 353, which were subjected to the optical calculation, are shown in Table 1 and Table 2.

TABLE 1

| Layer | Reference numeral | Material | Film thickness (nm) | | | | | | | |
|---|---|---|---|---|---|---|---|---|---|---|
| | | | Condition 1 | Condition 2 | Condition 3 | Condition 4 | Condition 5 | Condition 6 | Condition 7 | Condition 8 |
| Liquid crystal layer | 353 | Liquid crystal material | | | | 2200 | | | | |
| Alignment film | 331 | Polyimide | | | | 70 | | | | |
| Electrode | 351 | ITSO | | | | 120 | | | | |

TABLE 1-continued

| Layer | Reference numeral | Material | Film thickness (nm) | | | | | | | |
|---|---|---|---|---|---|---|---|---|---|---|
| | | | Condition 1 | Condition 2 | Condition 3 | Condition 4 | Condition 5 | Condition 6 | Condition 7 | Condition 8 |
| Insulating film | 501C | SiON | 200 | 200 | — | — | — | — | — | 200 |
| | | SiN | — | — | — | — | — | 200 | 350 | — |
| Insulating film | 506 | SiN | 50 | 50 | 50 | 50 | — | 50 | 50 | 50 |
| | | SiN | 300 | 300 | 300 | 300 | — | 300 | 300 | 250 |
| | | SiN | 50 | 50 | 50 | 50 | — | 50 | 50 | — |
| | | SiON | 50 | 50 | 50 | 50 | — | 50 | 50 | — |
| Insulating film | 516 | SiON | 30 | 30 | 30 | 30 | — | 30 | 30 | — |
| | | SiON | 400 | 400 | 400 | 400 | — | 400 | 400 | — |
| Insulating film | 518 | SiN | 100 | — | 100 | — | — | — | — | 100 |
| Insulating film | 521 | Acrylic | | | | 2500 | | | | |

TABLE 2

| Layer | Reference numeral | Material | Film thickness (nm) | | | | |
|---|---|---|---|---|---|---|---|
| | | | Condition 9 | Condition 10 | Condition 8 | Condition 11 | Condition 12 |
| Liquid crystal layer | 353 | Liquid crystal material | | | 2200 | | |
| Alignment film | 331 | Polyimide | | | 70 | | |
| Electrode | 351 | ITSO | | | 120 | | |
| Insulating film | 501C | SiON | | | 200 | | |
| | | SiN | | | — | | |
| Insulating film | 506 | SiN | | | 50 | | |
| | | SiN | 350 | 300 | 250 | 200 | 150 |
| | | SiN | | | — | | |
| | | SiON | | | — | | |
| Insulating film | 516 | SiON | | | — | | |
| | | SiON | | | — | | |
| Insulating film | 518 | SiN | | | 100 | | |
| Insulating film | 521 | Acrylic | | | 2500 | | |

In Conditions 1 to 12, the liquid crystal layer 353 contains a liquid crystal material, the alignment film 331 contains polyimide, the electrode 351 contains indium tin oxide containing silicon or silicon oxide (abbreviation: ITSO), the insulating film 501C contains silicon oxide containing nitrogen (abbreviation: SiON) or silicon nitride (abbreviation: SiN), the insulating film 506 contains SiN and SiON, the insulating film 516 contains SiON, the insulating film 518 contains SiN, and the insulating film 521 contains acrylic. The structure of Condition 1 (including the insulating films 501C, 506, 516, and 518) is preferably used for insulating films in a region overlapping with the semiconductor film 508.

Figure 5A:
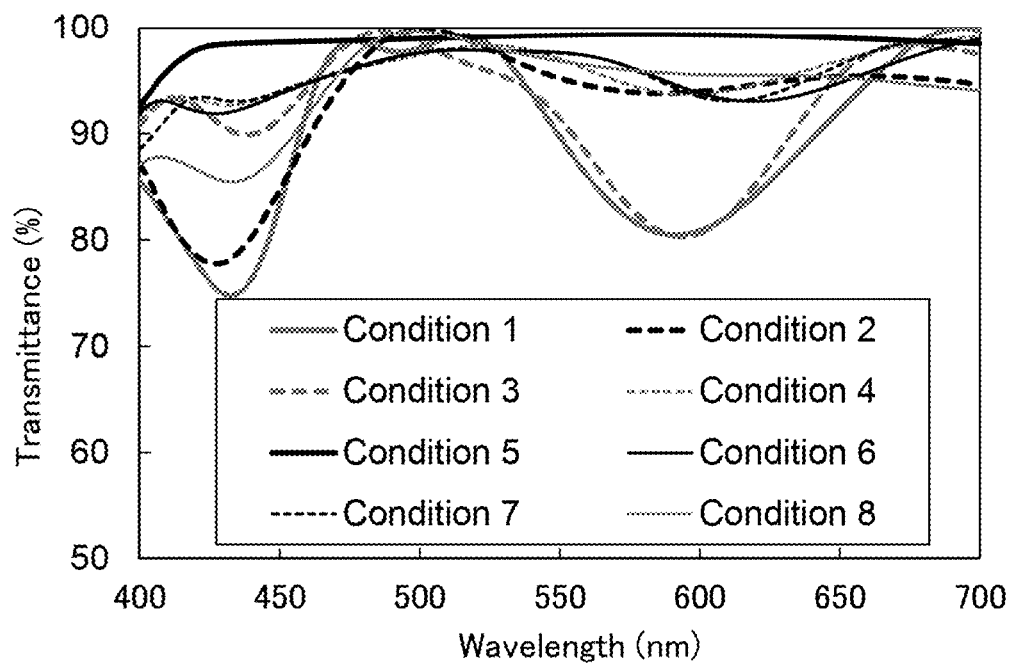
FIGS. 5A and 5B show transmittances of films in a display device of one embodiment of the present invention.
Figure 5B:
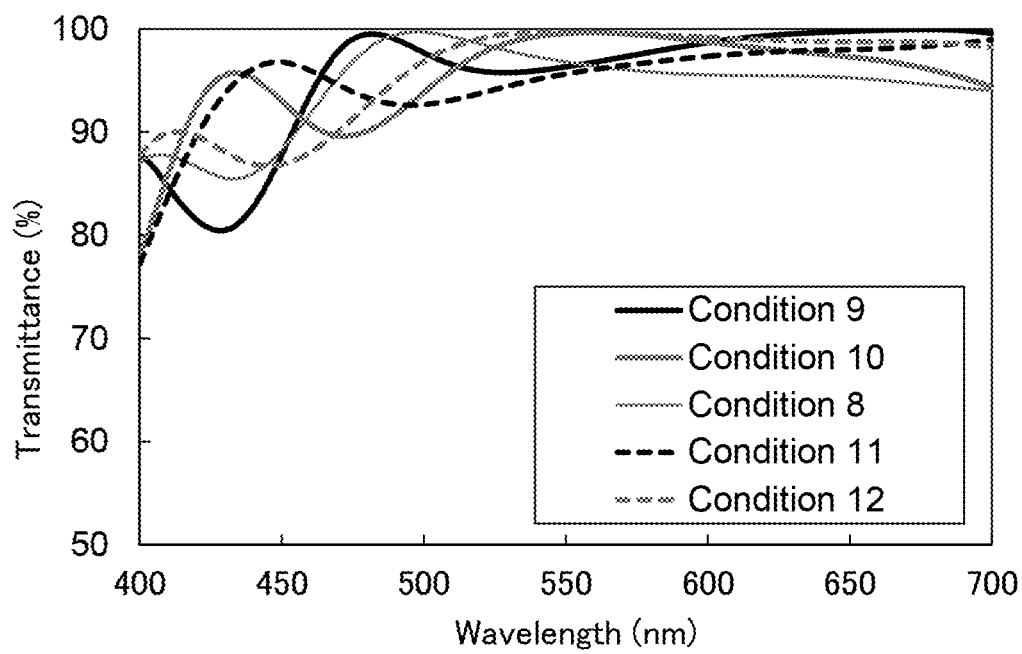

FIGS. 5A and 5B show transmittances estimated by optical calculation. In addition, Table 3 shows average transmittances under Conditions 1 to 8. Note that the average transmittance shown in Table 3 is an average transmittance in a wavelength range of greater than or equal to 450 nm and less than or equal to 650 nm.

As shown in calculation results in FIGS. 5A and 5B and Table 3, the transmittance under Condition 1 in which the number of insulating films is large is lower than those under other conditions. In particular, the transmittance is lower in a blue region where the wavelength region is greater than or equal to 400 nm and less than or equal to 450 nm and a yellow to red region where the wavelength region is greater than or equal to 550 nm and less than or equal to 650 nm. Thus, in the case where the insulating films in a region overlapping with the opening 351H have a structure of Condition 1, the intensity of light emitted from the second display element is reduced.

In contrast, under Conditions 2 to 12 in which the number of insulating films is smaller than that of Condition 1, the transmittances are higher than that under Condition 1. Thus, in the case where the insulating films in a region overlapping with the opening 351H have a structure of any of Conditions 2 to 12, the intensity of light emitted from the second display element can be increased.

With a structure where the insulating film 518 is not included, which is a structure of Condition 2 shown in FIG.

TABLE 3

| | Condition 1 | Condition 2 | Condition 3 | Condition 4 | Condition 5 | Condition 6 | Condition 7 | Condition 8 |
|---|---|---|---|---|---|---|---|---|
| Transmittance (%) | 90.3 | 95.3 | 91.1 | 95.9 | 99.1 | 95.8 | 95.9 | 96.3 |

7A, the transmittance in a yellow to red region where the wavelength region is greater than or equal to 550 nm and less than or equal to 650 nm is higher than that under Condition 1. In addition, with a structure where the insulating film 501C is not included, which is a structure of Condition 3 shown in FIG. 8A, the transmittance in a blue region where the wavelength region is greater than or equal to 400 nm and less than or equal to 450 nm is higher than that under Condition 1.

The transmittance is high with a structure where any one of insulating films is not included because the structure is not a structure including two insulating films having different refractive indices but a structure where one of the insulating films is not included. For example, when light enters a layer containing a material with a low refractive index from a layer containing a material with a high refractive index, the angle of travel of light is changed in accordance with Snell's law. For example, in the case where an organic EL element is used as the second display element 550, the refractive index of a light-emitting material used for the organic EL element is in general 1.7 to 1.9. Therefore, a refractive index of a layer (layer A) containing the light-emitting material is higher than a refractive index of general glass or the like. When light emitted from the layer containing the light-emitting material enters a layer (layer B) containing a material whose refractive index is lower than that of the light-emitting material, for example, the angle of travel of light is changed, and light that enters the layer B from the layer A at an angle wider than a critical angle θ is difficult to be extracted to the outside of the layer B. Note that θ is arcsin($n_A/n_B$), and $n_A$ and $n_B$ represent a refractive index of a material A and a refractive index of B, respectively, when light enters a layer containing the material B from a layer containing the material A. To prevent this, one of two layers different in refractive index is not included, whereby there is no decrease in light intensity based on a difference in refractive index. For example, there is no decrease in light intensity based on a difference in refractive index in such a manner that a structure including a layer containing a material with a high refractive index and a layer containing a material with a low refractive index is changed to a structure including the layer containing a material with a high refractive index and not including the layer containing a material with a low refractive index. Accordingly, transmittance of the layer through which light of a light-emitting element passes can be improved.

Specifically, a refractive index of SiON is lower than a refractive index of SiN; therefore, a decrease in light intensity based on a difference in refractive index between SiON and SiN is likely to occur in a structure having a region where SiON and SiN are in contact with each other. Therefore, as in Condition 3, when the insulating film 501C (SiON) is not included, there is no decrease in light intensity based on a difference in refractive index between the insulating film 501C and the insulating film 506 (SiN). Moreover, as in Condition 2, when the insulating film 518 (SiN) is not included, there is no decrease in light intensity based on a difference in refractive index between the insulating film 518 and the insulating film 516 (SiON).

With a structure where the insulating films 501C and 518 are not included, which is a structure of Condition 4 shown in FIG. 9A, the transmittances in a blue region where the wavelength region is greater than or equal to 400 nm and less than or equal to 450 nm and in a yellow to red region where the wavelength region is greater than or equal to 550 nm and less than or equal to 650 nm can be higher than those under Condition 1. This is because, under Condition 4 in which the insulating film 501C (SiON) and the insulating film 518 (SiN) are not included, there is no decrease in light intensity based on a difference in refractive index between the insulating film 501C and the insulating film 506 (SiN) and a difference in refractive index between the insulating film 518 and the insulating film 516 (SiON).

Under Condition 5 corresponding to a structure shown in FIG. 2A as an example, the transmittance in the entire visible light region where the wavelength region is greater than or equal to 400 nm and less than or equal to 700 nm is higher than or equal to 90%, and the average transmittance in a wavelength region of greater than or equal to 450 nm and less than or equal to 650 nm is higher than or equal to 99%, which is particularly preferably high. This is because, under Condition 5, the transmittance is less likely to be affected by a decrease in intensity of light based on the differences in refractive indices of films adjacent to each other, which are used as the insulating films 501C, 506, 516, 518, and 521. Thus, in the case where the insulating film in a region overlapping with the opening 351H has a structure of Condition 5, the intensity of light emitted from the second display element can be increased.

Alternatively, as in Conditions 6 and 7, the insulating film 501C may contain SiN.

Alternatively, as in Conditions 8 to 12 shown in FIG. 10A, the insulating film 516 is not necessarily included. In the structure illustrated in FIG. 10A, the side end portion of the insulating film 516 has a region sandwiched between the insulating films 506 and 518; therefore, entry of impurities into the semiconductor film 508 can be effectively suppressed, which is preferable to obtain a highly reliable light-emitting device.

Note that, as shown in FIG. 5B, even when the number of insulating films is the same, transmittance is changed by influence of interference of light by changing the thicknesses of the insulating films. Therefore, it is preferable to adjust the thicknesses of the insulating films so that desired transmittance can be obtained.

As described above, a plurality of insulating films are provided in a region overlapping with the semiconductor film 508, and insulating films whose number of layers is smaller than that of the insulating films including a region overlapping with the semiconductor film 508 are provided in a region overlapping with the opening 351H, whereby the transmittance in a region overlapping with the opening 351H can be high, and the intensity of light emitted from the second display element 550 through the opening 351H can be increased. Thus, a light-emitting device with low power consumption can be provided.

Other components of the display device 300 of one embodiment of the present invention are described below.

The pixel 302 includes a first conductive film and a second conductive film.

The first conductive film is electrically connected to the first display element 350. For example, the first conductive film can be used for the electrode 351 of the first display element 350 (see FIG. 2A).

The second conductive film has a region overlapping with the first conductive film. The pixel circuit 530 is electrically connected to the second conductive film. For example, the second conductive film can be used as the conductive film 512B functioning as a source electrode or a drain electrode of the transistor that can be used as the switch 581 (see FIG. 2A and FIG. 3).

The insulating film 501C has a region sandwiched between the first conductive film and the second conductive film. The insulating film 501C has an opening 591A (see FIG. 2A). The second conductive film is electrically connected to the first conductive film through the opening 591A. For example, the conductive film 512B that also serves as the second conductive film is electrically connected to the electrode 351 that also serves as the first conductive film. That is, the electrode 351 is electrically connected to the pixel circuit 530. Note that the electrode 351 has a side end portion in contact with the insulating film 501C. In this specification and the like, the first conductive film electrically connected to the second conductive film in the opening 591A can be referred to as a through electrode in some cases.

The intermediate film 354 has a region in contact with the electrode 351 that also serves as the first conductive film, and the electrode 351 is interposed between the insulating film 501C and part of the intermediate film 354.

The insulating film 501C has a region sandwiched between an insulating film 501A and a conductive film 511B. The insulating film 501C has an opening 591B in the region sandwiched between the insulating film 501A and the conductive film 511B and has an opening 591C in a region sandwiched between the insulating film 501A and a conductive film 511C.

The display device 300 includes a terminal 519B, and the terminal 519B includes the conductive film 511B and the intermediate film 354. In addition, the display device 300 includes a terminal 519C and a conductor 337, and the terminal 519C includes the conductive film 511C and the intermediate film 354 (see FIG. 2A).

The conductive film 511B is electrically connected to the pixel circuit 530. For example, when the electrode 351 or the first conductive film is used as the reflective film, a surface functioning as a contact with the terminal 519B is oriented in the same direction as a surface of the electrode 351 facing light incident on the first display element 350.

A flexible printed circuit 377 can be electrically connected to the terminal 519B using a conductive material 339. Thus, power or signals can be supplied to the pixel circuit 530 through the terminal 519B.

The conductive film 511C is electrically connected to the pixel circuit 530. For example, when the electrode 351 or the first conductive film is used as the reflective film, a surface functioning as a contact with the terminal 519C is oriented in the same direction as a surface of the electrode 351 facing light incident on the first display element 350.

The conductor 337 is interposed between the terminal 519C and the electrode 352 for electrically connecting them. For example, a conductive particle can be used as the conductor 337.

The insulating film 501A has an opening 592A, an opening 592B, and an opening 592C. The opening 592A has a region overlapping with the intermediate film 354 and the electrode 351. The opening 592B has a region overlapping with the intermediate film 354 and the conductive film 511B. The opening 592C has a region overlapping with the intermediate film 354 and the conductive film 511C. The insulating film 501A has a region sandwiched between the intermediate film 354 and the insulating film 501C in the end portion of the opening 592A.

The display device 300 includes a bonding layer 505, a sealant 305, and a structure body 335.

The bonding layer 505 is provided between the functional layer 520 and the substrate 570 and has a function of bonding the functional layer 520 and the substrate 570.

The sealant 305 is provided between the functional layer 520 and the substrate 370 and has a function of bonding the functional layer 520 and the substrate 370.

The structure body 335 has a function of making a predetermined space between the functional layer 520 and the substrate 370.

<Arrangement Examples of Pixels, Wirings, and the Like>

The display device 300 includes the driver circuit GD and the driver circuit SD (see FIG. 1A).

The driver circuit GD is electrically connected to a scan line GL1 and a scan line GL2. The driver circuit GD includes the transistor 586, for example. Specifically, a transistor including a semiconductor film which can be formed through the same process as the transistor included in the pixel circuit 530 (e.g., the transistor included in the switch 581) can be used as the transistor 586 (see FIGS. 2A and 2B).

The driver circuit SD is electrically connected to a signal line SL1 and a signal line SL2. The driver circuit SD is electrically connected to a terminal using a conductive material, for example. The terminal can be formed through the same process as the terminal 519B or the terminal 519C.

The pixel circuit 530 included in the pixel 302($i,j$) is electrically connected to the signal line SL1($j$) (see FIG. 3). Note that it is preferable that the conductive film 512A be electrically connected to the signal line SL1($j$) (see FIG. 2A and FIG. 3).

FIG. 4A is a block diagram illustrating arrangement of pixels, wirings, and the like which can be used for the display device 300 of one embodiment of the present invention. FIGS. 4B1 and 4B2 are schematic views illustrating arrangement of the openings 351H which can be used for the display device 300 of one embodiment of the present invention.

Note that the display device 300 of one embodiment of the present invention preferably includes a plurality of pixels 302; for example, the display device 300 includes a group of pixels 302($i,1$) to 302($i,n$) and another group of pixels 302($1,j$) to 302($m,j$) as illustrated in FIG. 4A. Note that i is an integer greater than or equal to 1 and less than or equal to m, j is an integer greater than or equal to 1 and less than or equal to n, and each of m and n is an integer greater than or equal to 1.

The group of pixels 302($i,1$) to 302($i,n$) each include the pixel 302 and are arranged in a row direction (indicated by an arrow R in FIG. 4A). The group of pixels 302($1,j$) to 302($m,j$) each include the pixel 302 and are arranged in a column direction (indicated by an arrow C in FIG. 4A) intersecting with the row direction.

The group of pixels 302($i,1$) to 302($i,n$) arranged in the row direction are electrically connected to the scan line GL1($i$). The group of pixels 302($1,j$) to 302($m,j$) arranged in the column direction are electrically connected to the signal line SL1($j$).

For example, the pixel adjacent to the pixel 302 in the row direction (indicated by an arrow R in FIG. 4B1) includes an opening in a position different from that of the opening 351H in the pixel 302. In addition, for example, the pixel adjacent to the pixel 302 in the column direction (indicated by an arrow C in FIG. 4B2) includes an opening in a position different from that of the opening 351H in the pixel 302.

Note that when a belt-like light-emitting layer that extends in the column direction along the signal line SL1($j$) is used as the light-emitting layer 553($j$), a belt-like light-emitting layer that extends in the column direction along the signal line SL1($j$+1) and emits light of a color different from that of light emitted from the light-emitting layer can be used for the light-emitting layer 553($j$+1). At this time, the pixel 302($i,j$) emits light of a color different from that of light emitted from the pixel 302($i,j$+1). In other words, the light-emitting element included in the pixel 302(*i,j*) has a function of emitting light of a color different from that of light emitted from the pixel 302(*i,j*+1).

At this time, the pixel 302(*i,j*) or the pixel 302(*i,j*+1) preferably has a structure where the second optical element is provided in a region sandwiched between the first display element 350 and the second display element 550 and overlapping with the opening 351H and where the second optical element includes the coloring layer 575. In addition, the pixel 302(*i,j*) and the pixel 302(*i,j*+1) preferably each have a structure where the first optical element is provided in a region sandwiched between the substrate 370 and the liquid crystal layer 353 and where the first optical element includes the coloring layer 375. That is, it is preferable that one of the pixel 302(*i,j*) and the pixel 302(*i,j*+1) include a region overlapping with one optical element in the opening 351H and the other include a region overlapping with two optical elements in the opening 351H. With such a structure, in a light-emitting element of one of the pixel 302(*i,j*) and the pixel 302(*i,j*+1), the intensity of light extracted to the outside can be improved, and in a light-emitting element of the other, light with high color purity can be extracted to the outside.

When the pixel 302(*i,j*) and the pixel 302(*i,j*+1) emit light of different colors, the first optical element included in the pixel 302(*i,j*) and the first optical element included in the pixel 302(*i,j*+1) have a function of transmitting light of different colors.

In the case where one of the pixel 302(*i,j*) and the pixel 302(*i,j*+1) includes a region overlapping with one optical element in the opening 351H and the other includes a region overlapping with two optical elements in the opening 351H, the light emitted from the light-emitting element of the pixel including the region overlapping with one optical element is preferably emitted at a wavelength shorter than and has an emission spectrum peak on the shorter wavelength side than the light emitted from the light-emitting element of the pixel including the region overlapping with two optical elements.

Figure 7B:
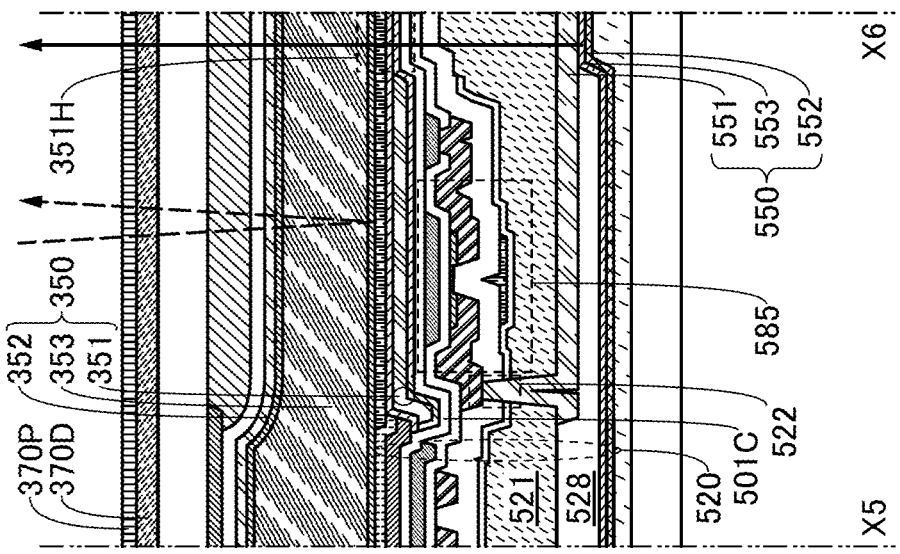
Figure 10B:
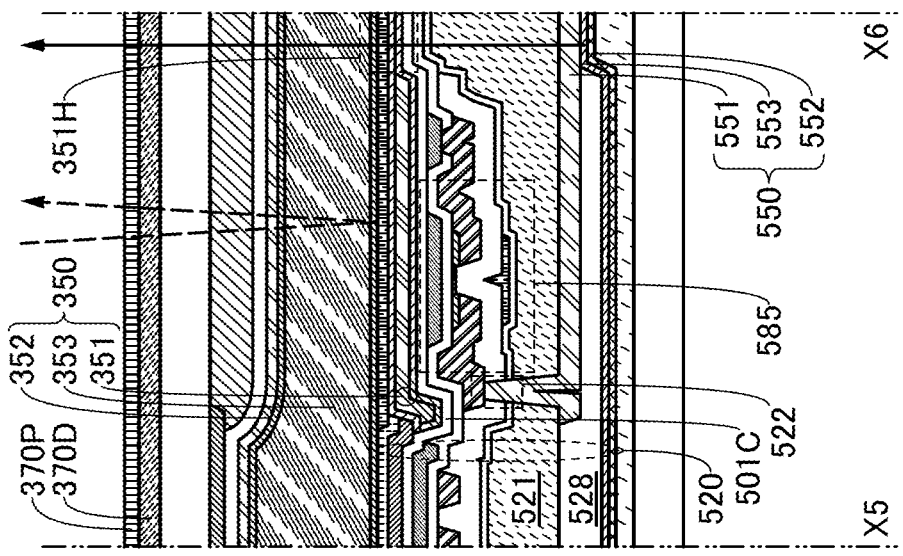

As the above structure, for example, a structure where one of the pixel 302(*i,j*) and the pixel 302(*i,j*+1) includes the pixel in FIG. 2A and the other includes the pixel in FIG. 6 is used. Alternatively, a structure where one of the pixel 302(*i,j*) and the pixel 302(*i,j*+1) includes the pixel in FIG. 7A and the other includes the pixel in FIG. 7B is used, for example. Alternatively, a structure where one of the pixel 302(*i,j*) and the pixel 302(*i,j*+1) includes the pixel in FIG. 8A and the other includes the pixel in FIG. 8B is used, for example. Alternatively, a structure where one of the pixel 302(*i,j*) and the pixel 302(*i,j*+1) includes the pixel in FIG. 9A and the other includes the pixel in FIG. 9B is used, for example. Alternatively, a structure where one of the pixel 302(*i,j*) and the pixel 302(*i,j*+1) includes the pixel in FIG. 10A and the other includes the pixel in FIG. 10B is used, for example.

Figure 11A:
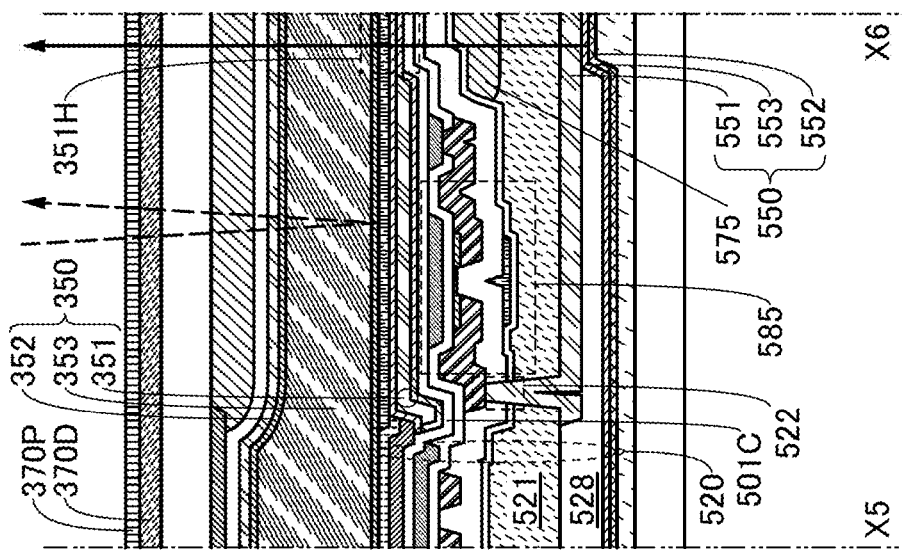
FIGS. 11A and 11B are cross-sectional views each illustrating a structure of a display device of one embodiment of the present invention.
Figure 11B:
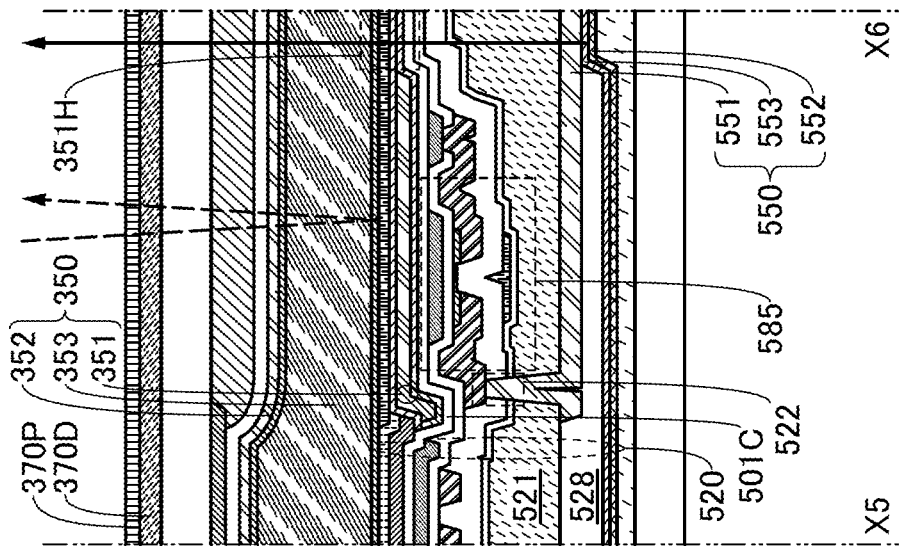

Note that the structure of the light-emitting device of one embodiment of the present invention is not limited to the above structures. For example, as illustrated in FIGS. 11A and 11B, the number of insulating films including a region overlapping with the semiconductor film 508 may be the same as the number of insulating films including a region overlapping with the opening 351H. Even in this case, one of the pixel 302(*i,j*) and the pixel 302(*i,j*+1) includes a pixel illustrated in FIG. 11A and the other includes a pixel illustrated in FIG. 11B, whereby in a light-emitting element of one of the pixel 302(*i,j*) and the pixel 302(*i,j*+1), the intensity of light extracted to the outside can be improved, and in a light-emitting element of the other, light with high color purity can be extracted to the outside.

Note that a light-emitting layer having a function of emitting white light may be used as the light-emitting layers 553(*j*) and 553(*j*+1). Specifically, a stack of a blue light-emitting layer, a green light-emitting layer, and a red light-emitting layer or a stack of a blue light-emitting layer and a yellow light-emitting layer can be used as the light-emitting layers 553(*j*) and 553(*j*+1).

As described above, the display device 300 of one embodiment of the present invention includes the first display element 350, the second display element 550, and the pixel circuit 530; the electrode 351 included in the first display element 350 is electrically connected to the pixel circuit 530; the electrode 551 included in the second display element 550 is electrically connected to the pixel circuit 530; the second display element 550 has a function of emitting light through the opening 351H; and the first display element 350 has a function of reflecting light entering the display device 300.

Thus, the first display element 350 and the second display element 550 can be driven using the pixel circuit 530 that can be formed through one process, for example.

Next, structure examples of the display elements that form the display device of one embodiment of the present invention are described.

<Components of First Display Element>

A display element having a function of controlling transmission or reflection of light can be used as the first display element 350. For example, a combined structure of a polarizing plate and a liquid crystal element or a MEMS shutter display element can be used. The use of a reflective display element can reduce power consumption of the display device. Specifically, a reflective liquid crystal display element is preferably used as the first display element 350.

Specifically, a liquid crystal element that can be driven by any of the following driving methods can be used: an in-plane switching (IPS) mode, a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

Other examples of the driving method of the first display element 350 include a polymer dispersed liquid crystal (PDLC) mode, a polymer network liquid crystal (PNLC) mode, and a guest-host mode. Note that one embodiment of the present invention is not limited to the above, and various liquid crystal elements and driving methods can be employed.

<Materials which can be used for First Display Element>

A liquid crystal material or the like which can be used for a liquid crystal element may be used for the first display element 350. For example, thermotropic liquid crystal, low-molecular liquid crystal, high-molecular liquid crystal, polymer dispersed liquid crystal, ferroelectric liquid crystal, or anti-ferroelectric liquid crystal can be used. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

Alternatively, liquid crystal exhibiting a blue phase for which an alignment film is unnecessary may be used. A blue phase is a liquid crystal phase which is generated just before a cholesteric phase changes into an isotropic phase while the temperature of cholesteric liquid crystal is increased. Since the blue phase appears only in a narrow temperature range, a liquid crystal composition in which 5 wt. % or more of a chiral material is mixed is used for the liquid crystal layer in order to widen the temperature range. The liquid crystal composition that includes the liquid crystal exhibiting a blue phase and a chiral material has a short response time of 1 msec or less, and has optical isotropy, which makes the alignment process unnecessary and the viewing angle dependence small. In addition, since an alignment film does not need to be provided, rubbing treatment is unnecessary. Therefore, electrostatic discharge damage caused by the rubbing treatment can be prevented and thus defects and damage of a liquid crystal display device in the manufacturing process can be reduced. Accordingly, productivity of the liquid crystal display device can be increased.

Furthermore, it is possible to use a method called domain multiplication or multi-domain design in which a pixel is divided into some regions (subpixels) and molecules are aligned in different directions in their respective regions.

<Components of Second Display Element>

As the second display element 550, a light-emitting element is preferably used.

A light-emitting element that is used as the second display element 550 includes a pair of electrodes (the electrodes 551 and 552) and the light-emitting layer 553 provided between the pair of electrodes. The light-emitting element used as the second display element 550 preferably includes a hole-injection layer, a hole-transport layer, an electron-transport layer, and an electron-injection layer in addition to the light-emitting layer 553.

The structure of the light-emitting element used as the second display element 550 is not limited thereto, and a structure including at least one layer selected from the hole-injection layer, the hole-transport layer, the electron-transport layer, and the electron-injection layer may be employed. Alternatively, the light-emitting element used as the second display element 550 may include a layer which is capable of lowering a hole- or electron-injection barrier, improving a hole- or electron-transport property, inhibiting a hole- or electron-transport property, or suppressing a quenching phenomenon by an electrode, for example. Note that the above layers may each be a single layer or stacked layers.

In the light-emitting element used as the second display element 550, voltage application between the pair of electrodes (the electrodes 551 and 552) allows electrons and holes to be injected from the cathode and the anode, respectively, into the light-emitting element and thus current flows. By recombination of the injected electrons and holes, a light-emitting material (a luminescent material) of the light-emitting layer 553 is brought into an excited state to provide light emission.

The light-emitting layer 553 contains at least the light-emitting material, preferably an organic light-emitting material or an inorganic light-emitting material. The organic light-emitting material preferably has a function of converting triplet excitation energy into light emission and is preferably a material capable of exhibiting phosphorescence (a phosphorescent material) because of high emission efficiency. As the inorganic light-emitting material, quantum dots are preferably used because they have small half width of an emission spectrum and a function of emitting light with high color purity.

It is preferable that the light-emitting layer 553 have a function of emitting light of blue, green, red, yellow, white, or the like.

The light-emitting element used as the second display element 550 may have a structure in which a charge-generation layer is provided and at least two light-emitting units are stacked so as to interpose the charge-generation layer. The charge-generation layer provided between the two light-emitting units injects electrons into one light-emitting unit and injects holes into the other light-emitting unit when a voltage is applied between a pair of electrodes. For example, the charge-generation layer may have either a structure in which an acceptor material that is an electron acceptor is added to a hole-transport material or a structure in which a donor material that is an electron donor is added to an electron-transport material. Alternatively, both of these structures may be stacked.

Note that one light-emitting unit includes at least a light-emitting layer, and a hole-injection layer, a hole-transport layer, an electron-transport layer, and an electron-injection layer are included in addition to the light-emitting layer. Note that the light-emitting element does not necessarily have the above structure.

One or both of the light-emitting layers of the two light-emitting units may be divided into layers and the divided layers may contain light-emitting materials having a function of emitting light of different colors.

The above structure is suitable for obtaining white light emission. For example, white light emission can be obtained using a light-emitting material emitting blue light and a light-emitting material emitting green light and red light. Alternatively, white light emission can be obtained using a light-emitting material emitting blue light and a light-emitting material emitting yellow light. Note that white light emission is not necessarily white and may include at least light emission of blue and another color (one or more of green, red, and yellow). A light-emitting element having a function of emitting white light is used for the display device of one embodiment of the present invention; therefore, a display device having high resolution can be fabricated.

With a plurality of light-emitting units partitioned by the charge-generation layer between a pair of electrodes, it is possible to provide a light-emitting element which can emit light having high luminance with the current density kept low and has a long lifetime. Furthermore, a light-emitting element with low power consumption can be provided.

<Materials which can be used for Second Display Element>

Described below is a material which can be used for a light-emitting element which is preferable as the second display element 550.

<<Light-Emitting Layer>>

For example, the following materials can be used for the light-emitting layer.

<<Phosphorescent Material>>

As the phosphorescent material, an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)).

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), and (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III)acetylacetonate (abbreviation: Ir(dpo)$_2$(acac)), bis{2-[4'-(perfluorophenyl)phenyl]pyridinato-N,C$^{2'}$}iridium(III)acetylacetonate (abbreviation: Ir(p-PF-ph)$_2$(acac)), and bis(2-phenylbenzothiazolato-N,C$^{2'}$)iridium(III)acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complexes having a pyrimidine skeleton have distinctively high reliability and emission efficiency and are thus particularly preferable.

Examples of the substance that has an emission peak in the yellow or red wavelength range include organometallic iridium complexes having a pyrimidine skeleton, such as (disobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(dlnpm)$_2$(dpm)); organometallic iridium complexes having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N,C$^{2'}$)iridium(III)acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and emission efficiency and are thus particularly preferable. Further, the organometallic iridium complexes having a pyrazine skeleton can provide red light emission with favorable chromaticity.

As the organic light-emitting material included in the light-emitting layer, any material can be used as long as the material can convert the triplet excitation energy into light emission. As an example of the material that can convert triplet excitation energy into light emission, a thermally activated delayed fluorescence material can be given in addition to the phosphorescent material. Therefore, the term "phosphorescent material" in the description can be replaced with the term "thermally activated delayed fluorescence material". Note that the thermally activated delayed fluorescence material is a material having a small energy difference between the singlet excitation energy level and the triplet excitation energy level and has a function of converting the triplet excitation energy into the singlet excitation energy by reverse intersystem crossing. Thus, the thermally activated delayed fluorescence material can up-convert a triplet excited state into a singlet excited state (i.e., reverse intersystem crossing is possible) using a little thermal energy and efficiently exhibit light emission (fluorescence) from the singlet excited state. Conditions for efficiently obtaining thermally activated delayed fluorescence are as follows: the energy difference between the triplet excitation energy level and the singlet excitation energy level is preferably greater than 0 eV and less than or equal to 0.2 eV and further preferably greater than 0 eV and less than or equal to 0.1 eV.

As the thermally activated delayed fluorescence material, any of the following materials can be used, for example. First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (abbreviation: $SnF_2$ (Proto IX)), a mesoporphyrin-tin fluoride complex (abbreviation: $SnF_2$(Meso IX)), a hematoporphyrin-tin fluoride complex (abbreviation: $SnF_2$(Hemato IX)), a coproporphyrin tetramethyl ester-tin fluoride complex (abbreviation: $SnF_2$(Copro III-4Me)), an octaethylporphyrin-tin fluoride complex (abbreviation: $SnF_2$(OEP)), an etioporphyrin-tin fluoride complex (abbreviation: $SnF_2$(Etio I)), and an octaethylporphyrin-platinum chloride complex (abbreviation: $PtCl_2$(OEP)).

As the thermally activated delayed fluorescence material composed of one kind of material, a heterocyclic compound including a π-electron rich heteroaromatic ring and a π-electron deficient heteroaromatic ring can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. The heterocyclic compound is preferably used because of having the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the difference between the level of the singlet excited state and the level of the triplet excited state becomes small. Note that an aromatic ring to which an electron-withdrawing group such as a cyano group is bonded may be used instead of the π-electron deficient heteroaromatic ring.

<<Fluorescent Material>>

Note that a fluorescent material may be used for the light-emitting layer. The fluorescent material is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like, and for example, any of the following materials can be used.

The examples include 5,6-bis[4-(10-phenyl-9-anthryl) phenyl]-2,2'-bipyridine (abbreviation: PAP2BPy), 5,6-bis [4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBu-FLPAPrn), N,N'-diphenyl-N,N'-bis[4-(9-phenyl-9H-fluoren-9-yl)phenyl]-3,8-dicyclohexylpyrene-1,6-diamine (abbreviation: ch-1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis [N,N',N'-triphenyl-1,4-phenylenediamine] (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-triphenyl-1,4-phenylenediamine (abbreviation: 2DPAPPA), N,N,N',N',N'',N'', N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzoquinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl) ethenyl]-4H-pyran-4-ylidene}propanedinitrile (abbreviation: BisDCJTM), and 5,10,15,20-tetraphenylbisbenzo[5,6]indeno[1,2,3-cd: 1',2', 3'-lm]perylene.

<<Host Material>>

In the light-emitting layer, the light-emitting material is preferably dispersed in the host material. In this case, the weight ratio of the host material to the light-emitting material is larger. A variety of materials can be used as the host material. For example, a material having a function of transporting a hole (a hole-transport material) and a material having a function of transporting an electron (an electron-transport material) can be used. Furthermore, a bipolar material having a hole-transport property and an electron-transport property can be used.

As the host material, a material having a property of transporting more electrons than holes can be used, and a material having an electron mobility of $1\times10^{-6}$ cm$^2$/Vs or higher is preferable. A compound including a π-electron deficient heteroaromatic ring skeleton such as a nitrogen-containing heteroaromatic compound, or a zinc- or aluminum-based metal complex can be used, for example, as the material which easily accepts electrons (the material having an electron-transport property). Specific examples include a compound such as an oxadiazole derivative, a triazole derivative, a benzimidazole derivative, a quinoxaline derivative, a dibenzoquinoxaline derivative, a phenanthroline derivative, a pyridine derivative, a bipyridine derivative, a pyrimidine derivative, and a triazine derivative. In addition, as examples, metal complexes having a quinoline ligand, a benzoquinoline ligand, an oxazole ligand, and a thiazole ligand can be given.

Specific examples include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq) and bis(8-quinolinolato)zinc(II) (abbreviation: Znq). Alternatively, a metal complex having an oxazole-based or thiazole-based ligand, such as bis[2-(2-benzoxazolyl)phenolate]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), 2,9-bis(naphthalen-2-yl)-4,7-diphenyl-1,10-phenanthroline (abbreviation: NBPhen), and bathocuproine (abbreviation: BCP); heterocyclic compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-[3-(3,9'-bi-9H-carbazol-9-yl)phenyl]dibenzo[f,h]quinoxaline (abbreviation: 2mCzCzPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton such as 3,5-bis[3-(9H-carbazol-9-yl)phenyl]pyridine (abbreviation: 35DCzPPy); and heteroaromatic compounds such as 4,4'-bis(5-methylbenzoxazol-2-yl)stilbene (abbreviation: BzOs). Among the above heterocyclic compounds, the heterocyclic compounds having a triazine skeleton, a diazine skeleton (pyrimidine, pyrazine, pyridazine), or a pyridine skeleton are highly reliable and stable and is thus preferably used. In addition, the heterocyclic compounds having the skeletons have a high electron-transport property to contribute to a reduction in drive voltage. Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1\times10^{-6}$ cm$^2$/Vs or higher. Note that other substances may also be used as long as their electron-transport properties are higher than their hole-transport properties.

Alternatively, as the host material, any of the following hole-transport materials can be used.

As the hole-transport material, a material having a property of transporting more holes than electrons can be used, and a material having a hole mobility of $1\times10^{-6}$ cm$^2$/Vs or higher is preferable. Specifically, an aromatic amine, a carbazole derivative, an aromatic hydrocarbon, a stilbene derivative, or the like can be used. Furthermore, the hole-transport material may be a high molecular compound.

Specific examples of the aromatic amine compounds that can be used as the material having a high hole-transport property are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]pheny}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenyl)phenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples are pentacene and coronene. The aromatic hydrocarbon having a hole mobility of $1 \times 10^{-6}$ cm$^2$/Vs or higher and having 14 to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: poly-TPD).

Examples of the material having a high hole-transport property are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl] fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl) phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds; triphenylene compounds; phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), 2,8-di(9H-carbazol-9-yl)-dibenzothiophene (abbreviation: Cz2DBT), 4-{3-[3-(9-phenyl-9H-fluoren-9-yl)phenyl] phenyl}dibenzofuran (abbreviation: mmDBFFLBi-II), 4,4',4''-(benzene-1,3,5-triyl)tri(dibenzofuran) (abbreviation: DBF3P-II), 1,3,5-tri(dibenzothiophen-4-yl)benzene (abbreviated as DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylene-2-yl)phenyl]dibenzothiophene (abbreviation: mDBTPTp-II). Among the above compounds, compounds including a pyrrole skeleton, a furan skeleton, a thiophene skeleton, or an aromatic amine skeleton are preferred because of their high stability and reliability. In addition, the compounds having the skeletons have a high hole-transport property to contribute to a reduction in drive voltage.

Note that it is preferable that the host material and the phosphorescent material be selected such that the emission peak of the host material overlaps with an absorption band, specifically an absorption band on the longest wavelength side, of a triplet metal to ligand charge transfer (MLCT) transition of the phosphorescent material. This makes it possible to provide a light-emitting element with drastically improved emission efficiency. Note that in the case where a thermally activated delayed fluorescent material is used instead of the phosphorescent material, it is preferable that the absorption band on the longest wavelength side be a singlet absorption band.

Note that the host material may be a mixture of a plurality of kinds of substances, and in the case of using a mixed host material, it is preferable to mix a material having an electron-transport property with a material having a hole-transport property. By mixing the material having an electron-transport property with the material having a hole-transport property, the carrier transport property of the light-emitting layer can be easily adjusted and a recombination region can be easily controlled. The content ratio of the material having an electron-transport property to the material having a hole-transport property is preferably 1:9 to 9:1.

An exciplex may be formed by these mixed substances. It is preferable that the combination of the materials be selected so as to form an exciplex that exhibits light emission whose wavelength overlaps with a wavelength of a lowest-energy-side absorption band of the light-emitting material, in which case excitation energy is transferred smoothly from the exciplex to the light-emitting material, light emission can be obtained efficiently from the light-emitting material, and the driving voltage can be reduced.

In the light-emitting layer, a material other than the host material and the light-emitting material may be contained. Besides the above materials, a high molecular compound (e.g., an oligomer, a dendrimer, and a polymer) or an inorganic compound such as a quantum dot may be used.

<<Quantum Dot>>

A quantum dot is a semiconductor nanocrystal with a size of several nanometers to several tens of nanometers and contains approximately $1\times10^3$ to $1\times10^6$ atoms. Since energy shift of quantum dots depend on their size, quantum dots made of the same substance emit light with different wavelengths depending on their size. Thus, emission wavelengths can be easily adjusted by changing the size of quantum dots.

Since a quantum dot has an emission spectrum with a narrow peak, emission with high color purity can be obtained. In addition, a quantum dot is said to have a theoretical internal quantum efficiency of 100%, which far exceeds that of a fluorescent organic compound, i.e., 25%, and is comparable to that of a phosphorescent organic compound. Therefore, a quantum dot can be used as a light-emitting material to obtain a light-emitting element having high emission efficiency. Furthermore, since a quantum dot which is an inorganic material has high inherent stability, a light-emitting element which is favorable also in terms of lifetime can be obtained.

Examples of a material of a quantum dot include a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used. For example, an alloyed quantum dot of cadmium, selenium, and sulfur is a means effective in obtaining blue light because the emission wavelength can be changed by changing the content ratio of elements.

As the quantum dot, any of a core-type quantum dot, a core-shell quantum dot, a core-multishell quantum dot, and the like can be used. Note that when a core is covered with a shell formed of another inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxylethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolones; animoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over a wavelength region of a spectrum of an ultraviolet region, a visible light region, and an infrared region by changing the size of quantum dots. The range of size (diameter) of quantum dots which is usually used is 0.5 nm to 20 nm, preferably 1 nm to 10 nm. The emission spectra are narrowed as the size distribution of the quantum dots gets smaller, and thus light can be obtained with high color purity. The shape of the quantum dots is not particularly limited and may be spherical shape, a rod shape, a circular shape, or the like. Quantum rods which are rod-like shape quantum dots has a function of emitting directional light; thus, quantum rods can be used as a light-emitting material to obtain a light-emitting element with higher external quantum efficiency.

However, in most organic EL elements, to improve emission efficiency, light-emitting materials are dispersed in host materials and concentration quenching of the light-emitting materials is suppressed. The host materials need to be materials each having a singlet excitation energy level or a triplet excitation energy level higher than or equal to that of the light-emitting material. In the case of using a blue phosphorescent material as the light-emitting material, it is necessary to develop a host material which has a triplet excitation energy level higher than or equal to that of the blue phosphorescent material and which is excellent in terms of a lifetime, but its development is particularly difficult. Here, even when a light-emitting layer is composed of quantum dots and made without a host material, the quantum dots enable emission efficiency to be ensured; thus, a light-emitting element which is favorable in terms of a lifetime can be obtained. In the case where the light-emitting layer is composed of quantum dots, the quantum dots preferably have core-shell structures (including core-multishell structures).

In the case of using quantum dots as the light-emitting material in the light-emitting layer, the thickness of the light-emitting layer is set to 3 nm to 100 nm, preferably 10 nm to 100 nm, and the light-emitting layer is made to contain 1 volume % to 100 volume % of the quantum dots. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, blade coating method, a roll coating method, an ink-jet method, a printing method, a spray coating method, a curtain coating method, or a Langmuir-Blodgett method) may be employed. For a light-emitting layer containing a phosphorescent light-emitting material, a vacuum evaporation method, as well as the wet process, can be suitably employed.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

<<Hole-Injection Layer>>

The hole-injection layer has a function of reducing a barrier for hole injection from the anode or the charge-generation layer to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer, a layer containing a composite material of a material having a function of transporting a hole (a hole-transport material) and a material having a property of accepting electrons (an acceptor property) from the hole-transport material can also be used. Alternatively, a stack of a layer containing a material having an electron accepting property (an acceptor property) and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: F4-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, titanium oxide, ruthenium oxide, zirconium oxide, hafnium oxide, silver oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, any of the aromatic amine, carbazole derivative, aromatic hydrocarbon, stilbene derivative, and the like described as examples of the hole-transport material that can be used in the light-emitting layer can be used. Furthermore, the hole-transport material may be a high molecular compound.

<<Hole-Transport Layer>>

The hole-transport layer is a layer containing a hole-transport material and can be formed using any of the hole-transport materials given as examples of the material of the hole-injection layer. In order that the hole-transport layer has a function of transporting holes injected into the hole-injection layer to the light-emitting layer, the highest occupied molecular orbital (HOMO) level of the hole-transport layer is preferably equal or close to the HOMO level of the hole-injection layer.

As the hole-transport material, a substance having a hole mobility of $1\times10^{-6}$ cm$^2$/Vs or higher is preferably used. Note that any substance other than the above substances may be used as long as the hole-transport property is higher than the electron-transport property. The layer including a substance having a high hole-transport property is not limited to a single layer, and two or more layers containing the aforementioned substances may be stacked.

<<Electron-Transport Layer>>

The electron-transport layer has a function of transporting, to the light-emitting layer, electrons injected from the cathode or the charge-generation layer through the electron-injection layer. A material having a property of transporting more electrons than holes can be used as the electron-transport material, and a material having an electron mobility of $1\times10^{-6}$ cm$^2$/Vs or higher is preferable. As the compound which easily accepts electrons (the material having an electron-transport property), a π-electron deficient heteroaromatic compound such as a nitrogen-containing heteroaromatic compound, or a metal complex can be used, for example. Specifically, a metal complex having a quinoline ligand, a benzoquinoline ligand, an oxazole ligand, or a thiazole ligand, which is described as the electron-transport material that can be used in the light-emitting layer, can be given. In addition, an oxadiazole derivative, a triazole derivative, a benzimidazole derivative, a quinoxaline derivative, a dibenzoquinoxaline derivative, a phenanthroline derivative, a pyridine derivative, a bipyridine derivative, a pyrimidine derivative, a triazine derivative, and the like can be given. A substance having an electron mobility of $1 \times 10^{-6}$ cm$^2$/Vs or higher is preferable. Note that other than these substances, any substance that has a property of transporting more electrons than holes may be used for the electron-transport layer. The electron-transport layer is not limited to a single layer, and may include stacked two or more layers containing the aforementioned substances.

Between the electron-transport layer and the light-emitting layer, a layer that controls transfer of electron carriers may be provided. The layer that controls transfer of electron carriers is a layer formed by addition of a small amount of a substance having a high electron-trapping property to a material having a high electron-transport property described above, and the layer is capable of adjusting carrier balance by suppressing transfer of electron carriers. Such a structure is very effective in preventing a problem (such as a reduction in element lifetime) caused when electrons pass through the light-emitting layer.

An n-type compound semiconductor may also be used, and an oxide such as titanium oxide, zinc oxide, silicon oxide, tin oxide, tungsten oxide, tantalum oxide, barium titanate, barium zirconate, zirconium oxide, hafnium oxide, aluminum oxide, yttrium oxide, or zirconium silicate; a nitride such as silicon nitride; cadmium sulfide; zinc selenide; or zinc sulfide can be used, for example.

<<Electron-Injection Layer>>

The electron-injection layer has a function of reducing a barrier for electron injection from the cathode or the charge-generation layer to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, or the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. Alternatively, a rare earth metal compound like erbium fluoride (ErF$_3$) can be used. Electride may also be used for the electron-injection layer. Examples of the electride include a substance in which electrons are added at high concentration to calcium oxide-aluminum oxide. The electron-injection layer can be formed using the substance that can be used for the electron-transport layer.

A composite material in which an organic compound and an electron donor (donor) are mixed may also be used for the electron-injection layer. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, sodium, cesium, magnesium, calcium, erbium, ytterbium, and the like are given. In addition, an alkali metal oxide or an alkaline earth metal oxide is preferable, and lithium oxide, calcium oxide, barium oxide, and the like are given. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by an evaporation method (including a vacuum evaporation method), an ink-jet method, a coating method, a gravure printing method, or the like. Besides the above materials, an inorganic compound or a high molecular compound (e.g., an oligomer, a dendrimer, and a polymer) may be used in the light-emitting layer, the hole-injection layer, the hole-transport layer, the electron-transport layer, and the electron-injection layer.

<<Charge-Generation Layer>>

In the case where the charge-generation layer contains a composite material of an organic compound and an acceptor substance, the composite material that can be used for the hole-injection layer may be used for the composite material. As the organic compound, a variety of compounds such as an aromatic amine compound, a carbazole compound, an aromatic hydrocarbon, and a high molecular compound (e.g., an oligomer, a dendrimer, and a polymer) can be used. A compound having a hole mobility of $1 \times 10^{-6}$ cm$^2$/Vs or higher is preferably used as the organic compound. Note that any other material may be used as long as it has a property of transporting more holes than electrons. Since the composite material of an organic compound and an acceptor substance has excellent carrier-injection and carrier-transport properties, low-voltage driving or low-current driving can be achieved.

The charge-generation layer may have a stacked-layer structure of a layer containing the composite material of an organic compound and an acceptor substance and a layer containing another material. For example, the charge-generation layer may be formed using a combination of a layer containing the composite material of an organic compound and an acceptor substance with a layer containing one compound selected from among electron-donating materials and a compound having a high electron-transport property. Furthermore, the charge-generation layer may be formed using a combination of a layer containing the composite material of an organic compound and an acceptor substance with a layer containing a transparent conductive film.

Note that in terms of light extraction efficiency, the charge-generation layer preferably has a visible light transmittance (specifically, a visible light transmittance of higher than or equal to 40%). The charge-generation layer functions even if it has lower conductivity than the pair of electrodes (the electrodes 551 and 552).

Note that forming the charge-generation layer by using any of the above materials can suppress an increase in drive voltage caused by the stack of the light-emitting layers.

<<Pair of Electrodes>>

The electrodes 551 and 552 function as an anode and a cathode of each light-emitting element. The electrodes 551 and 552 can be formed using a metal, an alloy, or a conductive compound, a mixture or a stack thereof, or the like.

The electrode 552 is preferably formed using a conductive material having a function of reflecting light. Examples of the conductive material include aluminum (Al) and an alloy containing Al. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectance. Aluminum is included in earth's crust in large amount and is inexpensive; therefore, it is possible to reduce costs for manufacturing a light-emitting element with aluminum. Alternatively, silver (Ag), an alloy of Ag and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), or gold (Au)) can be used. Examples of the alloy containing silver include an alloy containing silver, palladium, and copper, an alloy containing silver and copper, an alloy containing silver and magnesium, an alloy containing silver and nickel, an alloy containing silver and gold, and an alloy containing silver and ytterbium. Besides, a transition metal such as tungsten, chromium (Cr), molybdenum (Mo), copper, or titanium can be used.

Light emitted from the light-emitting layer is extracted through the electrode 551. Thus, the electrode 551 is preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1 \times 10^{-2}$ Ω·cm can be used.

The electrode 551 may be formed using a conductive material having a function of transmitting light and a function of reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1 \times 10^{-2}$ Ω·cm can be used. For example, one or more kinds of conductive metals and alloys, and conductive compounds can be used. Specifically, a metal oxide such as a conductive metal oxide containing indium, zinc oxide, or zinc oxide containing gallium, for example, indium tin oxide (hereinafter referred to as ITO), indium tin oxide containing silicon or silicon oxide (ITSO), indium oxide-zinc oxide (indium zinc oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, for example, Ag, an alloy of Ag and Al, an alloy of Ag and Mg, an alloy of Ag and Au, or an alloy of Ag and Yb can be used.

Alternatively, the electrode 551 may be a stack of a conductive material having a function of reflecting light and a conductive material having a function of transmitting light. In that case, the electrode 551 can have a function of adjusting the optical path length so that desired light emitted from each light-emitting layer is resonated and intensified; thus, such a structure is preferable.

In this specification and the like, as the material transmitting light, a material that transmits visible light and has conductivity is used. Examples of the material include, in addition to the above-described oxide conductor typified by an ITO, an oxide semiconductor and an organic conductor containing an organic substance. Examples of the organic conductor containing an organic substance include a composite material in which an organic compound and an electron donor (donor material) are mixed and a composite material in which an organic compound and an electron acceptor (acceptor material) are mixed. Alternatively, an inorganic carbon-based material such as graphene may be used. The resistivity of the material is preferably lower than or equal to $1 \times 10^5$ Ω·cm and further preferably lower than or equal to $1 \times 10^4$ Ω·cm.

Alternatively, the electrode 551 and/or the electrode 552 may be formed by stacking two or more of these materials.

In the case where the electrode 551 or the electrode 552 functions as the cathode, the electrode preferably contains a material having a low work function (lower than or equal to 3.8 eV). The examples include an element belonging to Group 1 or 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, and an alloy containing aluminum and silver.

In the case where the electrode 551 or the electrode 552 is used as an anode, a material having a high work function (higher than or equal to 4.0 eV) is preferably used.

As the method for forming the electrodes 551 and 552, a sputtering method, an evaporation method, a printing method, a coating method, a molecular beam epitaxy (MBE) method, a chemical vapor deposition (CVD) method, a pulsed laser deposition method, an atomic layer deposition (ALD) method, or the like can be used as appropriate.

<Components of Display Device>

Next, other components that form the display device of one embodiment of the present invention are described. In some cases, the components cannot be clearly distinguished from each other and one component also serves as another component or includes part of another component.

<<Substrate>>

The substrates 570 and 370 can be formed using a material having heat resistance high enough to withstand heat treatment in the manufacturing process. Specifically, a 0.7-mm-thick non-alkali glass substrate can be used, for example.

For example, a large-sized glass substrate having any of the following sizes can be used as the substrates 570 and 370: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

An organic material, an inorganic material, a composite material of an organic material and an inorganic material, or the like can be used. For example, an inorganic material such as glass, ceramics, or a metal can be used. Specifically, non-alkali glass, soda-lime glass, potash glass, crystal glass, quartz, sapphire, or the like can be used. In addition, an inorganic oxide, an inorganic nitride, an inorganic oxynitride, or the like can be used. For example, silicon oxide, silicon nitride, silicon oxynitride, or aluminum oxide, can be used. A metal containing iron, aluminum, or the like can be used.

Moreover, a single crystal semiconductor substrate or a polycrystalline semiconductor substrate of silicon or silicon carbide, a compound semiconductor substrate of silicon germanium, an SOI substrate, or the like can be used. Thus, a semiconductor element can be formed over the substrate 570 or the like.

Alternatively, an organic material such as a resin, a resin film, or plastic can be used, for example. A flexible substrate may also be used. Specifically, a resin film or a resin plate of polyester, polyolefin, polyamide (nylon, aramid, or the like), polyimide, polycarbonate, polyurethane, an acrylic resin, an epoxy resin, or the like can be used. Alternatively, a material that includes a resin having a siloxane bond such as silicone can be used. Specifically, polyethylene terephthalate (PET), polyethylene naphthalate (PEN), polyethersulfone (PES), can be used. Paper, wood, or the like may be used.

A composite material, such as a resin film to which a metal plate, a thin glass plate, or an inorganic film is bonded can be used. For example, a composite material formed by dispersing a fibrous or particulate metal, glass, an inorganic material, or the like into a resin film can be used. For example, a composite material formed by dispersing a fibrous or particulate resin, organic material, or the like into an inorganic material can be used.

A single-layer material or a stacked-layer material in which a plurality of layers are stacked can be used. For example, a stacked-layer material in which a substrate, an insulating film that prevents diffusion of impurities contained in the substrate, and the like are stacked can be used. Specifically, a stacked-layer material in which glass and one or a plurality of films that prevent diffusion of impurities contained in the glass and that are selected from silicon oxide, silicon nitride, silicon oxynitride, and the like are stacked can be used. Alternatively, a stacked-layer material in which a resin and a film for preventing diffusion of impurities that penetrate the resin, such as silicon oxide, silicon nitride, or silicon oxynitride, are stacked can be used.

Note that a transistor, a capacitor, or the like can be directly formed on the substrate. Alternatively, a transistor, a capacitor, or the like can be formed over a substrate for use in manufacturing process that can withstand heat applied in the manufacturing process and can be transferred to the substrate 570 or the like. Thus, a transistor, a capacitor, or the like can be formed over a flexible substrate, for example.

Note that another substrate can be used as long as it can function as a support through manufacturing processes of the light-emitting element and the display element. Any material can be used as long as it has a function of protecting the light-emitting element and the display element.

Note that a light-transmitting material is preferably used for the substrate 370. Specifically, a 0.7- or 0.5-mm-thick non-alkali glass or a non-alkali glass polished to a thickness of approximately 0.1 mm to 0.2 mm can be used.

<<Structure Body 335>>

An organic material, an inorganic material, or a composite material of an organic material and an inorganic material can be used for the structure body 335. Thus, components between which the structure body 335 is provided can have a predetermined space. Specifically, polyester, polyolefin, polyamide, polyimide, polycarbonate, polysiloxane, an acrylic resin, or the like, or a composite material of a plurality of kinds of resins selected from these can be used. Alternatively, a photosensitive material may be used.

<<Sealant 305>>

For the sealant 305, an inorganic material, an organic material, a composite material of an inorganic material and an organic material, or the like can be used. An organic material such as a thermally fusible resin or a curable resin can be used. An organic material such as a reactive curable adhesive, a photo-curable adhesive, a thermosetting adhesive, and/or an anaerobic adhesive can be used. Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin, or the like can be used.

<<Bonding Layer 505>>

For example, a material which can be used for the sealant 305 can be used for the bonding layer 505.

<<Insulating Film>>

For example, an inorganic insulating material, an organic insulating material, or an insulating composite material containing an inorganic material and an organic material can be used for the insulating films 521, 528, 501C, 506, 516, 518, and 371. Specifically, an inorganic oxide film, an inorganic nitride film, an inorganic oxynitride film, or the like, or a material obtained by stacking any of these films can be used. For example, a film containing silicon oxide, silicon nitride, silicon oxynitride, aluminum oxide, or the like, or a film including a material obtained by stacking any of these can be used. In addition, polyester, polyolefin, polyamide, polyimide, polycarbonate, polysiloxane, acrylic, or the like, or a stacked material or a composite material of a plurality of kinds of resins selected from these can be used. Alternatively, a photosensitive material may be used.

The insulating film 521 is preferably formed so that steps due to components overlapping with the insulating film 521 can be covered to form a flat surface. Therefore, an organic insulating material is preferably used for the insulating film 521.

It is preferable that the insulating film 528 have a function of preventing a short circuit between the electrodes 551 and 552. Thus, an organic insulating material is preferably used for the insulating film 528; for example, a 1-μm-thick film containing polyimide is preferably used.

A material containing silicon and oxygen is preferably used for the insulating film 501C. Thus, impurity diffusion into the pixel circuit or the second display element 550 can be suppressed. For example, a 200-nm-thick film containing silicon, oxygen, and nitrogen can be used as the insulating film 501C.

Polyimide, an epoxy resin, an acrylic resin, or the like is preferably used for the insulating film 371.

<<Intermediate Film>>

For example, a material having a function of allowing hydrogen passage and supplying hydrogen can be used for the intermediate film 354. A conductive material can be used for the intermediate film 354. A light-transmitting material can be used for the intermediate film 354.

The intermediate film 354 preferably contains an oxide conductor or an oxide semiconductor. Specifically, a material containing indium and oxygen, a material containing indium, gallium, zinc, and oxygen, a material containing indium, tin, and oxygen, or the like can be used for the intermediate film 354. Note that these materials have a function of allowing hydrogen passage.

For example, the thickness of the intermediate film 354 is preferably greater than or equal to 10 nm and less than or equal to 500 nm and further preferably greater than or equal to 10 nm and less than or equal to 100 nm. Specifically, a 50- or 100-nm-thick film containing indium, gallium, zinc, and oxygen can be used.

Note that a material obtained by stacking films functioning as an etching stopper can be used as the intermediate film 354. Alternatively, a film functioning as an etching stopper can be stacked over the intermediate film 354. Specifically, a material obtained by stacking a 50-nm-thick film containing indium, gallium, zinc, and oxygen and a 20-nm-thick film containing indium, tin, and oxygen, in this order, can be used for the intermediate film 354. Alternatively, a 50-nm-thick film containing indium, gallium, zinc, and oxygen may be used as the intermediate film 354 and a 20-nm-thick film containing indium, tin, and oxygen may be stacked over the intermediate film 354.

<<Wiring, Terminal, and Conductive Film>>

A conductive material can be used for a wiring, a terminal, a conductive film, and the like. Specifically, the conductive material can be used for the signal line SL1($j$), the signal line SL2($j$), the scan line GL1($i$), the scan line GL2($i$), a wiring CSCOM, a wiring ANO, the terminal 519B, the terminal 519C, the first conductive film, the second conductive film, the conductive film 511B, the conductive film 511C, the conductive film 512B, or the like.

For example, an inorganic conductive material, an organic conductive material, a metal material, a conductive ceramic material, or the like can be used. Specifically, a metal element selected from aluminum, gold, platinum, silver, copper, chromium, tantalum, titanium, molybdenum, tungsten, nickel, iron, cobalt, palladium, and manganese, or the like can be used. Alternatively, an alloy containing any of the above-described metal elements, or the like can be used. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Alternatively, a conductive oxide such as indium oxide, indium tin oxide, indium zinc oxide, zinc oxide, or zinc oxide to which gallium is added can be used.

Alternatively, a film containing graphene or graphite can be used. For example, a film containing graphene oxide is formed and is reduced, so that a film containing graphene can be formed. As a method for reducing graphene oxide, a method using heat, a method using a reducing agent, or the like can be employed. Further alternatively, a conductive high molecule may be used.

The first conductive film can be used for the electrode 351, the wiring, or the like.

The wiring, the conductive film 512B of the transistor that can be used as the switch 581, or the like can be used for the second conductive film.

<<Electrode 351>>

A material used for the wiring or the like can be used for the electrode 351, for example. Specifically, a reflective film can be used for the electrode 351.

<<Reflective Film>>

For example, a material reflecting visible light can be used for the reflective film. Specifically, a material containing silver is preferably used for the reflective film. For example, a material containing silver and palladium or a material containing silver and copper can be used for the reflective film.

The reflective film reflects light which passes through the liquid crystal layer 353. This allows the first display element 350 to serve as a reflective liquid crystal element. Alternatively, a material with an uneven surface can be used for the reflective film. In that case, incident light can be reflected in various directions so that a white image can be displayed.

Note that other structures may be used as the electrode 351 without limitation to the reflective film. For example, a structure in which the reflective film is provided between the liquid crystal layer 353 and the electrode 351, or a structure in which the electrode 351 having a light-transmitting property is provided between the reflective film and the liquid crystal layer 353 can be used.

<<Electrode 352>>

A material having a visible-light transmitting property and conductivity can be used for the electrode 352. For example, a conductive oxide, a metal film thin enough to transmit light, or a metal nanowire can be used as the electrode 352. Specifically, a conductive oxide containing indium, a metal thin film whose thickness is greater than or equal to 1 nm and less than or equal to 10 nm, or a metal nanowire containing silver can be used for the electrode 352.

Specifically, indium oxide, indium tin oxide, indium zinc oxide, zinc oxide, zinc oxide to which gallium is added, zinc oxide to which aluminum is added, or the like can be used.

<<Pixel Circuit 530>>

The pixel circuit 530 included in the pixel 302($i,j$) is electrically connected to the signal line SL1($j$), the signal line SL2($j$), the scan line GL1($i$), the scan line GL2($i$), the wiring CSCOM, and the wiring ANO (see FIG. 3).

The pixel circuit 530 included in the pixel 302($i,j$+1) is electrically connected to the signal line SL1($j$+1), the signal line SL2($j$+1), the scan line GL1($i$), a scan line GL2($i$), the wiring CSCOM, and the wiring ANO.

In the case where a voltage of a signal supplied to the signal line SL2($j$) is different from a voltage of a signal supplied to the signal line SL1($j$+1), the signal line SL1($j$+1) is positioned apart from the signal line SL2($j$). Specifically, the signal line SL2($j$+1) is positioned adjacent to the signal line SL2($j$).

The pixel circuit 530 includes the switch 581, a capacitor C1, a switch 582, the transistor 585, and a capacitor C2.

For example, a transistor including a gate electrode electrically connected to the scan line GL1($i$) and a first electrode electrically connected to the signal line SL1($j$) can be used as the switch 581.

The capacitor C1 includes a first electrode electrically connected to a second electrode of the transistor that is used as the switch 581 and a second electrode electrically connected to the wiring CSCOM.

For example, a transistor including a gate electrode electrically connected to the scan line GL2($i$) and a first electrode electrically connected to the signal line SL2($j$) can be used as the switch 582.

The transistor 585 includes a gate electrode electrically connected to a second electrode of the transistor that is used as the switch 582 and a first electrode electrically connected to the wiring ANO.

Note that a transistor including a conductive film provided such that a semiconductor film is provided between a gate electrode and the conductive film can be used as the transistor 585. For example, a conductive film electrically connected to the wiring supplying the same potential as that supplied to the first electrode of the transistor 585 can be used as the conductive film.

The capacitor C2 includes a first electrode electrically connected to the second electrode of the transistor that is used as the switch 582 and a second electrode electrically connected to the first electrode of the transistor 585.

Note that the first electrode and the second electrode of the first display element 350 are electrically connected to the second electrode of the transistor that is used as the switch 581 and the wiring VCOM1, respectively. With such a structure, the first display element 350 can be driven.

The first electrode and the second electrode of the second display element 550 are electrically connected to a second electrode of the transistor 585 and the wiring VCOM2, respectively. With such a structure, the second display element 550 can be driven.

<<Switch 581, Switch 582, Transistor 585, and Transistor 586>>

For example, a bottom-gate transistor, a top-gate transistor, or the like can be used as the switch 581, the switch 582, the transistor 585, the transistor 586, or the like.

For example, a semiconductor containing an element belonging to Group 14 can be used for a semiconductor film of the transistor. Specifically, a semiconductor containing silicon can be used for the semiconductor film of the transistor. For example, single crystal silicon, polysilicon, microcrystalline silicon, or amorphous silicon can be used for the semiconductor film of the transistor.

For example, a transistor whose semiconductor film includes an oxide semiconductor can be used for the switch 581, the switch 582, the transistor 585, the transistor 586, or the like. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used for the switch 581, the switch 582, the transistor 585, the transistor 586, or the like. Specifically, a transistor using an oxide semiconductor for the semiconductor film 508 can be used as the switch 581, the switch 582, the transistor 585, the transistor 586, or the like.

Thus, a pixel circuit can hold an image signal for a longer time than a pixel circuit including a transistor using amorphous silicon for a semiconductor film. Specifically, a selection signal can be supplied at a frequency of lower than 30 Hz, preferably lower than 1 Hz, and further preferably less than once per minute, while flickering is suppressed. Consequently, eyestrain on a user of a data processing device can be reduced, and power consumption for driving can be reduced.

An oxide semiconductor containing indium can be used for the semiconductor film 508 having a region functioning as a channel of the transistor. For example, a 25-nm-thick film containing indium, gallium, and zinc can be used.

The material used for the wiring or the like can be used for the conductive film 504 having a region functioning as a gate electrode of the transistor. For example, a conductive film formed by stacking a 10-nm-thick film containing tantalum and nitrogen and a 300-nm-thick film containing copper, in this order, can be used.

The insulating film used for the insulating film 501C can be used as the insulating film 506 having a region functioning as a gate insulating film of the transistor. For example, a material obtained by stacking a 400-nm-thick film containing silicon and nitrogen and a 200-nm-thick film containing silicon, oxygen, and nitrogen, in this order, can be used.

The material of the wiring or the like can be used for the conductive film 512A or 512B having a region functioning as a source electrode or a drain electrode of the transistor. For example, a conductive film formed by stacking a 50-nm-thick film containing tungsten, a 400-nm-thick film containing aluminum, and a 100-nm-thick film containing titanium, in this order, can be used.

<<Opening 351H>>

If the ratio of the total area of the opening 351H to the total area of the reflective film included in the first display element 350 other than the opening is too large, display performed using the first display element 350 is dark. In contrast, if the ratio of the total area of the opening 351H to the total area other than the opening is too small, display performed using the second display element 550 is dark. If the area of the opening 351H in the reflective film is too small, light emitted from the second display element 550 is not efficiently extracted. Thus, the ratio of the area of the opening 351H to the pixel 302 is preferably 1% to 10%.

In the case where a light-emitting element having an emission area larger than the area of the opening 351H (e.g., an LED) is used as the second display element 550, the area of the opening 351H might be reduced, in which case the intensity of light emitted from the second display element 550 is also lowered. In other words, the intensity of light emitted from the second display element 550 is proportional to the area of the opening 351H. Thus, higher power is consumed in the second display element 550 in order to maintain the intensity of light emitted from the second display element 550 when the area of the opening 351H is reduced.

However, in one embodiment of the present invention, a current-driving-type light-emitting element, such as an organic EL element or an inorganic EL element, is used as the second display element 550 so that the area of the opening 351H can be almost equal to the area of an emission part of the second display element 550. As a result, the intensity of light emitted from the second display element 550 can be maintained with little change in power consumption in the second display element 550 even if the area of the opening 351H is reduced.

The opening 351H can have a polygonal shape (e.g., a quadrangular shape or a cross-like shape), an elliptical shape, a circular shape, or the like. The opening 351H may have a stripe shape, a slit-like shape, or a checkered pattern. The opening 351H may be moved to the side of an adjacent pixel. Preferably, the opening 351H is provided to the side of another pixel having a function of emitting light of the same color. With this structure, a phenomenon in which light emitted from the second display element 550 enters a coloring film of the adjacent pixel (i.e., cross talk) can be suppressed.

<<Alignment Films 331 and 332>>

An organic material can be used for the alignment films 331 and 332. For example, a material containing polyimide or the like can be used. Specifically, a material formed to have alignment in the predetermined direction by rubbing treatment or an optical alignment technique can be used.

For example, a film containing soluble polyimide can be used as the alignment film 331 or 332.

<<Coloring Layer>>

A material that transmits light of a predetermined color can be used for the coloring layers 375 and 575. Thus, the coloring layers 375 and 575 can be used as, for example, a color filter.

For example, the coloring layers 375 and 575 can be formed using a material transmitting light of blue, green, red, yellow, or white.

<<Light-Blocking Film 373>>

A material that prevents light transmission can be used for the light-blocking film 373. Thus, the light-blocking film 373 can be used as, for example, a black matrix.

<<Functional Film>>

For example, a polarizing plate, a retardation plate, a diffusing film, an anti-reflective film, a condensing film, or the like can be used as the functional films 370D and 370P. Alternatively, a polarizing plate containing a dichromatic pigment can be used.

Alternatively, an antistatic film preventing the attachment of a foreign substance, a water repellent film suppressing the attachment of stain, a hard coat film suppressing generation of a scratch in use, or the like can be used as the functional films 370D and 370P.

<<Driver Circuit GD>>

Any of a variety of sequential circuits, such as a shift register, can be used as the driver circuit GD. For example, the transistor 586, a capacitor, and the like can be used in the driver circuit GD. Specifically, a transistor that can be formed in the same process as the transistor 585 can be used.

A structure which is different from that of the transistor that can be used as the switch 581 can be used for the transistor 586. Specifically, a transistor including the conductive film 524 can be used as the transistor 586 (see FIG. 2B).

The conductive film 524 is provided such that the semiconductor film 508 is interposed between the conductive film 504 and the conductive film 524. The insulating film 516 is provided between the conductive film 524 and the semiconductor film 508. The insulating film 506 is provided between the semiconductor film 508 and the conductive film 504. For example, the conductive film 524 is electrically connected to a wiring supplying the same potential as that supplied to the conductive film 504.

Note that a structure which is the same as that of the transistor 585 can be used for the transistor 586.

<<Driver Circuit SD>>

For example, an integrated circuit can be used in the driver circuit SD. Specifically, an integrated circuit formed on a silicon substrate can be used as the driver circuit SD.

For example, a chip on glass (COG) method can be used to mount the driver circuit SD on a pad electrically connected to the pixel circuit 530. Specifically, an anisotropic conductive film can be used to mount the integrated circuit on the pad.

Note that the pad can be formed through the same process as the terminal 519B or 519C.

<Structure Example 2 of Display Device>

FIGS. 12A and 12B are cross-sectional views illustrating the structure of a display device 300B of one embodiment of the present invention. FIG. 12A is a cross-sectional view taken along dashed-dotted lines X1-X2, X3-X4, X5-X6, X7-X8, X9-X10, and X11-X12 in FIG. 1A. FIG. 12B is a cross-sectional view illustrating part of the display device 300B.

The display device 300B is different from the display device 300 in FIGS. 2A to 2C in that it includes a top-gate transistor instead of a bottom-gate transistor. Here, the description of FIGS. 2A to 2C is referred to for the other similar structures, and different structures will be described in detail.

<<Switch 581B, Transistor 585B, and Transistor 586B>>

The transistor 586B includes the conductive film 504 having a region overlapping with the insulating film 501C and the semiconductor film 508 having a region located between the insulating film 501C and the conductive film 504. Note that the conductive film 504 functions as a gate electrode (see FIG. 12B).

The semiconductor film 508 includes a first region 508A, a second region 508B, and a third region 508C. The first region 508A and the second region 508B do not overlap with the conductive film 504. The third region 508C is located between the first region 508A and the second region 508B and overlaps with the conductive film 504.

The transistor 586B includes the insulating film 506 between the third region 508C and the conductive film 504. Note that the insulating film 506 functions as a gate insulating film.

The first region 508A and the second region 508B have a lower resistivity than the third region 508C, and function as a source region and a drain region.

Note that, for example, a method for controlling the resistivity of the oxide semiconductor that is described later can be used in forming the first region 508A and the second region 508B in the semiconductor film 508. Specifically, plasma treatment using a gas containing a rare gas can be employed.

For example, the conductive film 504 can be used as a mask. The use of the conductive film 504 as a mask allows the shape of part of the third region 508C to be self-aligned with the shape of an end of the conductive film 504.

The transistor 586B includes the conductive film 512A and the conductive film 512B which are in contact with the first region 508A and the second region 508B, respectively. The conductive film 512A and the conductive film 512B function as a source electrode and a drain electrode.

A transistor that can be formed in the same process as the transistor 586B can be used as a transistor 585B and a transistor of a switch 581B.

Figure 13:
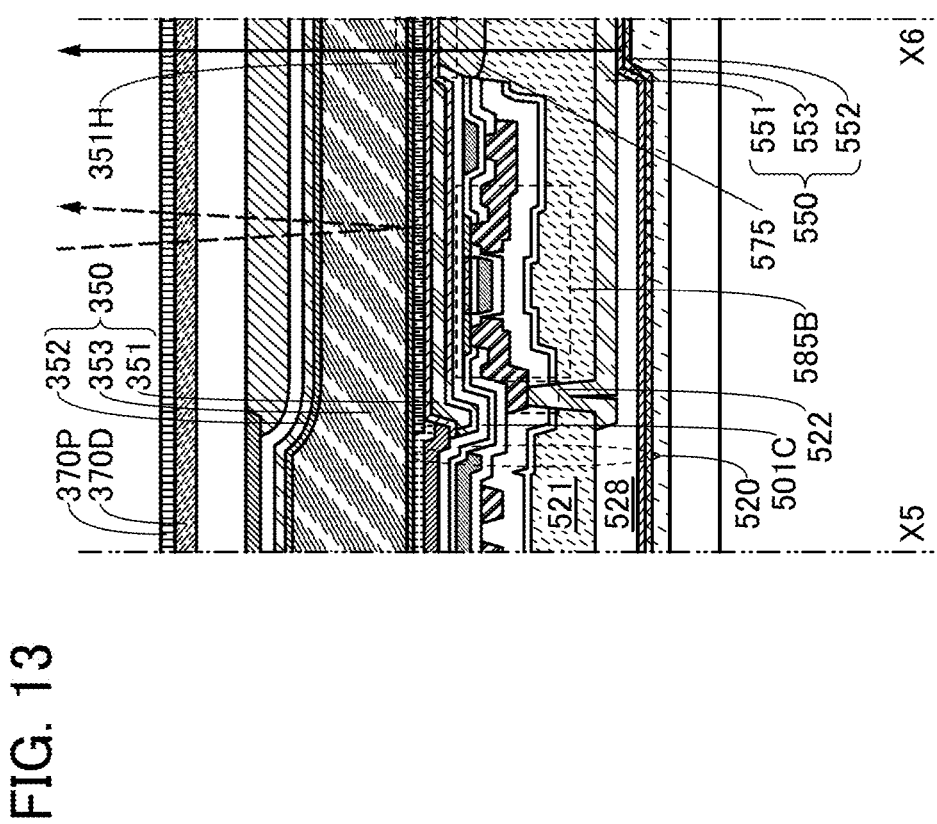
FIG. 13 is a cross-sectional view illustrating a structure of a display device of one embodiment of the present invention.

Note that as illustrated in FIG. 13, the display device 300B may have a structure where an optical element is provided in a region sandwiched between the first display element 350 and the second display element 550 and overlapping with the opening 351H and where the optical element includes the coloring layer 575. The coloring layer 575 has a region overlapping with the second display element 550, and light emitted from the second display element 550 is emitted to the outside through the coloring layer 575 and the coloring layer 375. Therefore, with the coloring layer 575, the color purity of light emitted from the second display element 550 can be improved.

Figure 14B:
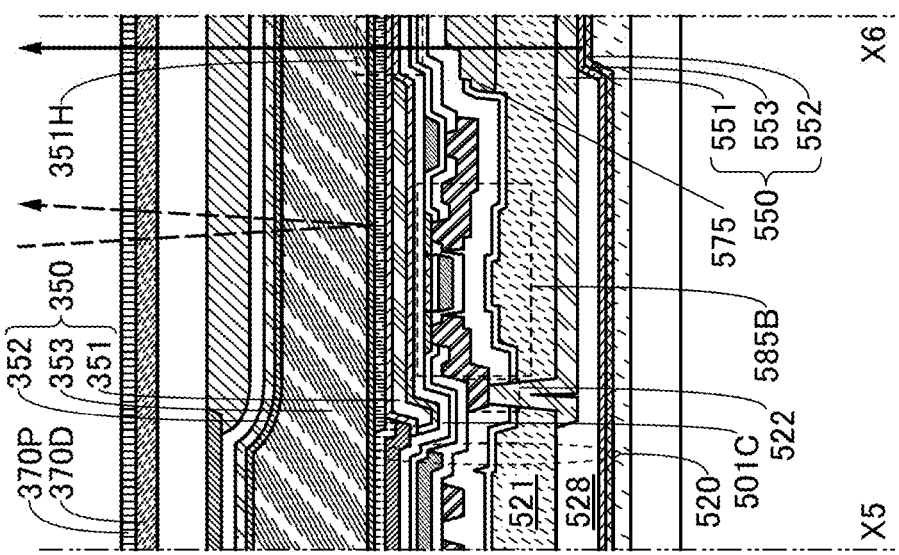
FIGS. 14A and 14B are cross-sectional views each illustrating a structure of a display device of one embodiment of the present invention.
Figure 14A:
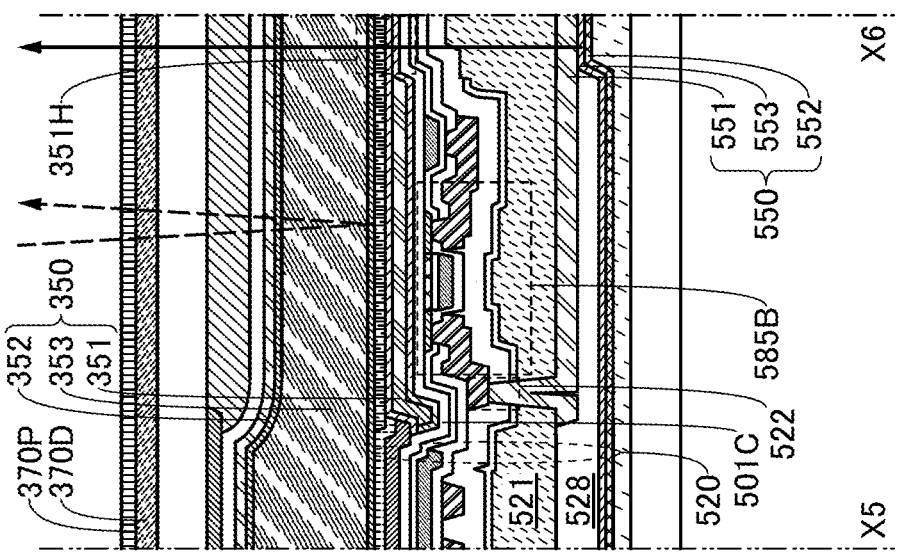
Figure 16A:
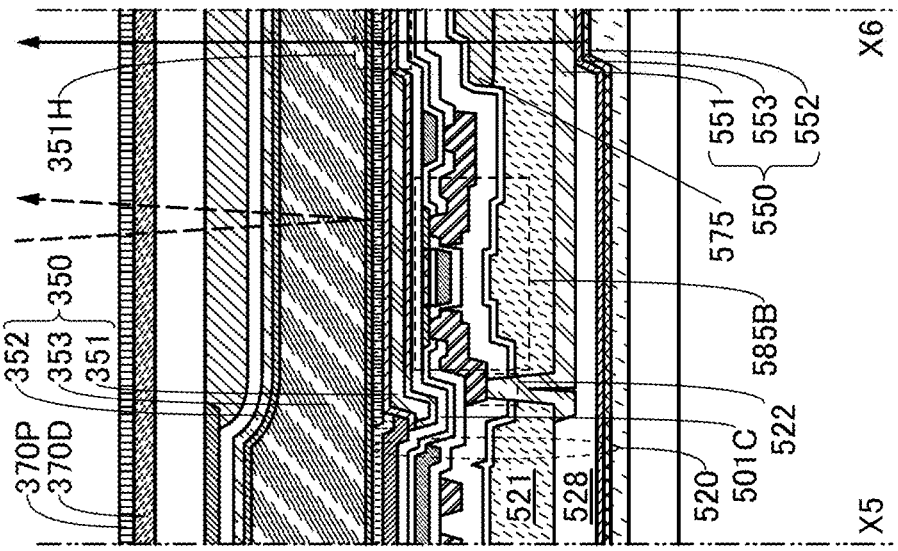
FIGS. 16A and 16B are cross-sectional views each illustrating a structure of a display device of one embodiment of the present invention.
Figure 16B:
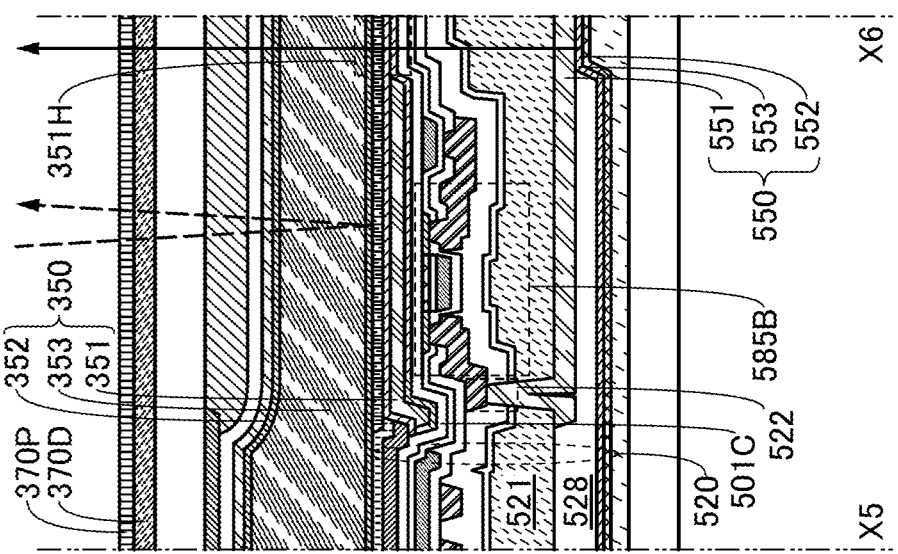

In addition, in the display device 300B in FIG. 12A, the number of insulating films including a region overlapping with the opening 351H is smaller than the number of insulating films including a region overlapping with the semiconductor film 508, and the opening 351H does not include a region overlapping with the insulating films 501C, 506, 516, and 518; however, the light-emitting device of one embodiment of the present invention is not limited thereto. For example, as illustrated in FIGS. 14A and 14B, the opening 351H does not necessarily include a region overlapping with the insulating film 518. Alternatively, for example, as illustrated in FIGS. 15A and 15B, the opening 351H does not necessarily include a region overlapping with the insulating film 501C. Alternatively, for example, as illustrated in FIGS. 16A and 16B, the number of insulating films overlapping with the semiconductor film 508 may be the same as the number of insulating films overlapping with the opening 351H.

Furthermore, in two adjacent pixels, it is preferable that the second display elements 550 include light-emitting elements emitting light of different colors, the light-emitting element of one pixel include a region overlapping with two optical elements as in FIG. 13, FIG. 14B, FIG. 15B, and FIG. 16B, and the light-emitting element of the other pixel include a region overlapping with one optical element as in FIG. 12A, FIG. 14A, FIG. 15A, and FIG. 16A.

<Method for Controlling Resistivity of Oxide Semiconductor Film>

The method for controlling the resistivity of an oxide semiconductor film will be described.

An oxide semiconductor film with a predetermined resistivity can be used for the semiconductor film 508 or the conductive film 524.

For example, a method for controlling the concentration of impurities such as hydrogen and water contained in the oxide semiconductor film and/or the oxygen vacancies in the film can be used as the method for controlling the resistivity of the oxide semiconductor film.

Specifically, plasma treatment can be used as a method for increasing or decreasing the concentration of impurities such as hydrogen and water and/or the oxygen vacancies in the film.

Plasma treatment using a gas containing one or more kinds selected from a rare gas (He, Ne, Ar, Kr, or Xe), hydrogen, boron, phosphorus, and nitrogen can be employed. For example, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, or plasma treatment in a nitrogen atmosphere can be employed. Thus, the oxide semiconductor film can have a high carrier density and a low resistivity.

Alternatively, hydrogen, boron, phosphorus, or nitrogen is added to the oxide semiconductor film by an ion implantation method, an ion doping method, a plasma immersion ion implantation method, or the like, so that the oxide semiconductor film can have a low resistivity.

Alternatively, an insulating film containing hydrogen is formed in contact with the oxide semiconductor film, and the hydrogen is diffused from the insulating film to the oxide semiconductor film, so that the oxide semiconductor film can have a high carrier density and a low resistivity.

For example, an insulating film with a hydrogen concentration greater than or equal to $1 \times 10^{22}$ atoms/cm$^3$ is formed in contact with the oxide semiconductor film, whereby hydrogen can be effectively supplied to the oxide semiconductor film. Specifically, a silicon nitride film can be used as the insulating film formed in contact with the oxide semiconductor film.

Hydrogen contained in the oxide semiconductor film reacts with oxygen bonded to a metal atom to be water, and an oxygen vacancy is formed in a lattice from which oxygen is released (or a portion from which oxygen is released). Due to entry of hydrogen into the oxygen vacancy, an electron serving as a carrier is generated in some cases. Furthermore, bonding of part of hydrogen to oxygen bonded to a metal atom causes generation of an electron serving as a carrier in some cases. Thus, the oxide semiconductor film can have a high carrier density and a low resistivity.

Specifically, an oxide semiconductor film with a hydrogen concentration measured by secondary ion mass spectrometry (SIMS) greater than or equal to $8 \times 10^{19}$ atoms/cm$^3$, preferably greater than or equal to $1 \times 10^{20}$ atoms/cm$^3$ and further preferably greater than or equal to $5 \times 10^{20}$ atoms/cm$^3$, can be suitably used as the conductive film 524.

On the other hand, an oxide semiconductor film with a high resistivity can be used as a semiconductor film where a channel of a transistor is formed. Specifically, the oxide semiconductor film can be suitably used as the semiconductor film 508.

For example, an insulating film containing oxygen, in other words, an insulating film capable of releasing oxygen, is formed in contact with an oxide semiconductor film, and the oxygen is supplied from the insulating film to the oxide semiconductor film, so that oxygen vacancies in the film or at the interface can be filled. Thus, the oxide semiconductor film can have a high resistivity.

For example, silicon oxide or silicon oxynitride can be used for the insulating film capable of releasing oxygen.

The oxide semiconductor film in which oxygen vacancy is filled with oxygen and the concentration of hydrogen is reduced can be referred to as a highly purified intrinsic or substantially highly purified intrinsic oxide semiconductor film. The term "substantially intrinsic" refers to a state where an oxide semiconductor film has a carrier density lower than $8 \times 10^{11}$/cm$^{-3}$, preferably lower than $1 \times 10^{11}$/cm$^{-3}$ and further preferably lower than $1 \times 10^{10}$/cm$^{-3}$. A highly purified intrinsic or substantially highly purified intrinsic oxide semiconductor film has few carrier generation sources, and thus can have a low carrier density. The highly purified intrinsic or substantially highly purified intrinsic oxide semiconductor film has a low density of defect states and accordingly can have a low density of trap states.

Furthermore, a transistor including the highly purified intrinsic or substantially highly purified intrinsic oxide semiconductor film has an extremely low off-state current; even when an element has a channel width of $1 \times 10^6$ μm and a channel length L of 10 μm, the off-state current can be lower than or equal to the measurement limit of a semiconductor parameter analyzer, that is, lower than or equal to $1 \times 10^{-13}$ A, at a voltage (drain voltage) between a source electrode and a drain electrode of from 1 V to 10 V.

The transistor in which a channel region is formed in the oxide semiconductor film that is a highly purified intrinsic or substantially highly purified intrinsic oxide semiconductor film can have a small change in electrical characteristics and high reliability.

Specifically, an oxide semiconductor having a hydrogen concentration which is measured by secondary ion mass spectrometry (SIMS) lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, further preferably lower than $5 \times 10^{18}$ atoms/cm$^3$, further preferably lower than or equal to $1 \times 10^{18}$ atoms/cm$^3$, further preferably lower than or equal to $5 \times 10^{17}$ atoms/cm$^3$, and still further preferably lower than or equal to $1 \times 10^{16}$ atoms/cm$^3$, can be favorably used for a semiconductor where a channel of a transistor is formed.

An oxide semiconductor film that has a higher hydrogen concentration and/or a larger number of oxygen vacancies and that has a lower resistivity than the semiconductor film 508 is used as the conductive film 524.

A film whose hydrogen concentration is twice or more, preferably ten times or more, the hydrogen concentration in the semiconductor film 508 can be used as the conductive film 524.

A film whose resistivity is greater than or equal to $1 \times 10^{-8}$ times and less than $1 \times 10^{-1}$ times the resistivity of the semiconductor film 508 can be used as the conductive film 524.

Specifically, a film with a resistivity greater than or equal to $1 \times 10^{-3}$ Ωcm and less than $1 \times 10^4$ Ωcm, preferably greater than or equal to $1 \times 10^{-3}$ Ωcm and less than $1 \times 10^{-1}$ Ωcm, can be used as the conductive film 524.

<Structure Example 3 of Display Device>

A touch panel may be provided in the display device 300 illustrated in FIGS. 2A to 2C. As the touch panel, a capacitive touch panel (a surface capacitive touch panel or a projected capacitive touch panel) can be preferably used.

A structure in which a touch panel is provided in the display device 300 is described with reference to FIG. 17, FIG. 18, and FIG. 19.

FIG. 17 is a cross-sectional view of a structure in which a touch panel 691 is provided in the display device 300. FIG.

18 is a cross-sectional view of a structure in which a touch panel 692 is provided in the display device 300. FIG. 19 is a cross-sectional view of a structure in which a touch panel 693 is provided in the display device 300.

The touch panel 691 illustrated in FIG. 17 is a so-called in-cell touch panel which is provided between the substrate 370 and the coloring layer 375. The touch panel 691 is formed over the substrate 370 before the light-blocking film 373 and the coloring layer 375 are formed.

The touch panel 691 includes a light-blocking film 662, an insulating film 663, a conductive film 664, a conductive film 665, an insulating film 666, a conductive film 667, and an insulating film 668. When an object such as a finger or a stylus approaches, for example, a change in mutual capacitance of the conductive films 664 and 665 can be sensed.

An intersection portion of the conductive films 664 and 665 is shown above the transistor 586 illustrated in FIG. 17. The conductive film 667 is electrically connected to the two conductive films 664 between which the conductive film 665 is interposed through openings provided in the insulating film 666. Although a region in which the conductive film 667 is provided is located in a region corresponding to the driver circuit GD in FIG. 17, it is not limited thereto, and the region in which the conductive film 667 is provided may be provided in a region in which the pixel circuit 530 is provided, for example.

The conductive films 664 and 665 are provided in a region overlapping with the light-blocking film 662. As illustrated in FIG. 17, it is preferable that the conductive film 664 do not overlap with the second display element 550. In other words, the conductive film 664 has openings in regions overlapping with the second display element 550. That is, the conductive film 664 has a mesh shape. With this structure, the conductive film 664 does not block light emitted from the second display element 550. Therefore, since luminance is hardly reduced even when the touch panel 691 is provided, a display device with high visibility and low power consumption can be obtained. Note that the conductive film 665 can have a structure similar to that of the conductive film 664.

Since the conductive films 664 and 665 do not overlap with the second display element 550, a metal material whose transmittance of visible light is low can be used for the conductive films 664 and 665. Therefore, as compared to the case of using an oxide material whose transmittance of visible light is high, resistance of the conductive films 664 and 665 can be reduced, whereby sensitivity of the sensor of the touch panel can be increased.

Note that a material that can be used for the light-blocking film 373 can be used for the light-blocking film 662. For the insulating films 663, 666, and 668, a material that can be used for the insulating films 521, 528, 501C, and 371 can be used. For the conductive films 664, 665, and 667, a material that can be used for the first conductive film, the second conductive film, the conductive films 511B, 511C, and 512B can be used.

Conductive nanowires may be used for the conductive films 664, 665, and 667. The nanowires may have a mean diameter greater than or equal to 1 nm and less than or equal to 100 nm, preferably greater than or equal to 5 nm and less than or equal to 50 nm and further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case of using an Ag nanowire for one or all of the conductive films 664, 665, and 667, a visible light transmittance of 89% or higher and a sheet resistance of 40 $\Omega$/square or more and 100 $\Omega$/square or less can be achieved.

Figure 18:
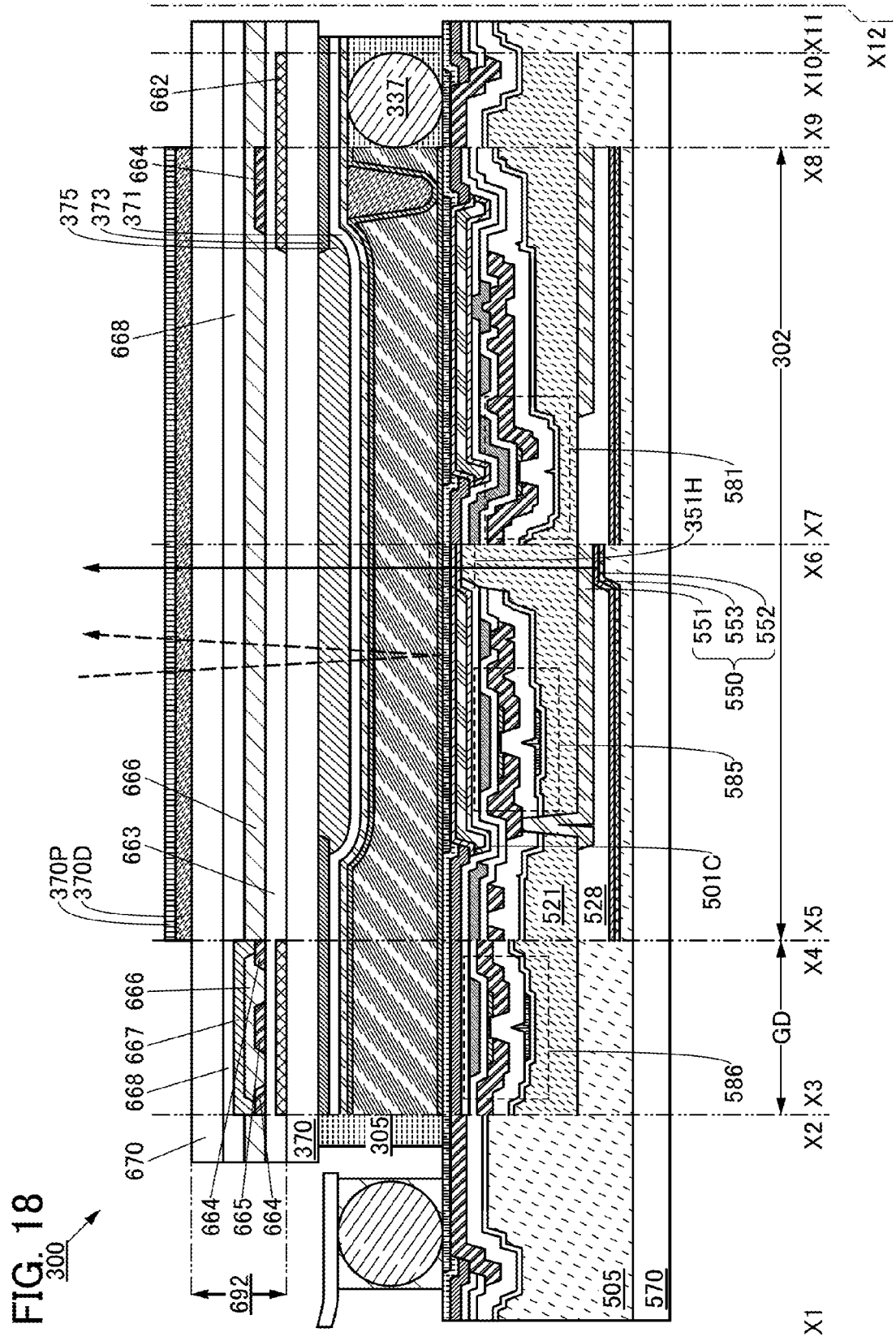
FIG. 18 is a cross-sectional view illustrating a structure of a display device of one embodiment of the present invention.

The touch panel 692 illustrated in FIG. 18 is a so-called on-cell touch panel which is provided above the substrate 370. The touch panel 692 is formed over a substrate 670, which is different from the touch panel 691. Other structures of the touch panel 692 are similar to the touch panel 691.

Figure 19:
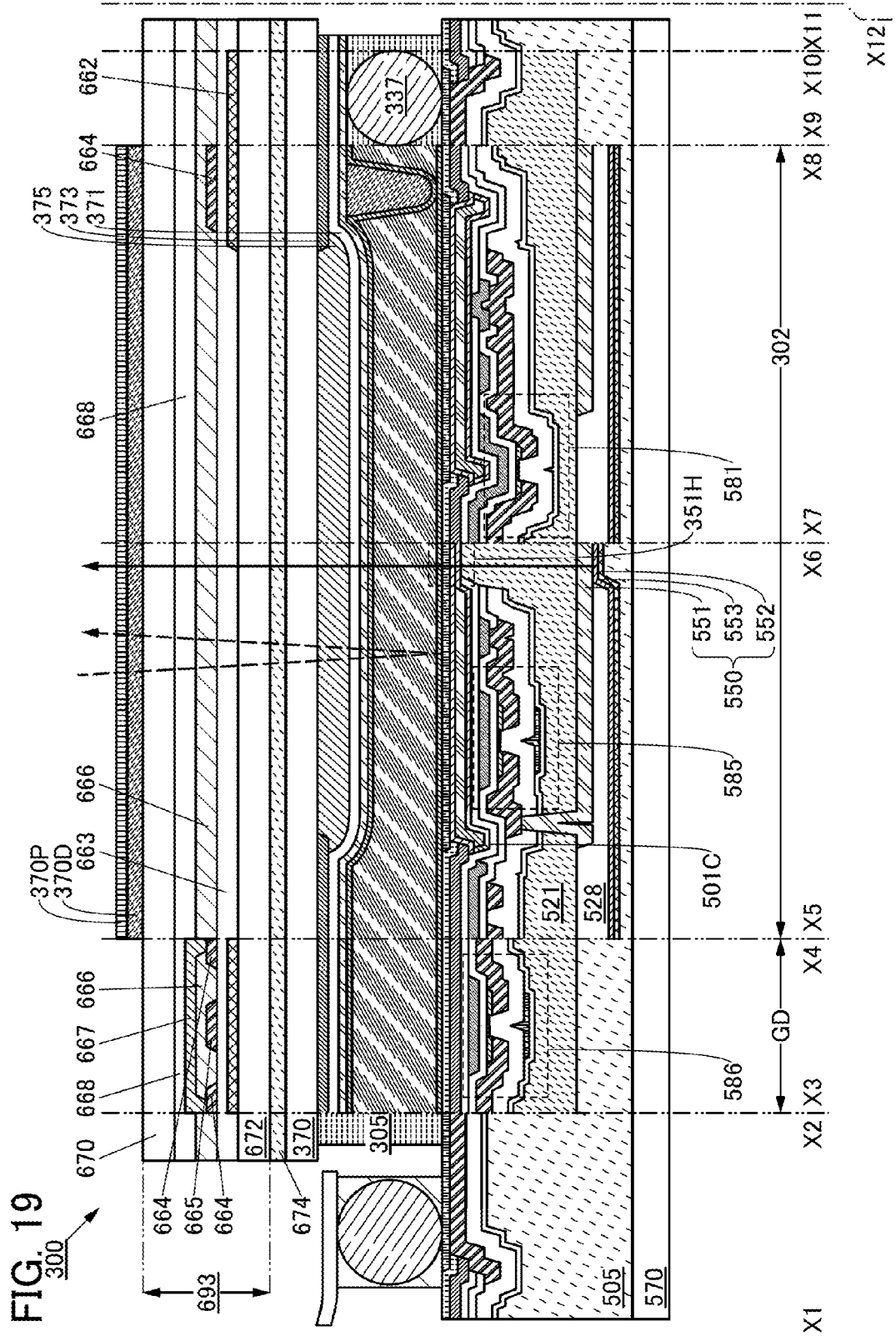
FIG. 19 is a cross-sectional view illustrating a structure of a display device of one embodiment of the present invention.

The touch panel 693 illustrated in FIG. 19 is provided over a substrate 672 and is bonded to the substrate 370 with an adhesive agent 674. The touch panel 693 is a so-called out-cell touch panel (also referred to as an externally attached touch panel). Other structures of the touch panel 693 are similar to the touch panel 691. In this manner, the display device of one embodiment of the present invention can be combined with various types of touch panels.

<Structure Example 4 of Display Device>

Figure 20:
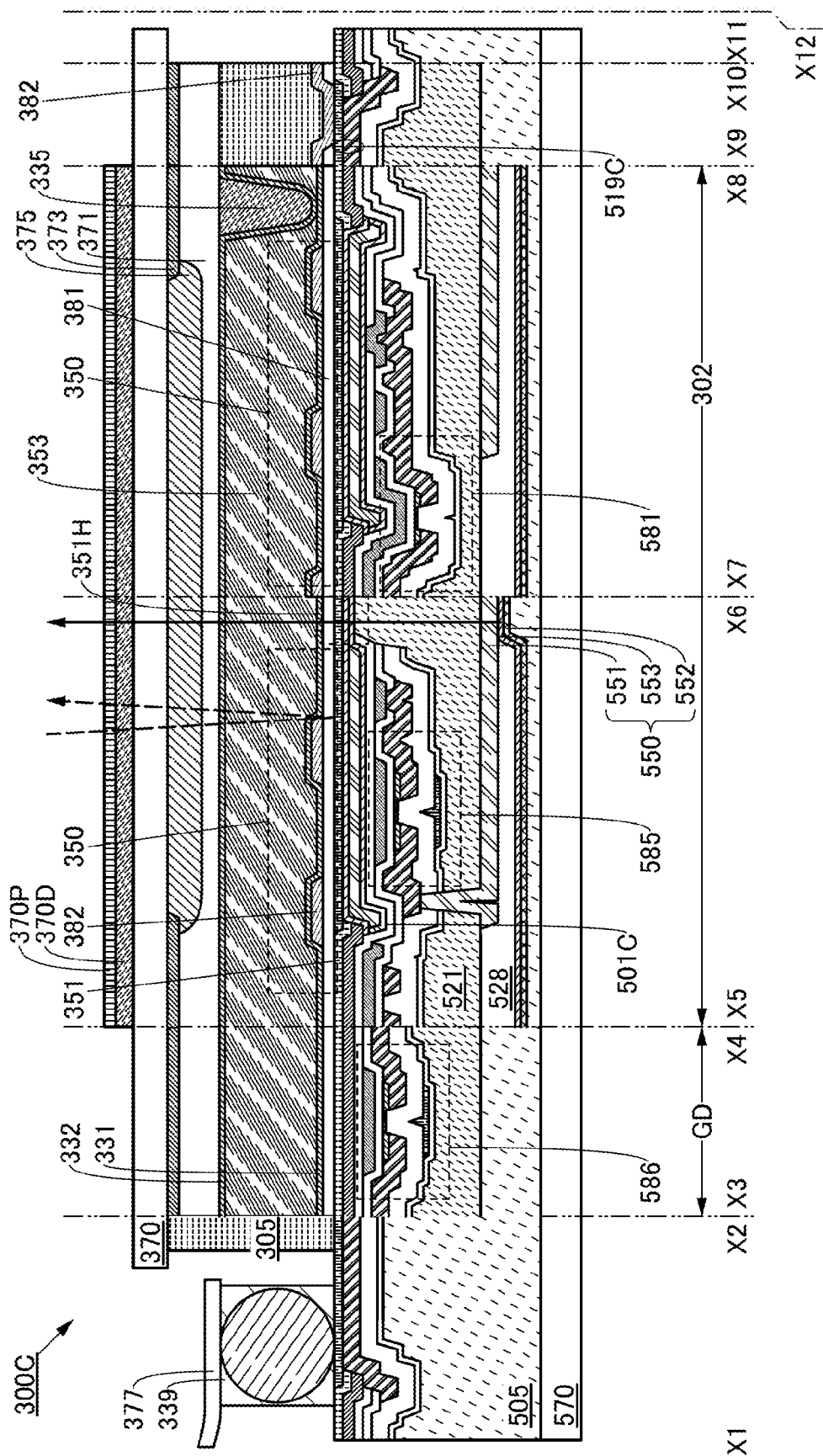
FIG. 20 is a cross-sectional view illustrating a structure of a display device of one embodiment of the present invention.

FIG. 20 illustrates a structure example where a liquid crystal element of a horizontal electric field mode (here, an FFS mode) is used for the display device 300 illustrated in FIGS. 2A to 2C.

A display device 300C illustrated in FIG. 20 includes an insulating film 381 over the electrode 351 and the terminal 519C and a conductive film 382 over the insulating film 381, in addition to the above-mentioned components.

The insulating film 381 has an opening in a region taken along the dashed-dotted line X9-X10, and the conductive film 382 is electrically connected to the terminal 519C through the opening. In FIG. 20, the conductor 337 included in the sealant 305 is not provided.

The conductive film 382 functions as a common electrode. The conductive film 382 may have a comb-like shape or a shape having a slit when seen from the above. Since the conductive film 382 is provided in the display device 300C illustrated in FIG. 20, the electrode 352 provided on the substrate 370 side is not provided. Note that the conductive film 382 may be provided and the electrode 352 may be further provided on the substrate 370 side.

For the insulating film 381, a material that can be used for the insulating films 521, 528, 501C, and 371 can be used. For the conductive film 382, a material that can be used for the first conductive film, the second conductive film, the conductive films 511B, 511C, and 512B can be used.

When the conductive film 382 is formed using a light-transmitting material, a light-transmitting capacitor can be formed. The light-transmitting capacitor includes the conductive film 382 and the insulating film 381 overlapping with the conductive film 382. This structure is preferable because the amount of charge accumulated in the capacitor can be increased.

<Structure Example 5 of Display Device>

Figure 21:
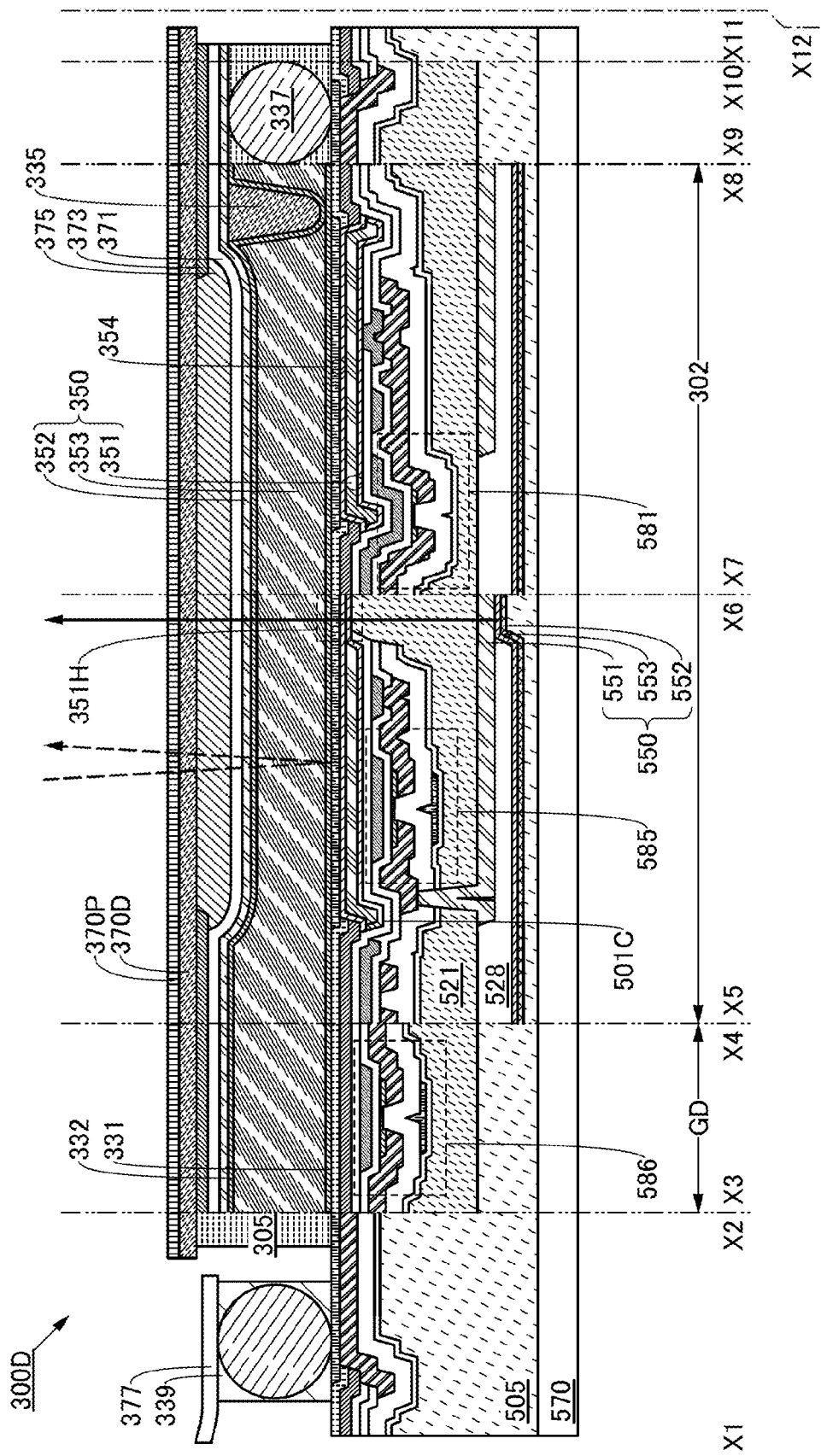
FIG. 21 is a cross-sectional view illustrating a structure of a display device of one embodiment of the present invention.

The display device 300 illustrated in FIGS. 2A to 2C does not necessarily include the substrate 370 as a display device 300D illustrated in FIG. 21. In that case, the functional films 370D and 370P each may include the coloring layer 375, the light-blocking film 373, the insulating film 371, the electrode 352, and the alignment film 332. The thickness of the display device 300D without the substrate 370 can be small. In addition, the display device 300D can display clearer images. Note that the coloring layer 375, the light-blocking film 373, the insulating film 371, the electrode 352, and the alignment film 332 may be directly formed on the functional film 370D. Alternatively, the coloring layer 375, the light-blocking film 373, the insulating film 371, the electrode 352, and the alignment film 332 may be formed over a substrate for use in manufacturing processes (a process substrate)

which is described below, be separated from the process substrate, and be bonded to the functional film 370D.

<Method for Manufacturing Display Device>

Next, a method for manufacturing a display device of one embodiment of the present invention will be described with reference to FIGS. 22 to 30. FIGS. 22 to 30 illustrate the method for manufacturing the display device 300 of one embodiment of the present invention. FIGS. 22 to 30 are cross-sectional views taken along section lines X1-X2, X3-X4, X5-X6, X7-X8, X9-X10, and X11-X12 in FIG. 1A.

The method for manufacturing the display device described in this embodiment includes the following ten steps.

<<First Step>>

In the first step, a separation film 501W is formed over a substrate 510. In the manufacturing process described in this embodiment, the substrate 510 where the separation film 501W is stacked is used as a process substrate (see FIG. 22A).

As the substrate 510, a substrate having heat resistance high enough to withstand heat treatment in the manufacturing process can be used.

For example, a large-sized glass substrate having any of the following sizes can be used as the substrate 510: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For example, an inorganic material such as glass, ceramic, or a metal can be used for the substrate 510. Specifically, non-alkali glass, soda-lime glass, potash glass, crystal glass, quartz, sapphire, or the like can be used for the substrate 510. Specifically, an inorganic oxide film, an inorganic nitride film, an inorganic oxynitride film, or the like can be used for the substrate 510. For example, silicon oxide, silicon nitride, silicon oxynitride, aluminum oxide, or the like can be used for the substrate 510. A metal containing iron, aluminum, or the like can be used for the substrate 510.

For the separation film 501W, an inorganic material or a resin can be used, for example. For example, a single-layer material or a layered material including a plurality of films can be used for the separation film 501W. Specifically, an inorganic material such as a metal containing an element selected from tungsten, molybdenum, titanium, tantalum, niobium, nickel, cobalt, zirconium, zinc, ruthenium, rhodium, palladium, osmium, iridium, and silicon, an alloy including any of the elements, or a compound including any of the elements can be used for the separation film 501W.

It is particularly preferable to use, as the separation film 501W, a film containing tungsten or a material obtained by stacking a film containing tungsten and a film containing an oxide of tungsten.

The film containing an oxide of tungsten can be formed on a film containing tungsten by a method in which another film is stacked on a film containing tungsten. Specifically, a film containing silicon and oxygen is stacked on the film containing tungsten. For example, the film containing silicon and oxygen is stacked on the film containing tungsten with the use of a gas containing nitrous oxide ($N_2O$).

The film containing an oxide of tungsten may be formed by subjecting a surface of a film containing tungsten to thermal oxidation treatment, oxygen plasma treatment, nitrous oxide ($N_2O$) plasma treatment, treatment with a solution with high oxidizing power (e.g., ozone water), or the like.

Specifically, a 30-nm-thick film containing tungsten having a surface subjected to plasma treatment in an atmosphere containing nitrous oxide ($N_2O$) can be used as the separation film 501W.

An organic material such as polyimide, polyester, polyolefin, polyamide, polycarbonate, or an acrylic resin can be used for the separation film 501W. Specifically, a film containing polyimide that has heat resistance higher than or equal to 200° C., preferably higher than or equal to 250° C., further preferably higher than or equal to 300° C., and still further preferably higher than or equal to 350° C., can be used as the separation film 501W.

Next, an intermediate film having a region overlapping with the process substrate is formed. A material that can be separated from the process substrate in a later step can be used for the intermediate film. This allows the separation film 501W to remain on the substrate 510 side after the intermediate film is separated from the process substrate. In another case, the separation film 501W can be separated together with the intermediate film from the substrate 510.

Note that a material obtained by stacking films serving as an etching stopper can be used as the intermediate film. Specifically, a material obtained by stacking a film containing indium, gallium, zinc, and oxygen and a film containing indium, tin, and oxygen, in this order, can be used for the intermediate film. A film containing indium, tin, silicon, and oxygen can alternatively be used as the intermediate film. Accordingly, a reduction in the thickness of the intermediate film in processing the insulating film 501A into a predetermined shape can be suppressed, for example. For example, the thickness of the intermediate film is preferably greater than or equal to 10 nm and less than or equal to 100 nm.

In this embodiment, a 50-nm-thick film containing indium, gallium, zinc, and oxygen is used as the intermediate film. The intermediate film can be formed by a sputtering method, for example. Specifically, a sputtering method using a material containing indium, gallium, and zinc at a ratio of 1:1:1 as a target can be employed. Alternatively, a sputtering method using a material containing indium, gallium, and zinc at a ratio of 4:2:3 as a target can be employed.

Next, the intermediate film is processed into a predetermined shape, so that the intermediate film 354 is formed (see FIG. 22A).

For example, a photolithography method and an etching method are used for the processing into a predetermined shape.

<<Second Step>>

In the second step, the insulating film 501A and the first conductive film each having a region overlapping with the intermediate films 354 are formed (see FIG. 22B).

First, an insulating film to be the insulating film 501A later is formed so as to cover the intermediate films 354. Note that a material that can be separated from the process substrate in a later step can be used for the insulating film 501A. Specifically, the insulating film to be the insulating film 501A later can be formed by a chemical vapor deposition method using silane or the like as a source gas. A material containing silicon and oxygen or a material containing silicon, oxygen, and nitrogen can be used. Note that the thickness of the insulating film is preferably greater than or equal to 200 nm and less than or equal to 600 nm.

In this embodiment, the insulating film is formed to a thickness of approximately 200 nm using a material containing silicon and nitrogen.

Next, the insulating film to be the insulating film 501A later is heated. For example, the insulating film is heated at 450° C. for one hour. Thus, the insulating film releases hydrogen, and hydrogen diffuses toward the interface between the insulating film and the separation film 501W. Alternatively, hydrogen released from the insulating film penetrates the intermediate films 354 and diffuses to an interface between the intermediate films 354 and the separation film 501W. Accordingly, in a later step, a structure with which the intermediate films 354 and the insulating film 501A can be separated from the process substrate is formed between the intermediate films 354 and the process substrate and between the insulating film 501A and the process substrate.

Next, the insulating film is patterned so that the openings 592A, 592B, and 592C are formed, whereby the insulating film 501A is formed. For example, a photolithography method and an etching method are used for the processing into a predetermined shape.

A conductive film is formed over the insulating film 501A formed in the above manner and processed into a predetermined shape by a photolithography method and an etching method, so that the first conductive film is formed. Specifically, the opening 351H and a region for reflecting external light which enters through the intermediate film 354 are formed. Note that the first conductive film can be used for the electrode 351 (see FIG. 22B).

For example, a material obtained by stacking a 20-nm-thick conductive film 351A containing indium, tin, and oxygen, a 100-nm-thick conductive film 351B containing silver, and a 100-nm-thick conductive film 351C containing indium, tin, and oxygen, in this order, can be used for the first conductive film. Alternatively, a material obtained by stacking a 20-nm-thick conductive film 351A containing indium, tin, silicon, and oxygen, a 100-nm-thick conductive film 351B containing silver, and a 100-nm-thick conductive film 351C containing indium, tin, silicon, and oxygen, in this order, can be used for the first conductive film. With the use of the films functioning as an etching stopper as the intermediate film 354, a reduction in the thickness of the first conductive film in processing the insulating film 501C into a predetermined shape in a later step can be suppressed.

<<Third Step>>

In the third step, the insulating film 501C covering the insulating film 501A, the intermediate films 354, and the first conductive film, having the opening 591A in a region overlapping with the first conductive film, and having the openings 592B and 592C each in a region overlapping with the intermediate film 354 is formed (see FIG. 23A).

For example, a photolithography method and an etching method are used for the processing into a predetermined shape.

The insulating film 501C can be formed by a chemical vapor deposition method using silane or the like as a source gas, for example.

For example, an insulating film with a thickness greater than or equal to 200 nm and less than or equal to 600 nm can be used as the insulating film 501C. In addition, a material containing silicon and oxygen or a material containing silicon, oxygen, and nitrogen can be used for the insulating film 501C. Note that the insulating film 501C may be either a single film or a stacked film.

<<Fourth Step>>

In the fourth step, the pixel circuit 530 is formed. In addition, a second conductive film overlapping with the opening 591A is formed (see FIGS. 23B, 24A, and 24B).

The transistors included in the pixel circuit 530 can be formed through the film formation and patterning of a conductive film, a semiconductor film, and an insulating film in a predetermined order, as described below.

For example, a conductive film having a region overlapping with the insulating film 501C is formed and processed into a predetermined shape. The conductive film can be used as the conductive film 504 having a region functioning as a gate electrode of each of the transistor 585, the transistor 586, and a transistor that can be used as the switch 581, for example.

In addition, an insulating film is formed in a region overlapping with the conductive film 504 and the insulating film 501C, and is processed into a predetermined shape. The insulating film can be used as the insulating film 506 having a region functioning as a gate insulating film of each of the transistor 585, the transistor 586, and the transistor that can be used as the switch 581, for example. In addition, the insulating film has openings in regions overlapping with the openings 591A, 591B, and 591C, for example (see FIG. 23B).

Then, a semiconductor film having a region overlapping with the conductive film 504 is formed and processed into a predetermined shape. The semiconductor film functions as the semiconductor film 508 included in each of the transistor 585, the transistor 586, and the transistor that can be used as the switch 581, for example.

In addition, a second conductive film which can be electrically connected to the first conductive film in the opening 591A and electrically connected to the intermediate films 354 in the openings 591B, 592B, 591C, and 592C is formed and processed into a predetermined shape. The second conductive film can be used as the conductive films 512A and 512B included in each of the transistor 585, the transistor 586, and the transistor that can be used as the switch 581, for example (see FIG. 24A).

The first conductive film and the second conductive film can be electrically connected to each other using another conductive film including a region overlapping with the opening 591A. For example, a conductive film that can be formed in the same process as the conductive film 504 can be used as the conductive film.

Next, an insulating film having a region overlapping with the semiconductor film 508, the second conductive film, and the insulating film 501C is formed. The insulating film can be used as the insulating film 516 included in each of the transistor 585, the transistor 586, and the transistor that can be used as the switch 581, for example. In addition, a conductive film having a region overlapping with the insulating film 516, the semiconductor film 508, and the conductive film 504 functioning as a gate electrode is formed and processed into a predetermined shape. The conductive film can be used as the conductive film 524 included in each of the transistors 585 and 586, for example. The conductive film 524 is preferably formed so that the semiconductor film 508 can be interposed between the conductive films 524 and 504. In addition, an insulating film having a region overlapping with the insulating film 516 and the conductive film 524 is formed. The insulating film can be used as the insulating film 518 included in each of the transistor 585, the transistor 586, and the transistor that can be used as the switch 581, for example (see FIG. 24B).

<<Fifth Step>>

In a fifth step, an opening is formed in the insulating films 501C, 506, 516, and 518 in a region overlapping with the opening 351H. The insulating films are processed into predetermined shapes by a photolithography method and an etching method, for example (see FIG. 25A).

The insulating films 501C, 506, 516, and 518 may be processed by the same treatment or may be processed by treatment performed on each insulating film.

<<Sixth Step>>

In the sixth step, the second display element 550 electrically connected to the pixel circuit 530 is formed (see FIGS. 25B, 26A, and 26B).

The second display element 550 can be formed in the following manner, for example.

For example, the insulating film 521 is formed over the pixel circuit 530 and processed into a predetermined shape. The insulating film 521 is preferably formed so that steps due to the pixel circuit 530 and the like which overlap with the insulating film 521 can be eliminated (see FIG. 25B).

In addition, the insulating film 521 has the connection portion 522 in a region overlapping with the second conductive film. A conductive material is deposited in a region overlapping with the insulating film 521 and the pixel circuit 530 and is processed into a predetermined shape to form the electrode 551. The electrode 551 is preferably formed using a conductive material which has a function of transmitting light. The electrode 551 functions as a cathode or an anode of the second display element 550. The electrode 551 is electrically connected to the pixel circuit 530 in the connection portion 522 which is provided in the insulating film 521.

In addition, an insulating film is formed in a region overlapping with the insulating film 521 and with the side end portion of the electrode 551 and is processed into a predetermined shape to form the insulating film 528. The insulating film 528 has an opening in a region overlapping with the electrode 551 (see FIG. 26A).

Next, the light-emitting layer 553 is formed in a region overlapping with the electrode 551 and the insulating film 528. The light-emitting layer 553 preferably contains an organic light-emitting material or an inorganic light-emitting material. In addition, the electrode 552 is formed in a region overlapping with the light-emitting layer 553, the electrode 551, and the insulating film 528. The electrode 552 is preferably formed using a conductive material having a function of reflective light. The electrode 552 functions as an anode or a cathode of the second display element 550 (see FIG. 26B).

<<Seventh Step>>

Figure 27:
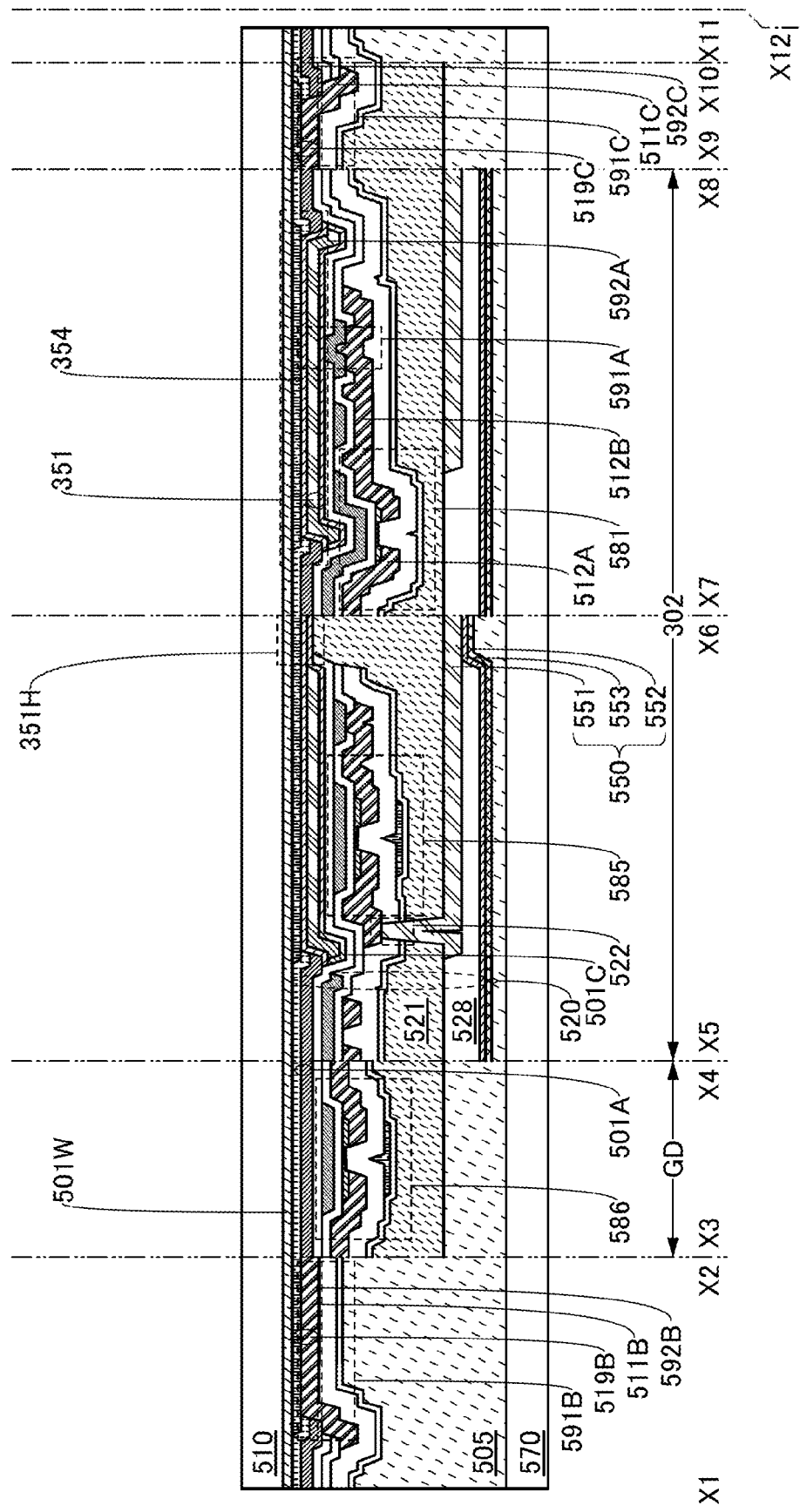
FIG. 27 is a cross-sectional view illustrating a method for manufacturing a display device of one embodiment of the present invention.

In the seventh step, the substrate 570 is stacked such that the second display element 550 is interposed between the process substrate and the substrate 570 (see FIG. 27).

The bonding layer 505 is formed over the process substrate by a printing method or a coating method, for example, and the substrate 570 is bonded to the process substrate using the bonding layer 505.

<<Eighth Step>>

Figure 28:
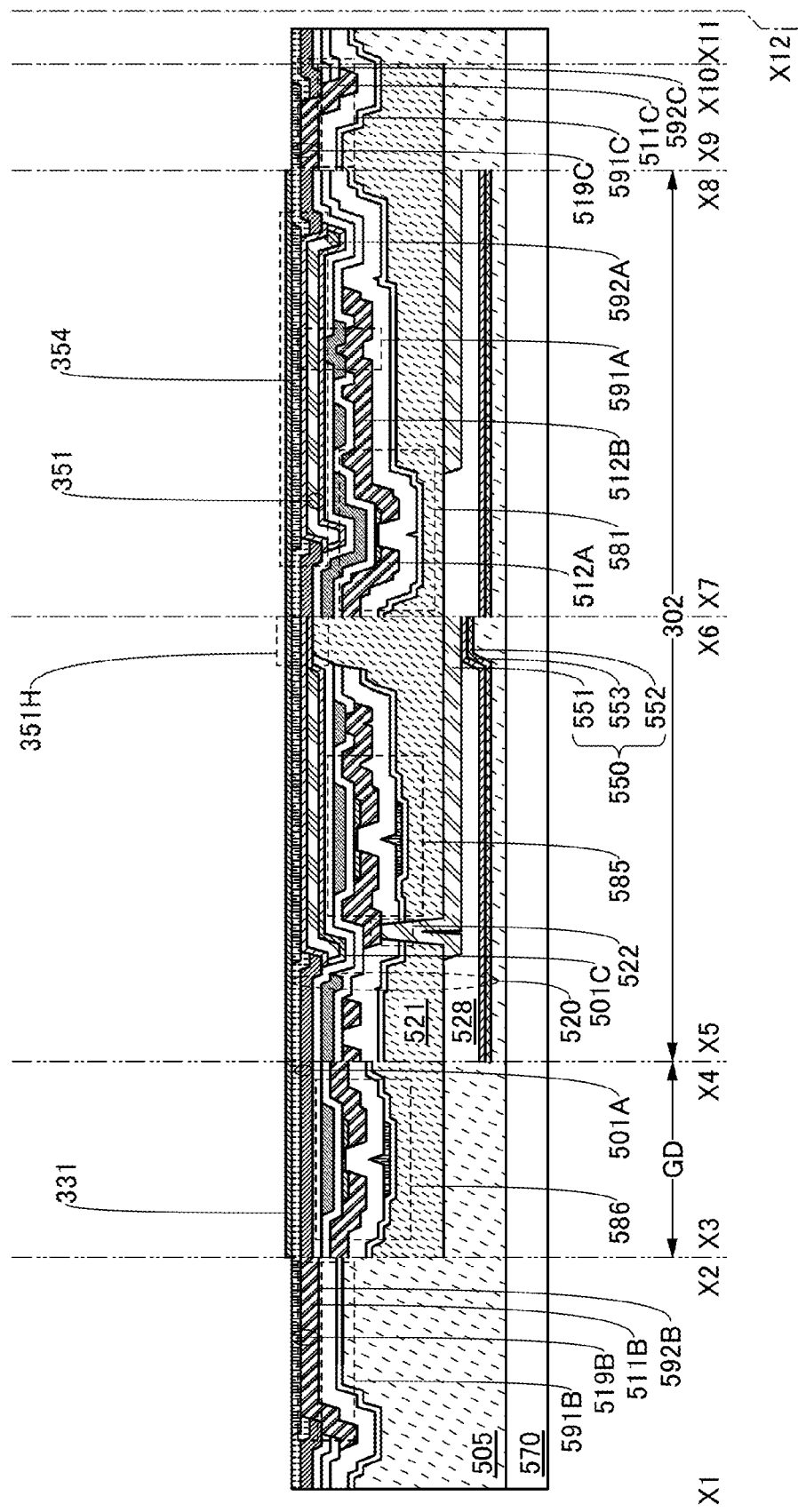
FIG. 28 is a cross-sectional view illustrating a method for manufacturing a display device of one embodiment of the present invention.
Figure 30:
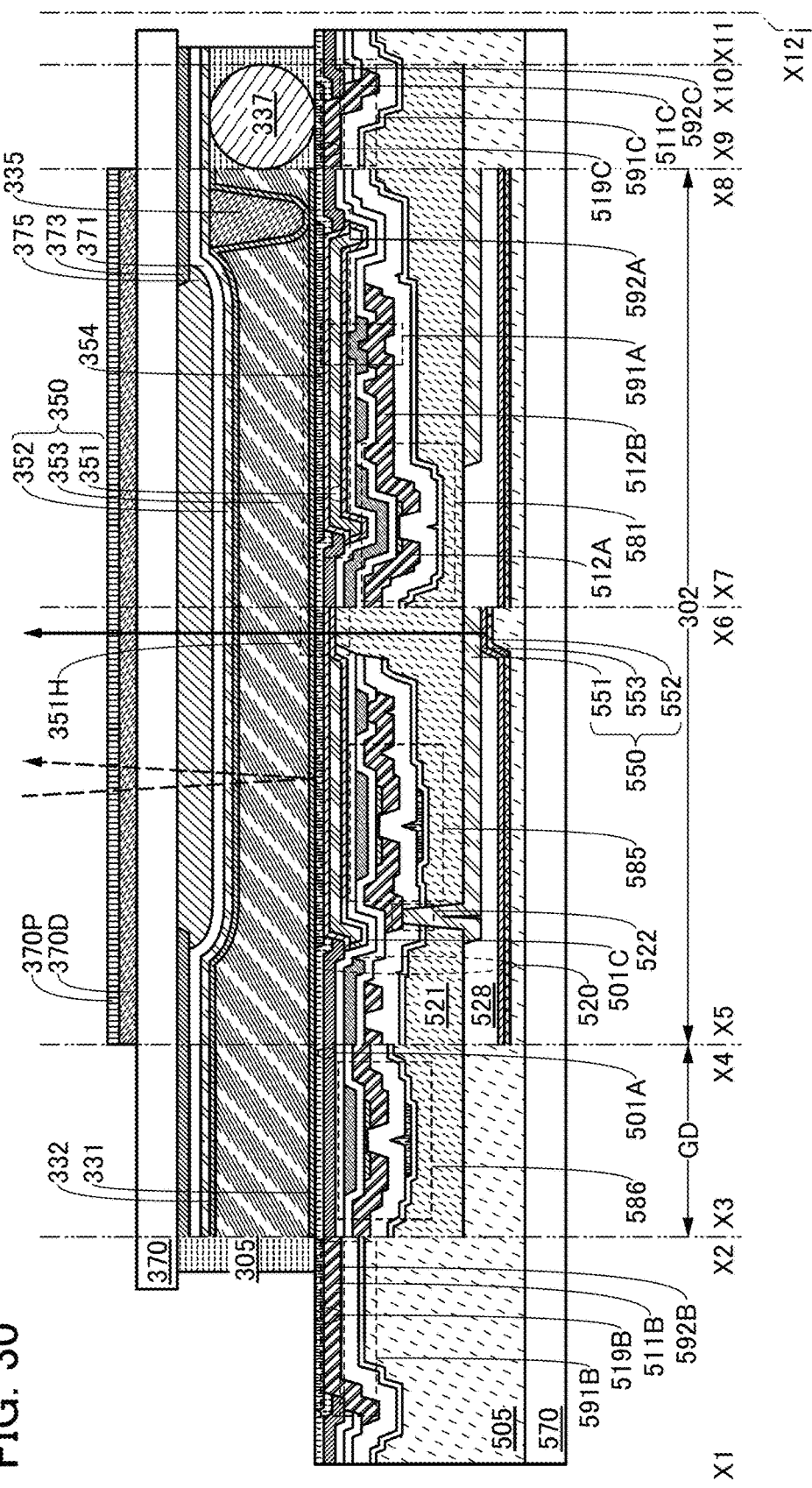
FIG. 30 is a cross-sectional view illustrating a method for manufacturing a display device of one embodiment of the present invention.

In the eighth step, the process substrate is separated, and the alignment film 331 is formed such that the intermediate film 354 is interposed between the first conductive film and the alignment film 331 (see FIG. 28).

For example, the insulating film 501A and the intermediate film 354 are separated along the separation film 501W. For example, part of the insulating film 501A is separated from the process substrate, thereby forming a separation starting point, so that the insulating film 501A and the intermediate film 354 are separated from the process substrate. In the case of forming the separation starting point, the insulating film 501A and the intermediate film 354 can be separated from the process substrate in the following manner: a region where the insulating film 501A or the intermediate film 354 is separated from the process substrate is gradually increased from the separation starting point. The separation starting point can be formed by a method using a laser or the like (specifically, a laser ablation method) or a method using a cutter with a cutting edge, for example.

Note that a polar solvent (typically water), a nonpolar solvent, or the like is preferably added to the interface between the separation film 501W and the insulating film 501A and the intermediate film 354 when the insulating film 501A and the intermediate film 354 are separated from the separation film 501W. For example, the use of water can reduce damage caused by electrification in the separation.

In the display device of one embodiment of the present invention, in order to form the alignment film 331 in a region overlapping with the first display element 350, a polyimide-containing film serving as the alignment film 331 is formed over the first conductive film by a printing method, for example. For example, the polyimide-containing film serving as the alignment film 331 can be formed by a method using a soluble polyimide or a method using a precursor of polyimide, such as a polyamic acid. Note that the temperature of heat transferred to the second display element 550 in formation of the alignment film 331 by the method using a soluble polyimide can be lower than that when a method using a precursor of polyimide, such as a polyamic acid, is employed. Accordingly, damage caused by heat applied to the second display element 550 can be reduced. Thus, a highly reliable display device can be provided.

<<Ninth Step>>

In the ninth step, the coloring layer 375, the structure body 335, the alignment film 332, and the like which are necessary for the first display element 350 are formed over the substrate 370 (see FIGS. 29A and 29B).

First, the light-blocking film 373 is formed over the substrate 370. Then, the coloring layer 375 is formed over the substrate 370 and the light-blocking film 373. For example, a titanium film can be used as the light-blocking film 373. For example, an acrylic resin containing pigment can be used for the coloring layer 375. The insulating film 371 is formed over the light-blocking film 373 and the coloring layer 375. Then, the electrode 352 is formed over the insulating film 371 (see FIG. 29A). For example, an acrylic resin can be used for the insulating film 371. For example, ITSO can be used for the electrode 352.

Next, the structure body 335 is formed in a desired region over the electrode 352. In addition, the alignment film 332 is formed over the electrode 352 and the structure body 335 (see FIG. 29B). For example, an acrylic resin can be used for the structure body 335. For example, a polyimide-containing film can be formed as the alignment film 332. Note that the alignment film 332 is not necessarily provided. Although the structure body 335 is provided over the substrate 370 in this embodiment, one embodiment of the present invention is not limited thereto. For example, the structure body 335 may be formed over the second display element 550 which is formed over the substrate 570.

<<Tenth Step>>

In the tenth step, the substrates 570 and 370 are bonded and sealed with the sealant 305. Then, the liquid crystal layer 353 is provided between the alignment films 331 and 332 to form the first display element 350 (see FIG. 30).

The sealant 305 on the terminal 519C includes the conductor 337. As for the conductor 337, conductive particles may be dispersed in a desired region of the sealant 305 using a dispenser method or the like. Note that the terminal 519C is electrically connected to the electrode 352 through the conductor 337.

Next, the functional films 370D and 370P are formed over the substrate 370. Note that the functional film 370D and/or 370P is not necessarily formed.

Then, the flexible printed circuit 377 is bonded onto the terminal 519B with the conductive material 339 (see FIG. 2A). Note that an anisotropic conductive film (ACF) or an anisotropic conductive paste (ACP) can be used as the conductive material 339, for example.

Through the above-described process, the display device 300 of one embodiment of the present invention can be manufactured.

The manufacturing method of the display device of one embodiment of the present invention includes a step of forming an intermediate film; a step of forming a first conductive film; a step of forming an insulating film having an opening overlapping with the first conductive film; a step of forming a pixel circuit such that the insulating film is interposed between the first conductive film and part of the pixel circuit and the pixel circuit is electrically connected to the first conductive film; a step of forming a second display element such that it is electrically connected to the pixel circuit; and a step of forming a first display element such that it is electrically connected to the first conductive film. In this method, the display device can be manufactured through the processes performed in the following descending order of the temperature and the degree of vacuum required in the manufacturing process and the degree of difficulty: a process for forming the pixel circuit that requires a high temperature; a process for forming the second display element that requires a high degree of vacuum; and a process for forming the first display element that does not require a high temperature or a high degree of vacuum. Thus, a highly reliable novel display device can be provided. In addition, a method for manufacturing a highly reliable novel display device can be provided.

In Embodiment 1, one embodiment of the present invention has been described. Other embodiments of the present invention will be described in Embodiments 2 to 7. Note that one embodiment of the present invention is not limited thereto. In other words, various embodiments of the invention are described in Embodiments 1 to 7, and one embodiment of the present invention is not limited to a particular embodiment. For example, in one embodiment of the present invention, an example where the number of insulating films including a region overlapping with an opening including a region overlapping with a second display element is smaller than the number of insulating films including a region overlapping with a semiconductor film of a transistor is shown; however, one embodiment of the present invention is not limited to the example. Depending on circumstances or conditions, in one embodiment of the present invention, the number of insulating films including a region overlapping with an opening including a region overlapping with a second display element is not necessarily smaller than the number of insulating films including a region overlapping with a semiconductor film of a transistor, for example. Alternatively, for example, in one embodiment of the present invention, an example where a light-emitting element and a reflective liquid crystal element are used as display elements has been described; however, one embodiment of the present invention is not limited to the example. Depending on circumstances or conditions, in one embodiment of the present invention, a light-emitting element and a reflective liquid crystal element are not necessarily used, for example. Alternatively, for example, in one embodiment of the present invention, an example where one of two light-emitting elements includes a region overlapping with one optical element and the other includes a region overlapping with two optical elements is shown; however, one embodiment of the present invention is not limited to the example. Depending on circumstances or conditions, in one embodiment of the present invention, the number of optical elements overlapping with one light-emitting element may be the same as the number of optical elements overlapping with the other.

EMBODIMENT 2

In this embodiment, a transistor which can be used in a display device of one embodiment of the present invention is described with reference to FIGS. 31 to 45.

<Structure Example 1 of Transistor>

Figure 31A:
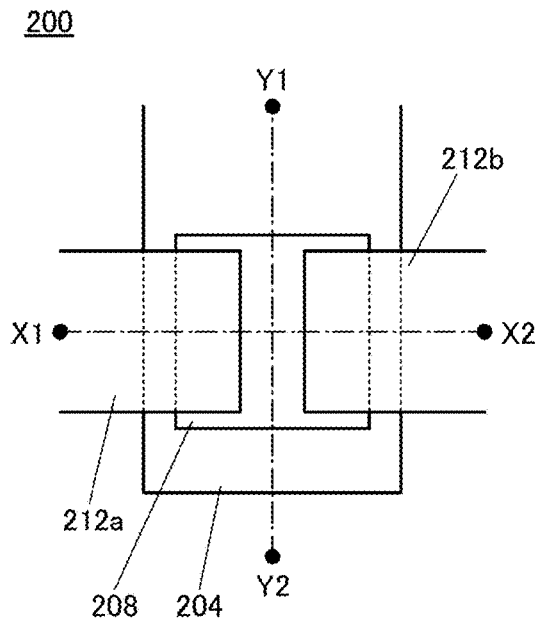
FIGS. 31A to 31C are a top view and cross-sectional views illustrating an example of a transistor.
Figure 31B:
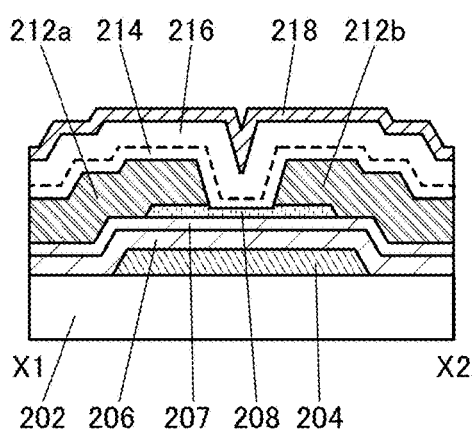
Figure 31C:
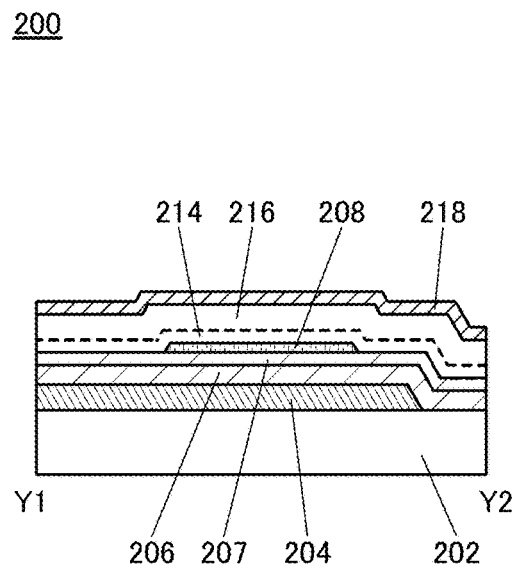

FIG. 31A is a top view of a transistor 200 that can be used in a display device of one embodiment of the present invention. FIG. 31B is a cross-sectional view taken along a dashed-dotted line X1-X2 in FIG. 31A. FIG. 31C is a cross-sectional view taken along a dashed-dotted line Y1-Y2 in FIG. 31A. Note that in FIG. 31A, some components of the transistor 200 (e.g., an insulating film serving as a gate insulating film) are not illustrated to avoid complexity. Furthermore, the direction of the dashed-dotted line X1-X2 may be referred to as a channel length direction, and the direction of the dashed-dotted line Y1-Y2 may be referred to as a channel width direction. As in FIG. 31A, some components are not illustrated in some cases in top views of transistors described below.

The transistor 200 includes a conductive film 204 functioning as a gate electrode over a substrate 202, an insulating film 206 over the substrate 202 and the conductive film 204, an insulating film 207 over the insulating film 206, an oxide semiconductor film 208 over the insulating film 207, a conductive film 212a functioning as a source electrode electrically connected to the oxide semiconductor film 208, and a conductive film 212b functioning as a drain electrode electrically connected to the oxide semiconductor film 208. Over the transistor 200, specifically, over the conductive films 212a and 212b and the oxide semiconductor film 208, an insulating film 214, an insulating film 216, and an insulating film 218 are provided. The insulating films 214, 216, and 218 function as protective insulating films for the transistor 200.

Furthermore, the insulating films 206 and 207 function as gate insulating films of the transistor 200.

Components of the transistor will be described below in detail.

<<Substrate>>

There is no particular limitation on a material and the like of the substrate 202 as long as the material has heat resistance high enough to withstand at least heat treatment to be performed later. For example, a glass substrate, a ceramic substrate, a quartz substrate, a sapphire substrate, or the like may be used as the substrate 202. Alternatively, a single crystal semiconductor substrate or a polycrystalline semiconductor substrate made of silicon or silicon carbide, a compound semiconductor substrate made of silicon germanium or the like, an SOI substrate, or the like may be used as the substrate 202. Further alternatively, any of these substrates provided with a semiconductor element may be used as the substrate 202. In the case where a glass substrate is used as the substrate 202, a large-area glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured. Such a large-area substrate is preferably used because the manufacturing cost can be reduced.

Alternatively, a flexible substrate may be used as the substrate 202, and the transistor 200 may be provided directly on the flexible substrate. Further alternatively, a separation layer may be provided between the substrate 202 and the transistor 200. The separation layer can be used when part or the whole of a semiconductor device formed over the separation layer is completed and separated from the substrate 202 and transferred to another substrate. In such a case, the transistor 200 can be transferred to a substrate having low heat resistance or a flexible substrate as well.

<<Conductive Films Functioning as Gate Electrode, Source Electrode, and Drain Electrode>>

The conductive film 204 functioning as a gate electrode, the conductive film 212a functioning as a source electrode, and the conductive film 212b functioning as a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

The conductive films 204, 212a, and 212b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The conductive films 204, 212a, and 212b can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 204, 212a, and 212b. Use of a Cu—X alloy film enables the manufacturing cost to be reduced because wet etching process can be used in the processing.

It is especially favorable that the conductive films 204, 212a, and 212b include at least one of titanium, tungsten, tantalum, and molybdenum. When the conductive films 204, 212a, and 212b include at least one of titanium, tungsten, tantalum, and molybdenum, copper in the conductive films 204, 212a, and 212b can be prevented from being diffused to the outside, so that a function of what is called a barrier metal can be obtained.

Furthermore, the conductive films 204, 212a, and 212b preferably include a nitride containing nitrogen and tantalum or a nitride containing nitrogen and titanium. Such a nitride has conductivity and a high barrier property against copper or hydrogen. In addition, a film of such a nitride releases little hydrogen and can be favorably used as a metal in contact with the oxide semiconductor film.

<<Insulating Film Functioning as Gate Insulating Film>>

As each of the insulating films 206 and 207 functioning as gate insulating films of the transistor 200, an insulating layer including at least one of the following films formed by a plasma-enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of the stacked-layer structure of the insulating films 206 and 207, an insulating film of a single layer formed using a material selected from the above or an insulating film of three or more layers may be used.

The insulating film 206 functions as a blocking film which inhibits penetration of oxygen. For example, in the case where excess oxygen is supplied to the insulating film 207, the insulating film 214, the insulating film 216, and/or the oxide semiconductor film 208, the insulating film 206 can inhibit penetration of oxygen.

Note that the insulating film 207 that is in contact with the oxide semiconductor film 208 functioning as a channel region of the transistor 200 is preferably an oxide insulating film and preferably includes a region including oxygen in excess of the stoichiometric composition (oxygen-excess region). In other words, the insulating film 207 is an insulating film capable of releasing oxygen. In order to provide the oxygen-excess region in the insulating film 207, the insulating film 207 is formed in an oxygen atmosphere, for example. Alternatively, the oxygen-excess region may be formed by introduction of oxygen into the insulating film 207 after the deposition. As a method for introducing oxygen, an ion implantation method, an ion doping method, a plasma immersion ion implantation method, plasma treatment, or the like may be employed.

In the case where hafnium oxide is used as the insulating film 207, the following effect is attained. Hafnium oxide has a higher dielectric constant than silicon oxide and silicon oxynitride. Therefore, by using hafnium oxide, the thickness of the insulating film 207 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 206, and a silicon oxide film is formed as the insulating film 207. The silicon nitride film has a higher dielectric constant than a silicon oxide film and needs a larger thickness for capacitance equivalent to that of the silicon oxide film. Thus, when the silicon nitride film is included as the gate insulating film of the transistor 200, the thickness of the insulating film can be physically increased. This makes it possible to reduce a decrease in withstand voltage of the transistor 200 and furthermore to increase the withstand voltage, thereby reducing electrostatic discharge damage to the transistor 200.

<<Oxide Semiconductor Film>>

As the oxide semiconductor film 208, the oxide semiconductor described above can be used. An oxide semiconductor will be described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in an oxide semiconductor according to the present invention are described with reference to FIGS. 43A to 43C. Note that the proportion of oxygen atoms is not illustrated in FIGS. 43A to 43C. The terms of the atomic ratio of indium, the element M, and zinc contained in the oxide semiconductor are denoted by [In], [M], and [Zn], respectively.

Figure 43A:
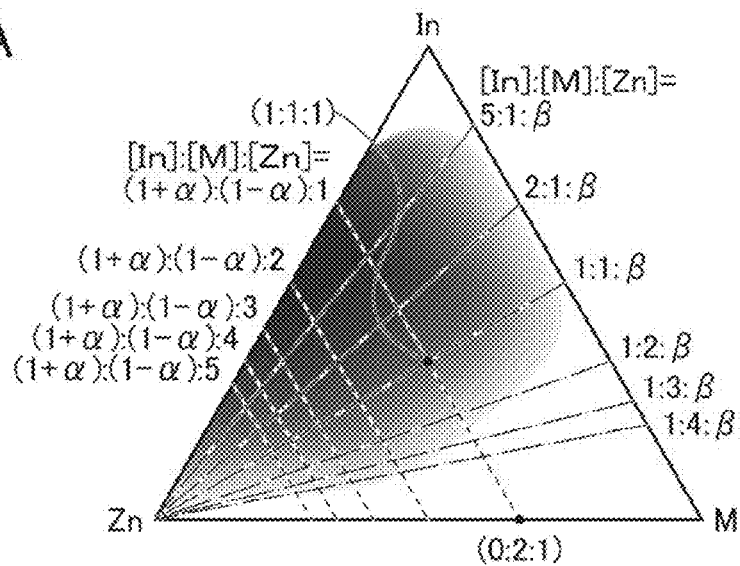
FIGS. 43A to 43C each illustrate the range of the atomic ratio of an oxide semiconductor of one embodiment of the present invention.
Figure 43B:
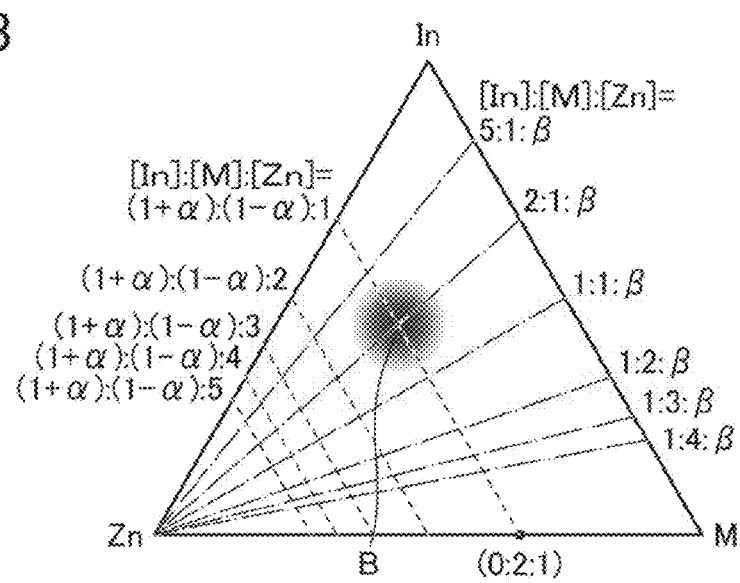
Figure 43C:
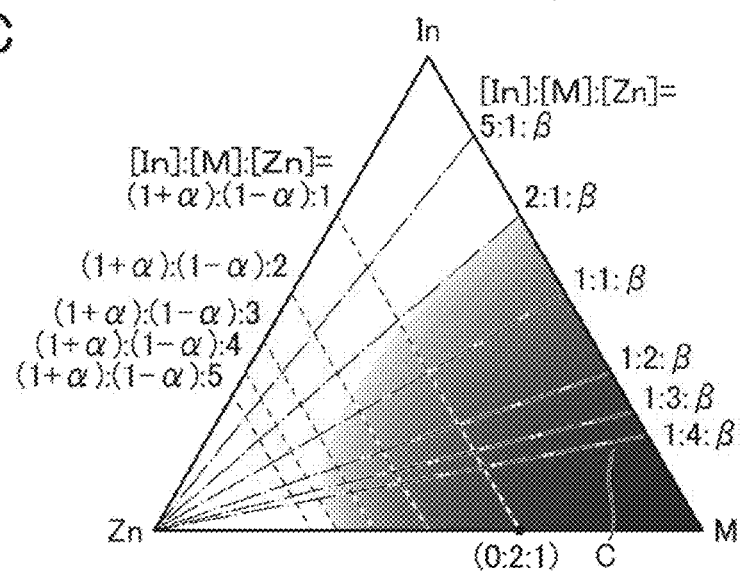

In FIGS. 43A to 43C, broken lines indicate a line where the atomic ratio [In]:[M]:[Zn] is $(1+\alpha):(1-\alpha):1$, where $-1 \le \alpha \le 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1\beta$, where $\beta \ge 0$, a line where the atomic ratio [In]:[M]:[Zn] is $1:2\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

The oxide semiconductor shown in FIGS. 43A to 43C with an atomic ratio of [In]:[M]:[Zn]=0:2:1 or an atomic ratio which is in the neighborhood is likely to have a spinel crystal structure.

FIGS. 43A and 43B illustrate examples of the preferred ranges of the atomic ratio of indium, the element M, and zinc contained in an oxide semiconductor in one embodiment of the present invention.

Figure 44:
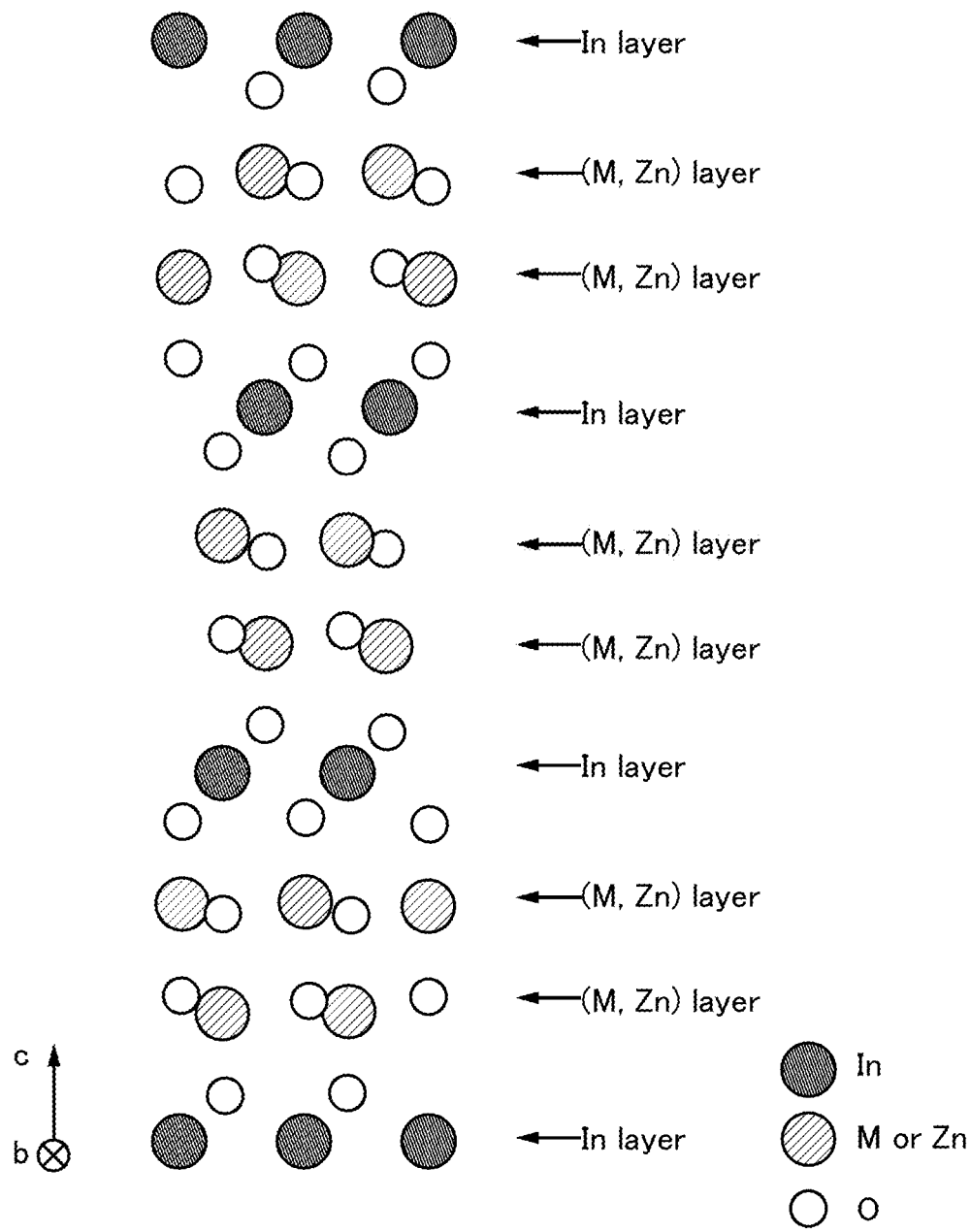
FIG. 44 illustrates three crystals of InMZnO$_4$.

FIG. 44 illustrates an example of the crystal structure of InMZnO$_4$ whose atomic ratio [In]:[M]:[Zn] is 1:1:1. The crystal structure illustrated in FIG. 44 is InMZnO$_4$ observed from a direction parallel to a b-axis. Note that a metal element in a layer that contains M, Zn, and oxygen (hereinafter, this layer is referred to as an "(M,Zn) layer") in FIG. 44 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as a layered structure) and include one layer that contains indium and oxygen (hereinafter referred to as an In layer) for every two (M,Zn) layers that contain the element M, zinc, and oxygen, as illustrated in FIG. 44.

Indium and the element M can be replaced with each other. Therefore, when the element M in the (M,Zn) layer is replaced by indium, the layer can also be referred to as an (In,M,Zn) layer. In that case, a layered structure that contains one In layer for every two (In,M,Zn) layers is obtained.

An oxide whose atomic ratio [In]:[M]:[Zn] is 1:1:2 has a layered structure that includes one In layer for every three (M,Zn) layers. In other words, if [Zn] is larger than [In] and [M], the proportion of the (M,Zn) layer to the In layer becomes higher when the oxide is crystallized.

Note that in the case where the number of (M,Zn) layers for every In layer is not an integer in the oxide, the oxide might have a plurality of kinds of layered structures where the number of (M,Zn) layers for every In layer is an integer. For example, in the case of [In]:[M]:[Zn]=1:1:1.5, the oxide might have the following layered structures: a layered structure that includes one In layer for every two (M,Zn) layers and a layered structure that includes one In layer for every three (M,Zn) layers.

For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; therefore, an oxide semiconductor having a high content of indium has higher carrier mobility than that of an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 43C), insulation performance becomes better.

Accordingly, an oxide semiconductor in one embodiment of the present invention preferably has an atomic ratio represented by a region A in FIG. 43A. With the atomic ratio, a layered structure with high carrier mobility and a few grain boundaries is easily obtained.

A region B in FIG. 43B represents an atomic ratio of [In]:[M]:[Zn]=4:2:3 to 4:2:4.1 and the vicinity thereof. The vicinity includes an atomic ratio of [In]:[M]:[Zn]=5:3:4. An oxide semiconductor with an atomic ratio represented by the region B is an excellent oxide semiconductor that has particularly high crystallinity and high carrier mobility.

Note that a condition where an oxide semiconductor has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide semiconductor has few carrier generation sources and thus can have a low carrier density. The highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor will be described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/$cm^3$, and preferably lower than or equal to $2\times10^{17}$ atoms/$cm^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1\times10^{18}$ atoms/$cm^3$, and preferably lower than or equal to $2\times10^{16}$ atoms/$cm^3$.

When the oxide semiconductor contains nitrogen, the oxide semiconductor easily becomes n-type by generation of electrons serving as carriers and an increase of carrier density. Thus, a transistor whose semiconductor includes nitrogen is likely to be normally-on. For this reason, nitrogen in the oxide semiconductor is preferably reduced as much as possible; the nitrogen concentration measured by SIMS is set, for example, lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, and still further preferably lower than or equal to $5\times10^{17}$ atoms/$cm^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/$cm^3$, preferably lower than $1\times10^{19}$ atoms/$cm^3$, further preferably lower than $5\times10^{18}$ atoms/$cm^3$, and still further preferably lower than $1\times10^{18}$ atoms/$cm^3$.

When an oxide semiconductor with sufficiently reduced impurity concentration is used for a channel formation region in a transistor, the transistor can have stable electrical characteristics.

Next, the case where the oxide semiconductor has a two-layer structure or a three-layer structure is described. A band diagram of insulators that are in contact with a layered structure of an oxide semiconductor S1, an oxide semiconductor S2, and an oxide semiconductor S3 and a band diagram of insulators that are in contact with a layered structure of the oxide semiconductor S2 and the oxide semiconductor S3 are described with reference to FIGS. 45A and 45B.

Figure 45A:
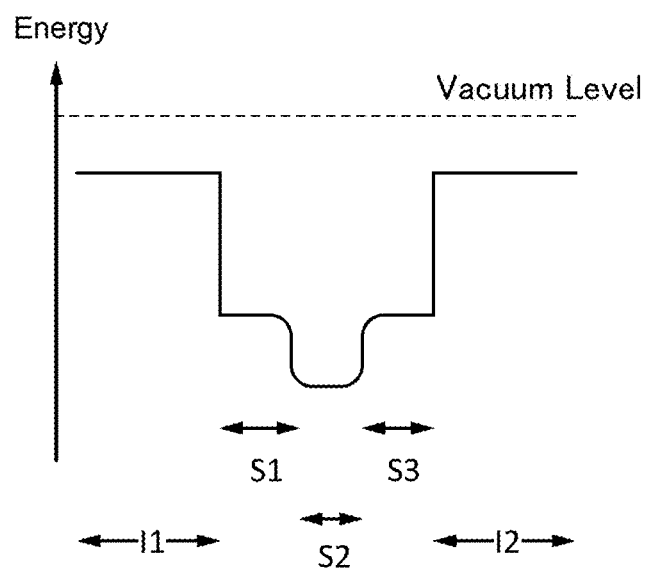
FIGS. 45A and 45B are each a band diagram of a stacked-layer structure of an oxide semiconductor.
Figure 45B:
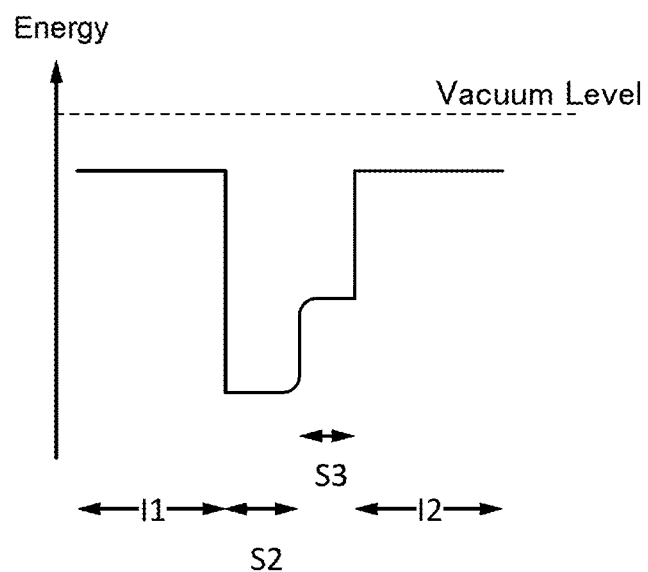

FIG. 45A is an example of a band diagram of a layered structure including an insulator I1, the oxide semiconductor S1, the oxide semiconductor S2, the oxide semiconductor S3, and an insulator I2 in a thickness direction. FIG. 45B is an example of a band diagram of a layered structure including the insulator I1, the oxide semiconductor S2, the oxide semiconductor S3, and the insulator I2 in a thickness direction. Note that for easy understanding, the band diagrams show the conduction band minimum (Ec) of each of the insulator I1, the oxide semiconductor S1, the oxide semiconductor S2, the oxide semiconductor S3, and the insulator I2.

The conduction band minimum of each of the oxide semiconductors S1 and S3 is closer to the vacuum level than that of the oxide semiconductor S2. Typically, a difference between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, the electron affinity of the oxide semiconductor S2 is higher than the electron affinity of each of the oxide semiconductors S1 and S3, and the difference between the electron affinity of each of the oxide semiconductors S1 and S3 and the electron affinity of the oxide semiconductor S2 is greater than or equal to 0.15 eV or greater than or equal to 0.5 eV, and less than or equal to 2 eV or less than or equal to 1 eV.

As illustrated in FIGS. 45A and 45B, the conduction band minimum of each of the oxide semiconductors S1 to S3 is gradually varied. In other words, the conduction band minimum is continuously varied or continuously connected. To obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 43C can be used as the oxide semiconductors S1 and S3. Note that the region C in FIG. 43C represents the atomic ratio of [In]:[M]:[Zn]=0:1:0 or the vicinity thereof.

In the case where an oxide semiconductor with the atomic ratio represented by the region A is used as the oxide semiconductor S2, it is particularly preferable to use an oxide semiconductor with [M]/[In] of greater than or equal to 1, preferably greater than or equal to 2, as each of the oxide semiconductors S1 and S3. In addition, it is suitable to use an oxide semiconductor with sufficiently high insulation performance and [M]/([Zn]+[In]) of greater than or equal to 1 as the oxide semiconductor S3.

<<Insulating Film Functioning as Protective Insulating Film for Transistor>>

The insulating films 214 and 216 each have a function of supplying oxygen to the oxide semiconductor film 208. The insulating film 218 functions as a protective insulating film for the transistor 200. The insulating films 214 and 216 contain oxygen. Furthermore, the insulating film 214 is an insulating film which is permeable to oxygen. Note that the insulating film 214 serves also as a film which relieves damage to the oxide semiconductor film 208 at the time of forming the insulating film 216 later.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 214.

In addition, it is preferable that the amount of defects in the insulating film 214 be small; as a typical example, the spin density corresponding to a signal that appears at around g=2.001 due to a dangling bond of silicon be lower than or equal to $3 \times 10^{17}$ spins/cm$^3$ by electron spin resonance (ESR) measurement. This is because if the density of defects in the insulating film 214 is high, oxygen is bonded to the defects and the amount of oxygen that passes through the insulating film 214 is decreased.

Note that not all oxygen entering the insulating film 214 from the outside move to the outside of the insulating film 214 and some oxygen remains in the insulating film 214. Furthermore, movement of oxygen occurs in the insulating film 214 in some cases in such a manner that oxygen enters the insulating film 214 and oxygen contained in the insulating film 214 moves to the outside of the insulating film 214. When an oxide insulating film which is permeable to oxygen is formed as the insulating film 214, oxygen released from the insulating film 216 provided over the insulating film 214 can be moved to the oxide semiconductor film 208 through the insulating film 214.

The insulating film 214 can be formed using an oxide insulating film having a low density of states due to nitrogen oxide. Note that the density of states due to nitrogen oxide can be formed between the energy level of the valence band maximum ($E_{v\_os}$) and the energy level of the conduction band minimum ($E_{c\_os}$) of the oxide semiconductor film. A silicon oxynitride film that releases less nitrogen oxide, an aluminum oxynitride film that releases less nitrogen oxide, or the like can be used as the oxide insulating film.

Note that a silicon oxynitride film that releases less nitrogen oxide is a film of which the amount of released ammonia is larger than the amount of released nitrogen oxide in thermal desorption spectroscopy analysis; as a typical example, the amount of released ammonia molecules is greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of the film becomes a temperature higher than or equal to 50° C. and lower than or equal to 650° C., preferably higher than or equal to 50° C. and lower than or equal to 550° C.

Nitrogen oxide ($NO_x$; x is greater than 0 and less than or equal to 2, preferably greater than or equal to 1 and less than or equal to 2), typified by $NO_2$ or NO, forms a level in the insulating film 214, for example. The level is positioned in the energy gap of the oxide semiconductor film 208. Therefore, when nitrogen oxide is diffused to the interface between the insulating film 214 and the oxide semiconductor film 208, an electron is in some cases trapped by the level on the insulating film 214 side. As a result, the trapped electron remains in the vicinity of the interface between the insulating film 214 and the oxide semiconductor film 208; thus, the threshold voltage of the transistor is shifted in the positive direction.

Nitrogen oxide reacts with ammonia and oxygen in heat treatment. Since nitrogen oxide contained in the insulating film 214 reacts with ammonia contained in the insulating film 216 in heat treatment, nitrogen oxide contained in the insulating film 214 is reduced. Therefore, an electron is hardly trapped at the interface between the insulating film 214 and the oxide semiconductor film 208.

With such an oxide insulating film, the insulating film 214 can reduce a shift in the threshold voltage of the transistor, which leads to a smaller change in the electrical characteristics of the transistor.

Note that in an ESR spectrum at 100 K or lower of the insulating film 214 subjected to heat treatment of a manufacturing process of the transistor, typically, heat treatment at a temperature lower than 400° C. or lower than 375° C. (preferably higher than or equal to 340° C. and lower than or equal to 360° C.), a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The width of the split between the first and second signals and the width of the split between the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the smaller the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6 \times 10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 216 is formed using an oxide insulating film whose oxygen content is higher than that in the stoichiometric composition. Part of oxygen is released by heating from the oxide insulating film whose oxygen content is higher than that in the stoichiometric composition. The oxide insulating film whose oxygen content is higher than that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$ in thermal desorption spectroscopy (TDS). Note that the surface temperature of the film in the TDS is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 216.

It is preferable that the amount of defects in the insulating film 216 be small; as a typical example, the spin density corresponding to a signal which appears at g=2.001 due to a dangling bond of silicon be lower than $1.5 \times 10^{18}$ spins/cm$^3$, further preferably lower than or equal to $1 \times 10^{18}$ spins/cm$^3$ by ESR measurement. Note that the insulating film 216 is provided more apart from the oxide semiconductor film 208 than the insulating film 214 is; thus, the insulating film 216 may have higher defect density than the insulating film 214.

Furthermore, the insulating films 214 and 216 can be formed using insulating films formed of the same kinds of materials; thus, a boundary between the insulating films 214 and 216 cannot be clearly observed in some cases. Thus, in this embodiment, the boundary between the insulating films 214 and 216 is shown by a dashed line. Although a two-layer structure of the insulating films 214 and 216 is described in this embodiment, the present invention is not limited to this structure. For example, a single-layer structure of either one of the insulating films 214 and 216 may be employed.

The insulating film 218 has a function of blocking oxygen, hydrogen, water, alkali metal, alkaline earth metal, or the like. It is possible to prevent outward diffusion of oxygen from the oxide semiconductor film 208, outward diffusion of oxygen included in the insulating films 214 and 216, and entry of hydrogen, water, or the like into the oxide semiconductor film 208 from the outside by providing the insulating film 218.

As the insulating film 218, a nitride insulating film can be used, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

<Structure Example 2 of Transistor>

A structure example different from that of the transistor 200 in FIGS. 31A to 31C is described with reference to FIGS. 32A to 32C.

Figure 32A:
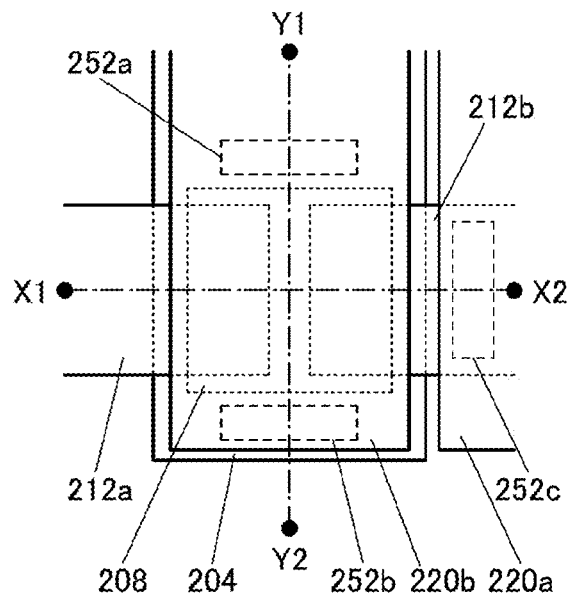
FIGS. 32A to 32C are a top view and cross-sectional views illustrating an example of a transistor.

FIG. 32A is a top view of a transistor 250 which can be used in a display device of one embodiment of the present invention. FIG. 32B is a cross-sectional view taken along dashed-dotted line X1-X2 in FIG. 32A, and FIG. 32C is a cross-sectional view taken along dashed-dotted line Y1-Y2 in FIG. 32A.

The transistor 250 includes the conductive film 204 functioning as a first gate electrode over the substrate 202, the insulating film 206 over the substrate 202 and the conductive film 204, the insulating film 207 over the insulating film 206, the oxide semiconductor film 208 over the insulating film 207, the insulating films 214 and 216 over the oxide semiconductor film 208, the conductive film 212a functioning as a source electrode electrically connected to the oxide semiconductor film 208, the conductive film 212b functioning as a drain electrode electrically connected to the oxide semiconductor film 208, the insulating film 218 over the conductive films 212a and 212b and the insulating film 216, and conductive films 220a and 220b over the insulating film 218.

In the transistor 250, the insulating films 214, 216, and 218 function as second gate insulating films of the transistor 250. Furthermore, the conductive film 220a in the transistor 250 functions as, for example, a pixel electrode used for a display device. The conductive film 220a is connected to the conductive film 212b through an opening 252c provided in the insulating films 214, 216, and 218. The conductive film 220b in the transistor 250 functions as a second gate electrode (also referred to as a back gate electrode).

Figure 32B:
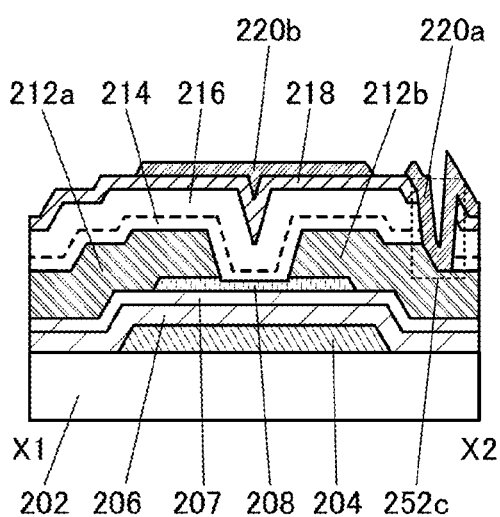
Figure 32C:
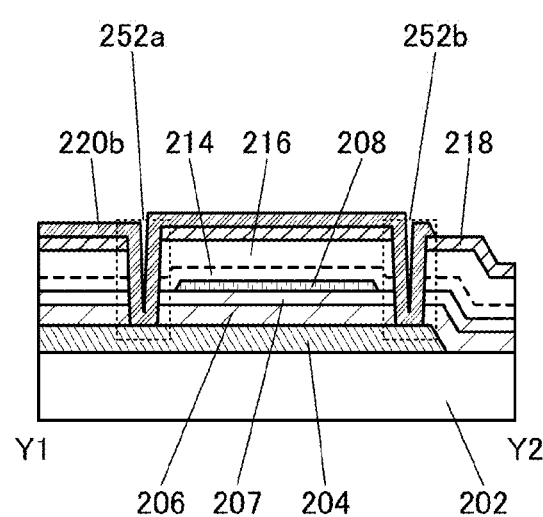

As illustrated in FIG. 32C, the conductive film 220b is connected to the conductive film 204 functioning as the first gate electrode through openings 252a and 252b provided in the insulating films 206, 207, 214, 216, and 218. Accordingly, the conductive film 220b and the conductive film 204 are supplied with the same potential.

Note that although the structure in which the openings 252a and 252b are provided so that the conductive film 220b and the conductive film 204 are connected to each other is described in this embodiment, one embodiment of the present invention is not limited thereto. For example, a structure in which only one of the openings 252a and 252b is provided so that the conductive film 220b and the conductive film 204 are connected to each other, or a structure in which the openings 252a and 252b are not provided and the conductive film 220b and the conductive film 204 are not connected to each other may be employed. Note that in the case where the conductive film 220b and the conductive film 204 are not connected to each other, it is possible to apply different potentials to the conductive film 220b and the conductive film 204.

As illustrated in FIG. 32B, the oxide semiconductor film 208 is positioned to face each of the conductive film 204 functioning as the first gate electrode and the conductive film 220b functioning as the second gate electrode, and is sandwiched between the two conductive films functioning as gate electrodes. The lengths in the channel length direction and the channel width direction of the conductive film 220b functioning as the second gate electrode are longer than those in the channel length direction and the channel width direction of the oxide semiconductor film 208. The whole oxide semiconductor film 208 is covered with the conductive film 220b with the insulating films 214, 216, and 218 positioned therebetween. Since the conductive film 220b functioning as the second gate electrode is connected to the conductive film 204 functioning as the first gate electrode through the openings 252a and 252b provided in the insulating films 206 and 207 and the insulating films 214, 216, and 218, a side surface of the oxide semiconductor film 208 in the channel width direction faces the conductive film 220b functioning as the second gate electrode with the insulating films 214, 216, and 218 positioned therebetween.

In other words, in the channel width direction of the transistor 250, the conductive film 204 functioning as the gate electrode and the conductive film 220b functioning as the second gate electrode are connected to each other through the openings provided in the insulating films 206 and 207 functioning as first gate insulating films and the insulating films 214, 216, and 218 functioning as second gate insulating films; and the conductive film 204 and the conductive film 220b surround the oxide semiconductor film 208 with the insulating films 206 and 207 functioning as the first gate insulating films and the insulating films 214, 216, and 218 functioning as the second gate insulating films positioned therebetween.

Such a structure enables the oxide semiconductor film 208 included in the transistor 250 to be electrically surrounded by electric fields of the conductive film 204 functioning as the first gate electrode and the conductive film 220b functioning as the second gate electrode. A device structure of a transistor, like that of the transistor 250, in which electric fields of a first gate electrode and a second gate electrode electrically surround an oxide semiconductor where a channel region is formed can be referred to as a surrounded channel (s-channel) structure.

Since the transistor 250 has the s-channel structure, an electric field for inducing a channel can be effectively applied to the oxide semiconductor film 208 by the conductive film 204 functioning as the first gate electrode; therefore, the current drive capability of the transistor 250 can be improved and high on-state current characteristics can be obtained. Since the on-state current can be increased, it is possible to reduce the size of the transistor 250. In addition, since the transistor 250 has a structure in which the oxide semiconductor film 208 is surrounded by the conductive film 204 functioning as the first gate electrode and the conductive film 220b functioning as the second gate electrode, the mechanical strength of the transistor 250 can be increased.

<Structure Example 3 of Transistor>

A structure example different from that of the transistor 250 in FIGS. 32A to 32C is described with reference to FIGS. 33A to 33D.

Figure 33A:
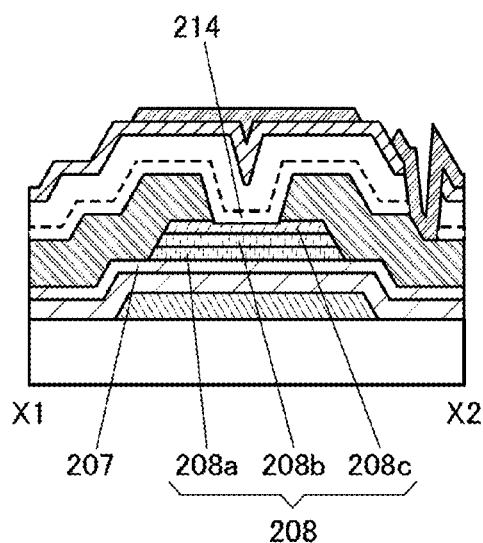
FIGS. 33A to 33D are cross-sectional views illustrating examples of transistors.
Figure 33B:
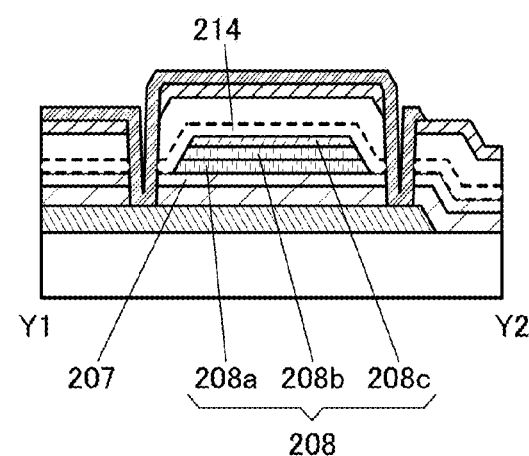
Figure 33C:
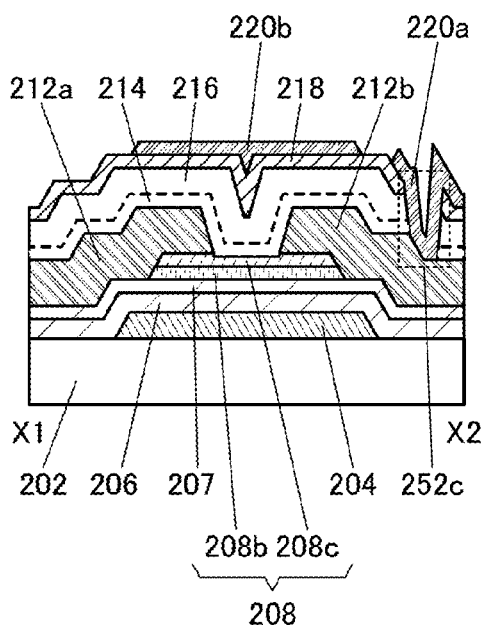
Figure 33D:
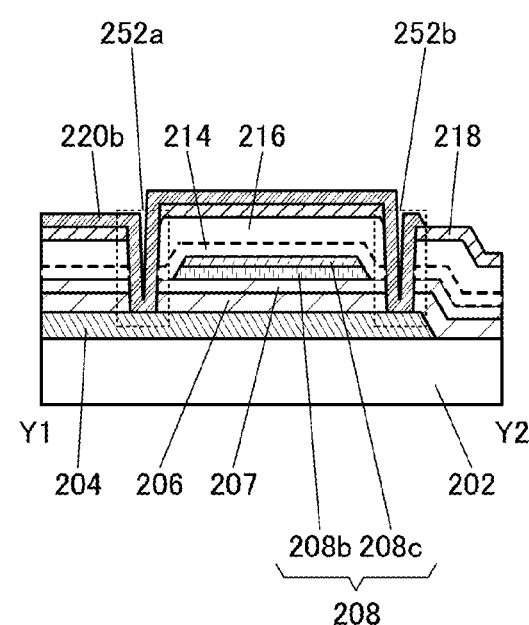

FIGS. 33A and 33B are cross-sectional views illustrating a variation of the transistor 250 in FIGS. 32B and 32C. FIGS. 33C and 33D are cross-sectional views illustrating another variation of the transistor 250 in FIGS. 32B and 32C.

A transistor 250A in FIGS. 33A and 33B has the same structure as the transistor 250 in FIGS. 32B and 32C except that the oxide semiconductor film 208 has a three-layer structure. Specifically, the oxide semiconductor film 208 of the transistor 250A includes an oxide semiconductor film 208a, an oxide semiconductor film 208b, and an oxide semiconductor film 208c.

A transistor 250B in FIGS. 33C and 33D has the same structure as the transistor 250 in FIGS. 32B and 32C except that the oxide semiconductor film 208 has a two-layer structure. Specifically, the oxide semiconductor film 208 of the transistor 250B includes the oxide semiconductor film 208b and the oxide semiconductor film 208c.

Here, a band structure including the oxide semiconductor film 208 and insulating films in contact with the oxide semiconductor film 208 is described with reference to FIGS. 45A and 45B. The oxide semiconductors S1, S2, and S3 in FIGS. 45A and 45B correspond to oxide semiconductors which can be used for the oxide semiconductor films 208a, 208b, and 208c, respectively. The insulators I1 and I2 correspond to insulators which can be used for the insulating films 207 and 214, respectively.

Figure 34A:
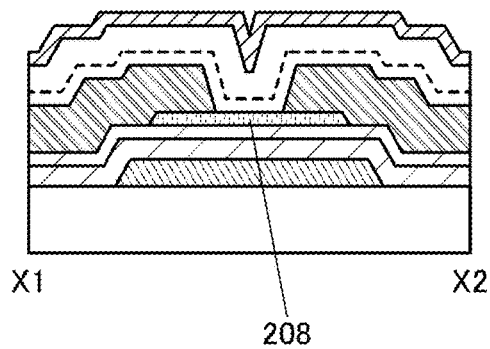
FIGS. 34A to 34D are cross-sectional views illustrating examples of transistors.
Figure 34B:
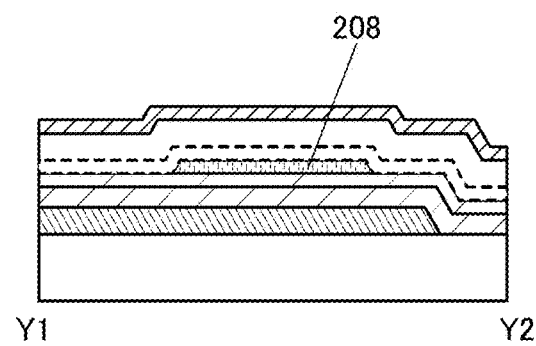
Figure 34C:
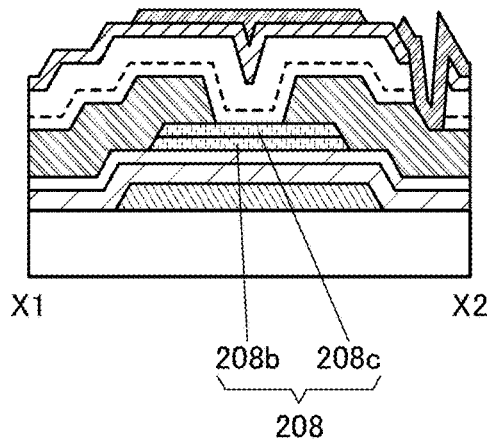
Figure 34D:
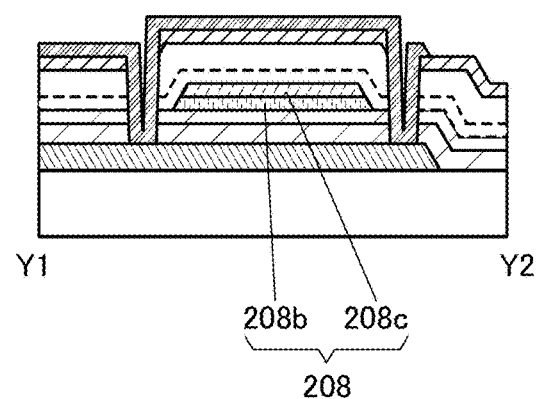

The drawings illustrate an example where the oxide semiconductor film 208 in the transistors 200 and 250 and the oxide semiconductor film 208c in the transistors 250A and 250B have a small thickness in a region which is not covered with the conductive films 212a and 212b, that is, an example where part of the oxide semiconductor film has a depressed portion. However, one embodiment of the present invention is not limited thereto, and the oxide semiconductor film does not necessarily have a depressed portion in a region which is not covered with the conductive films 212a and 212b. FIGS. 34A to 34D illustrate examples in that case. FIGS. 34A to 34D are cross-sectional views illustrating an example of the transistor. FIGS. 34A and 34B illustrate a structure where the oxide semiconductor film 208 in the transistor 200 does not have a depressed portion, and FIGS. 34C and 34D illustrate a structure where the oxide semiconductor film 208 in the transistor 250B does not have a depressed portion.

<Structure Example 4 of Transistor>

A structure example different from that of the transistor 200 in FIGS. 31A to 31C is described with reference to FIGS. 35A to 35C.

Figure 35A:
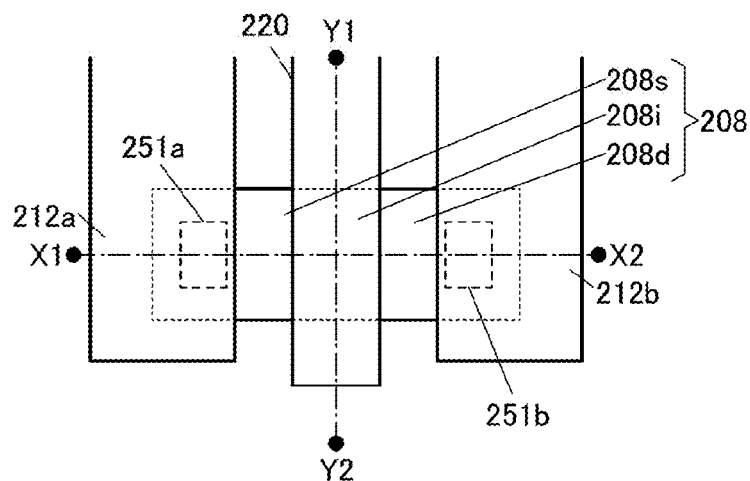
FIGS. 35A to 35C are a top view and cross-sectional views illustrating an example of a transistor.

FIG. 35A is a top view of a transistor 260 which can be used in a display device of one embodiment of the present invention. FIG. 35B is a cross-sectional view taken along the dashed dotted line X1-X2 in FIG. 35A. FIG. 35C is a cross-sectional view taken along the dashed dotted line Y1-Y2 in FIG. 35A.

The transistor 260 includes the insulating film 206 over the substrate 202, the oxide semiconductor film 208 over the insulating film 206, the insulating film 214 over the oxide semiconductor film 208, a conductive film 220 serving as a gate electrode over the insulating film 214, and the insulating film 216 over the insulating film 206, the oxide semiconductor film 208, and the conductive film 220. The oxide semiconductor film 208 has a channel region 208i overlapping with the conductive film 220 and in contact with the insulating film 214, a source region 208s in contact with the insulating film 216, and a drain region 208d in contact with the insulating film 216.

In addition, the transistor 260 includes the insulating film 218 over the insulating film 216, the conductive film 212a electrically connected to the oxide semiconductor film 208 in the source region 208s via an opening 251a which is provided in the insulating films 216 and 218, and the conductive film 212b electrically connected to the oxide semiconductor film 208 in the drain region 208d via an opening 251b which is provided in the insulating films 216 and 218.

The transistor 260 preferably has a region in which a side end portion of the insulating film 214 is aligned with a side end portion of the conductive film 220. In other words, in the transistor 260, an upper end portion of the insulating film 214 is substantially aligned with a lower end portion of the conductive film 220. The above structure can be obtained by processing the insulating film 214 with the use of the conductive film 220 as a mask, for example. The other structures are the same as those of the transistor 200 and a similar effect can be obtained.

<Structure Example 5 of Transistor>

Figure 35B:
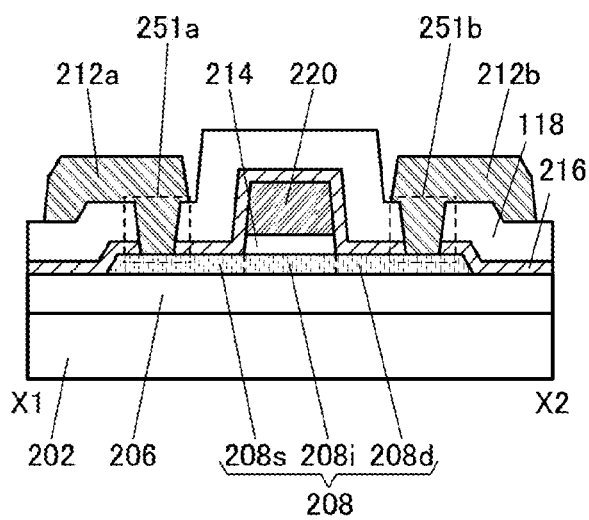
Figure 35C:
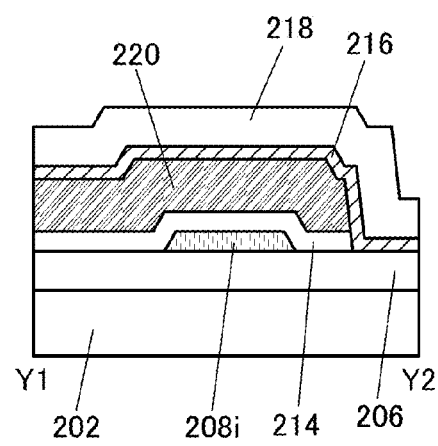

Next, a structure example different from that of the transistor 260 in FIGS. 35A to 35C are described with reference to FIGS. 36A to 36C.

Figure 36A:
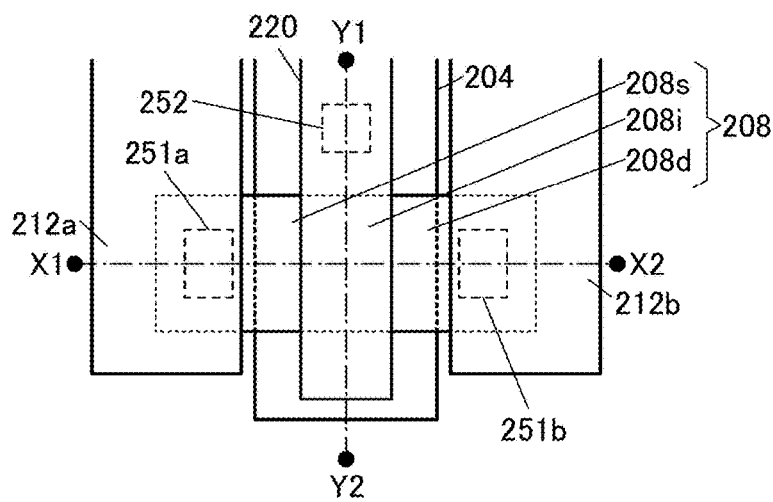
FIGS. 36A to 36C are a top view and cross-sectional views illustrating an example of a transistor.
Figure 36B:
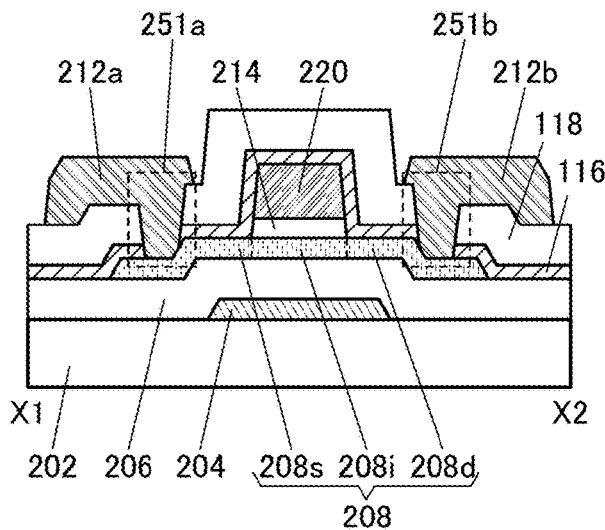
Figure 36C:
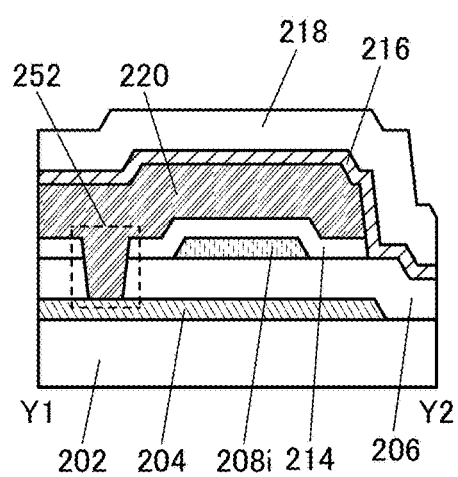

FIG. 36A is a top view of a transistor 270 which can be used in a display device of one embodiment of the present invention. FIG. 36B is a cross-sectional view taken along dashed-dotted line X1-X2 in FIG. 36A, and FIG. 36C is a cross-sectional view taken along dashed-dotted line Y1-Y2 in FIG. 36A.

The transistor 270 includes the conductive film 204 serving as a first gate electrode (also referred to as bottom gate electrode) over the substrate 202, the insulating film 206 over the substrate 202 and the conductive film 204, the oxide semiconductor film 208 over the insulating film 206, the insulating film 214 over the oxide semiconductor film 208, the conductive film 220 serving as a second gate electrode (also referred to as top gate electrode) over the insulating film 214, and the insulating film 216 over the insulating film 206, the oxide semiconductor film 208, and the conductive film 220. The oxide semiconductor film 208 has the channel region 208i overlapping with the conductive film 220 and in contact with the insulating film 214, the source region 208s in contact with the insulating film 216, and the drain region 208d in contact with the insulating film 216.

The transistor 270 includes the insulating film 218 over the insulating film 216, the conductive film 212a electrically connected to the oxide semiconductor film 208 in the source region 208s via an opening 251a which is provided in the insulating films 216 and 218, and the conductive film 212b electrically connected to the oxide semiconductor film 208 in the drain region 208d via an opening 251b which is provided in the insulating films 216 and 218.

In the transistor 270, the conductive films 204 and 220 are electrically connected via the opening 252 provided in the insulating films 206 and 214. Accordingly, the same potential is applied to the conductive films 204 and 220. In other words, the transistor 270 is a transistor having a surrounded channel (s-channel) structure in which electric fields of a first gate electrode and a second gate electrode electrically surround an oxide semiconductor film where a channel region is formed.

Since the transistor 270 has the s-channel structure, an electric field for inducing a channel can be effectively applied to the oxide semiconductor film 208 by the conductive film 204 functioning as a first gate electrode; therefore, the current drive capability of the transistor 270 can be improved and high on-state current characteristics can be obtained. Since the on-state current can be increased, it is possible to reduce the size of the transistor 270. In addition, since the transistor 270 is surrounded by the conductive film 204 functioning as a first gate electrode and the conductive film 220 functioning as a second gate electrode, the mechanical strength of the transistor 270 can be increased. The other components are the same as those of the transistor 260 and have similar functions as those in the transistor 260.

<Structure Example 6 of Transistor>

Next, a structure example different from that of the transistor 200 in FIGS. 31A to 31C is described with reference to FIGS. 37A to 37C.

Figure 37A:
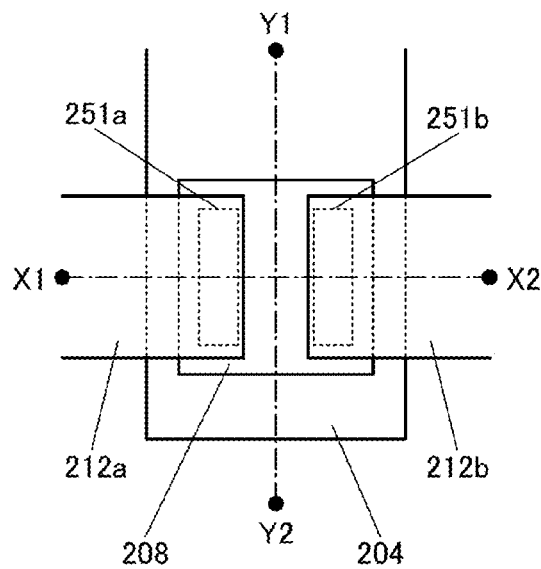
FIGS. 37A to 37C are a top view and cross-sectional views illustrating an example of a transistor.

FIG. 37A is a top view of a transistor 280 that can be used in a display device of one embodiment of the present invention. FIG. 37B is a cross-sectional view taken along a dashed-dotted line X1-X2 in FIG. 37A. FIG. 37C is a cross-sectional view taken along a dashed-dotted line Y1-Y2 in FIG. 37A.

The transistor 280 includes the conductive film 204 functioning as a gate electrode over the substrate 202, the insulating film 206 over the substrate 202 and the conductive film 204, the insulating film 207 over the insulating film 206, the oxide semiconductor film 208 over the insulating film 207, the insulating films 214 and 216 over the oxide semiconductor film 208, the conductive film 212a functioning as a source electrode electrically connected to the oxide semiconductor film 208 through an opening 251a provided in the insulating films 214 and 216, and the conductive film 212b functioning as a drain electrode electrically connected to the oxide semiconductor film 208 through an opening 251b provided in the insulating films 214 and 216. Over the transistor 280, specifically over the conductive films 212a and 212b and the insulating film 216, the insulating film 218 is provided. The insulating films 214 and 216 function as protective insulating films for the oxide semiconductor film 208. The nitride insulating film 218 functions as a protective insulating film for the transistor 280.

Figure 37B:
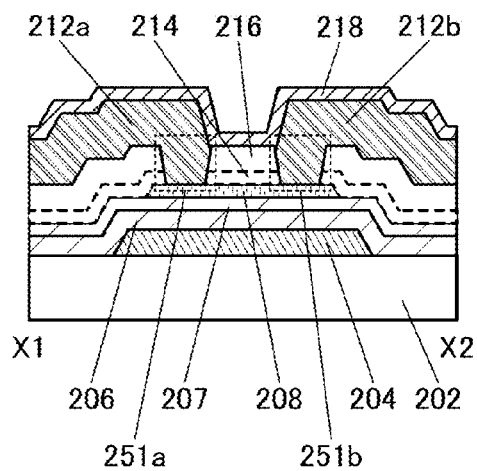
Figure 37C:
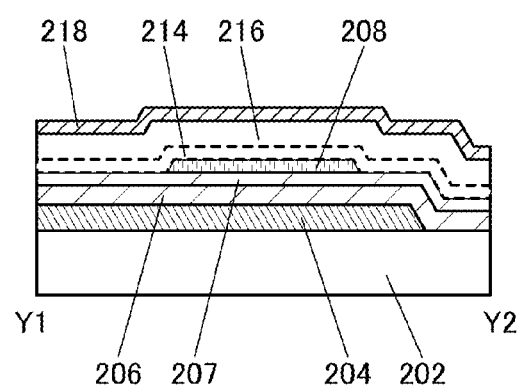

Although the transistor 200 has a channel-etched structure, the transistor 280 in FIGS. 37A to 37C has a channel-protective structure. In this manner, the oxide semiconductor film according to one embodiment of the present invention can be applied to various transistors. The other structures are the same as those of the transistor 200 and a similar effect can be obtained.

<Structure Example 7 of Transistor>

Next, a structure example different from that of the transistor 280 in FIGS. 37A to 37C is described with reference to FIGS. 38A to 38C.

Figure 38A:
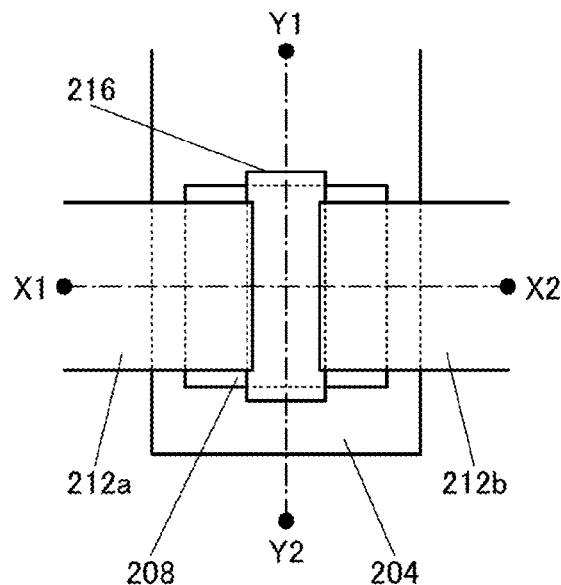
FIGS. 38A to 38C are a top view and cross-sectional views illustrating an example of a transistor.
Figure 38B:
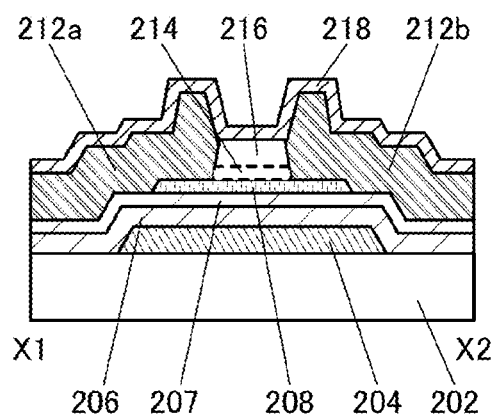
Figure 38C:
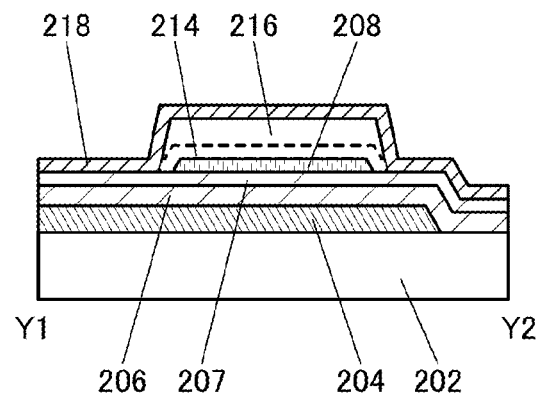

FIG. 38A is a top view of a transistor 290 that can be used in a display device of one embodiment of the present invention. FIG. 38B is a cross-sectional view taken along a dashed-dotted line X1-X2 in FIG. 38A. FIG. 38C is a cross-sectional view taken along a dashed-dotted line Y1-Y2 in FIG. 38A.

The transistor 290 includes the conductive film 204 functioning as a gate electrode over the substrate 202, the insulating film 206 over the substrate 202 and the conductive film 204, the insulating film 207 over the insulating film 206, the oxide semiconductor film 208 over the insulating film 207, the insulating films 214 and 216 over the oxide semiconductor film 208, the conductive film 212a functioning as a source electrode electrically connected to the oxide semiconductor film 208, and the conductive film 212b functioning as a drain electrode electrically connected to the oxide semiconductor film 208. Over the transistor 290, specifically over the conductive films 212a and 212b and the insulating film 216, the insulating film 218 is provided. The insulating films 214 and 216 function as protective insulating films for the oxide semiconductor film 208. The nitride insulating film 218 functions as a protective insulating film for the transistor 290.

The transistor 290 is different from the transistor 280 illustrated in FIGS. 37A to 37C in the shape of the insulating films 214 and 216. Specifically, the insulating films 214 and 216 of the transistor 290 have an island shape over a channel region of the oxide semiconductor film 208. The other components are the same as those of the transistor 280, and a similar effect is obtained.

The structures of the transistors of this embodiment can be freely combined with each other.

<Method for Manufacturing Transistor>

Next, a method for manufacturing the transistor of one embodiment of the present invention is described with reference to drawings.

The films included in the semiconductor device of one embodiment of the present invention (i.e., the conductive film, the insulating film, the oxide semiconductor film, and the like) can be formed by a sputtering method, a chemical vapor deposition (CVD) method, a plasma-enhanced CVD (PECVD) method, a vacuum evaporation method, or a pulsed laser deposition (PLD) method. However, the present invention is not limited thereto, and the films may be formed by a coating method, a printing method, a thermal CVD method, or an atomic layer deposition (ALD) method, for example. By a thermal CVD method such as a metal organic chemical vapor deposition (MOCVD) method, the conductive film, the insulating film, the oxide semiconductor film, and the like may be formed.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time while the pressure in the chamber is set to an atmospheric pressure or a reduced pressure, and the source gas and the oxidizer react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced when or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then, the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; thus, an ALD method makes it possible to adjust the film thickness accurately and thus is suitable for manufacturing a minute FET.

The above conductive films, insulating films, oxide semiconductor films, the metal oxide films, and the like can be formed by a thermal CVD method such as an MOCVD method. To form an In—Ga—Zn—O film, for example, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed with a deposition apparatus employing ALD, two kinds of gases, i.e., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on the surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed by a deposition apparatus using an ALD method, a $WF_6$ gas and a $B_2H_6$ gas are sequentially introduced a plurality of times to form an initial tungsten film, and then a $WF_6$ gas and an $H_2$ gas are introduced to form a tungsten film. Note that an $SiH_4$ gas may be used instead of a $B_2H_6$ gas.

For example, in the case where an oxide semiconductor film, e.g., an In—Ga—Zn—O film is formed with a deposition apparatus using an ALD method, an In(CH$_3$)$_3$ gas and an O$_3$ gas are sequentially introduced a plurality of times to form an In—O layer, a Ga(CH$_3$)$_3$ gas and an O$_3$ gas are introduced to form a Ga—O layer, and then a Zn(CH$_3$)$_2$ gas and an O$_3$ gas are introduced to form a Zn—O layer. Note that the order of these layers is not limited to this example. A mixed compound layer such as an In—Ga—O layer, an In—Zn—O layer, or a Ga—Zn—O layer may be formed by using these gases. Note that although an H$_2$O gas which is obtained by bubbling water with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ may be used. Instead of a Ga(CH$_3$)$_3$ gas, a Ga(C$_2$H$_5$)$_3$ gas may be used. Furthermore, Zn(CH$_3$)$_2$ gas may be used.

<<Method 1 for Manufacturing Transistor>>

First, a method for manufacturing the transistor 250B that is a transistor of one embodiment of the present invention, which is illustrated in FIGS. 33C and 33D, is described with reference to FIGS. 39 to 41. FIGS. 39A to 39F, FIGS. 40A to 40F, and FIGS. 41A to 41F are cross-sectional views illustrating a method for manufacturing a semiconductor device. FIGS. 39A, 39C, and 39E, FIGS. 40A, 40C, and 40E, and FIGS. 41A, 41C, and 41E are cross-sectional views in the channel length direction, and FIGS. 39B, 39D, and 39F, FIGS. 40B, 40D, and 40F, and FIGS. 41B, 41D, and 41F are cross-sectional views in the channel width direction.

First, a conductive film is formed over the substrate 202 and processed through a lithography process and an etching process, whereby the conductive film 204 functioning as a gate electrode is formed. Then, the insulating films 206 and 207 functioning as gate insulating films are formed over the conductive film 204 (see FIGS. 39A and 39B).

In this embodiment, a glass substrate is used as the substrate 202, and as the conductive film 204 functioning as a gate electrode, a 100-nm-thick tungsten film is formed by a sputtering method. A 400-nm-thick silicon nitride film as the insulating film 206 and a 50-nm-thick silicon oxynitride film as the insulating film 207 are formed by a PECVD method.

The insulating film 206 can have a stacked-layer structure of silicon nitride films. Specifically, the insulating film 206 can have a three-layer stacked-layer structure of a first silicon nitride film, a second silicon nitride film, and a third silicon nitride film. An example of the three-layer stacked-layer structure can be formed as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and a power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can be each formed at a substrate temperature of 350° C. or lower.

When the insulating film 206 has the three-layer stacked-layer structure of silicon nitride films, for example, in the case where a conductive film containing copper (Cu) is used as the conductive film 204, the following effect can be obtained.

The first silicon nitride film can inhibit diffusion of a copper (Cu) element from the conductive film 204. The second silicon nitride film has a function of releasing hydrogen and can improve withstand voltage of the insulating film serving as a gate insulating film. The third silicon nitride film releases a small amount of hydrogen and can inhibit diffusion of hydrogen released from the second silicon nitride film.

The insulating film 207 is preferably an insulating film containing oxygen to improve characteristics of an interface with the oxide semiconductor film 208 (specifically the oxide semiconductor film 208b) formed later.

Figure 39A:
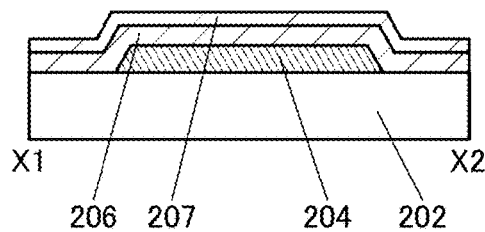
FIGS. 39A to 39F are cross-sectional views illustrating an example of a manufacturing process of a transistor.
Figure 39B:
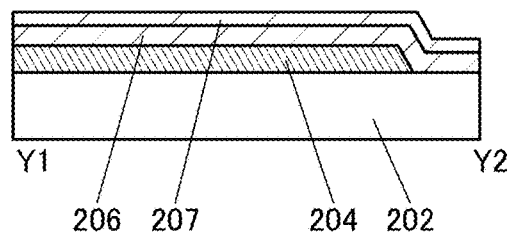
Figure 39C:
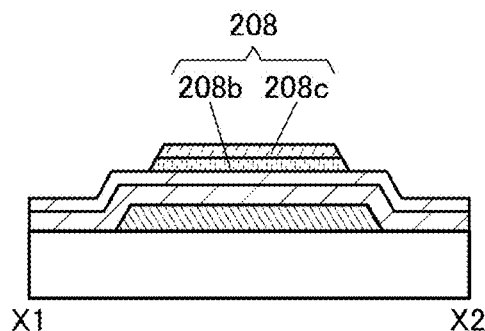
Figure 39D:
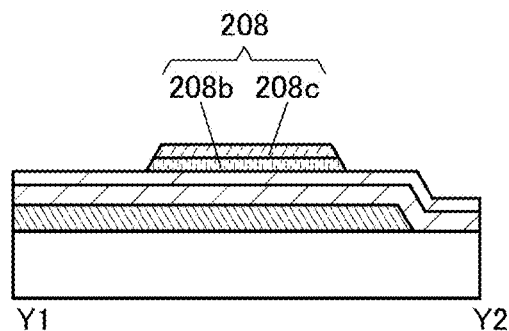

Next, a stacked-layer film of oxide semiconductors is formed over the insulating film 207 and is processed into a desired shape, so that the island-shaped oxide semiconductor film 208 including the oxide semiconductor film 208b and the oxide semiconductor film 208c is formed (see FIGS. 39C and 39D).

The oxide semiconductor film 208 is formed at a temperature higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C. The oxide semiconductor film 208 is formed while being heated, so that the crystallinity of the oxide semiconductor film 208 can be increased. On the other hand, in the case where a large-sized glass substrate (e.g., the 6th generation to the 10th generation) is used as the substrate 202 and the oxide semiconductor film 208 is formed at a temperature higher than or equal to 150° C. and lower than 340° C., the substrate 202 might be changed in shape (distorted or warped). In the case where a large-sized glass substrate is used, the change in the shape of the glass substrate can be suppressed by forming the oxide semiconductor film 208 at a temperature higher than or equal to 100° C. and lower than 150° C.

The oxide semiconductor films 208b and 208c may be formed at the same substrate temperature or different substrate temperatures. Note that the oxide semiconductor films 208b and 208c are preferably formed at the same substrate temperature, in which case the manufacturing cost can be reduced.

In this embodiment, an oxide semiconductor to be the oxide semiconductor film 208b is deposited by a sputtering method using an In—Ga—Zn metal oxide target (having an atomic ratio of [In]:[Ga]:[Zn]=4:2:4.1), and an oxide semiconductor to be the oxide semiconductor film 208c is successively deposited in a vacuum by a sputtering method using an In—Ga—Zn metal oxide target (having an atomic ratio of [In]:[Ga]:[Zn]=1:1:1.2). The substrate temperature during the deposition of the oxide semiconductor to be the oxide semiconductor film 208 is 170° C. Oxygen and argon are used as deposition gases for the oxide semiconductor to be the oxide semiconductor film 208.

In the case where the oxide semiconductor is deposited by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. In addition, increasing the purity of a sputtering gas is necessary. For example, when a gas which is highly purified to have a dew point of −40° C. or lower, preferably −80° C. or lower, further preferably −100° C. or lower, still further preferably −120° C. or lower, is used as a sputtering gas, i.e., the oxygen gas or the argon gas, entry of moisture or the like into the oxide semiconductor can be minimized.

In the case where the oxide semiconductor is deposited by a sputtering method, the sputtering gas containing oxygen is preferably used. When the oxide semiconductor is deposited using the sputtering gas containing oxygen, oxygen can be added to a film under the oxide semiconductor (here, the insulating film 207) at the same time as the deposition of the oxide semiconductor. Therefore, an oxygen-excess region can be provided in the insulating film 207.

In the case where the oxide semiconductor is deposited by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor, as much as possible. Alternatively, a turbo molecular pump and a cold trap are preferably combined so as to prevent a backflow of a gas, especially a gas containing carbon or hydrogen from an exhaust system to the inside of the chamber.

Figure 39E:
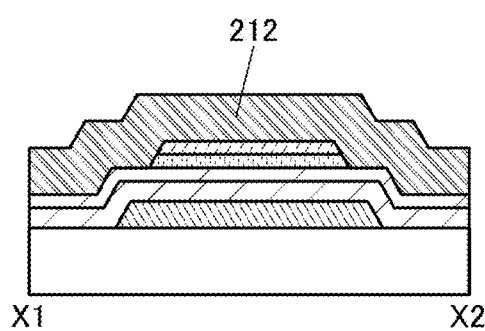
Figure 39F:
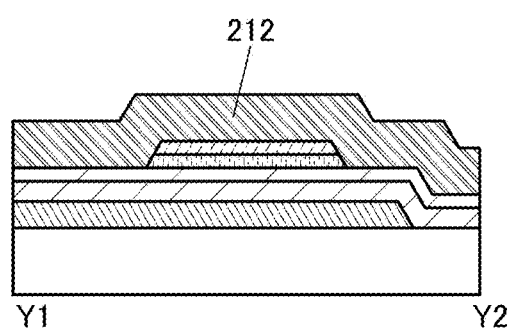

Next, a conductive film 212 to be the source electrode and the drain electrode is formed over the insulating film 207 and the oxide semiconductor film 208 by a sputtering method (see FIGS. 39E and 39F).

In this embodiment, a stacked-layer film in which a 50-nm-thick tungsten film and a 400-nm-thick aluminum film are sequentially stacked is formed as the conductive film 212 by a sputtering method. Although the conductive film 212 has a two-layer structure in this embodiment, one embodiment of the present invention is not limited thereto. For example, the conductive film 212 may have a three-layer structure in which a 50-nm-thick tungsten film, a 400-nm-thick aluminum film, and a 100-nm-thick titanium film are sequentially stacked.

Figure 40A:
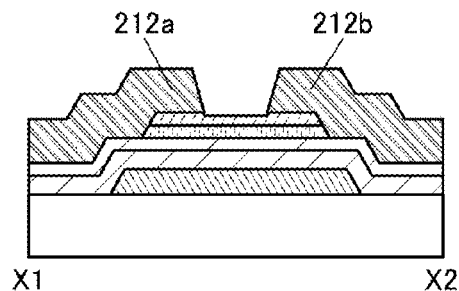
FIGS. 40A to 40F are cross-sectional views illustrating an example of a manufacturing process of a transistor.
Figure 40B:
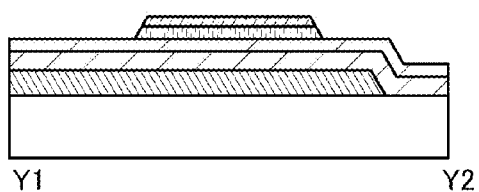

Next, the conductive film 212 is processed into desired shapes, so that the separate conductive films 212a and 212b are formed (see FIGS. 40A and 40B).

In this embodiment, the conductive film 212 is processed with a dry etching apparatus. Note that the method for processing the conductive film 212 is not limited thereto, and a wet etching apparatus may be used, for example. The conductive film 212 can be processed into a finer pattern with a dry etching apparatus than with a wet etching apparatus. On the other hand, the conductive film 212 can be processed at lower manufacturing cost with a wet etching apparatus than with a dry etching apparatus.

After the conductive films 212a and 212b are formed, a surface (on the back channel side) of the oxide semiconductor film 208 (specifically, the oxide semiconductor film 208c) may be cleaned. The cleaning may be performed, for example, using a chemical solution such as phosphoric acid. The cleaning using a chemical solution such as a phosphoric acid can remove impurities (e.g., an element included in the conductive films 212a and 212b) attached to the surface of the oxide semiconductor film 208c. Note that the cleaning is not necessarily performed, and thus the cleaning may be unnecessary.

In the step of forming the conductive films 212a and 212b and/or the cleaning step, the thickness of a region of the oxide semiconductor film 208 which is not covered by the conductive films 212a and 212b might be reduced. For example, a region where the oxide semiconductor film 208c has a smaller thickness than the oxide semiconductor film 208b is formed in some cases.

Figure 40C:
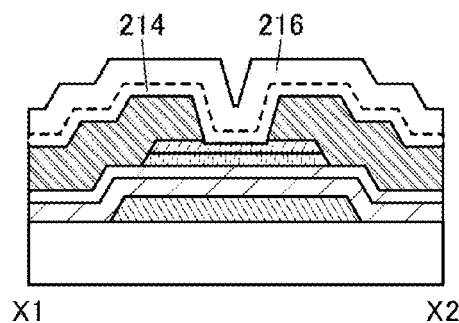
Figure 40D:
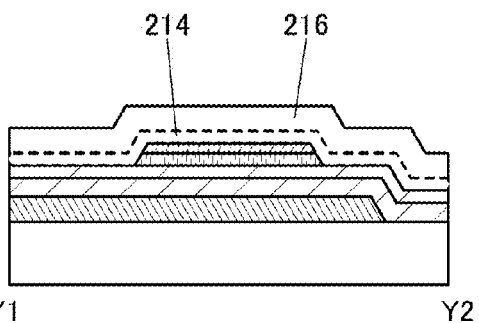

Next, the insulating films 214 and 216 are formed over the oxide semiconductor film 208 and the conductive films 212a and 212b (see FIGS. 40C and 40D).

Note that after the insulating film 214 is formed, the insulating film 216 is preferably formed in succession without exposure to the air. After the insulating film 214 is formed, the insulating film 216 is formed in succession without exposure to the air while at least one of the flow rate of a source gas, pressure, a high-frequency power, and a substrate temperature is adjusted, whereby the concentration of impurities attributed to the atmospheric component at the interface between the insulating film 214 and the insulating film 216 can be reduced and oxygen in the insulating films 214 and 216 can be moved to the oxide semiconductor film 208; accordingly, the amount of oxygen vacancies in the oxide semiconductor film 208 can be reduced.

As the insulating film 214, a silicon oxynitride film can be formed by a PECVD method, for example. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small amount of defects can be formed as the insulating film 214 by a PECVD method under the conditions where the flow rate of the oxidizing gas is higher than 20 times and lower than 100 times, preferably higher than or equal to 40 times and lower than or equal to 80 times, that of the deposition gas; and the pressure in a treatment chamber is lower than 100 Pa, preferably lower than or equal to 50 Pa.

In this embodiment, a silicon oxynitride film is formed as the insulating film 214 by a PECVD method under the conditions where the substrate 202 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6\times10^{-2}$ W/cm$^2$ as the power density) is supplied to parallel-plate electrodes.

As the insulating film 216, a silicon oxide film or a silicon oxynitride film is formed under the following conditions: the substrate placed in a treatment chamber of the PECVD apparatus that is vacuum-evacuated is held at a temperature higher than or equal to 180° C. and lower than or equal to 350° C.; the pressure is greater than or equal to 100 Pa and less than or equal to 250 Pa, preferably greater than or equal to 100 Pa and less than or equal to 200 Pa with introduction of a source gas into the treatment chamber; and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 216, the high-frequency power having the above power density is supplied to a reaction chamber having the above pressure, whereby the decomposition efficiency of the source gas in plasma is increased, oxygen radicals are increased, and oxidation of the source gas is promoted; thus, the oxygen content in the insulating film 216 becomes higher than that in the stoichiometric composition. In addition, in the film formed at a substrate temperature within the above temperature range, the bond between silicon and oxygen is weak, and accordingly, part of oxygen in the film is released by heat treatment in a later step. Thus, it is possible to form an oxide insulating film whose oxygen content is higher than that in the stoichiometric composition and from which part of oxygen is released by heating.

Note that the insulating film 214 functions as a protective film for the oxide semiconductor film 208 in the step of forming the insulating film 216. Therefore, the insulating film 216 can be formed using the high-frequency power having a high power density while damage to the oxide semiconductor film 208 is reduced.

Note that in the deposition conditions of the insulating film 216, when the flow rate of the deposition gas containing silicon with respect to the oxidizing gas is increased, the amount of defects in the insulating film 216 can be reduced. As a typical example, it is possible to form an oxide insulating layer in which the amount of defects is small, i.e., the spin density corresponding to a signal which appears at g=2.001 due to a dangling bond of silicon is lower than $6\times10^{17}$ spins/cm$^3$, preferably lower than or equal to $3\times10^{17}$ spins/cm$^3$, further preferably lower than or equal to $1.5\times10^{17}$ spins/cm$^3$ by ESR measurement. As a result, the reliability of the transistor can be improved.

Heat treatment (hereinafter referred to as first heat treatment) is preferably performed after the insulating films 214 and 216 are formed. The first heat treatment can reduce nitrogen oxide contained in the insulating films 214 and 216. By the first heat treatment, part of oxygen contained in the insulating films 214 and 216 can be moved to the oxide semiconductor film 208, so that the amount of oxygen vacancies included in the oxide semiconductor film 208 can be reduced.

The temperature of the first heat treatment is typically lower than 400° C., preferably lower than 375° C., further preferably higher than or equal to 150° C. and lower than or equal to 350° C. The first heat treatment may be performed under an atmosphere of nitrogen, oxygen, ultra-dry air (air with a water content of 20 ppm or less, preferably 1 ppm or less, further preferably 10 ppb or less), or a rare gas (argon, helium, or the like). Note that an electric furnace, a rapid thermal annealing (RTA) apparatus, or the like can be used for the first heat treatment, in which it is preferable that hydrogen, water, and the like not be contained in the atmosphere of nitrogen, oxygen, ultra-dry air, or a rare gas.

Figure 40E:
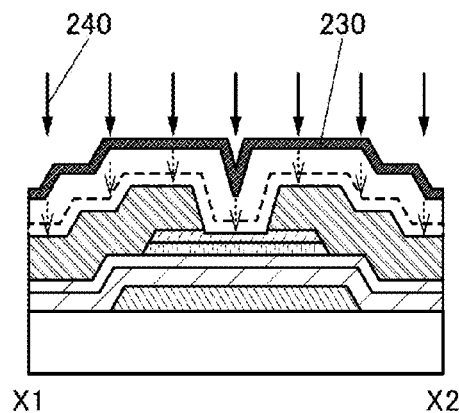
Figure 40F:
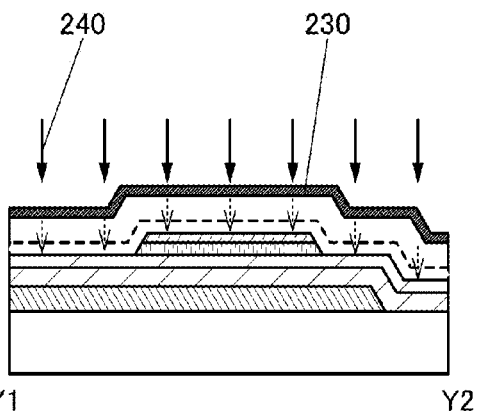

Next, a barrier film 230 is formed over the insulating film 216, and oxygen 240 is added to the insulating film 216, the insulating film 214, or the oxide semiconductor film 208 through the barrier film 230 (see FIGS. 40E and 40F).

In FIGS. 40E and 40F, oxygen added to the insulating film 214 or the insulating film 216 is schematically shown by arrows of broken lines.

The barrier film 230 is permeable to oxygen and inhibits release of oxygen. The barrier film 230 includes, for example, oxygen and metal (at least one element selected from indium, zinc, titanium, aluminum, tungsten, tantalum, molybdenum, hafnium, and yttrium). In particular, the barrier film 230 preferably includes ITO, ITSO, or indium oxide because an uneven surface can be favorably covered with such a material. Alternatively, as the barrier film 230, the above-described oxide semiconductor (having an atomic ratio of In:Ga:Zn=1:1:1, In:Ga:Zn=1:3:2, In:Ga:Zn=1:3:4, In:Ga:Zn=1:3:6, In:Ga:Zn=4:2:3, In:Ga:Zn=3:1:2, In:Ga:Zn=4:2:3, for example) may be used.

The barrier film 230 can be formed by a sputtering method. When the barrier film 230 is thin, oxygen release from the insulating film 216 to the outside is difficult to suppress in some cases. On the other hand, when the barrier film 230 is thick, oxygen cannot be favorably added to the insulating film 216 in some cases. Accordingly, the thickness of the barrier film 230 is preferably greater than or equal to 1 nm and less than or equal to 20 nm, or greater than or equal to 2 nm and less than or equal to 10 nm. In this embodiment, the barrier film 230 is a 5-nm-thick ITSO film.

Examples of the method for adding the oxygen 240 to the insulating film 216 through the barrier film 230 include an ion doping method, an ion implantation method, and a plasma treatment method. Depending on the apparatus or conditions for adding the oxygen 240, the oxygen 240 can be added to the insulating film 214 or the oxide semiconductor film 208 under the insulating film 216 in some cases. As the oxygen 240, excess oxygen, an oxygen radical, or the like can be used. The oxygen 240 can be effectively added to the insulating film 216 by application of a bias to the substrate side. For the bias, for example, an ashing apparatus is used, and the power density of a bias applied between a pair of electrodes included in the ashing apparatus can be greater than or equal to 1 W/cm$^2$ and less than or equal to 5 W/cm$^2$. By providing the barrier film 230 over the insulating film 216 and adding the oxygen 240, the barrier film 230 functions as a protective film for inhibiting release of oxygen from the insulating film 216. Thus, a larger amount of oxygen can be added to the insulating film 216.

After the oxygen 240 is added to the insulating film 216 through the barrier film 230, heat treatment (hereinafter referred to as second heat treatment) may be performed. The second heat treatment can be performed under conditions similar to those of the first heat treatment.

Figure 41A:
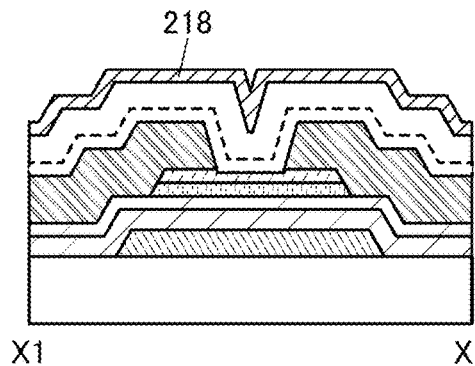
FIGS. 41A to 41F are cross-sectional views illustrating an example of a manufacturing process of a transistor.
Figure 41B:
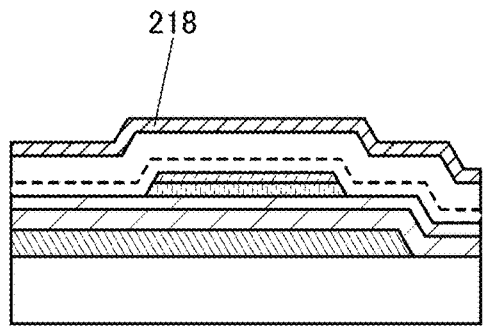
Figure 41C:
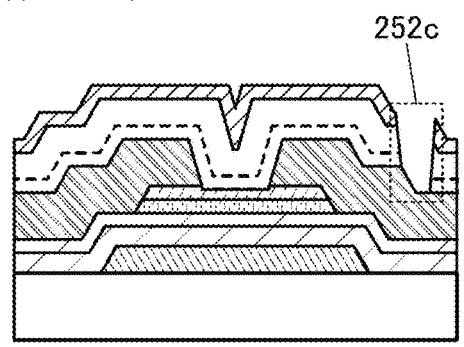
Figure 41D:
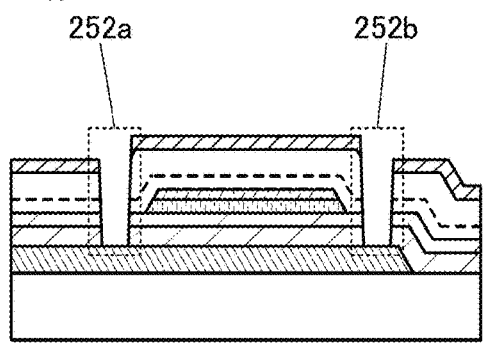

Next, the barrier film 230 is removed to expose a surface of the insulating film 216, and then, the insulating film 218 is formed over the insulating film 216 (see FIGS. 41A and 41B).

When the barrier film 230 is removed, part of the insulating film 216 is also removed in some cases. A method for removing the barrier film 230 is, for example, a dry etching method, a wet etching method, or a combination of a dry etching method and a wet etching method. In this embodiment, a wet etching method is used to remove the barrier film 230. A wet etching method is preferably used as the method for removing the barrier film 230 because of low manufacturing cost.

The insulating film 218 can be formed by a sputtering method or a PECVD method, for example. In the case where the insulating film 218 is formed by a PECVD method, for example, the substrate temperature is lower than 400° C., preferably lower than 375° C., further preferably higher than or equal to 180° C. and lower than or equal to 350° C. The substrate temperature at which the insulating film 218 is formed is preferably within the above range because a dense film can be formed. Furthermore, when the substrate temperature at which the insulating film 218 is formed is within the above range, oxygen or excess oxygen in the insulating films 214 and 216 can be moved to the oxide semiconductor film 208.

After the insulating film 218 is formed, heat treatment similar to the second heat treatment (hereinafter referred to as third heat treatment) may be performed. Through such heat treatment at lower than 400° C., preferably lower than 375° C., further preferably higher than or equal to 180° C. and lower than or equal to 350° C. after the addition of the oxygen 240 to the insulating film 216, oxygen or excess oxygen in the insulating film 216 can be moved to the oxide semiconductor film 208 (particularly, the oxide semiconductor film 208b) to fill oxygen vacancies in the oxide semiconductor film 208.

Figure 42A:
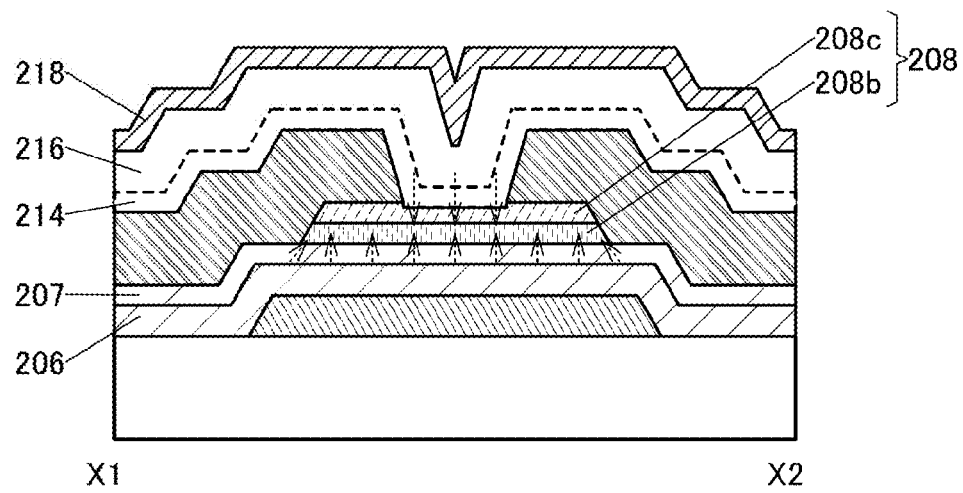
FIGS. 42A and 42B are model diagrams illustrating oxygen moving into an oxide semiconductor film.
Figure 42B:
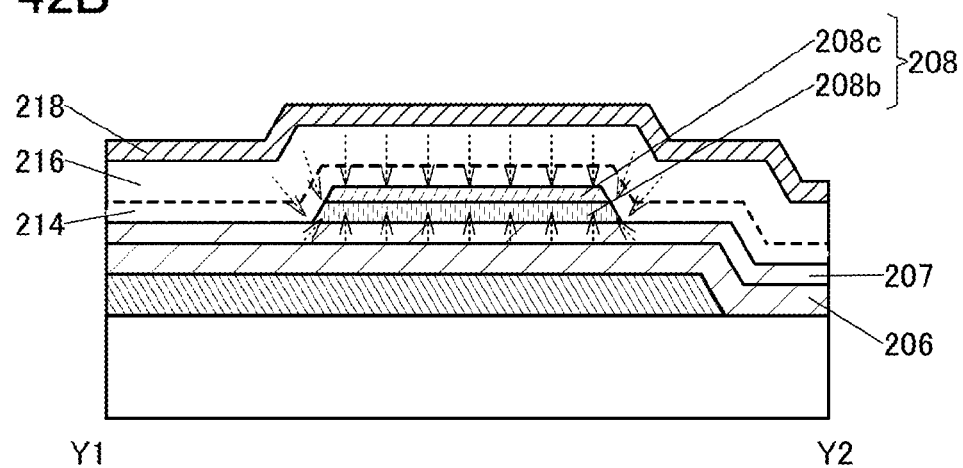

Oxygen moved into the oxide semiconductor film 208 is described with reference to FIGS. 42A and 42B. FIG. 42A is a cross-sectional view in the channel length direction and FIG. 42B is a cross-sectional view in the channel width direction. FIGS. 42A and 42B are model diagrams illustrating oxygen moved into the oxide semiconductor film 208 due to the substrate temperature at the time of forming the insulating film 218 (typically, lower than 375° C.) or the third heat treatment after the formation of the insulating film 218 (typically, lower than 375° C.). In FIGS. 42A and 42B, oxygen (oxygen radicals, oxygen atoms, or oxygen molecules) moved into the oxide semiconductor film 208 is shown by arrows of broken lines.

In the oxide semiconductor film 208 in FIGS. 42A and 42B, oxygen vacancies are filled with oxygen moved from films in contact with the oxide semiconductor film 208 (here, the insulating film 207 and the insulating film 214). Specifically, in the transistor of one embodiment of the present invention, the insulating film 207 includes an oxygen-excess region because an oxygen gas is used at the time of forming the oxide semiconductor film 208 by sputtering and oxygen is added to the insulating film 206. Since oxygen is added through the barrier film 230, the insulating films 214 and 216 also include an oxygen-excess region. In the oxide semiconductor film 208 between the insulating films including the oxygen-excess regions, oxygen vacancies can be favorably filled.

Furthermore, the insulating film 206 is provided under the insulating film 207, and the insulating film 218 is provided over the insulating films 214 and 216. When the insulating films 206 and 218 are formed using a material having low oxygen permeability, e.g., silicon nitride, oxygen contained in the insulating films 207, 214, and 216 can be confined to the oxide semiconductor film 208 side; thus, oxygen can be favorably moved to the oxide semiconductor film 208.

In the case where a silicon nitride film is formed by a PECVD method as the insulating film 218, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cut a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen are few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in a source gas, the flow rate of nitrogen is set to be preferably 5 times or more and 50 times or less, more preferably 10 times or more and 50 times or less the flow rate of ammonia.

In this embodiment, with the use of a PECVD apparatus, a 50-nm-thick silicon nitride film is formed as the insulating film 218 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and a high-frequency power of 1000 W is supplied to parallel-plate electrodes with a 27.12 MHz high-frequency power source. The PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Next, a mask is formed over the insulating film 218 through a lithography process, and the opening 252c is formed in a desired region in the insulating films 214, 216, and 218. In addition, a mask is formed over the insulating film 218 through a lithography process, and the openings 252a and 252b are formed in desired regions in the insulating films 206, 207, 214, 216, and 218. Note that the opening 252c reaches the conductive film 212b. The openings 252a and 252b reach the conductive film 204 (see FIGS. 41C and 41D).

Note that the openings 252a and 252b and the opening 252c may be formed in the same step or may be formed by different steps. In the case where the openings 252a and 252b and the opening 252c are formed in the same step, for example, a gray-tone mask or a half-tone mask can be used. Moreover, the openings 252a and 252b may be formed in a plurality of steps. For example, openings are formed in the insulating films 206 and 207 in advance, and then, openings are formed in the insulating films 214, 216, and 218 over the openings.

Figure 41E:
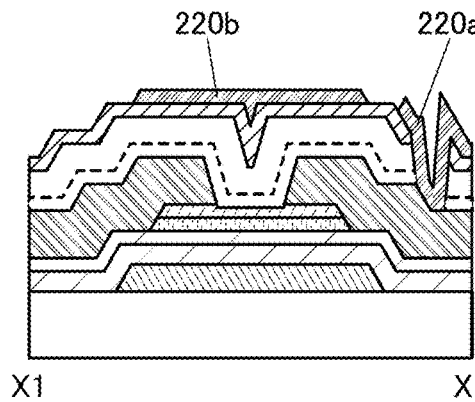
Figure 41F:
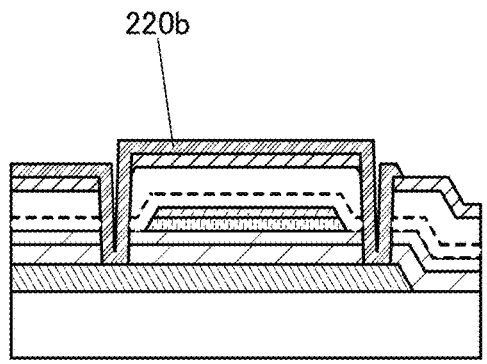

Next, a conductive film is formed over the insulating film 218 to cover the openings 252a, 252b, and 252c and processed into desired shapes, so that the conductive films 220a and 220b are formed (see FIGS. 41E and 41F).

For the conductive film to be the conductive films 220a and 220b, for example, a material including one of indium (In), zinc (Zn), and tin (Sn) can be used. In particular, for the conductive films 220a and 220b, a light-transmitting conductive material such as indium oxide including tungsten oxide, indium zinc oxide including tungsten oxide, indium oxide including titanium oxide, indium tin oxide including ITO, indium zinc oxide, or ITSO can be used. Moreover, the conductive film to be the conductive films 220a and 220b can be formed by a sputtering method, for example. In this embodiment, a 110-nm-thick ITSO film is formed by a sputtering method.

Through the above process, the transistor 250B illustrated in FIGS. 33C and 33D can be manufactured.

In the entire manufacturing process of the transistor 250B, the substrate temperature is preferably lower than 400° C., further preferably lower than 375° C., still further preferably higher than or equal to 180° C. and lower than or equal to 350° C. because a change in shape of the substrate (distortion or warp) can be reduced even when the substrate is a large-area substrate. Typical examples of high substrate temperatures in the manufacturing process of the transistor 250B are as follows: the substrate temperature at the time of forming the insulating films 206 and 207 (lower than 400° C., preferably higher than or equal to 250° C. and lower than or equal to 350° C.), the substrate temperature at the time of forming the oxide semiconductor film 208 (higher than or equal to room temperature and lower than 340° C., preferably higher than or equal to 100° C. and lower than or equal to 200° C., more preferably higher than or equal to 100° C. and lower than 150° C.), the substrate temperature at the time of forming the insulating films 216 and 218 (lower than 400° C., preferably lower than 375° C., more preferably higher than or equal to 180° C. and lower than or equal to 350° C.), and the substrate temperature at the time of the first heat treatment or the second heat treatment after the addition of the oxygen 240 (lower than 400° C., preferably lower than 375° C., more preferably higher than or equal to 180° C. and lower than or equal to 350° C.).

<<Method 2 for Manufacturing Transistor>>

A manufacturing method different from <<Method 1 for manufacturing transistor>> is described below.

First, steps up to the step illustrated in FIGS. 40C and 40D are performed in a similar manner to that of <<Method 1 for manufacturing transistor>>. Next, the barrier film 230 is formed as illustrated in FIGS. 40E and 40F, and the oxygen 240 is not added. Then, the step illustrated in FIGS. 41A and 41B is not performed, and the steps illustrated in FIGS. 41C and 41D and FIGS. 41E and 41F are performed.

In this case, for the barrier film 230, a material having a highly insulating property is selected from the above materials. For the barrier film 230 used in this manufacturing method, aluminum oxide, hafnium oxide, or yttrium oxide is preferably used.

When the barrier film 230 is formed by a sputtering method using aluminum oxide, hafnium oxide, or yttrium oxide, the sputtering gas preferably contains at least oxygen. Oxygen used for the sputtering gas in the formation of the barrier film 230 becomes oxygen radicals in plasma, and the oxygen and/or the oxygen radicals are added to the insulating film 216 in some cases. Therefore, the step of adding the oxygen 240 illustrated in FIGS. 40E and 40F is not necessarily performed. In other words, oxygen adding treatment and the formation of the barrier film 230 can be performed at the same time. Note that the barrier film 230 has a function of adding oxygen in the formation of the barrier film 230 (particularly in an early stage of the formation), whereas the barrier film 230 has a function of blocking oxygen after the formation of the barrier film 230 (particularly in a later stage of the formation).

In the case where the barrier film 230 is formed by a sputtering method using aluminum oxide, for example, a mixed layer might be formed in the vicinity of the interface between the insulating film 216 and the barrier film 230. For example, when the insulating film 216 is a silicon oxynitride film, an $Al_xSi_yO_z$ layer might be formed as the mixed layer. The mixed layer may include an oxygen-excess region.

When the barrier film 230 is formed using aluminum oxide, hafnium oxide, or yttrium oxide, which have a highly insulating property and a high oxygen barrier property, the step of forming the insulating film 218 illustrated in FIGS. 41A and 41B is not necessarily performed. Instead of the insulating film 218, the barrier film 230 may be used without being removed.

When the substrate temperature in the formation of the barrier film 230 is lower than 400° C., preferably lower than 375° C., further preferably higher than or equal to 180° C. and lower than or equal to 350° C., oxygen or excess oxygen added to the insulating film 216 can be moved into the oxide semiconductor film 208.

By using aluminum oxide, hafnium oxide, or yttrium oxide for the barrier film 230 as described above, the number of manufacturing steps of the transistor can be reduced, which leads to low manufacturing cost.

The structures and the methods described in this embodiment can be used in combination with any of the other structures and methods described in the other embodiments and examples as appropriate.

EMBODIMENT 3

In this embodiment, the structure and the like of an oxide semiconductor will be described with reference to FIGS. 46 to 50.

<Structure of Oxide Semiconductor>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 46A:
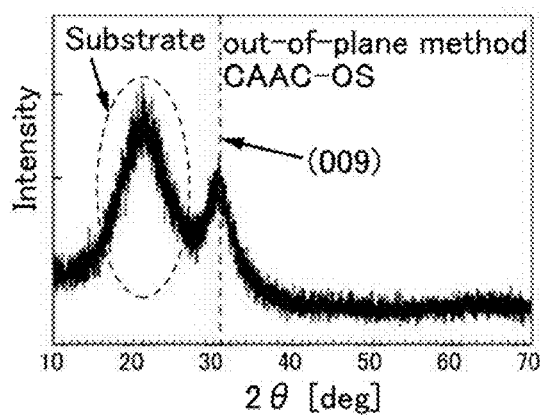
FIGS. 46A to 46E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 46A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 46B:
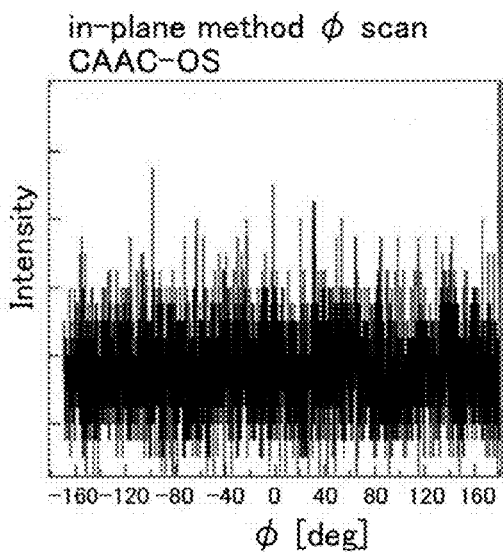
Figure 46C:
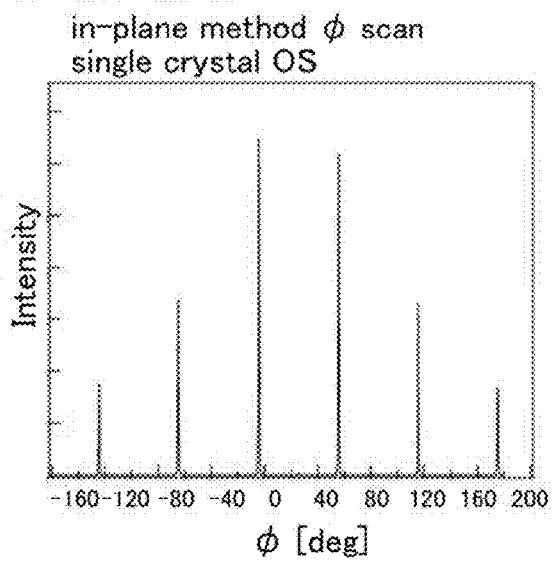
Figure 46D:
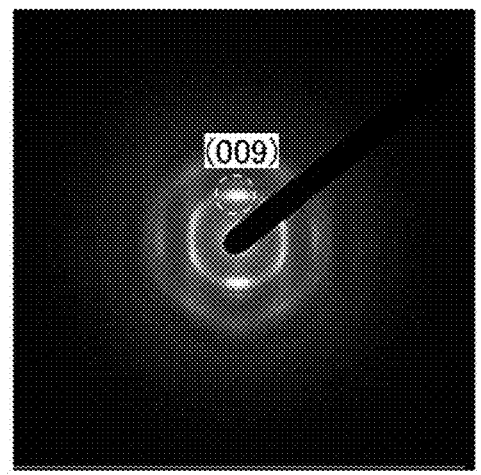

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 46B, a peak is not clearly observed. In contrast, in the case where single crystal InGaZnO$_4$ is subjected to φ scan with 2θ fixed at around 56°, as shown in FIG. 46C, six peaks that are derived from crystal planes equivalent to the (110) plane are observed. Accordingly, the structural analysis using XRD shows that the directions of a-axes and b-axes are irregularly oriented in the CAAC-OS.

Figure 46E:
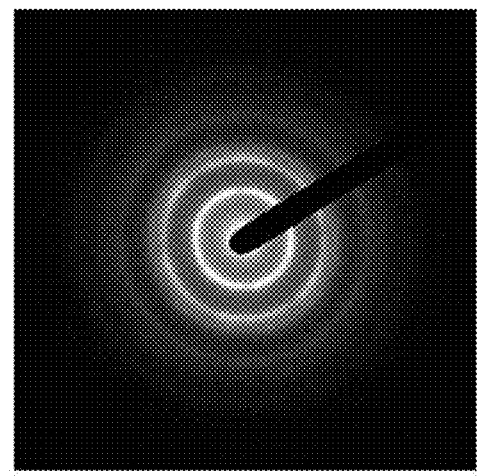

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 46D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 46E shows a diffraction pattern obtained in such a manner that an electron beam with a probe diameter of 300 nm is incident on the same sample in a direction perpendicular to the sample surface. As shown in FIG. 46E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 46E is considered to be derived from the (010) plane, the (100) plane, and the like of the InGaZnO$_4$ crystal. The second ring in FIG. 46E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 47A:
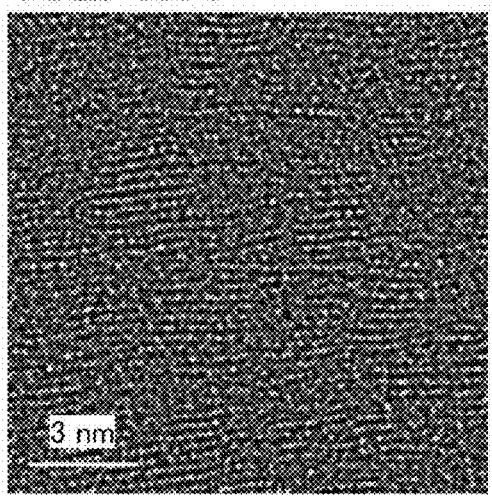
FIGS. 47A to 47E show a cross-sectional TEM image and plan-view TEM images of a CAAC-OS and images obtained through analysis thereof.

FIG. 47A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 47A shows pellets in which metal atoms are arranged in a layered manner. FIG. 47A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 47B:
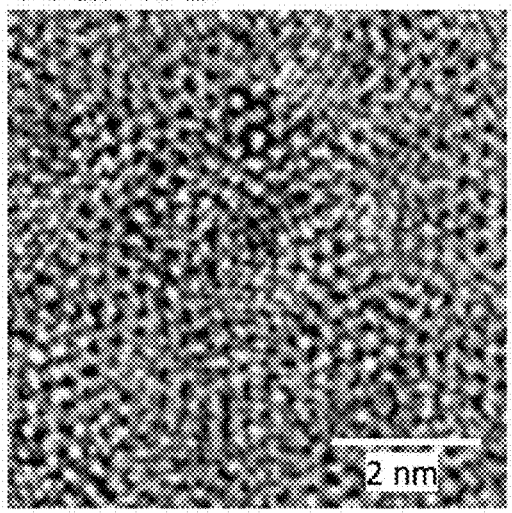
Figure 47C:
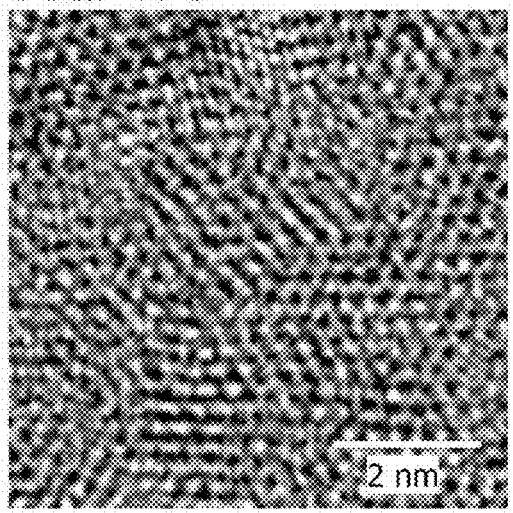
Figure 47D:
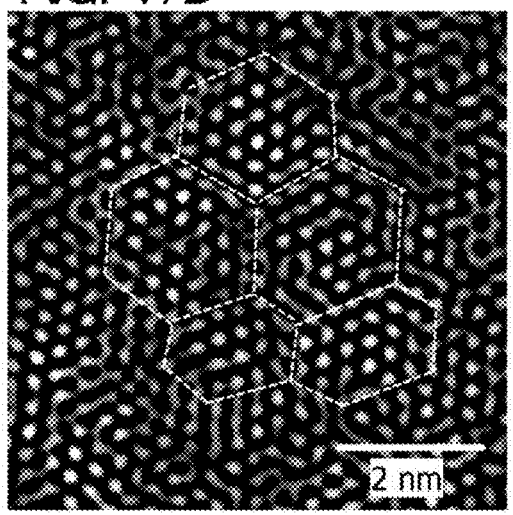
Figure 47E:
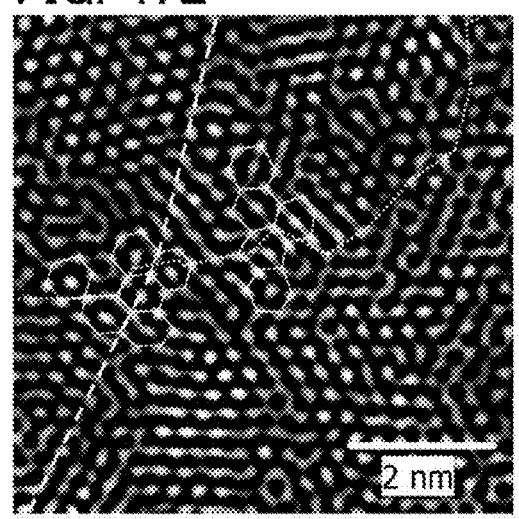

FIGS. 47B and 47C show Cs-corrected high-resolution TEM images of a plane of the CAAC-OS observed from a direction substantially perpendicular to the sample surface. FIGS. 47D and 47E are images obtained through image processing of FIGS. 47B and 47C. The method of image processing is as follows. The image in FIG. 47B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 47D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 47E, a dotted line denotes a portion where the direction of a lattice arrangement changes between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 48A:
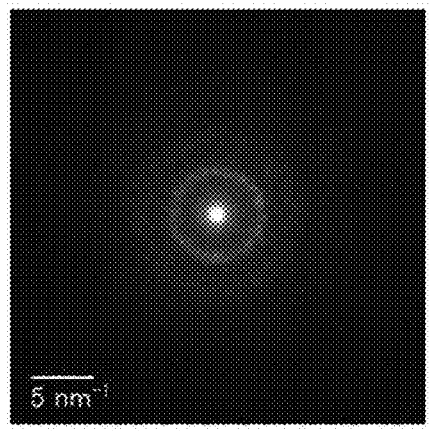
FIGS. 48A to 48D show electron diffraction patterns and a cross-sectional TEM image of an nc-OS.
Figure 48B:
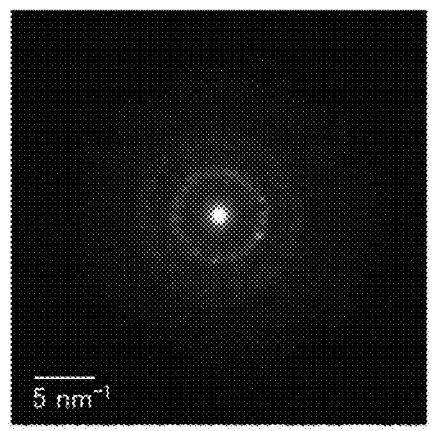

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 48A is observed. FIG. 48B shows a diffraction pattern obtained when an electron beam with a probe diameter of 1 nm is incident on the same sample. As shown in FIG. 48B, a plurality of spots are observed in a ring-like region. In other words, ordering in an nc-OS is not observed with an electron beam with a probe diameter of 50 nm but is observed with an electron beam with a probe diameter of 1 nm.

Figure 48C:
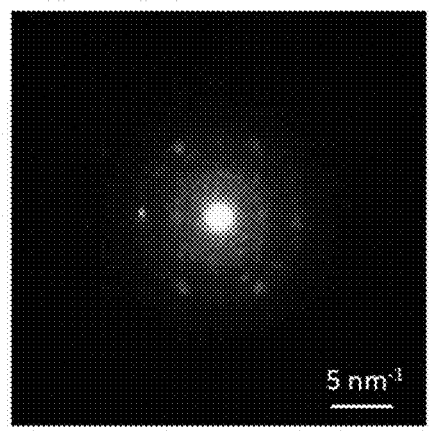

Furthermore, an electron diffraction pattern in which spots are arranged in a regular hexagonal shape is observed in some cases as shown in FIG. 48C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 48D:
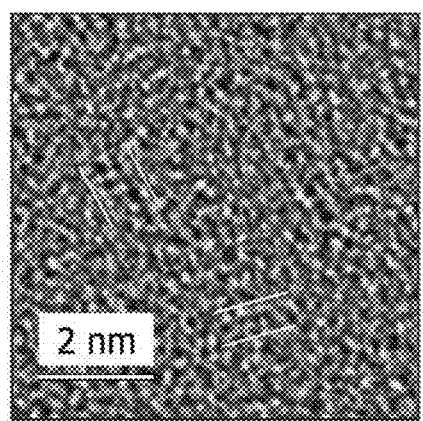

FIG. 48D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 48D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

Figure 49A:
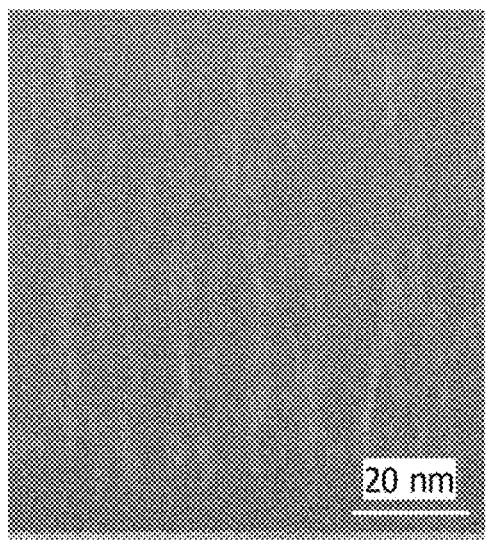
FIGS. 49A and 49B show cross-sectional TEM images of an a-like OS.
Figure 49B:
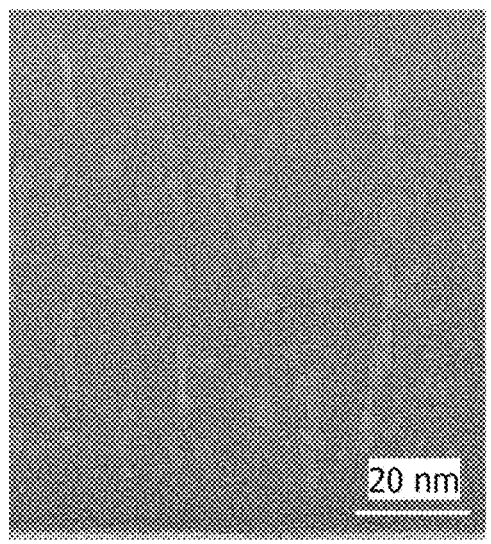

FIGS. 49A and 49B are high-resolution cross-sectional TEM images of an a-like OS. FIG. 49A is the high-resolution cross-sectional TEM image of the a-like OS at the start of the electron irradiation. FIG. 49B is the high-resolution cross-sectional TEM image of a-like OS after the electron (e) irradiation at $4.3\times10^8$ $e^-/nm^2$. FIGS. 49A and 49B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 50:
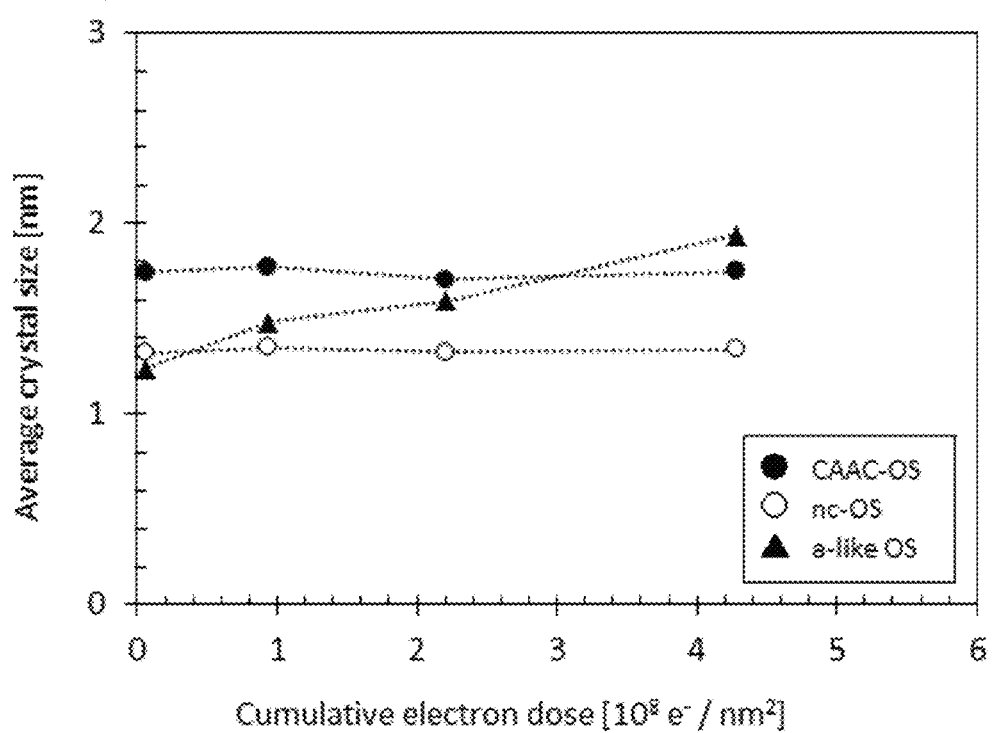
FIG. 50 shows changes in crystal parts of an In—Ga—Zn oxide induced by electron irradiation.

FIG. 50 shows a change in the average size of crystal parts (at 22 points to 30 points) in each sample. Note that the crystal part size corresponds to the length of a lattice fringe. FIG. 50 indicates that the crystal part size in the a-like OS increases with an increase in the cumulative electron dose in obtaining TEM images, for example. As shown in FIG. 50, a crystal part of approximately 1.2 nm (also referred to as an initial nucleus) at the start of TEM observation grows to a size of approximately 1.9 nm at a cumulative electron (e) dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e/nm^2$. As shown in FIG. 50, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:

Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm$^{-3}$, preferably lower than $1\times10^{11}$ cm$^{-3}$, and more preferably lower than $1\times10^{10}$ cm$^{-3}$ and higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, more preferably higher than or equal to $1\times10^7$ cm$^{-3}$ and lower than or equal to $1\times10^{17}$ cm$^{-3}$, still more preferably higher than or equal to $1\times10^9$ cm$^{-3}$ and lower than or equal to $5\times10^{16}$ cm$^{-3}$, yet more preferably higher than or equal to $1\times10^{10}$ cm$^{-3}$ and lower than or equal to $1\times10^{16}$ cm$^{-3}$, and yet still more higher than or equal to $1\times10^{11}$ cm$^{-3}$ and lower than or equal to $1\times10^{15}$ cm$^{-3}$.

The structure described in this embodiment can be used in combination with any of the structures described in the other embodiments and examples as appropriate.

EMBODIMENT 4

In this embodiment, a structure of an input/output device which includes a display device of one embodiment of the present invention will be described with reference to FIG. 51.

<Structure Example of Input/Output Device>

Figure 51:
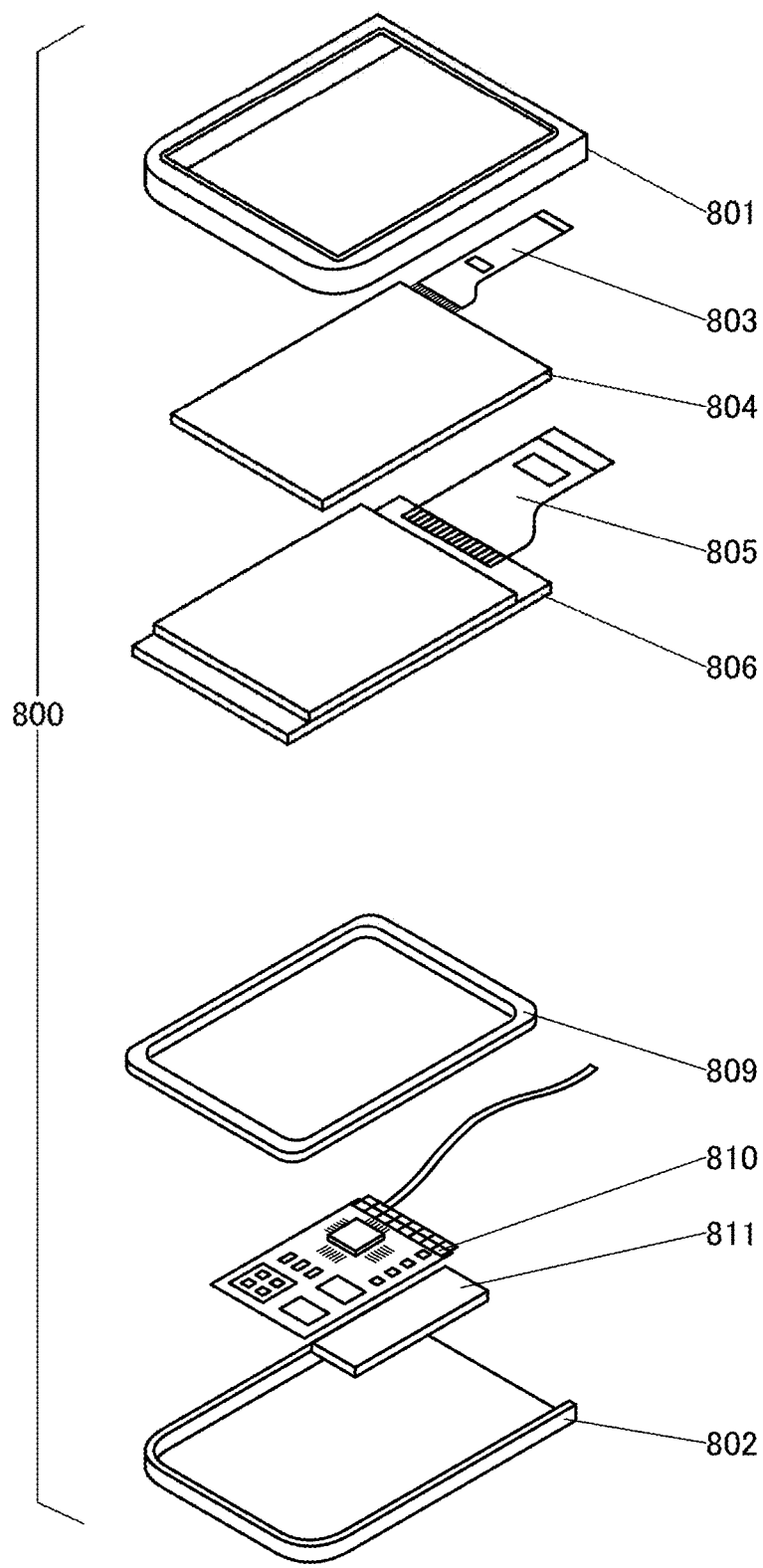
FIG. 51 illustrates a structure of an input/output device of one embodiment of the present invention.

FIG. 51 is an exploded view of a structure of an input/output device 800.

The input/output device 800 includes a display device 806 and a touch sensor 804 having a region overlapping with the display device 806. Note that the input/output device 800 can be referred to as a touch panel.

The input/output device 800 is provided with a driver circuit 810 for driving the touch sensor 804 and the display device 806, a battery 811 for supplying power to the driver circuit 810, and a housing where the touch sensor 804, the display device 806, the driver circuit 810, and the battery 811 are stored.

<<Touch Sensor 804>>

The touch sensor 804 includes a region overlapping with the display device 806. Note that an FPC 803 is electrically connected to the touch sensor 804.

For the touch sensor 804, a resistive touch sensor, a capacitive touch sensor, or a touch sensor using a photoelectric conversion element can be used, for example.

Note that the touch sensor 804 may be used as part of the display device 806.

<<Display Device 806>>

For example, the display device described in Embodiment 1 can be used as the display device 806. Note that an FPC 805 or the like is electrically connected to the display device 806.

<<Driver Circuit 810>>

As the driver circuit 810, a power supply circuit or a signal processing circuit can be used, for example. Power supplied to the battery or an external commercial power supply can be utilized.

The signal processing circuit has a function of outputting a video signal, a clock signal, and the like.

The power supply circuit has a function of supplying predetermined power.

<<Housing>>

An upper cover 801, a lower cover 802 which fits the upper cover 801, and a frame 809 which is stored in a region surrounded by the upper cover 801 and the lower cover 802 can be used for the housing, for example.

The frame 809 has a function of protecting the display device 806, a function of blocking electromagnetic waves generated by the operation of the driver circuit 810, or a function as a radiator plate.

Metal, a resin, an elastomer, or the like can be used for the upper cover 801, the lower cover 802, or the frame 809.

<<Battery 811>>

The battery 811 has a function of supplying power.

Note that a member such as a polarizing plate, a retardation plate, or a prism sheet can be used for the input/output device 800.

This embodiment can be combined with any of the other embodiments and examples in this specification as appropriate.

EMBODIMENT 5

In this embodiment, a structure of an information processing device of one embodiment of the present invention will be described with reference to FIGS. 52 to 55.

Figure 52A:
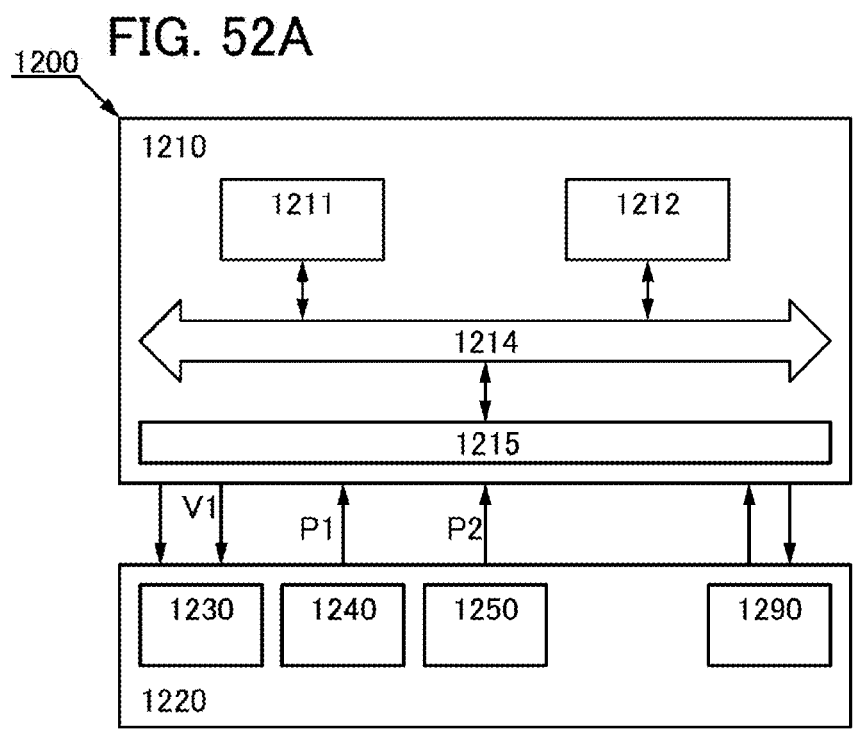
FIGS. 52A to 52C are a block diagram and projection views illustrating structures of information processing devices of one embodiment of the present invention.
Figure 52B:
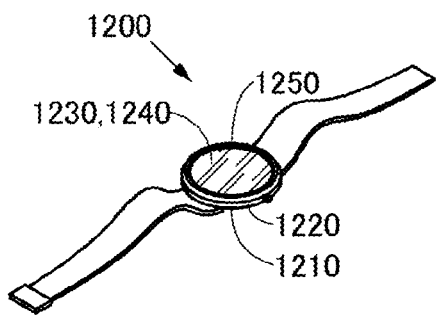
Figure 52C:
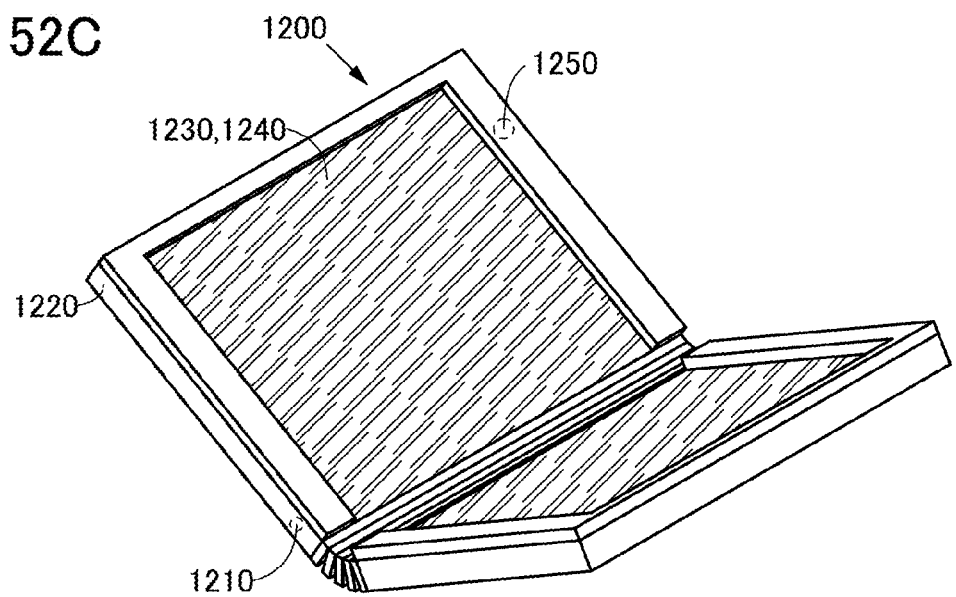

FIG. 52A is a block diagram illustrating the structure of an information processing device 1200. FIGS. 52B and 52C are projection views illustrating an example of an external view of the information processing device 1200.

Figure 53A:
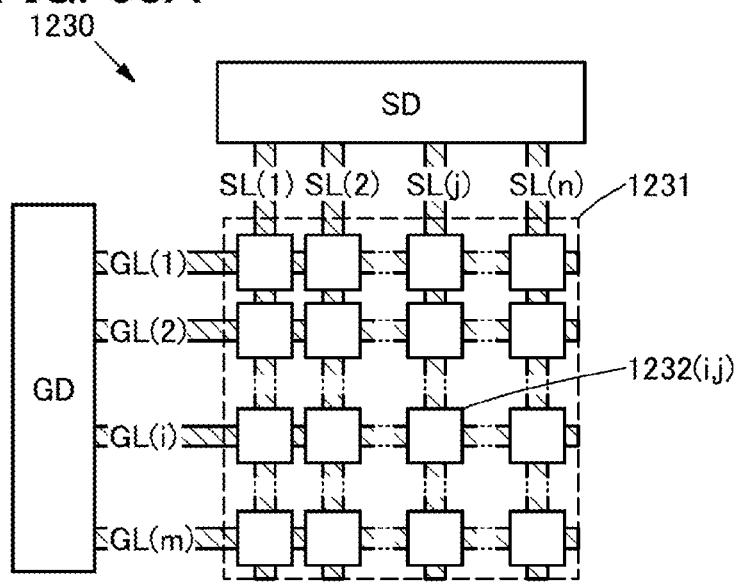
FIGS. 53A to 53C are block diagrams and a circuit diagram illustrating structures of display portions of one embodiment of the present invention.
Figure 53B:
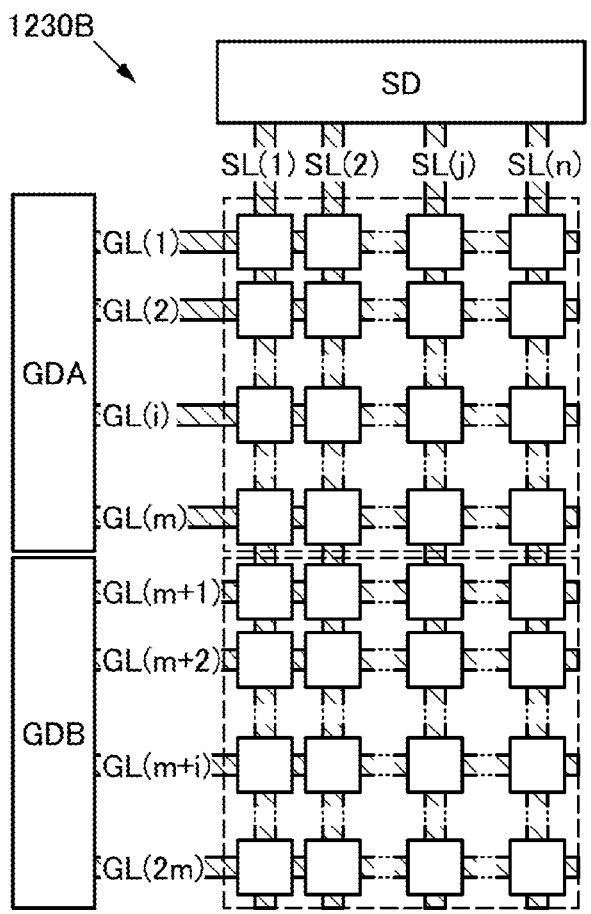
Figure 53C:
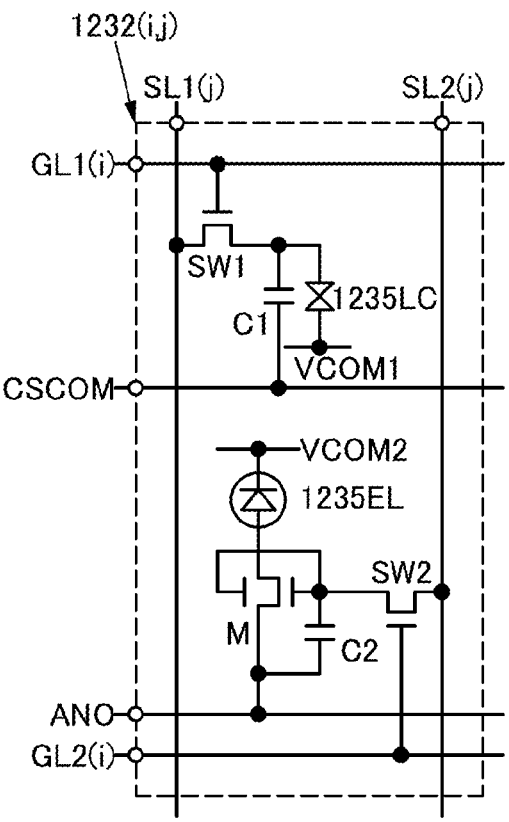

FIG. 53A is a block diagram illustrating a configuration of a display portion 1230. FIG. 53B is a block diagram illustrating a configuration of a display portion 1230B. FIG. 53C is a circuit diagram illustrating the configuration of a pixel 1232($i$, $j$).

<Structure Example of Information Processing Device>

The information processing device 1200 described in this embodiment includes an arithmetic device 1210 and an input/output device 1220 (see FIG. 52A).

The arithmetic device 1210 is configured to receive positional information P1 and supply image information V1 and control information.

The input/output device 1220 is configured to supply the positional information P1 and receive the image information V1 and the control information.

The input/output device 1220 includes the display portion 1230 that displays the image information V1 and an input portion 1240 that supplies the positional information P1.

The display portion 1230 includes a first display element and a second display element overlapping with the first display element. The display portion 1230 further includes a first pixel circuit for driving the first display element and a second pixel circuit for driving the second display element.

The input portion 1240 is configured to detect the position of a pointer and supply the positional information P1 determined in accordance with the position.

The arithmetic device 1210 is configured to determine the moving speed of the pointer in accordance with the positional information P1.

The arithmetic device 1210 is configured to determine the contrast or brightness of the image information V1 in accordance with the moving speed.

The information processing device 1200 described in this embodiment includes the input/output device 1220 that supplies the positional information P1 and receives the image information V1 and the arithmetic device 1210 that receives the positional information P1 and supplies the image information V1. The arithmetic device 1210 is configured to determine the contrast or brightness of the image information V1 in accordance with the moving speed of the positional information P1.

With this structure, eyestrain on a user caused when the display position of image information is moved can be reduced, that is, eye-friendly display can be achieved. Moreover, the power consumption can be reduced and excellent visibility can be provided even in a bright place exposed to direct sunlight, for example. Thus, the novel information processing device that is highly convenient or reliable can be provided.

<Configuration>

The information processing device of one embodiment of the present invention includes the arithmetic device 1210 or the input/output device 1220.

<<Arithmetic Device 1210>>

The arithmetic device 1210 includes an arithmetic portion 1211 and a memory portion 1212. The arithmetic device 1210 further includes a transmission path 1214 and an input/output interface 1215 (see FIG. 52A).

<<Arithmetic Portion 1211>>

The arithmetic portion 1211 is configured to, for example, execute a program. For example, a CPU described in Embodiment 6 can be used. Thus, power consumption can be sufficiently reduced.

<<Memory Portion 1212>>

The memory portion 1212 is configured to, for example, store the program executed by the arithmetic portion 1211, initial information, setting information, an image, or the like.

Specifically, a hard disk, a flash memory, a memory including a transistor including an oxide semiconductor, or the like can be used for the memory portion 1212.

<<Input/Output Interface 1215, Transmission Path 1214>>

The input/output interface 1215 includes a terminal or a wiring and is configured to supply and receive information. For example, the input/output interface 1215 can be electrically connected to the transmission path 1214 and the input/output device 1220.

The transmission path 1214 includes a wiring and is configured to supply and receive information. For example, the transmission path 1214 can be electrically connected to the input/output interface 1215. In addition, the transmission path 1214 can be electrically connected to the arithmetic portion 1211 or the memory portion 1212.

<<Input/Output Device 1220>>

The input/output device 1220 includes the display portion 1230, the input portion 1240, a sensor portion 1250, or a communication portion 1290.

<<Display Portion 1230>>

The display portion 1230 includes a display region 1231, a driver circuit GD, and a driver circuit SD (see FIG. 53A). For example, the display device described in Embodiment 1 can be used. Thus, low power consumption can be achieved.

The display region 1231 includes a plurality of pixels 1232($i$,1) to 1232($i$,$n$) arranged in the row direction, a plurality of pixels 1232(1,$j$) to 1232($m$,$j$) arranged in the column direction, a scan line GL1($i$) and a scan line GL2($i$) electrically connected to the plurality of pixels 1232($i$,1) to 1232($i$,$n$), and a signal line SL1($j$) and a signal line SL2($j$) electrically connected to the plurality of pixels 1232(1,$j$) to 1232($m$,$j$). Note that i is an integer greater than or equal to 1 and less than or equal to m, j is an integer greater than or equal to 1 and less than or equal to n, and each of m and n is an integer greater than or equal to 1.

Note that the pixel 1232($i$, $j$) includes the switch SW1, the switch SW2, a transistor M, the capacitor C1, and the capacitor C2, as a pixel circuit. The pixel 1232($i$, $j$) is electrically connected to the scan line GL1($i$), the scan line GL2(*i*), the signal lines SL1(*j*) and SL2(*j*), the wiring ANO, the wiring CSCOM, the wiring VCOM1, and the wiring VCOM2 (see FIG. 53C).

The display portion can include a plurality of driver circuits. For example, the display portion 1230B can include a driver circuit GDA and a driver circuit GDB (see FIG. 53B).

<<Driver Circuit GD>>

The driver circuit GD is configured to supply a selection signal in accordance with the control information.

For example, the driver circuit GD is configured to supply a selection signal to one scan line at a frequency of 30 Hz or higher, preferably 60 Hz or higher, in accordance with the control information. Accordingly, moving images can be smoothly displayed.

For example, the driver circuit GD is configured to supply a selection signal to one scan line at a frequency of lower than 30 Hz, preferably lower than 1 Hz, more preferably less than once per minute, in accordance with the control information. Accordingly, a still image can be displayed while flickering is suppressed.

For example, in the case where a plurality of driver circuits is provided, the driver circuits GDA and GDB may supply the selection signals at different frequencies. Specifically, the selection signal can be supplied at a higher frequency to a region on which moving images are smoothly displayed than to a region on which a still image is displayed in a state where flickering is suppressed.

<<Driver Circuit SD>>

The driver circuit SD is configured to supply an image signal in accordance with the image information V1.

<<Pixel 1232(*i, j*)>>

The pixel 1232(*i, j*) includes a first display element 1235LC and a second display element 1235EL overlapping with the opening in the reflective film of the first display element 1235LC. The pixel 1232(*i, j*) further includes a first pixel circuit for driving the first display element 1235LC and a second pixel circuit for driving the second display element 1235EL (see FIG. 53C).

<<First Display Element 1235LC>>

For example, a display element having a function of controlling light reflection or transmission can be used as the first display element 1235LC. For example, a combined structure of a polarizing plate and a liquid crystal element or a MEMS shutter display element can be used. The use of a reflective display element can reduce power consumption of a display device. Specifically, a reflective liquid crystal display element can be used as the display element 1235LC.

The first display element 1235LC includes a first electrode, a second electrode, and a liquid crystal layer. The liquid crystal layer contains a liquid crystal material whose orientation is controlled by voltage applied between the first electrode and the second electrode. For example, the orientation of the liquid crystal material can be controlled by an electric field in the thickness direction (also referred to as the vertical direction), the horizontal direction, or the diagonal direction of the liquid crystal layer.

<<Second Display Element 1235EL>>

A display element having a function of emitting light, such as an organic EL element or an inorganic EL element, can be used as the second display element 1235EL.

Specifically, an organic EL element or an inorganic EL element which emits white light can be used as the second display element 1235EL. Alternatively, an organic EL element or an inorganic EL element which emits blue light, green light, or red light can be used as the second display element 1235EL.

<<Pixel Circuit>>

A pixel circuit including a circuit which is configured to drive the first display element or the second display element can be used.

Alternatively, for example, a switch, a transistor, a diode, a resistor, a capacitor, or an inductor can be used in the pixel circuit.

For example, one or a plurality of transistors can be used as a switch. Alternatively, a plurality of transistors connected to be parallel to each other, in series, or in combination of parallel connection and series connection can be used as a switch.

<<Transistor>>

For example, a semiconductor film formed at the same step can be used for transistors in the driver circuit and the pixel circuit.

As the transistors in the driver circuit and the pixel circuit, bottom-gate transistors, top-gate transistors, or the like can be used.

For example, a manufacturing line for a bottom-gate transistor including amorphous silicon as a semiconductor can be easily remodeled into a manufacturing line for a bottom-gate transistor including an oxide semiconductor as a semiconductor. Furthermore, for example, a manufacturing line for a top-gate transistor including polysilicon as a semiconductor can be easily remodeled into a manufacturing line for a top-gate transistor including an oxide semiconductor as a semiconductor.

For example, a transistor including a semiconductor containing an element of Group 14 can be used. Specifically, a semiconductor containing silicon can be used for a semiconductor film. For example, single crystal silicon, polysilicon, microcrystalline silicon, or amorphous silicon can be used for the semiconductor of the transistor.

Note that the temperature for forming a transistor using polysilicon in a semiconductor is lower than the temperature for forming a transistor using single crystal silicon in a semiconductor.

In addition, the transistor using polysilicon in a semiconductor has higher field-effect mobility than the transistor using amorphous silicon in a semiconductor, and therefore a pixel including the transistor using polysilicon can have a high aperture ratio. Moreover, pixels arranged at a high density, a gate driver circuit, and a source driver circuit can be formed over the same substrate. As a result, the number of components included in an electronic device can be reduced.

In addition, the transistor using polysilicon in a semiconductor has higher reliability than the transistor using amorphous silicon in a semiconductor.

For example, a transistor including an oxide semiconductor can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used. Specifically, a transistor that uses an oxide semiconductor for a semiconductor film can be used.

A pixel circuit in the transistor that uses an oxide semiconductor for the semiconductor film can hold an image signal for a longer time than a pixel circuit in a transistor that uses amorphous silicon for a semiconductor film. Specifically, the selection signal can be supplied at a frequency of lower than 30 Hz, preferably lower than 1 Hz, more preferably less than once per minute while flickering is suppressed. Consequently, eyestrain on a user of the information processing device can be reduced, and power consumption for driving can be reduced.

Alternatively, for example, a transistor including a compound semiconductor can be used. Specifically, a semiconductor containing gallium arsenide can be used for a semiconductor film.

For example, a transistor including an organic semiconductor can be used. Specifically, an organic semiconductor containing any of polyacenes and graphene can be used for the semiconductor film.

<<Input Portion 1240>>

A variety of human interfaces or the like can be used as the input portion 1240 (see FIG. 52A).

For example, a keyboard, a mouse, a touch sensor, a microphone, a camera, or the like can be used as the input portion 1240. Note that a touch sensor having a region overlapping with the display portion 1230 can be used. An input/output device that includes the display portion 1230 and a touch sensor having a region overlapping with the display portion 1230 can be referred to as a touch panel.

For example, a user can make various gestures (e.g., tap, drag, swipe, and pinch in) using his/her finger as a pointer on the touch panel.

The arithmetic device 1210, for example, analyzes information on the position, track, or the like of the finger on the touch panel and determines that a specific gesture is supplied when the analysis results meet predetermined conditions. Therefore, the user can supply a certain operation instruction associated with a certain gesture to the input portion 1240 by using the gesture.

For instance, the user can supply a "scrolling instruction" for changing a portion where image information is displayed by using a gesture of touching and moving his/her finger on the touch panel.

<<Sensor Portion 1250>>

The sensor portion 1250 is configured to acquire information P2 by measuring the surrounding state.

For example, a imaging element, an acceleration sensor, a direction sensor, a pressure sensor, a temperature sensor, a humidity sensor, an illuminance sensor, or a global positioning system (GPS) signal receiving circuit can be used as the sensor portion 1250.

For example, when the arithmetic device 1210 determines that the ambient light level measured by an illuminance sensor of the sensor portion 1250 is sufficiently higher than the predetermined illuminance, image information is displayed using the first display element 1235LC. When the arithmetic device 1210 determines that it is dim, image information is displayed using the first display element 1235LC and the second display element 1235EL. When the arithmetic device 1210 determines that it is dark, image information is displayed using the second display element 1235EL.

Specifically, an image is displayed with a reflective liquid crystal element and/or a self-luminous organic EL element depending on the ambient brightness.

Thus, image information can be displayed in such a manner that, for example, a reflective display element is used in an environment with strong external light and a self-luminous display element is used in a dim environment. Thus, a novel information processing device which has low power consumption and is highly convenient or reliable can be provided.

For example, a sensor measuring chromaticity of ambient light, such as a CCD camera, can be used in the sensor portion 1250, and white balance can be adjusted in accordance with the chromaticity of ambient light measured by the sensor portion 1250.

Specifically, in the first step, imbalance disruption of white balance of ambient light is measured.

In the second step, the intensity of light of a color which is insufficient in an image to be displayed by the first display element using reflection of ambient light is estimated.

In the third step, ambient light is reflected by the first display element, and light is emitted from the second display element so that light of the insufficient color is supplemented, whereby the image is displayed.

In this manner, display can be performed with adjusted white balance by utilizing light reflected by the first display element and light emitted from the second display element. Thus, a novel information processing device which can display an image with low power consumption or with adjusted white balance and which is highly convenient and reliable can be provided.

<<Communication Portion 1290>>

The communication portion 1290 is configured to supply and acquire information to/from a network.

<<Program>>

A program of one embodiment of the present invention will be described with reference to FIGS. 54A and 54B and FIG. 55.

Figure 54A:
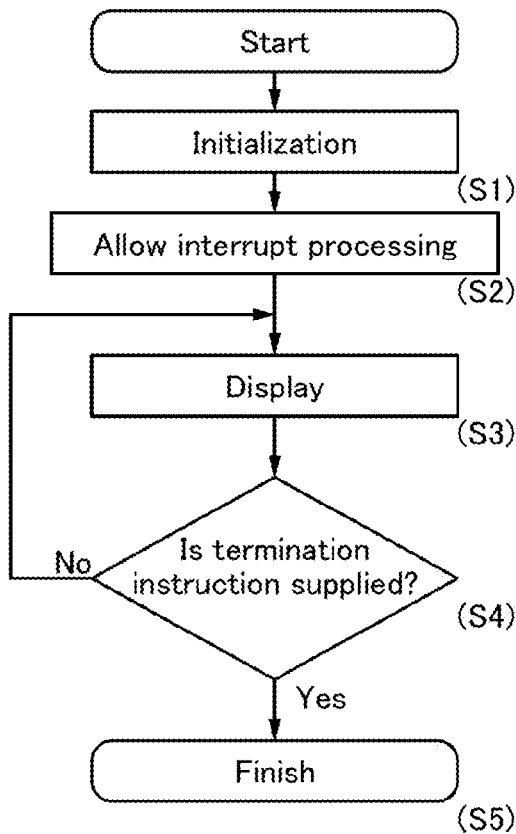
FIGS. 54A and 54B are flow charts showing a program of one embodiment of the present invention.
Figure 54B:
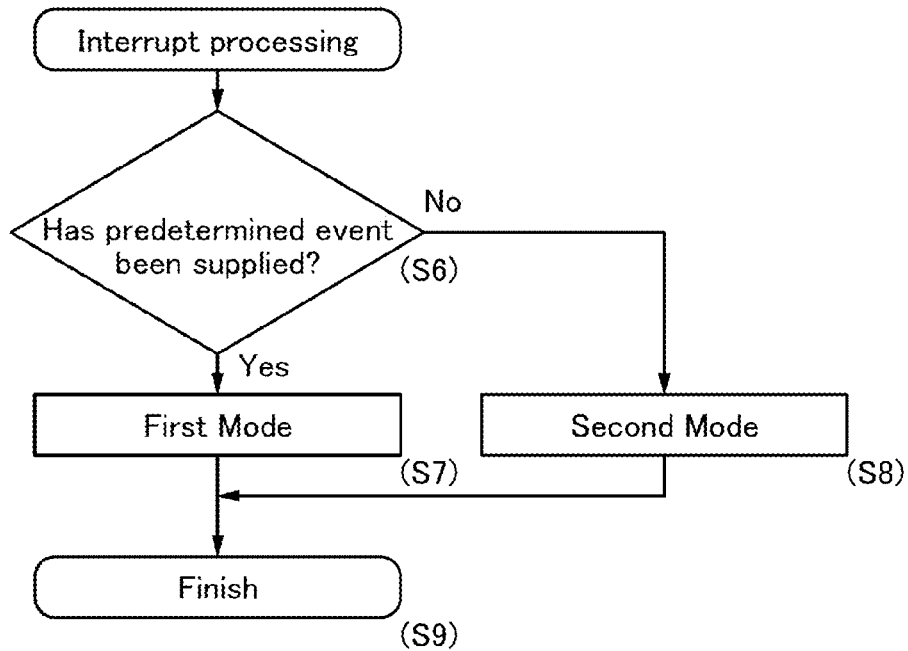

FIG. 54A is a flow chart showing main processing of the program of one embodiment of the present invention, and FIG. 54B is a flow chart showing interrupt processing.

Figure 55:
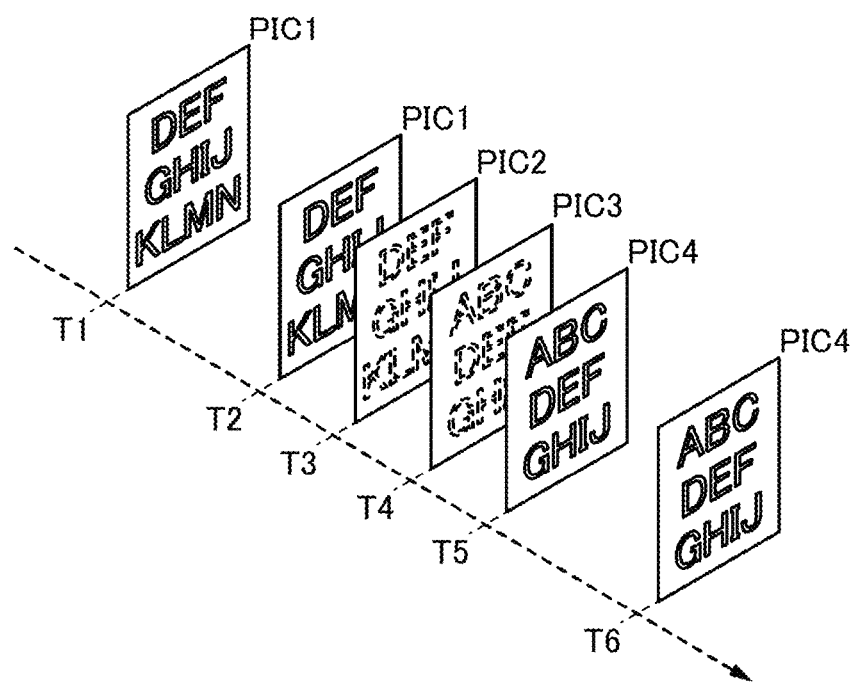
FIG. 55 is a schematic diagram illustrating image information of one embodiment of the present invention.

FIG. 55 schematically illustrates a method for displaying image information on the display portion 1230.

The program of one embodiment of the present invention has the following steps (see FIG. 54A).

In a first step, setting is initialized (see S1 in FIG. 54A).

For instance, predetermined image information and the second mode can be used for the initialization.

For example, a still image can be used as the predetermined image information. Alternatively, a mode in which the selection signal is supplied at a frequency of lower than 30 Hz, preferably lower than 1 Hz, more preferably less than once per minute can be used as the second mode.

In a second step, interrupt processing is allowed (see S2 in FIG. 54A). Note that an arithmetic device allowed to execute the interrupt processing can perform the interrupt processing in parallel with the main processing. The arithmetic device which has returned from the interrupt processing to the main processing can reflect the results of the interrupt processing in the main processing.

The arithmetic device may execute the interrupt processing when a counter has an initial value, and the counter may be set at a value other than the initial value when the arithmetic device returns from the interrupt processing. Thus, the interrupt processing is ready to be executed after the program is started up.

In a third step, image information is displayed in a mode selected in the first step or the interrupt processing (see S3 in FIG. 54A).

For instance, predetermined image information is displayed in the second mode, in accordance with the initialization.

Specifically, the predetermined image information is displayed in a mode in which the selection signal is supplied to one scan line at a frequency of lower than 30 Hz, preferably lower than 1 Hz, more preferably less than once per minute.

For example, the selection signal is supplied at Time T1 so that first image information PIC1 is displayed on the display portion 1230 (see FIG. 55). At Time T2, which is, for example, one second after Time T1, the selection signal is supplied so that the predetermined image information is displayed.

Alternatively, in the case where a predetermined event is not supplied in the interrupt processing, image information is displayed in the second mode.

For example, the selection signal is supplied at Time T5 so that fourth image information PIC4 is displayed on the display portion 1230. At Time T6, which is, for example, one second after Time T5, the selection signal is supplied so that the same image information is displayed. Note that the length of a period from Time T5 to Time T6 can be equal to that of a period from Time T1 to Time T2.

For instance, in the case where the predetermined event is supplied in the interrupt processing, predetermined image information is displayed in the first mode.

Specifically, in the case where an event associated with a "page turning instruction" is supplied in the interrupt processing, image information is switched from one to another in a mode in which the selection signal is supplied to one scan line at a frequency of 30 Hz or higher, preferably 60 Hz or higher.

Alternatively, in the case where an event associated with the "scrolling instruction" is supplied in the interrupt processing, second image information PIC2, which includes part of the displayed first image information PIC1 and the following part, is displayed in a mode in which the selection signal is supplied to one scan line at a frequency of 30 Hz or higher, preferably 60 Hz or higher.

Thus, for example, moving images in which images are gradually switched in accordance with the "page turning instruction" can be displayed smoothly. Alternatively, a moving image in which an image is gradually moved in accordance with the "scrolling instruction" can be displayed smoothly.

Specifically, the selection signal is supplied at Time T3 after the event associated with the "scrolling instruction" is supplied so that the second image information PIC2 whose display position and the like are changed from those of the first image information PIC1 is displayed (see FIG. 55). The selection signal is supplied at Time T4 so that third image information PIC3 whose display position and the like are changed from those of the second image information PIC2 is displayed. Note that each of a period from Time T2 to Time T3, a period from Time T3 to Time T4, and a period from Time T4 to Time T5 is shorter than the period from Time T1 to Time T2.

In the fourth step, the program moves to the fifth step when a termination instruction is supplied, and the program moves to the third step when the termination instruction is not supplied (see S4 in FIG. 54A).

Note that in the interrupt processing, for example, the termination instruction can be supplied.

In the fifth step, the program terminates (see S5 in FIG. 54A).

The interrupt processing includes sixth to ninth steps described below (see FIG. 54B).

In the sixth step, the processing proceeds to the seventh step when a predetermined event has been supplied during a predetermined period, whereas the processing proceeds to the eighth step when the predetermined event has not been supplied (see S6 in FIG. 54B).

For example, the predetermined period is shorter than 0.5 seconds, preferably shorter than 0.1 seconds.

For example, the predetermined event can include an event associated with the termination instruction.

In the seventh step, the first mode is selected (see S7 in FIG. 54B).

In the eighth step, the second mode is selected (see S8 in FIG. 54B).

In the ninth step, the operation returns from the interrupt processing (see S9 in FIG. 54B).

<<Predetermined Event>>

A variety of instructions can be associated with a variety of events.

The following instructions can be given as examples: "page-turning instruction" for switching displayed image information from one to another and "scroll instruction" for moving the display position of part of image information and displaying another part continuing from that part.

For example, the following events can be used: events supplied using a pointing device such as a mouse (e.g., "click" and "drag") and events supplied to a touch panel with a finger or the like used as a pointer (e.g., "tap", "drag", and "swipe").

For example, the position of a slide bar pointed by a pointer, the swipe speed, and the drag speed can be used as arguments assigned to various instructions.

Specifically, an argument that determines the page-turning speed or the like can be used to execute the "page-turning instruction," and an argument that determines the moving speed of the display position or the like can be used to execute the "scroll instruction."

For example, the display brightness, contrast, or saturation may be changed in accordance with the page-turning speed and/or the scroll speed.

Specifically, in the case where the page-turning speed and/or the scroll speed are/is higher than the predetermined speed, the display brightness may be decreased in synchronization with the speed.

Alternatively, in the case where the page-turning speed and/or the scroll speed are/is higher than the predetermined speed, the contrast may be decreased in synchronization with the speed.

For example, the speed at which user's eyes cannot follow displayed images can be used as the predetermined speed.

The contrast can be reduced in such a manner that the gray level of a bright region (with a high gray level) included in image information is brought close to the gray level of a dark region (with a low gray level) included in the image information.

Alternatively, the contrast can be reduced in such a manner that the gray level of the dark region included in image information is brought close to the gray level of the bright region included in the image information.

Specifically, in the case where the page-turning speed and/or the scroll speed are/is higher than the predetermined speed, display may be performed such that the yellow tone is increased or the blue tone is decreased.

Image information may be generated on the basis of information of the usage environment of the information processing device acquired by the sensor portion 1250. For example, user's favorite color can be used as the background color of the image information in accordance with the acquired ambient brightness or the like (see FIG. 52B).

Image data may be generated in accordance with received data delivered to a specific space using the communication portion 1290. For example, educational materials can be fed from a classroom of, for example, a school or a university and displayed to be used as a schoolbook. Alternatively, materials distributed from a conference room in, for example, a company can be received and displayed (see FIG. 52C).

Thus, favorable environment can be provided for a user of the information processing device 1200.

This embodiment can be combined with any of the other embodiments and examples in this specification as appropriate.

EMBODIMENT 6

In this embodiment, a semiconductor device (memory device) that can retain stored data even when not powered and that has an unlimited number of write cycles, and a CPU including the semiconductor device will be described with reference to FIGS. 56A to 56C, FIG. 57, and FIG. 58. The CPU described in this embodiment can be used for the information processing device described in Embodiment 5, for example.

<Memory Device>

Figure 56A:
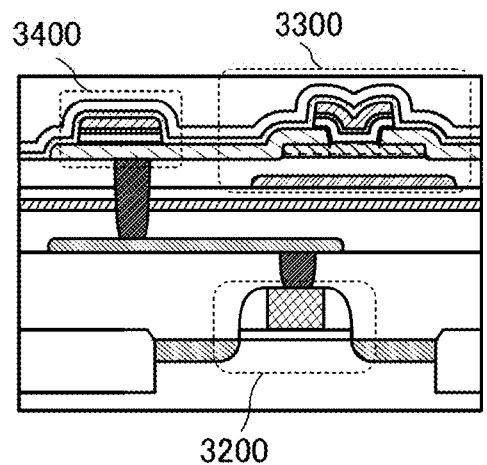
FIGS. 56A to 56C are a cross-sectional view and circuit diagrams illustrating structures of a semiconductor device of one embodiment of the present invention.
Figure 56B:
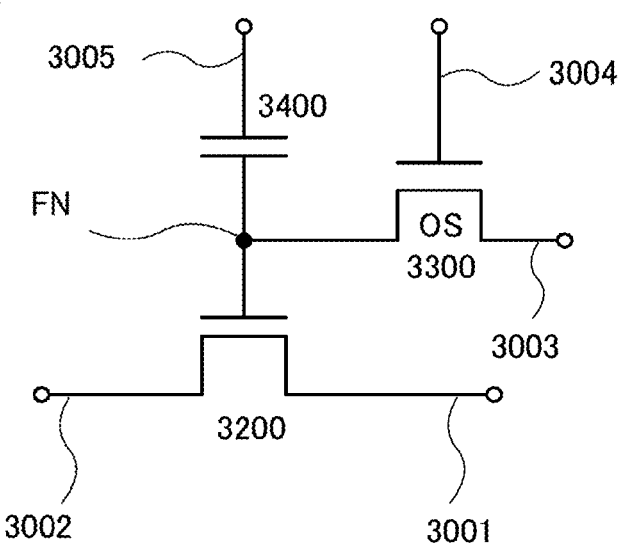
Figure 56C:
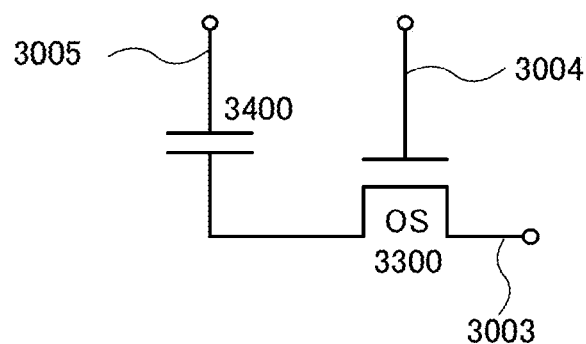

Examples of a semiconductor device (memory device) which can retain stored data even when not powered and which has an unlimited number of write cycles are shown in FIGS. 56A to 56C. Note that FIG. 56B is a circuit diagram of the structure in FIG. 56A.

The semiconductor device illustrated in FIGS. 56A and 56B includes a transistor 3200 using a first semiconductor material, a transistor 3300 using a second semiconductor material, and a capacitor 3400.

The first and second semiconductor materials preferably have different energy gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. On the other hand, a transistor including an oxide semiconductor has a low off-state current.

The transistor 3300 is a transistor in which a channel is formed in a semiconductor layer including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 56B, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 56A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off Thus, the data retained in the gate electrode of the transistor 3200 can be read by determining the potential of the second wiring 3002.

The semiconductor device illustrated in FIG. 56C is different from the semiconductor device illustrated in FIG. 56A in that the transistor 3200 is not provided. Also in this case, writing and retaining operation of data can be performed in a manner similar to the semiconductor device illustrated in FIG. 56A.

Next, reading of data of the semiconductor device illustrated in FIG. 56C is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0}+C \times V_0)/(C_B+C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely small off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device described in this embodiment does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The above memory device can also be used in an LSI such as a digital signal processor (DSP), a custom LSI, or a programmable logic device (PLD), in addition to a central processing unit (CPU), and a radio frequency identification (RF-ID) tag, for example.

<CPU>

A CPU including the above memory device is described below.

Figure 57:
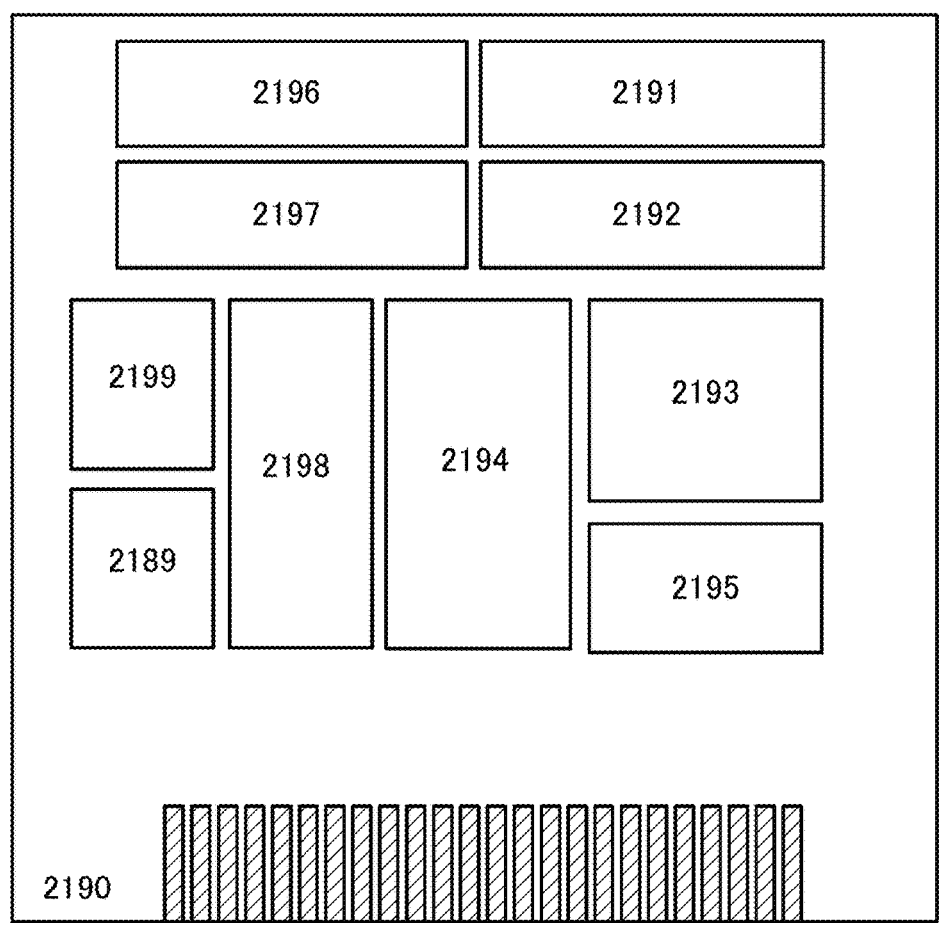
FIG. 57 is a block diagram illustrating a structure of a CPU of one embodiment of the present invention.

FIG. 57 is a block diagram illustrating a configuration example of the CPU including the above memory device.

The CPU illustrated in FIG. 57 includes, over a substrate 2190, an arithmetic logic unit (ALU) 2191, an ALU controller 2192, an instruction decoder 2193, an interrupt controller 2194, a timing controller 2195, a register 2196, a register controller 2197, a bus interface (BUS I/F) 2198, a rewritable ROM 2199, and a ROM interface (ROM I/F) 2189. A semiconductor substrate, an SOI substrate, a glass substrate, or the like is used as the substrate 2190. The rewritable ROM 2199 and the ROM interface 2189 may be provided over a separate chip. Needless to say, the CPU in FIG. 57 is just an example in which the configuration is simplified, and an actual CPU may have a variety of configurations depending on the application. For example, the CPU may have the following configuration: a structure including the CPU illustrated in FIG. 57 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 2198 is input to the instruction decoder 2193 and decoded therein, and then, input to the ALU controller 2192, the interrupt controller 2194, the register controller 2197, and the timing controller 2195.

The ALU controller 2192, the interrupt controller 2194, the register controller 2197, and the timing controller 2195 conduct various controls in accordance with the decoded instruction. Specifically, the ALU controller 2192 generates signals for controlling the operation of the ALU 2191. While the CPU is executing a program, the interrupt controller 2194 processes an interrupt request from an external input/output device or a peripheral circuit depending on its priority or a mask state. The register controller 2197 generates an address of the register 2196, and reads/writes data from/to the register 2196 depending on the state of the CPU.

The timing controller 2195 generates signals for controlling operation timings of the ALU 2191, the ALU controller 2192, the instruction decoder 2193, the interrupt controller 2194, and the register controller 2197. For example, the timing controller 2195 includes an internal clock generator for generating an internal clock signal on the basis of a reference clock signal, and supplies the internal clock signal to the above circuits.

In the CPU illustrated in FIG. 57, a memory cell is provided in the register 2196.

In the CPU illustrated in FIG. 57, the register controller 2197 selects operation of retaining data in the register 2196 in accordance with an instruction from the ALU 2191. That is, the register controller 2197 selects whether data is retained by a flip-flop or by a capacitor in the memory device included in the register 2196. When data retaining by the flip-flop is selected, a power supply voltage is supplied to the memory device in the register 2196. When data retaining by the capacitor is selected, the data is rewritten in the capacitor, and supply of the power supply voltage to the memory device in the register 2196 can be stopped.

Figure 58:
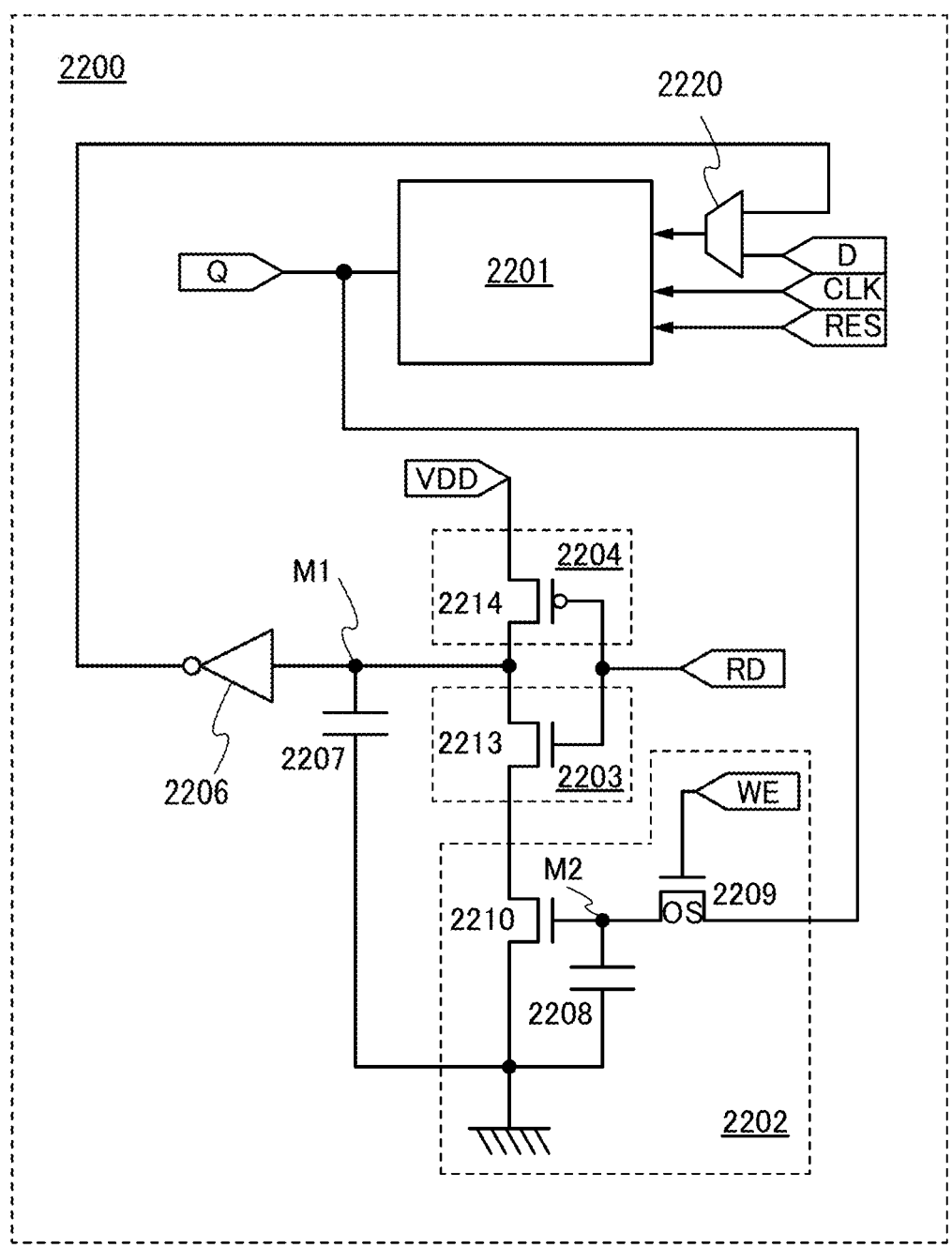
FIG. 58 is a circuit diagram illustrating a configuration of a memory element of one embodiment of the present invention.

FIG. 58 is an example of a circuit diagram of a memory element that can be used for the register 2196. A memory element 2200 includes a circuit 2201 in which stored data is volatile when power supply is stopped, a circuit 2202 in which stored data is nonvolatile even when power supply is stopped, a switch 2203, a switch 2204, a logic element 2206, a capacitor 2207, and a circuit 2220 having a selecting function. The circuit 2202 includes a capacitor 2208, a transistor 2209, and a transistor 2210. Note that the memory element 2200 may further include another element such as a diode, a resistor, or an inductor, as needed.

Here, the above-described memory device can be used as the circuit 2202. When supply of a power supply voltage to the memory element 2200 is stopped, a ground potential (0 V) or a potential at which the transistor 2209 in the circuit 2202 is turned off continues to be input to a gate of the transistor 2209. For example, the gate of the transistor 2209 is grounded through a load such as a resistor.

Shown here is an example in which the switch 2203 is a transistor 2213 having one conductivity type (e.g., an n-channel transistor) and the switch 2204 is a transistor 2214 having a conductivity type opposite to the one conductivity type (e.g., a p-channel transistor). A first terminal of the switch 2203 corresponds to one of a source and a drain of the transistor 2213, a second terminal of the switch 2203 corresponds to the other of the source and the drain of the transistor 2213, and conduction or non-conduction between the first terminal and the second terminal of the switch 2203 (i.e., the on/off state of the transistor 2213) is selected by a control signal RD input to a gate of the transistor 2213. A first terminal of the switch 2204 corresponds to one of a source and a drain of the transistor 2214, a second terminal of the switch 2204 corresponds to the other of the source and the drain of the transistor 2214, and conduction or non-conduction between the first terminal and the second terminal of the switch 2204 (i.e., the on/off state of the transistor 2214) is selected by the control signal RD input to a gate of the transistor 2214.

One of a source and a drain of the transistor 2209 is electrically connected to one of a pair of electrodes of the capacitor 2208 and a gate of the transistor 2210. Here, the connection portion is referred to as a node M2. One of a source and a drain of the transistor 2210 is electrically connected to a wiring that can supply a low power supply potential (e.g., a GND line), and the other is electrically connected to the first terminal of the switch 2203 (the one of the source and the drain of the transistor 2213). The second terminal of the switch 2203 (the other of the source and the drain of the transistor 2213) is electrically connected to the first terminal of the switch 2204 (the one of the source and the drain of the transistor 2214). The second terminal of the switch 2204 (the other of the source and the drain of the transistor 2214) is electrically connected to a wiring that can supply a power supply potential VDD. The second terminal of the switch 2203 (the other of the source and the drain of the transistor 2213), the first terminal of the switch 2204 (the one of the source and the drain of the transistor 2214), an input terminal of the logic element 2206, and one of a pair of electrodes of the capacitor 2207 are electrically connected to each other. Here, the connection portion is referred to as a node M1. The other of the pair of electrodes of the capacitor 2207 can be supplied with a constant potential. For example, the other of the pair of electrodes of the capacitor 2207 can be supplied with a low power supply potential (e.g., GND) or a high power supply potential (e.g., VDD). The other of the pair of electrodes of the capacitor 2207 is electrically connected to the wiring that can supply a low power supply potential (e.g., a GND line). The other of the pair of electrodes of the capacitor 2208 can be supplied with a constant potential. For example, the other of the pair of electrodes of the capacitor 2208 can be supplied with a low power supply potential (e.g., GND) or a high power supply potential (e.g., VDD). The other of the pair of electrodes of the capacitor 2208 is electrically connected to the wiring that can supply a low power supply potential (e.g., a GND line).

The capacitor 2207 and the capacitor 2208 are not necessarily provided as long as the parasitic capacitance of the transistor, the wiring, or the like is actively utilized.

A control signal WE is input to a gate of the transistor 2209. As for each of the switch 2203 and the switch 2204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 2201 is input to the other of the source and the drain of the transistor 2209. FIG. 58 illustrates an example in which a signal output from the circuit 2201 is input to the other of the source and the drain of the transistor 2209. The logic value of a signal output from the second terminal of the switch 2203 (the other of the source and the drain of the transistor 2213) is inverted by the logic element 2206, and the inverted signal is input to the circuit 2201 through the circuit 2220.

In the example of FIG. 58, a signal output from the second terminal of the switch 2203 (the other of the source and the drain of the transistor 2213) is input to the circuit 2201 through the logic element 2206 and the circuit 2220; however, one embodiment of the present invention is not limited thereto. The signal output from the second terminal of the switch 2203 (the other of the source and the drain of the transistor 2213) may be input to the circuit 2201 without its logic value being inverted. For example, in the case where the circuit 2201 includes a node in which a signal obtained by inversion of the logic value of a signal input from the input terminal is retained, the signal output from the second terminal of the switch 2203 (the other of the source and the drain of the transistor 2213) can be input to the node.

In FIG. 58, the transistors included in the memory element 2200 except for the transistor 2209 can each be a transistor in which a channel is formed in a layer formed using a semiconductor other than an oxide semiconductor or in the substrate 2190. For example, the transistor can be a transistor whose channel is formed in a silicon layer or a silicon substrate. Alternatively, a transistor in which a channel is formed in an oxide semiconductor film can be used for all the transistors in the memory element 2200. Further alternatively, in the memory element 2200, a transistor in which a channel is formed in an oxide semiconductor film can be included besides the transistor 2209, and a transistor in which a channel is formed in a layer formed using a semiconductor other than an oxide semiconductor or the substrate 2190 can be used for the rest of the transistors.

As the circuit 2201 in FIG. 58, for example, a flip-flop circuit can be used. As the logic element 2206, for example, an inverter or a clocked inverter can be used.

In a period during which the memory element 2200 is not supplied with the power supply voltage, the semiconductor device described in this embodiment can retain data stored in the circuit 2201 by the capacitor 2208 that is provided in the circuit 2202.

The off-state current of a transistor in which a channel is formed in an oxide semiconductor film is extremely small. For example, the off-state current of a transistor in which a channel is formed in an oxide semiconductor film is significantly smaller than that of a transistor in which a channel is formed in silicon having crystallinity. Thus, when the transistor in which a channel is formed in an oxide semiconductor film is used as the transistor 2209, a signal is retained in the capacitor 2208 for a long time also in a period during which the power supply voltage is not supplied to the memory element 2200. The memory element 2200 can accordingly retain the stored content (data) also in a period during which the supply of the power supply voltage is stopped.

Since the memory element performs pre-charge operation with the switch 2203 and the switch 2204, the time required for the circuit 2201 to retain original data again after the supply of the power supply voltage is restarted can be shortened.

In the circuit 2202, a signal retained by the capacitor 2208 is input to the gate of the transistor 2210. Thus, after supply of the power supply voltage to the memory element 2200 is restarted, the state (the on state or the off state) of the transistor 2210 is determined in accordance with the signal retained by the capacitor 2208 and can be read from the circuit 2202. Consequently, an original signal can be accurately read even when a potential corresponding to the signal retained by the capacitor 2208 changes to some degree.

By using the above-described memory element 2200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 2200 is used in a CPU in this embodiment, the memory element 2200 can also be used in an LSI such as a digital signal processor (DSP), a custom LSI, or a programmable logic device (PLD), and a radio frequency identification (RF-ID).

At least part of this embodiment can be implemented in combination with any of the other embodiments and examples described in this specification as appropriate.

EMBODIMENT 7

In this embodiment, a display module and electronic devices that include a display device of one embodiment of the present invention are described with reference to FIGS. 59A to 59H.

FIGS. 59A to 59G illustrate electronic devices. These electronic devices can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 59A:
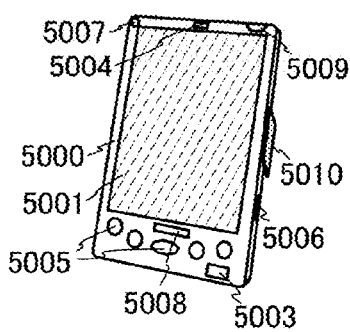
FIGS. 59A to 59H illustrate structures of electronic devices of embodiments of the present invention.
Figure 59B:
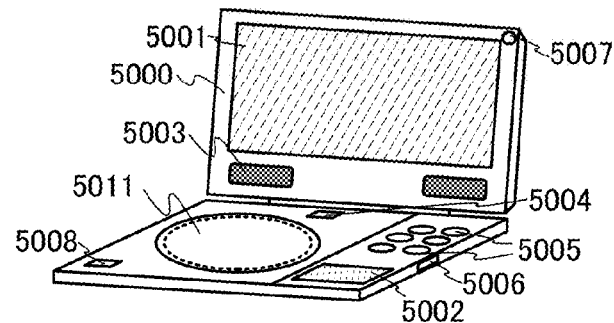
Figure 59C:
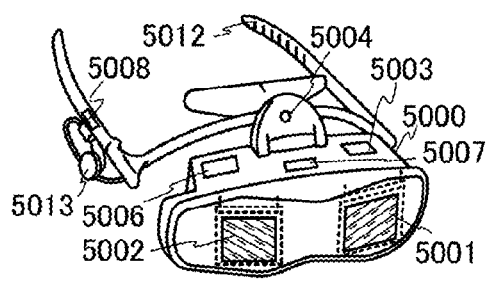
Figure 59D:
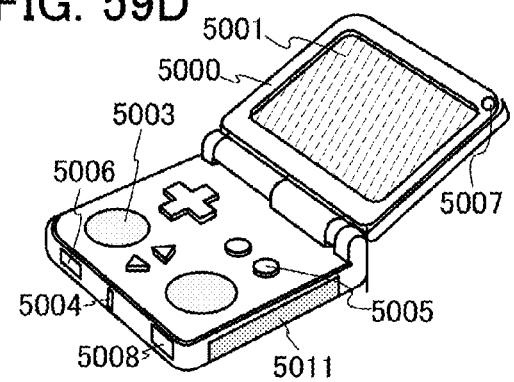
Figure 59E:
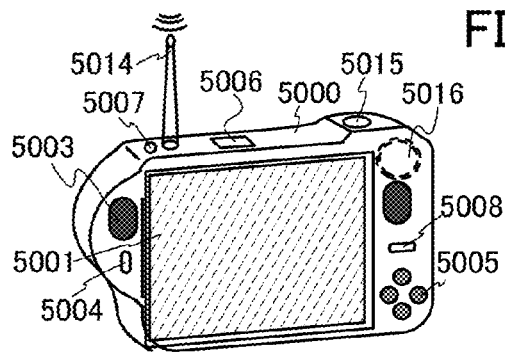
Figure 59F:
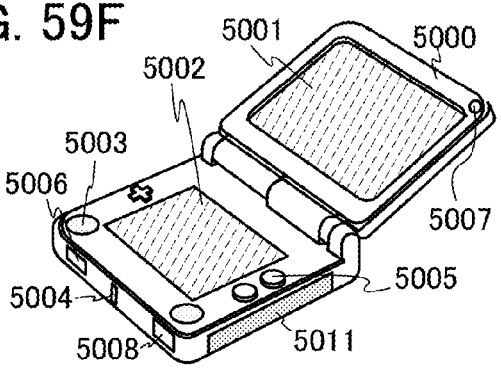
Figure 59G:
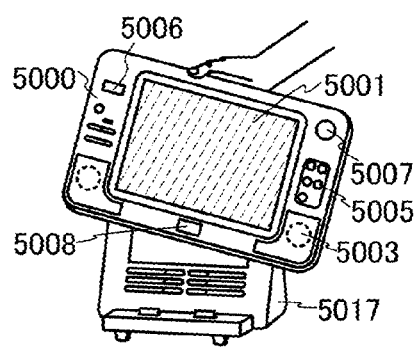

FIG. 59A illustrates a mobile computer that can include a switch 5009, an infrared port 5010, and the like in addition to the above components. FIG. 59B illustrates a portable image reproducing device (e.g., a DVD reproducing device) provided with a recording medium, and the portable image reproducing device can include a second display portion 5002, a recording medium reading portion 5011, and the like in addition to the above components. FIG. 59C illustrates a goggle-type display that can include the second display portion 5002, a support portion 5012, an earphone 5013, and the like in addition to the above components. FIG. 59D illustrates a portable game console that can include the recording medium reading portion 5011 and the like in addition to the above components. FIG. 59E illustrates a digital camera with a television reception function, and the digital camera can include an antenna 5014, a shutter button 5015, an image receiving portion 5016, and the like in addition to the above components. FIG. 59F illustrates a portable game console that can include the second display portion 5002, the recording medium reading portion 5011, and the like in addition to the above components. FIG. 59G illustrates a portable television receiver that can include a charger 5017 capable of transmitting and receiving signals, and the like in addition to the above components.

The electronic devices in FIGS. 59A to 59G can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image information mainly on one display portion while displaying text information mainly on another display portion, a function of displaying a three-dimensional image by displaying images on a plurality of display portions with a parallax taken into account, or the like. Furthermore, the electronic device including an image receiving portion can have a function of shooting a still image, a function of taking moving images, a function of automatically or manually correcting a shot image, a function of storing a shot image in a recording medium (an external recording medium or a recording medium incorporated in the camera), a function of displaying a shot image on the display portion, or the like. Note that functions of the electronic devices in FIGS. 59A to 59G are not limited thereto, and the electronic devices can have a variety of functions.

Figure 59H:
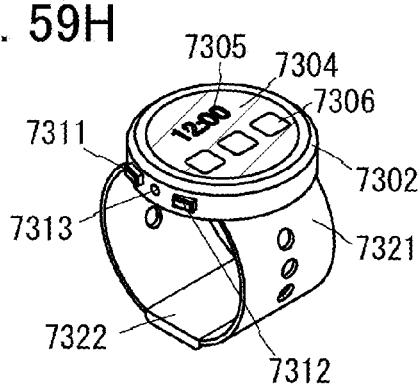

FIG. 59H illustrates a smart watch, which includes a housing 7302, a display device 7304, operation buttons 7311 and 7312, a connection terminal 7313, a band 7321, a clasp 7322, and the like.

The display device 7304 mounted in the housing 7302 serving as a bezel includes a non-rectangular display region. The display device 7304 may have a rectangular display region. The display device 7304 can display an icon 7305 indicating time, another icon 7306, and the like.

The smart watch in FIG. 59H can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting element for the display device 7304.

As a material of the housings 5000 and 7302, an alloy, plastic, ceramic, or a material containing carbon fiber can be used. As the material containing carbon fiber, carbon fiber reinforced plastic (CFRP) has advantages of lightweight and corrosion-free; however, it is black and thus limits the exterior and design of the housing. The CFRP can be regarded as a kind of reinforced plastic, which may use glass fiber or aramid fiber. Alloy is preferable because fiber has higher possibility of separation from resin by high impact than alloy. As the alloy, an aluminum alloy and a magnesium alloy can be given. An amorphous alloy (also referred to as metallic glass) containing zirconium, copper, nickel, and titanium especially has high elastic strength. This amorphous alloy has a glass transition region at room temperature, which is also referred to as a bulk-solidifying amorphous alloy and substantially has an amorphous atomic structure. An alloy material is molded in a mold of at least the part of the housing and coagulated by a solidification casting method, whereby part of the housing is formed with the bulk-solidifying amorphous alloy. The amorphous alloy may contain beryllium, silicon, niobium, boron, gallium, molybdenum, tungsten, manganese, iron, cobalt, yttrium, vanadium, phosphorus, carbon, or the like in addition to zirconium, copper, nickel, and titanium. The amorphous alloy may be formed by a vacuum evaporation method, a sputtering method, an electroplating method, an electroless plating method, or the like instead of the solidification casting method. The amorphous alloy may include a microcrystal or a nanocrystal as long as a state without a long-range order (a periodic structure) is maintained as a whole. Note that the term alloy includes both a complete solid solution alloy having a single solid-phase structure and a partial solution having two or more phases. The housings 5000 and 7302 using the amorphous alloy can have high elastic strength. Even if the electronic device or smart watch is dropped and the impact causes temporary deformation, the use of the amorphous alloy in the housing 9000 allows a return to the original shape; thus, the impact resistance of the electronic device or smart watch can be improved.

This embodiment can be combined with any of the other embodiments in this specification as appropriate.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

EXAMPLE 1

In this example, display devices of embodiments of the present invention were fabricated and cross-sectional shapes of the display devices were observed with a scanning transmission electron microscope (STEM).

The display devices used in this example are a display device (display device 1) that corresponds to a display device having the cross-sectional shape in FIG. 2A and a display device (display device 2) that corresponds to a display device having the cross-sectional shape in FIG. 7A.

For the fabrication methods of the display devices, Embodiment 1 can be referred to. Note that each cross-sectional shape was observed with a process substrate obtained through the first step to the fifth step (FIG. 22A to FIG. 25A) described in <Method for manufacturing display device> in Embodiment 1.

<Fabrication of Display Device>

As the separation film 501W on the substrate 510, a tungsten film with a thickness of 30 nm was formed. A film with a thickness of 50 nm was formed by a sputtering method using a material containing indium, gallium, and zinc as a target, and processed into a predetermined shape to form the intermediate film 354. The insulating film 501A was formed in the following manner: a 200-nm-thick silicon oxide film containing nitrogen and a 200-nm-thick silicon nitride film were formed by a PECVD method, and processed into a predetermined shape.

The electrode 351 was formed in the following manner: an ITSO film was formed to a thickness of 20 nm; an alloy film of silver, palladium, and copper (also referred to as an Ag—Pd—Cu film or APC) was formed to a thickness of 100 nm and processed into a predetermined shape; an ITSO film was formed to a thickness of 100 nm; and the 20-nm-thick ITSO film and the 100-nm-thick ITSO film were processed into predetermined shapes. Here, the 20-nm-thick ITSO film serves as the conductive film 351A, the 100-nm-thick APC film serves as the conductive film 351B, and the 100-nm-thick ITSO film serves as the conductive film 351C. Note that an opening included in the conductive film 351B serves as the opening 351H.

As the insulating film 501C, a 200-nm-thick silicon oxide film containing nitrogen was used.

Next, the pixel circuit 530 was formed. As insulating films included in the pixel circuit 530, the insulating film 506, the insulating film 516, and the insulating film 518 were sequentially formed. As the insulating film 506, a silicon nitride film and a silicon oxide film containing nitrogen were formed to a thickness of 450 nm in total. As the insulating film 516, a silicon oxide film containing nitrogen was formed to a thickness of 430 nm. As the insulating film 518, a silicon nitride film was formed to a thickness of 100 nm. The silicon oxide film containing nitrogen and the silicon nitride film were formed by a PECVD method. Note that, after the formation, these insulating films were sequentially processed into predetermined shapes by a lithography method and an etching method.

Here, in the display device 1 in this example, an opening was formed in the insulating films 501C, 506, 516, and 518 in a region overlapping with the opening 351H. In the display device 2 in this example, an opening was formed in the insulating film 518 in a region overlapping with the opening 351H.

<Cross-Sectional Observation>

Figure 60A:
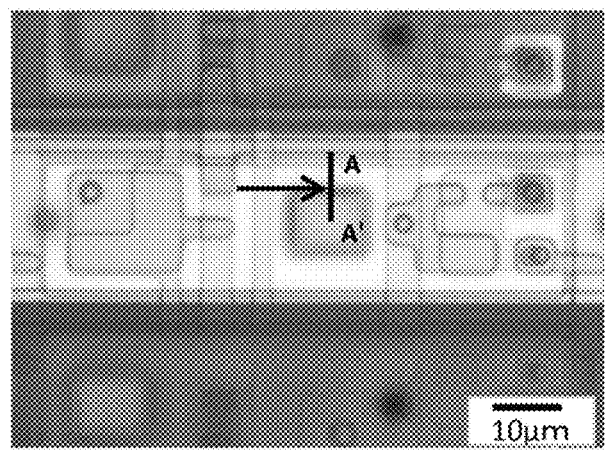
FIGS. 60A and 60B are a micrograph and a STEM photograph of a display device in Example.
Figure 60B:
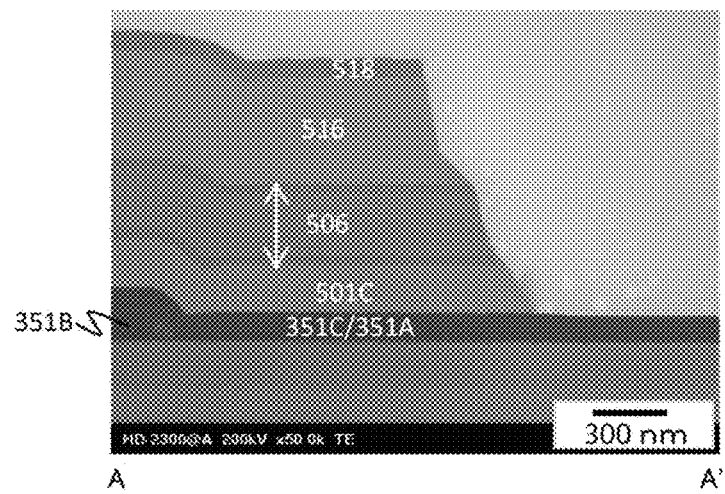
Figure 61A:
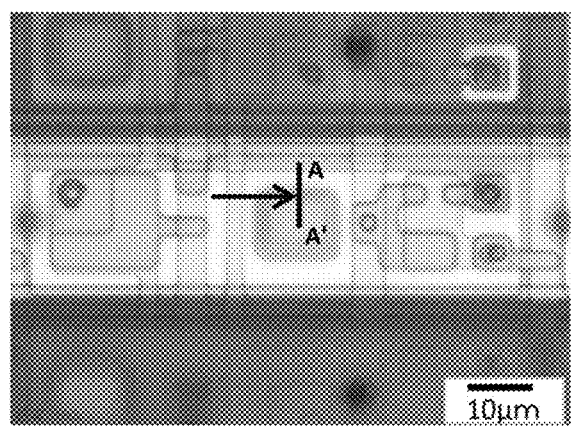
FIGS. 61A and 61B are a micrograph and a STEM photograph of a display device in Example.

Cross-sectional shapes of the display device 1 and the display device 2 on the process substrates fabricated through the above steps (the first step to the fifth step in Embodiment 1) were observed with a STEM. FIG. 60A is a micrograph of a pixel region in the display device 1 and FIG. 60B is a STEM photograph of a cross section taken along line A-A' in FIG. 60A. In addition, FIG. 61A is a micrograph of a pixel region in the display device 2 and FIG. 61B is a STEM photograph of a cross section taken along line A-A' in FIG. 61A.

The STEM photograph in FIG. 60B shows that an opening is formed in the insulating films 501C, 506, 516, and 518 in a region overlapping with the opening 351H.

Figure 61B:
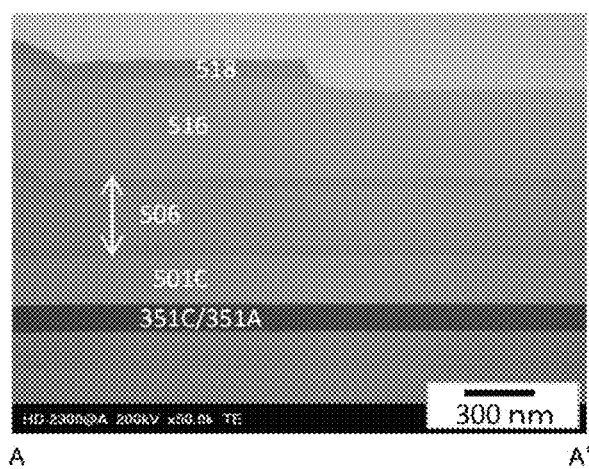

Furthermore, the STEM photograph in FIG. 61B shows that an opening is formed in the insulating film 518 in a region overlapping with the opening 351H.

The structures described above in this example can be used in combination with any of the structures described in the other examples and embodiments as appropriate.

EXAMPLE 2

In this example, light-emitting elements of embodiments of the present invention were fabricated, and emission characteristics of the light-emitting elements were measured.

Table 4 shows details of element structures of the light-emitting elements fabricated in this example. In addition, structures and abbreviations of compounds used here are given below.
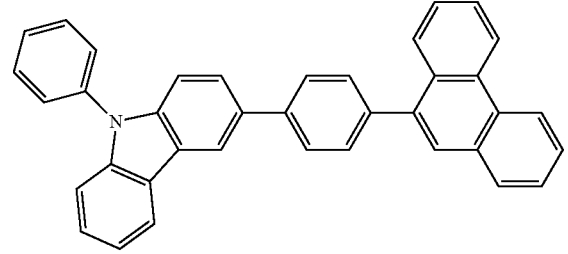
PCPPn
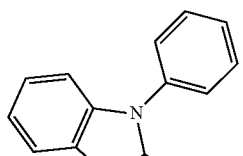
PCBBiF
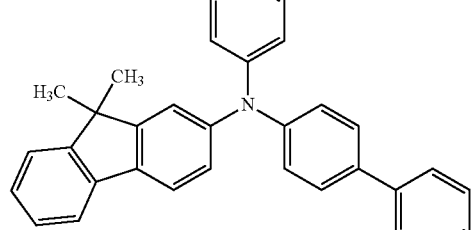
NBphen
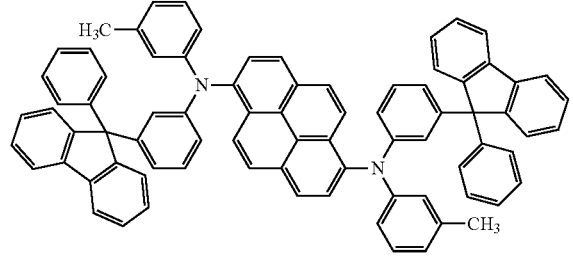
1,6mMemFLPAPrn
-continued
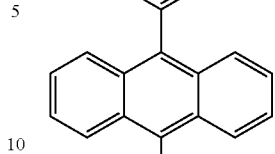
cgDBCzPA
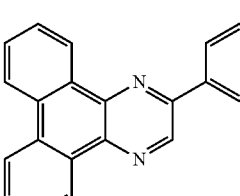
2mDBTBPDBq-II
Ir(dmdppr-dmp)$_2$(acac)
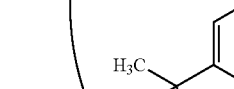
Ir(tBuppm)$_2$(acac)

TABLE 4

| | Layer | Film thickness (nm) | Material | Weight ratio |
|---|---|---|---|---|
| Light-emitting element 1 | Electrode | 120 | Al | — |
| | Electron-injection layer | 1 | LiF | — |
| | Electron-transport layer | 15 | NBphen | — |
| | | 5 | cgDBCzPA | — |
| | | 25 | cgDBCzPA:1,6mMemFLPAPrn | 1:0.05 |
| | Light-emitting layer | 30 | 2mDBTBPDBq-II:PCBBiF:Ir(dmdppr-dmp)$_2$(acac) | 0.8:0.2:0.06 |
| | Hole-transport layer | 20 | PCPPn | — |
| | Hole-injection layer | 35 | PCPPn:MoO$_3$ | 1:0.5 |
| | Electrode | 70 | ITSO | — |
| Light-emitting element 2 | Electrode | 120 | Al | — |
| | Electron-injection layer | 1 | LiF | — |
| | Electron-transport layer | 15 | NBphen | — |
| | | 5 | cgDBCzPA | — |
| | | 25 | cgDBCzPA:1,6mMemFLPAPrn | 1:0.05 |
| | Light-emitting layer | 10 | 2mDBTBPDBq-II:Ir(tBuppm)$_2$(acac) | 0.7:0.06 |
| | | 20 | 2mDBTBPDBq-II:PCBBiF:Ir(tBuppm)$_2$(acac) | 0.7:0.3:0.06 |
| | Hole-transport layer | 20 | PCPPn | — |
| | Hole-injection layer | 35 | PCPPn:MoO$_3$ | 1:0.5 |
| | Electrode | 70 | ITSO | — |
| Light-emitting element 3 | Electrode | 120 | Al | — |
| | Electron-injection layer | 1 | LiF | — |
| | Electron-transport layer | 15 | NBphen | — |
| | | 5 | cgDBCzPA | — |
| | Light-emitting layer | 25 | cgDBCzPA:1,6mMemFLPAPrn | 1:0.05 |
| | Hole-transport layer | 20 | PCPPn | — |
| | Hole-injection layer | 35 | PCPPn:MoO$_3$ | 1:0.5 |
| | Electrode | 70 | ITSO | — |

<Fabrication of Light-Emitting Elements>
<<Fabrication of Light-Emitting Element 1>>

As the electrode 551, an ITSO film was formed to a thickness of 70 nm over a glass substrate. Note that the area of the electrode 551 was set to 4 mm$^2$ (2 mm×2 mm).

As a hole-injection layer, 3-[4-(9-phenanthryl)-phenyl]-9-phenyl-9H-carbazole (abbreviation: PCPPn) and molybdenum oxide (MoO$_3$) were deposited over the electrode 551 by co-evaporation to a thickness of 35 nm such that the weight ratio of PCPPn to MoO$_3$ was 1:0.5.

As a hole-transport layer, PCPPn was deposited over the hole-injection layer by evaporation to a thickness of 20 nm.

Next, as the light-emitting layer 553, 2-[3'-(dibenzothiophen-4-yl)biphenyl-3-yl]dibenzo[f,h]quinoxaline (abbreviation: 2mDBTBPDBq-II), N-(1,1'-biphenyl-4-yl)-N-[4-(9-phenyl-9H-carbazol-3-yl)phenyl]-9,9-dimethyl-9H-fluoren-2-amine (abbreviation: PCBBiF), and bis{4,6-dimethyl-2-[5-(2,6-dimethylphenyl)-3-(3,5-dimethylphenyl)-2-pyrazinyl-κN]phenyl-κC} (2,4-pentanedionato-κ$^2$O,O') iridium(III) (abbreviation: Ir(dmdppr-dmp)$_2$(acac)) were deposited over the hole-transport layer by co-evaporation to a thickness of 30 nm such that the weight ratio of 2mDBTBPDBq-II to PCBBiF and Ir(dmdppr-dmp)$_2$(acac) was 0.8:0.2:0.06. In the light-emitting layer 553, Ir(dmdppr-dmp)$_2$(acac) serves as a light-emitting material.

As an electron-transport layer, 7-[4-(10-phenyl-9-anthryl)phenyl]-7H-dibenzo[c,g]carbazole (abbreviation: cgDBCzPA) and N,N'-bis(3-methylphenyl)-N,N'-bis[3-(9-phenyl-9H-fluoren-9-yl)phenyl]pyrene-1,6-diamine (abbreviation: 1,6mMemFLPAPrn) were deposited over the light-emitting layer 553 by co-evaporation to a thickness of 25 nm such that the weight ratio of cgDBCzPA to 1,6mMemFLPAPrn was 1:0.05. Then, cgDBCzPA and 2,9-bis(naphthalen-2-yl)-4,7-diphenyl-1,10-phenanthroline (abbreviation: NBPhen) were sequentially deposited by evaporation to a thickness of 5 nm and a thickness of 15 nm, respectively. Next, as an electron-injection layer, lithium fluoride (LiF) was deposited over the electron-transport layer by evaporation to a thickness of 1 nm.

As the electrode 552, an aluminum (Al) film was formed over the electron-injection layer to a thickness of 120 nm.

Next, in a glove box containing a nitrogen atmosphere, a glass substrate on which an organic material was deposited was sealed using a sealant for an organic EL device. Through the above process, the light-emitting element 1 was fabricated.

<<Fabrication of Light-Emitting Element 2>>

The light-emitting element 2 was fabricated through the same steps as those for the light-emitting element 1 except for the step of forming the light-emitting layer 553.

As the light-emitting layer 553 of the light-emitting element 2, 2mDBTBPDBq-II, PCBBiF, and (acetylacetonato)bis(6-tert-butyl-4-phenylpyrimidinato)iridium(III) (abbreviation: Ir(tBuppm)$_2$(acac)) were deposited by co-evaporation to a thickness of 20 nm such that the weight ratio of 2mDBTBPDBq-II to PCBBiF and Ir(tBuppm)$_2$(acac) was 0.7:0.3:0.06 and successively, 2mDBTBPDBq-II and Ir(tBuppm)$_2$(acac) were deposited by co-evaporation to a thickness of 10 nm such that the weight ratio of 2mDBT-BPDBq-II to Ir(tBuppm)$_2$(acac) was 0.7:0.06. In the light-emitting layer 553, Ir(tBuppm)$_2$(acac) serves as a light-emitting material.

<<Fabrication of Light-Emitting Element 3>>

In the light-emitting element 3, the above-described light-emitting layer 553 formed in the light-emitting element 1 and the light-emitting element 2 was not formed, and the co-evaporation film of cgDBCzPA and 1,6mMemFLPAPrn formed as the electron-transport layer serves as a light-emitting layer. In the light-emitting element 3, 1,6mMemFLPAPrn serves as a light-emitting material.

<Characteristics of Light-Emitting Elements>

Next, the characteristics of the fabricated light-emitting elements 1 to 3 were measured. Luminances and CIE chromaticities were measured with a luminance colorimeter (BM-5A manufactured by TOPCON TECHNOHOUSE CORPORATION), and electroluminescence spectra were measured with a multi-channel spectrometer (PMA-11 manufactured by Hamamatsu Photonics K.K.). The measurements of the light-emitting elements were performed at room temperature (in an atmosphere kept at 23° C.).

Figure 62:
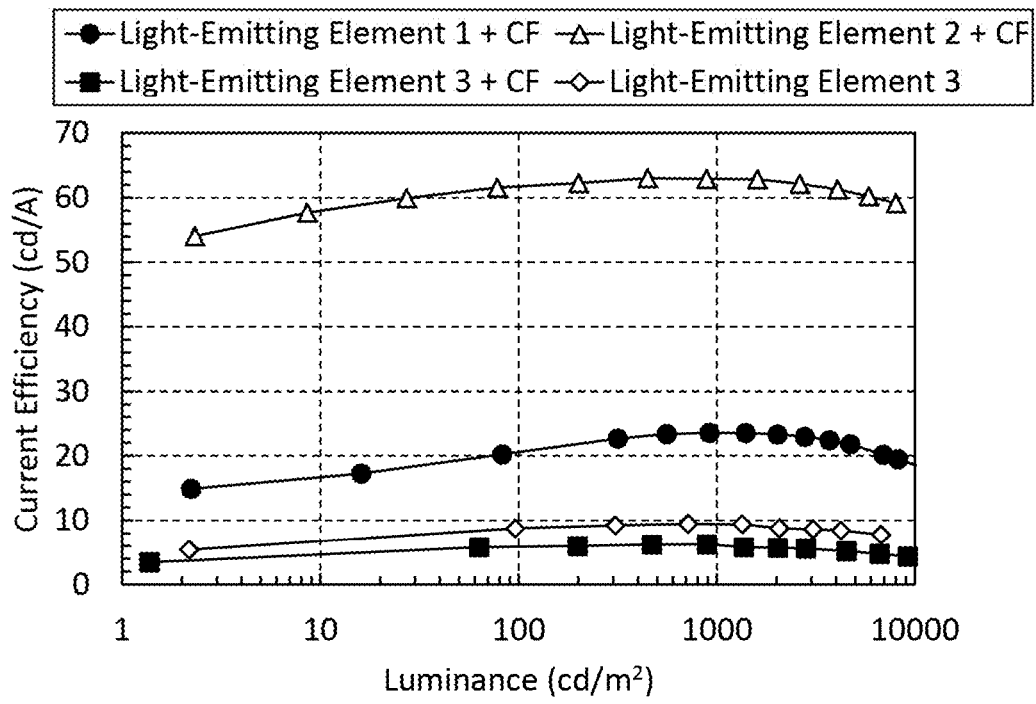
FIG. 62 shows current efficiency-luminance characteristics of light-emitting elements in Example.
Figure 63:
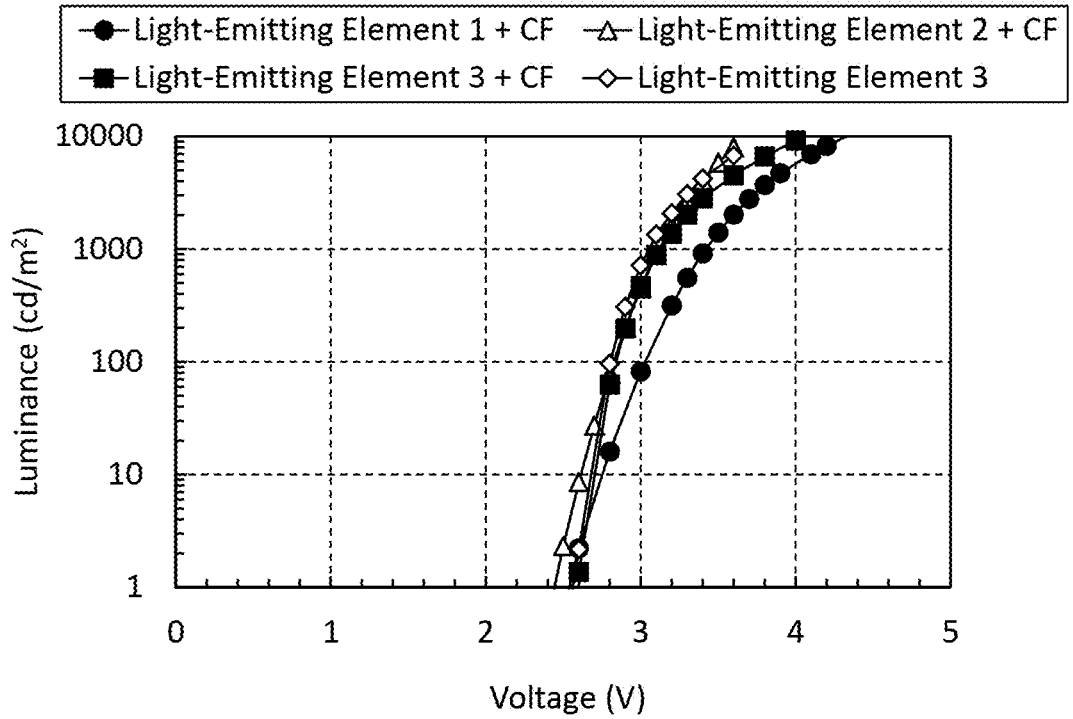
FIG. 63 shows luminance-voltage characteristics of light-emitting elements in Example.
Figure 64:
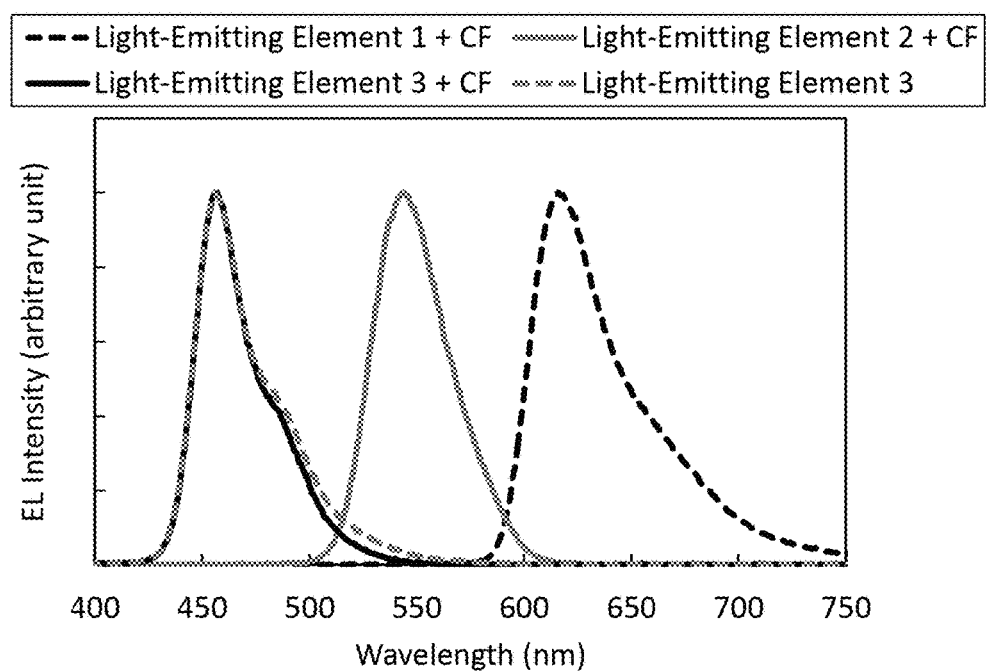
FIG. 64 shows electroluminescence spectra of light-emitting elements in Example.

FIG. 62 shows current efficiency-luminance characteristics of the light-emitting elements 1 to 3. FIG. 63 shows luminance-voltage characteristics. FIG. 64 shows electroluminescence spectra when a current at a current density of 2.5 mA/cm$^2$ was supplied to the light-emitting elements 1 to 3. The measurement where the light-emitting element 1 overlaps with an optical element including a 2.2-μm-thick coloring layer that has a function of transmitting red light (color filter: CF) was performed. In addition, the measurement where the light-emitting element 2 overlaps with an optical element including a 2.2-μm-thick coloring layer that has a function of transmitting green light (color filter: CF) was performed. In addition, the measurement where the light-emitting element 3 overlaps with an optical element including a 0.8-μm-thick coloring layer that has a function of transmitting blue light (color filter: CF) and the measurement where the light-emitting element 3 does not overlap with an optical element were performed.

Table 5 shows element characteristics of the light-emitting elements 1 to 3 at around 1000 cd/m$^2$.

TABLE 5

| | Voltage (V) | Current density (mA/cm$^2$) | CIE chromaticity (x, y) | Luminance (cd/m$^2$) | Current efficiency (cd/A) |
|---|---|---|---|---|---|
| Light-emitting element 1 + CF | 3.40 | 3.90 | (0.684, 0.316) | 917 | 23.5 |
| Light-emitting element 2 + CF | 3.10 | 1.41 | (0.329, 0.662) | 887 | 62.9 |
| Light-emitting element 3 + CF | 3.10 | 14.3 | (0.137, 0.083) | 890 | 6.25 |
| Light-emitting element 3 | 3.00 | 7.57 | (0.140, 0.104) | 716 | 9.46 |

As shown in FIGS. 62 to 64 and Table 5, the light-emitting element 1 overlapping with the CF has high current efficiency and emits red light with high color purity. In addition, the light-emitting element 2 overlapping with the CF has high current efficiency and emits green light with high color purity.

In addition, the light-emitting element 3 overlapping with the CF and the light-emitting element 3 not overlapping with the CF each have high current efficiency and emit blue light with high color purity. Note that the light-emitting element 3 not overlapping with the CF has higher current efficiency than the light-emitting element 3 overlapping with the CF. Furthermore, as shown in FIG. 64 and Table 5, the light-emitting element 3 not overlapping with the CF has the electroluminescence spectrum which is almost the same as that of the light-emitting element 3 overlapping with the CF and has sufficient color purity.

Next, the power consumption of display devices fabricated using the light-emitting elements 1 to 3 was estimated.

The power consumption of the display devices were estimated on the assumption that the display device has an aspect ratio of 16:9, a diagonal of 4.3 inches, and an area of the display region of 50.97 cm$^2$, and the aperture ratio is 35%.

When the light-emitting element 1 overlapping with the CF, the light-emitting element 2 overlapping with the CF, the light-emitting element 3 overlapping with the CF were used and the luminances of display elements having the structures of the light-emitting element 1, the light-emitting element 2, and the light-emitting element 3 were 507 cd/m$^2$, 1776 cd/m$^2$, and 288 cd/m$^2$, respectively, the entire surface of the display region can display white (chromaticity coordinates (x,y)=(0.313, 0.329)) with a color temperature of 6500 K at 300 cd/m$^2$, and the power consumption of the display element portion here can be estimated to be 180 mW.

In addition, when the light-emitting element 1 overlapping with the CF, the light-emitting element 2 overlapping with the CF, the light-emitting element 3 overlapping with the CF were used, and the luminances of display elements having the structures of the light-emitting element 1, the light-emitting element 2, and the light-emitting element 3 were 521 cd/m$^2$, 1671 cd/m$^2$, and 380 cd/m$^2$, respectively, the entire surface of the display region can display white (chromaticity coordinates (x,y)=(0.313, 0.329)) with a color temperature of 6500 K at 300 cd/m$^2$, and the power consumption of the display element portion here can be estimated to be 166 mW.

Thus, it is shown that, in the display element having a structure where the light-emitting elements 1 and 2 each overlap with the CF and the light-emitting element 3 does not overlap with the CF, the power consumption is reduced. With such a display element, a display device with low power consumption can be provided.

The structures described above in this example can be used in combination with any of the structures described in the other examples and embodiments as appropriate.

EXAMPLE 3

In this example, the display devices of embodiments of the present invention were fabricated and power consumption of the display devices was measured.

In this example, a display device (display device 1) which corresponds to a display device having the cross-sectional structures in FIG. 2A and FIG. 6, a display device (display device 2) which corresponds to a display device having the cross-sectional structures in FIGS. 7A and 7B, and a display device (display device 3) which corresponds to a display device having the cross-sectional structure in FIG. 11B were used.

Note that the display device 1 and the display device 2 used in this example can be fabricated by methods similar to those for fabricating the display device 1 and the display device 2 used in Example 1. The display device 3 is the display device 1 or the display device 2 in which the fifth step described in <Method for manufacturing display device> in Embodiment 1 is omitted. That is, in each of the display devices 1 and 2, an opening is provided in an insulating film in a region overlapping with the second display element 550 and the opening 351H, and in the display device 3, an opening is not provided in an insulating film in a region overlapping with the second display element 550 and the opening 351H.

Table 6 shows specifications of the display devices fabricated in this example.

TABLE 6

| | | Specification |
|---|---|---|
| Panel size | | 1.55 inches diagonal |
| Number of effective pixels | | 320 × RGB × 320 |
| Resolution | | 292 ppi |
| Liquid crystal element | Mode | Reflective twisted ECB mode |
| | Coloring system | Color filter system |
| | Aperture ratio | 69.0% |
| Light-emitting element (Organic EL element) | Coloring system | Separate coloring + color filter system |
| | Aperture ratio | 3.9% |

An oxide semiconductor was used for semiconductor films of transistors included in the display devices 1 to 3.

In addition, as the second display elements 550 (light-emitting elements) of each of the display devices 1 to 3, light-emitting elements that correspond to the light-emitting elements 1 to 3 fabricated in Example 2 were used.

Pixel regions including a red light-emitting element and a green light-emitting element of the display device 1 each have a cross-sectional structure including an optical element including the coloring layer 575 in FIG. 6, and a pixel region including a blue light-emitting element of the display device 1 has a cross-sectional structure in FIG. 2A.

Pixel regions including a red light-emitting element and a green light-emitting element of the display device 2 each have a cross-sectional structure including an optical element including the coloring layer 575 in FIG. 7B, and a pixel region including a blue light-emitting element of the display device 2 has a cross-sectional structure in FIG. 7A.

Pixel regions including a red light-emitting element, a green light-emitting element, and a blue light-emitting element of the display device 3 each have a cross-sectional structure including an optical element including the coloring layer 575 in FIG. 11B.

Table 7 shows structures of insulating films each including a region overlapping with the opening 351H and structures of coloring layers included in the optical element of the display devices 1 to 3.

TABLE 7

| | | Reference | Film thickness (nm) | | |
|---|---|---|---|---|---|
| | Layer | numeral | Red pixel | Green pixel | Blue pixel |
| Display device 1 | Coloring layer | 375 | 800 | 1000 | 800 |
| | Insulating film | 501C | — | | |
| | Insulating film | 506 | — | | |
| | Insulating film | 516 | — | | |
| | Insulating film | 518 | — | | |
| | Coloring layer | 575 | 800 | 1000 | — |

TABLE 7-continued

| | | Reference | Film thickness (nm) | | |
|---|---|---|---|---|---|
| | Layer | numeral | Red pixel | Green pixel | Blue pixel |
| Display device 2 | Coloring layer | 375 | 800 | 1000 | 800 |
| | Insulating film | 501C | | 200 | |
| | Insulating film | 506 | | 450 | |
| | Insulating film | 516 | | 430 | |
| | Insulating film | 518 | | — | |
| | Coloring layer | 575 | 800 | 1000 | — |
| Display device 3 | Coloring layer | 375 | 800 | 1000 | 800 |
| | Insulating film | 501C | | 200 | |
| | Insulating film | 506 | | 450 | |
| | Insulating film | 516 | | 430 | |
| | Insulating film | 518 | | 100 | |
| | Coloring layer | 575 | 800 | 1000 | 800 |

<Measurement of Power Consumption of Display Devices>

The power consumption of the fabricated display devices 1 to 3 in the display state was measured.

Figure 65A:
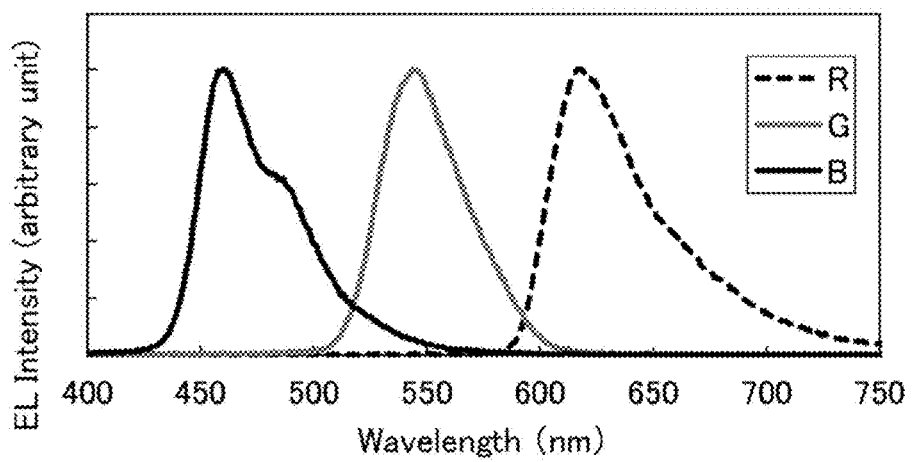
FIGS. 65A to 65C each show electroluminescence spectra of display devices in Example.
Figure 65B:
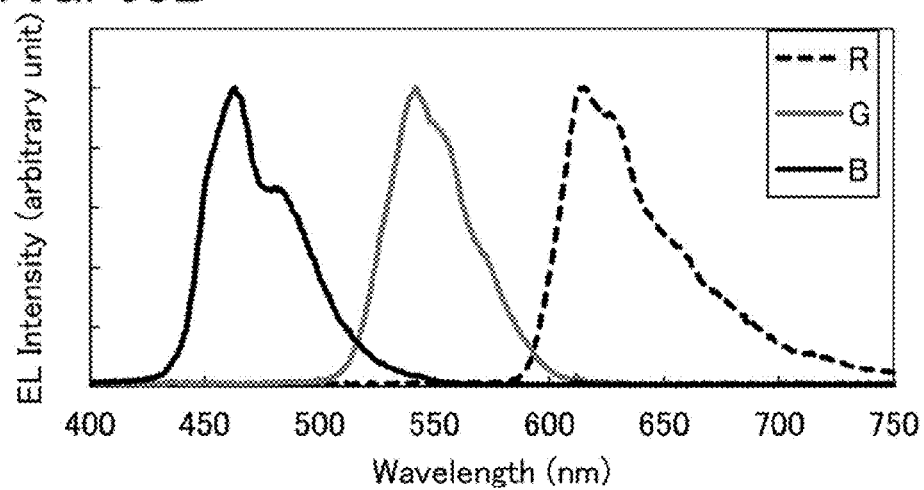
Figure 65C:
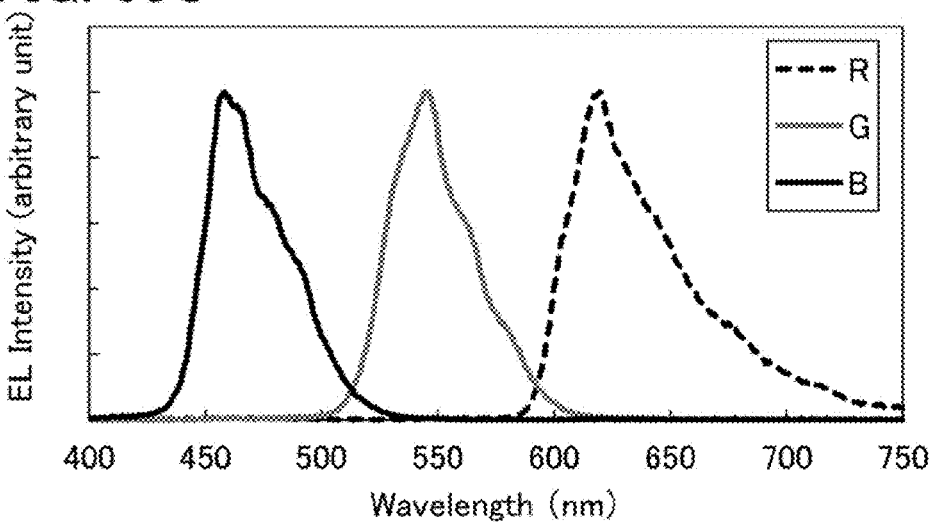

The measurement was performed on a display device which performed display so that the luminance of white light was 75 cd/m² in a dark place. In the above display settings, in addition to the power consumption for obtaining white light, the power consumption for obtaining red light, green light, and blue light was measured. Table 8 shows the measurement results. In addition, FIGS. 65A to 65C show electroluminescence spectra of the display devices when the red light (R), the green light (G), and the blue light (B) were displayed. FIG. 65A, FIG. 65B, and FIG. 65C show electroluminescence spectra of the display device 1, the display device 2, and the display device 3, respectively.

TABLE 8

| | Power consumption (mW) | | | |
|---|---|---|---|---|
| | Red | Green | Blue | White |
| Display device 1 | 15.0 | 26.0 | 44.9 | 82.0 |
| Display device 2 | 15.6 | 28.9 | 53.3 | 92.9 |
| Display device 3 | 21.8 | 40.6 | 83.6 | 125.6 |

As shown in Table 8, the power consumption of the display devices 1 and 2 is lower than that of the display device 3. Thus, it is found that when the number of insulating films including a region overlapping with the second display element 550 (light-emitting element) and the opening 351H becomes small, the power consumption of the display device can be reduced. In addition, it is found that when a blue light-emitting element does not include a region overlapping with the coloring layer 575 (optical element), the power consumption of the display device can be reduced.

Furthermore, the power consumption of the display device 1 is lower than that of the display device 2. That is, as the number of insulating films including a region overlapping with the second display element 550 (light-emitting element) and the opening 351H becomes smaller, the power consumption of the display device can be reduced.

The structures described above in this example can be used in combination with any of the structures described in the other examples and embodiments as appropriate.

EXAMPLE 4

In this example, refractive indices of insulating films included in the display device of one embodiment of the present invention were measured.

The insulating films used in this example are similar to the insulating films included in the display devices of Example 1 and Example 3, which are a nitrogen-containing silicon oxide (SiON) film and a silicon nitride (SiN) film.

The SiON film and the SiN film were each formed to a thickness of 50 nm by a PECVD method.

The refractive indices were measured using a spectroscopic ellipsometer (UVISEL, manufactured by HORIBA, Ltd.).

Figure 66:
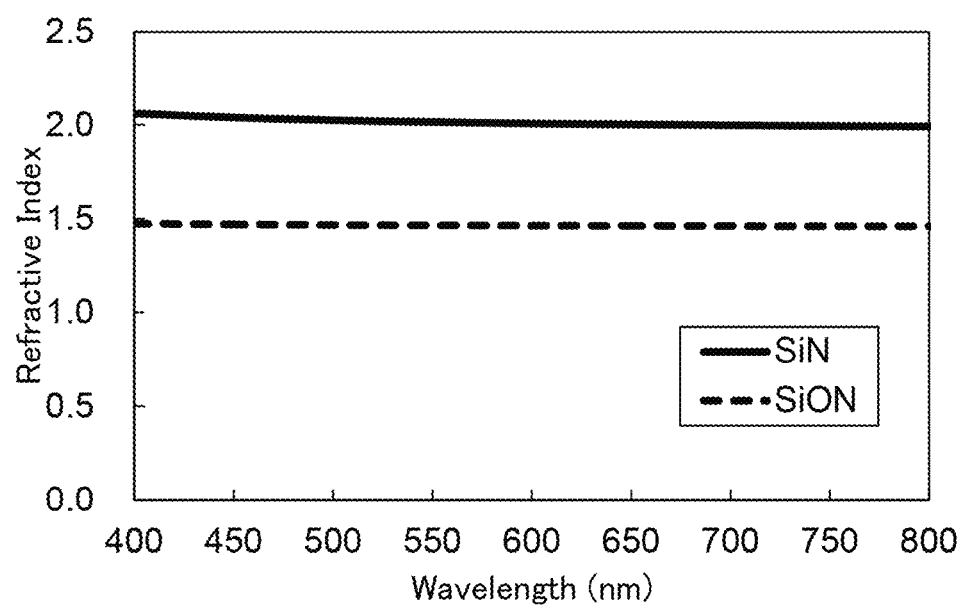
FIG. 66 shows refractive indices of insulating films included in a display device in Example.

FIG. 66 shows the measurement results of the refractive indices of the SiON film and the SiN film.

As shown in FIG. 66, the refractive index of the SiN film is higher than that of the SiON film.

The structure described above in this example can be used in combination with any of the structures described in the other examples and embodiments as appropriate.

EXPLANATION OF REFERENCE

ANO: wiring, C1: capacitor, C2: capacitor, CSCOM: wiring, GD: driver circuit, GDA: driver circuit, GDB: driver circuit, GL1: scan line, GL2: scan line, M1: node, M2: node, P1: positional information, P2: information, PIC1: image information, PIC2: image information, PIC3: image information, PIC4: image information, S1: oxide semiconductor, S2: oxide semiconductor, S3: oxide semiconductor, SL1: signal line, SL2: signal line, SD: driver circuit, VCOM1: wiring, VCOM2: wiring, 200: transistor, 202: substrate, 204: conductive film, 206: insulating film, 207: insulating film, 208: oxide semiconductor film, 208*a*: oxide semiconductor film, 208*b*: oxide semiconductor film, 208*c*: oxide semiconductor film, 208*d*: drain region, 208*i*: channel region, 208*s*: source region, 212: conductive film, 212*a*: conductive film, 212*b*: conductive film, 214: insulating film, 216: insulating film, 218: insulating film, 220: conductive film, 220*a*: conductive film, 220*b*: conductive film, 230: barrier film, 240: oxygen, 250: transistor, 250A: transistor, 250B: transistor, 251*a*: opening, 251*b*: opening, 252: opening, 252*a*: opening, 252*b*: opening, 252*c*: opening, 260: transistor, 270: transistor, 280: transistor, 290: transistor, 300: display device, 300B: display device, 300C: display device, 300D: display device, 302: pixel, 305: sealant, 331: alignment film, 332: alignment film, 335: structure body, 337: conductor, 339: conductive material, 350: display element, 351: electrode, 351A: conductive film, 351B: conductive film, 351C: conductive film, 351H: opening, 352: electrode, 353: liquid crystal layer, 354: intermediate film, 370: substrate, 370D: functional film, 370P: functional film, 371: insulating film, 373: light-blocking film, 375: coloring layer, 377: flexible printed circuit, 381: insulating film, 382: conductive film, 501A: insulating film, 501C: insulating film, 504: conductive film, 505: bonding layer, 506: insulating film, 508: semiconductor film, 508A: region, 508B: region, 508C: region, 510: substrate, 511B: conductive film, 511C: conductive film, 512A: conductive film, 512B: conductive film, 516: insulating film, 518: insulating film, 519B: terminal, 519C: terminal, 520: functional layer, 521: insulating film, 522: connection portion, 524: conductive film, 528: insulating film, 530: pixel circuit, 550: display element, 551: electrode, 552: electrode, 553: light-emitting layer, 570: substrate, 575: coloring layer, 581: switch, 581B: switch, 582: switch, 585: transistor, 585B: transistor, 586: transistor, 586B: transistor, 591A: opening, 591B: opening, 591C: opening, 592A: opening, 592B: opening, 592C: opening, 662: light-blocking film, 663: insulating film, 664: conductive film, 665: conductive film, 666: insulating film, 667: conductive film, 668: insulating film, 670: substrate, 672: substrate, 674: adhesive agent, 691: touch panel, 692: touch panel, 693: touch panel, 800: input/output device, 801: upper cover, 802: lower cover, 803: FPC, 804: touch sensor, 805: FPC, 806: display device, 809: frame, 810: driver circuit, 811: battery, 1200: information processing device, 1210: arithmetic device, 1211: arithmetic portion, 1212: memory portion, 1214: transmission path, 1215: input/output interface, 1220: input/output device, 1230: display portion, 1230B: display portion, 1231: display region, 1232: pixel, 1235EL: display element, 1235LC: display element, 1240: input portion, 1250: sensor portion, 1290: communication portion, 2189: ROM interface, 2190: substrate, 2191: ALU, 2192: ALU controller, 2193: instruction decoder, 2194: interrupt controller, 2195: timing controller, 2196: register, 2197: register controller, 2198: bus interface, 2199: ROM, 2200: memory element, 2201: circuit, 2202: circuit, 2203: switch, 2204: switch, 2206: logic element, 2207: capacitor, 2208: capacitor, 2209: transistor, 2210: transistor, 2213: transistor, 2214: transistor, 2220: circuit, 3001: wiring, 3002: wiring, 3003: wiring, 3004: wiring, 3005: wiring, 3200: transistor, 3300: transistor, 3400: capacitor, 5000: housing, 5001: display portion, 5002: display portion, 5003: speaker, 5004: LED lamp, 5005: operation key, 5006: connection terminal, 5007: sensor, 5008: microphone, 5009: switch, 5010: infrared port, 5011: recording medium reading portion, 5012: support portion, 5013: earphone, 5014: antenna, 5015: shutter button, 5016: image receiving portion, 5017: charger, 7302: housing, 7304: display device, 7305: icon, 7306: icon, 7311: operation button, 7312: operation button, 7313: connection terminal, 7321: band, 7322: clasp.

This application is based on Japanese Patent Application serial no. 2015-201659 filed with Japan Patent Office on Oct. 12, 2015, the entire contents of which are hereby incorporated by reference.

The invention claimed is:

1. A display device comprising:
    a first display element configured to display an image by reflecting ambient light, wherein the first display element comprises a reflective film;
    a second display element configured to display an image by emitting light;
    a first insulating film between the first display element and the second display element; and
    a second insulating film between the first display element and the first insulating film,
    wherein the reflective film comprises a first opening overlapping with the second display element, to extract the light emitted from the second display element through the first opening,
    wherein the second insulating film comprises a second opening overlapping with the first opening and the second display element, and
    wherein the first insulating film is in the second opening.

2. The display device according to claim 1, wherein the first display element comprises a first electrode comprising the reflective film, a second electrode, and a liquid crystal layer between the first electrode and the second electrode.

3. The display device according to claim 1, wherein the second display element comprises a light-emitting element comprising a first electrode, a second electrode, and a light-emitting layer between the first electrode and the second electrode.

4. The display device according to claim 1, wherein the first insulating film is in contact with a first electrode comprising the reflective film of the first display element.

5. The display device according to claim 1, comprising a transistor between the first display element and the first insulating film.

6. The display device according to claim 5, wherein the transistor comprises the second insulating film.

7. The display device according to claim 5, wherein the transistor comprises the second insulating film as a gate insulating film.

8. The display device according to claim 5, wherein the transistor is electrically connected to one of the first display element and the second display element.

9. A display device comprising:
a first display element;
a second display element;
a pixel circuit; and
a first insulating film,
wherein the first display element comprises a first electrode and a liquid crystal layer,
wherein the second display element comprises a second electrode and a light-emitting layer,
wherein the first electrode is electrically connected to the pixel circuit,
wherein the second electrode is electrically connected to the pixel circuit,
wherein the first electrode comprises a reflective film,
wherein the reflective film comprises an opening,
wherein the pixel circuit comprises a transistor,
wherein the transistor comprises a semiconductor film and a second insulating film,
wherein the opening comprises a region overlapping with the first insulating film, and
wherein the semiconductor film comprises a region overlapping with the first insulating film and the second insulating film.

10. The display device according to claim 9,
wherein the transistor comprises a third insulating film,
wherein the region of the opening overlaps with the first insulating film and the second insulating film, and
wherein the region of the semiconductor film overlaps with the first insulating film, the second insulating film, and the third insulating film.

11. The display device according to claim 10, wherein a refractive index of the second insulating film is different from a refractive index of the third insulating film.

12. The display device according to claim 9, wherein the number of insulating films overlapping with the opening is smaller than the number of insulating films overlapping with the semiconductor film.

13. The display device according to claim 9,
wherein the second display element comprises a first light-emitting element and a second light-emitting element,
wherein the first light-emitting element is configured to emit light of a color different from a color of light emitted from the second light-emitting element,
wherein the first light-emitting element comprises a region overlapping with a first optical element, and
wherein the second light-emitting element comprises a region overlapping with a second optical element and a third optical element.

14. The display device according to claim 13, wherein the light emitted from the first light-emitting element has an emission spectrum peak on a shorter wavelength side than the light emitted from the second light-emitting element.

15. The display device according to claim 9,
wherein the second display element is configured to emit light toward the opening, and
wherein the second display element is configured to perform display in a direction in which the first display element performs display.

16. The display device according to claim 9, wherein the semiconductor film comprises an oxide semiconductor.

17. A display device comprising:
a first display element;
a second display element; and
a pixel circuit,
wherein the first display element comprises a first electrode and a liquid crystal layer,
wherein the second display element comprises a second electrode and a light-emitting layer,
wherein the first electrode is electrically connected to the pixel circuit,
wherein the second electrode is electrically connected to the pixel circuit,
wherein the second display element comprises a first light-emitting element and a second light-emitting element,
wherein the first light-emitting element is configured to emit light of a color different from a color of light emitted from the second light-emitting element,
wherein the first light-emitting element comprises a region overlapping with a first optical element, and
wherein the second light-emitting element comprises a region overlapping with a second optical element and a third optical element.

18. The display device according to claim 17, wherein the light emitted from the first light-emitting element has an emission spectrum peak on a shorter wavelength side than the light emitted from the second light-emitting element.

19. The display device according to claim 17,
wherein the first electrode comprises a reflective film,
wherein the reflective film comprises an opening,
wherein the second display element is configured to emit light toward the opening, and
wherein the second display element is configured to perform display in a direction in which the first display element performs display.

* * * * *